US007282275B2

(12) United States Patent
Wolk et al.

(10) Patent No.: US 7,282,275 B2
(45) Date of Patent: Oct. 16, 2007

(54) MATERIALS FOR ORGANIC ELECTRONIC DEVICES

(75) Inventors: Martin B. Wolk, Woodbury, MN (US); James G. Bentsen, North St. Paul, MN (US); Ralph R. Roberts, Cottage Grove, MN (US); John S. Staral, Woodbury, MN (US); Yingbo Li, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 562 days.

(21) Appl. No.: 10/414,066

(22) Filed: Apr. 15, 2003

(65) Prior Publication Data

US 2003/0219625 A1 Nov. 27, 2003

Related U.S. Application Data

(60) Provisional application No. 60/373,857, filed on Apr. 19, 2002.

(51) Int. Cl.
*H01L 51/50* (2006.01)
*H01L 51/30* (2006.01)
*H01L 51/05* (2006.01)
*C09K 11/06* (2006.01)

(52) U.S. Cl. .................. 428/690; 428/917; 252/301.16; 252/500; 252/519.21; 427/66

(58) Field of Classification Search ................ 428/690, 428/917; 252/500, 519.21, 301.16; 427/64
See application file for complete search history.

(56) References Cited

U.S. PATENT DOCUMENTS

| 4,252,671 | A |   | 2/1981  | Smith          |         |
|-----------|---|---|---------|----------------|---------|
| 5,061,569 | A |   | 10/1991 | VanSlyke et al.|         |
| 5,166,024 | A |   | 11/1992 | Bugner et al.  |         |
| 5,256,506 | A |   | 10/1993 | Ellis et al.   |         |
| 5,281,489 | A | * | 1/1994  | Mori et al.    | 428/690 |
| 5,351,617 | A |   | 10/1994 | Williams et al.|         |
| 5,408,109 | A |   | 4/1995  | Heeger et al.  |         |
| 5,508,136 | A |   | 4/1996  | Shirota et al. |         |
| 5,536,588 | A |   | 7/1996  | Naito          |         |
| 5,550,290 | A |   | 8/1996  | Mizuta et al.  |         |
| 5,621,131 | A |   | 4/1997  | Kreuder et al. |         |
| 5,681,664 | A |   | 10/1997 | Tamano et al.  |         |
| 5,693,446 | A |   | 12/1997 | Staral et al.  |         |
| 5,695,907 | A |   | 12/1997 | Chang          |         |
| 5,707,745 | A |   | 1/1998  | Forrest et al. |         |
| 5,708,130 | A |   | 1/1998  | Woo et al.     |         |
| 5,710,097 | A |   | 1/1998  | Staral et al.  |         |
| 5,725,989 | A |   | 3/1998  | Chang et al.   |         |
| 5,728,801 | A |   | 3/1998  | Wu et al.      |         |
| 5,792,557 | A |   | 8/1998  | Nakaya et al.  |         |
| 5,840,217 | A |   | 11/1998 | Lupo et al.    |         |
| 5,869,350 | A |   | 2/1999  | Heeger et al.  |         |
| 5,900,327 | A |   | 5/1999  | Pei et al.     |         |
| 5,929,194 | A |   | 7/1999  | Woo et al.     |         |
| 5,945,502 | A |   | 8/1999  | Hsieh et al.   |         |
| 5,998,085 | A |   | 12/1999 | Isberg et al.  |         |
| 6,030,715 | A |   | 2/2000  | Thompson et al.|         |
| 6,074,734 | A |   | 6/2000  | Kawamura et al.|         |
| 6,114,088 | A |   | 9/2000  | Wolk et al.    |         |
| 6,132,641 | A |   | 10/2000 | Rietz et al.   |         |
| 6,150,043 | A |   | 11/2000 | Thompson et al.|         |
| 6,169,163 | B1|   | 1/2001  | Woo et al.     |         |
| 6,194,119 | B1|   | 2/2001  | Wolk et al.    |         |
| 6,203,933 | B1|   | 3/2001  | Nakaya et al.  |         |
| 6,214,520 | B1|   | 4/2001  | Wolk et al.    |         |
| 6,221,543 | B1|   | 4/2001  | Guehler et al. |         |
| 6,221,553 | B1|   | 4/2001  | Wolk et al.    |         |
| 6,228,543 | B1|   | 5/2001  | Mizuno et al.  |         |
| 6,228,555 | B1|   | 5/2001  | Hoffend, Jr. et al. |    |
| 6,242,115 | B1|   | 6/2001  | Thomson et al. |         |
| 6,242,152 | B1|   | 6/2001  | Staral et al.  |         |
| 6,284,425 | B1|   | 9/2001  | Staral et al.  |         |
| 6,329,082 | B1|   | 12/2001 | Kreuder et al. |         |
| 6,358,664 | B1|   | 3/2002  | Nirmal et al.  |         |
| 6,485,884 | B2|   | 11/2002 | Wolk et al.    |         |
| 6,521,324 | B1|   | 2/2003  | Debe et al.    |         |
| 6,664,111 | B2|   | 12/2003 | Bentsen et al. |         |
| 2002/0158574 | A1| | 10/2002 | Wolk et al.    |         |
| 2003/0068525 | A1| | 4/2003  | Bellmann et al.|         |
| 2003/0124265 | A1| | 7/2003  | Bellmann et al.|         |
| 2006/0051611 | A1| | 3/2006  | Brunner et al. |         |

(Continued)

FOREIGN PATENT DOCUMENTS

DE          3610649         10/1987

(Continued)

OTHER PUBLICATIONS

Certified English Translation of JP 2001-97949, Publication Date Apr. 10, 2001.*

(Continued)

*Primary Examiner*—Dawn L. Garrett
(74) *Attorney, Agent, or Firm*—Jean A. Lown; Loren D. Albin

(57) ABSTRACT

The invention provides compositions, organic electronic devices, and methods for preparing organic electronic devices. The compositions include a small molecule that is combined with at least one other material selected from a charge transporting material, a charge blocking material, a light emitting material, a color conversion material, or a combination thereof. The first compound has an aromatic core and two to four identical end capping groups attached to the aromatic core. The second compound has at least some structural similarities to the first compound of the composition.

31 Claims, 2 Drawing Sheets

FOREIGN PATENT DOCUMENTS

| | | | |
|---|---|---|---|
| EP | 0 553 950 A2 | 8/1993 | |
| EP | 0650955 | 5/1995 | |
| EP | 0827367 | 3/1998 | |
| EP | 0879868 | 11/1998 | |
| EP | 0891121 | 1/1999 | |
| EP | 0953624 | 11/1999 | |
| EP | 0968175 B | 1/2000 | |
| EP | 1 170 273 A1 | 1/2002 | |
| EP | 1170273 | 1/2002 | |
| GB | 2348316 A | * | 9/2000 |
| JP | 191694/1990 | 7/1990 | |
| JP | 000792/1991 | 1/1991 | |
| JP | 5-152072 | 6/1993 | |
| JP | 5-202011 | 8/1993 | |
| JP | 6-096860 | 4/1994 | |
| JP | 295695/1988 | 2/1998 | |
| JP | 10-195063 | 7/1998 | |
| JP | 2000-195673 | 7/2000 | |
| JP | 2001-097949 | * | 4/2001 |
| WO | WO 98/06773 | 2/1998 | |
| WO | WO 98/55561 | 12/1998 | |
| WO | WO 99/32537 | 7/1999 | |
| WO | WO 99/40655 | 8/1999 | |
| WO | WO 00/18851 | 4/2000 | |
| WO | WO 00/70655 | 11/2000 | |
| WO | WO 01/39234 | 5/2001 | |
| WO | WO 01/41512 | 6/2001 | |
| WO | WO 02/22374 | 3/2002 | |
| WO | WO 03/019179 | 3/2003 | |

OTHER PUBLICATIONS

Amashukeli et al., *J. Phys. Chem. A.*, 106(33) 7593-7598 (2002).
Bailey, T.R., *Tetrahedron Lett.*, 27, 4407-4410 (1986).
Barton et al., *Tetrahedron Lett.*, 24 (15) 1601-1604 (1983).
Bettenhausen et al., *Synthetic Metals*, 91, 223-228 (1997).
Bokova et al., *J. Org. Chem. USSR* (Engl. Transl), 5, 1103-1106 (1969).
Brownstein, S.K., et al., *J. Org. Chem.*, 67, 663 (2002).
Bumagin, N.A. et al., *J. Organomet. Chem.*, 364 231-234 (1989).
Chen, C.H., et al., "Recent Developments in Molecular Organic Electroluminescent Materials," *Macromolecular Symposia*, 125, 1-48 (1997)
Clayden, J., et al., *J. Chem. Soc., Perkin Trans*, 1, 7 (1995).
Creason, S.C., et al., *J. Org. Chem.* 37, 4440-4446 (1972).
Fischer, *Chem Ber.*, 25, 2826-2846 (1892).
Friend, R.H., et al., "Electroluminescence in Conjugated Polymers", *Nature*, 121, 397 (1999).
Fritsch, et al., *Chem Ber.*, 125, 849-855 (1992).
Fujikawa, et al., *Synthetic Metals*, 91, 161-162 (1997).
Gautun et al., *Acta Chem. Scand.*, 45(6), 609-615 (1991).
Goodbrand et al., *J. Org. Chem.* 64, 670-674 (1999).
Grazulevicius, J.V. et al., "Charge-Transporting Polymers and Molecular Glasses", *Handbook of Advanced Electronic and Photonic Materials and Devices*, H.S. Nalwa (ed.), 10, 233-274 (2001).
Grekov et al., *J. Gen. Chem. USSR* (Engl. Transl) 30, 3763-3766 (1960).
Halls, J.J.M., et al., "Light-emitting and Photoconductive Diodes Fabricated with Conjugated Polymers," *Thin Solid Films*, 276, 13-20 (1996).
Huntress et al., *J. Am. Chem. Soc.*, 55, 4262-4270 (1933).
Ishiyama et al., *J. Org. Chem.*, 60, 7508-7510 (1995).
Kajino et al., *Chem. Pharm. Bull*, 39 (11), 2888-2895 (1991).
Kido, J., "Organic Electroluminescent Devices Based on Polymeric Materials," *Trends in Polymer Science*, 2, 350-355 (1994).
Klingsberg, E, *J. Org. Chem.*, 23, 1086-1087 (1958).
Koene, B.E., et al., *Chem. Mater.*, 10, 2235-2250 (1998).
Kraft, et al., *Angew. Chem. Int. Ed.*, 37, 402-428 (1998).
Kreger, K. et al., *Synthetic Metals*, 119, 163 (2001).
Kristensen et al., *Org. Lett.*, 10, 1435-1438 (2001).
Meng, et al., *J. Am. Chem. Soc.*, 123(37), 9214-9215 (2001).
Miyaura, N., et al., *Chemical Reviews*, 95, 2457-2483 (1995).
Moss, et al., *J. Chem. Soc. Perkin Trans*1(9), 1999-2006 (1982).
Myznikov et al., *J. Gen. Chem. USSR* (Engl. Transl.), 62(6), 1125-1128 (1992).
Namkung et al., *J. Med. Chem. Soc.*, 8, 551-554 (1965).
Otera, J., et al., *Bull. Chem. Soc. Jpn*, 54, 2964-2967 (1981).
Park, M., et al., *Tetrahedron*, 42, 12707-12714 (1998).
Pei, et al., *J. Org. Chem.*, 67, 4924-4936 (2002).
Pei, Q., et al., "Polymer Light-Emitting Electrochemical Cells: In Situ Formation of Light-Emitting p-n Junction," *Journal of the American Chemical Society*, 118, 3922-3929 (1996).
Pilgram, K., et al., *J. Heterocycl. Chem*, 7, 629-633 (1970).
Prudchenko, A.T., et al., *J. Gen Chem. USSR* (Engl. Transl.), 37, 2082-2084 (1967).
Ranger, M., et al., *Can. J. Chem.*, 76, 1571-1577, 1998.
Ranger, M., et al., *Chem. Commun.*, 1597-1598 (1997).
Rule et al., *J. Chem. Soc.*, 1096-1101 (1937).
Salbeck et al., Low Molecular Organic Glasses for Blue Electroluminescence, *Synthetic Metals*, 91, 209-215 (1997).
Sanechika et al., *Bull. Chem. Soc. Jpn.*, 57, 752-755 (1984).
Schidlo et al., *Chem Ber.*, 96, 2595-2600 (1963).
Shen, Z., et al., Three-Color, Tunable, Organic Light-Emitting Devices, *Science*, 276, 2009-2011 (1997).
Strohriegl, P., "Charge Transporting Molecular Glasses," *Adv. Mat.*, 14, 1439 (2002).
Strukelj et al., *Science*, 267, 1969 (1995).
Takahashi et al., *Synthesis*, 627 (1980).
Takeda et al., *J. Org. Chem.*, 52 (18), 4137-4139 (1987).
Tamoto, et al., *Chem. Mater.*, 1077-1085 (1997).
Tanaka et al., *Chem. Commun.*, 2175-2176 (1996).
Tokito et al., *Appl. Phys. Lett.*, 70(15), 1929-1931 (1997).
Tokito et al., *Polym. Prep.* (Am. Chem. Soc. Div. Polym. Chem.) 38(1), 388-389 (1997).
Tokito et al., *Synthetic Metals*, 111-112, 393-396 (2000).
Weber, E, et al., *J. Chem. Soc. Perkin Trans*, 2, 1251-1258 (1988).
Weil et al., *J. Amer. Chem. Soc.*, 123(33), 8101-8108 (2001).
Widdowson, D.A., et al., *Tetrahedron*, 42, 2111 (1986).
Yoon et al., *J. Chem. Soc., Chem. Commun.*, 13, 1013-1014 (1987).
Zinke, A., et al., *Chem. Ber.*, 74, 107-112 (1941).
Ayabe et al., "*Construction of Monomeric and Polymeric Porphyrin Compartments by a Pd(II)-Pyridine Interaction and Their Chiral Twisting by a BINAP Ligand*", Journal of Organic Chemistry, vol. 68, No. 3, pp. 1059-1066 (2003).
Ikeda et al., "*A Novel Self-Assembled Porphyrin Polymer Constructed by a Pd(II)- Pyridine Interaction*", Chemical Letters, vol. 11, pp. 1138-1139 (2001).
Tomizaki et al., "*Practical Synthesis of Perylene-Monoimide Building Blocks That Possess Features Appropriate For Use In Porphyrin-Based Light-Harvesting Arrays*", Tetrahedron, vol. 59, No. 8, pp. 1191-1207 (2003).
Tomizaki et al., "Synthesis and Photophysical Properties of Light-Harvesting Arrays Comprised of a Porphyrin Bearing Multiple Perylene-Monoimide Accessory Pigments", *Journal of Organic Chemistry*, vol. 67, pp. 6519-6534 (2002).
Cha et al., "*Synthesis and Luminescence Properties of Four-Armed Conjugated Structures Containing 1,3,4-oxadiazole Moieties*", Journal of Materials Chemistry, vol. 13, No. 8, pp. 1900-1904 (2003).
Nam et al., "*Photoluminescence and Electroluminescence Properties of Poly(9-vinylcarbarzole) Doped With Anthracence Derivatives Containing bis(ethynylphenyl oxadiazole) or bis(vinylphenyl oxadiazole) Substituents*", Synthetic Metals, vol. 130, No. 3, pp. 271-277 (2002).

* cited by examiner

MATERIALS FOR ORGANIC ELECTRONIC DEVICES

CROSS-REFERENCE TO RELATED APPLICATION

This application claims priority to U.S. Provisional Patent Application No. 60/373,857, filed Apr. 19, 2002.

TECHNICAL FIELD

The invention relates to compositions, organic electronic devices, and methods for preparing organic electronic devices.

BACKGROUND

Electroluminescent materials can be used to make organic electroluminescent (OEL) devices such as organic light-emitting diodes (OLEDs). There is continuing research and development of materials suitable for such devices and methods for making the devices. In some instances, materials can be selected or developed which facilitate one or more of these methods.

Pattern-wise thermal transfer of materials from donor sheets to receptor substrates has been proposed as one method for forming OEL devices. Selective thermal transfer of organic light emitters for formation of organic electroluminescent devices has been shown to be particularly useful.

SUMMARY OF THE INVENTION

Compositions, organic electronic devices, and methods for preparing organic electronic devices are described. More particularly, the compositions include a small molecule that is combined with at least one other material selected from a charge transporting material, a charge blocking material, a light emitting material, a color conversion material, and a combination thereof. The compositions are amorphous and solution processable. The compositions can be used to prepare organic electronic devices such as organic electroluminescent devices.

A composition is provided that includes (a) a first compound of Formula I

that is a charge transporting molecule, a charge blocking molecule, a light emitting molecule, a color conversion molecule, or a combination thereof, wherein $Ar^1$ is a first aromatic core and is a divalent, trivalent, or tetravalent radical of

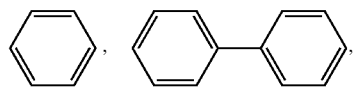

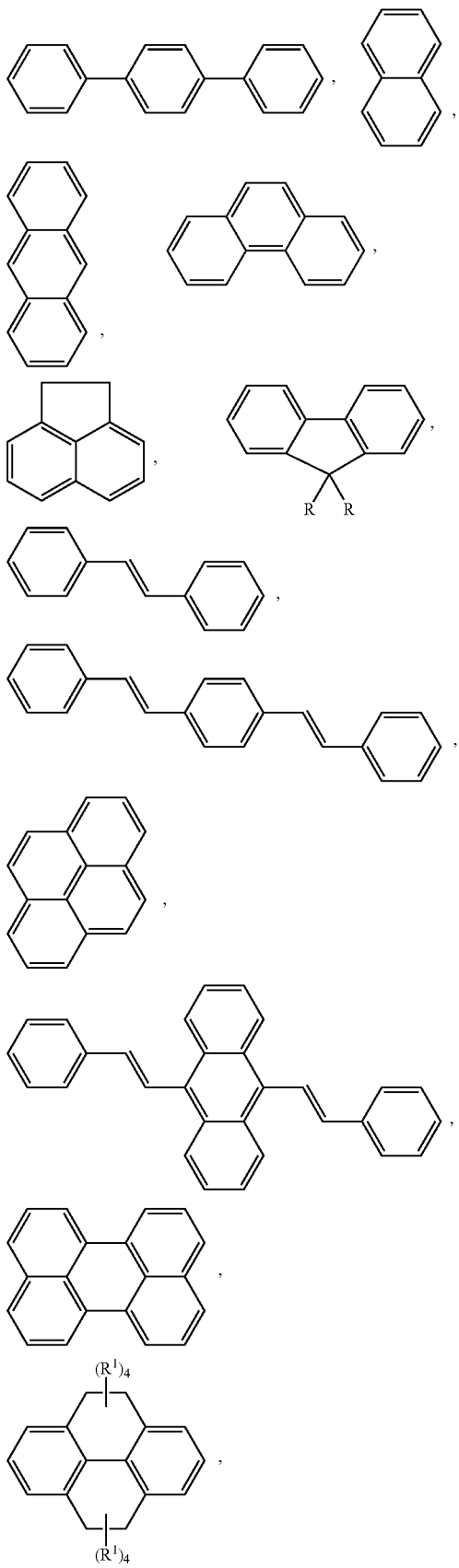

-continued
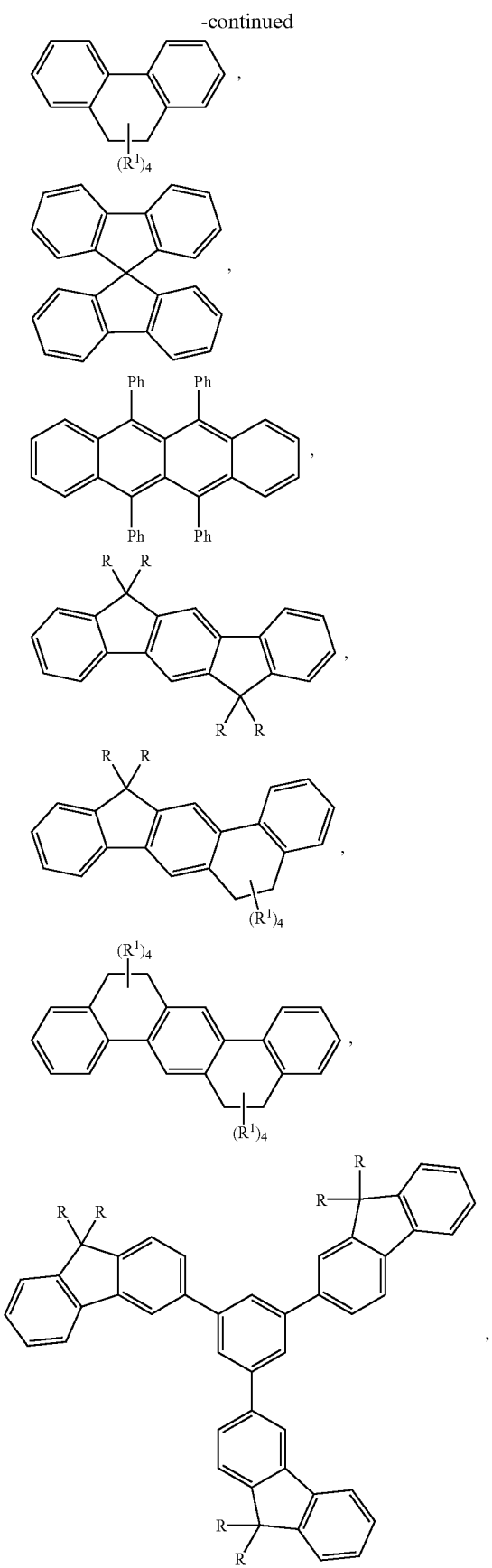
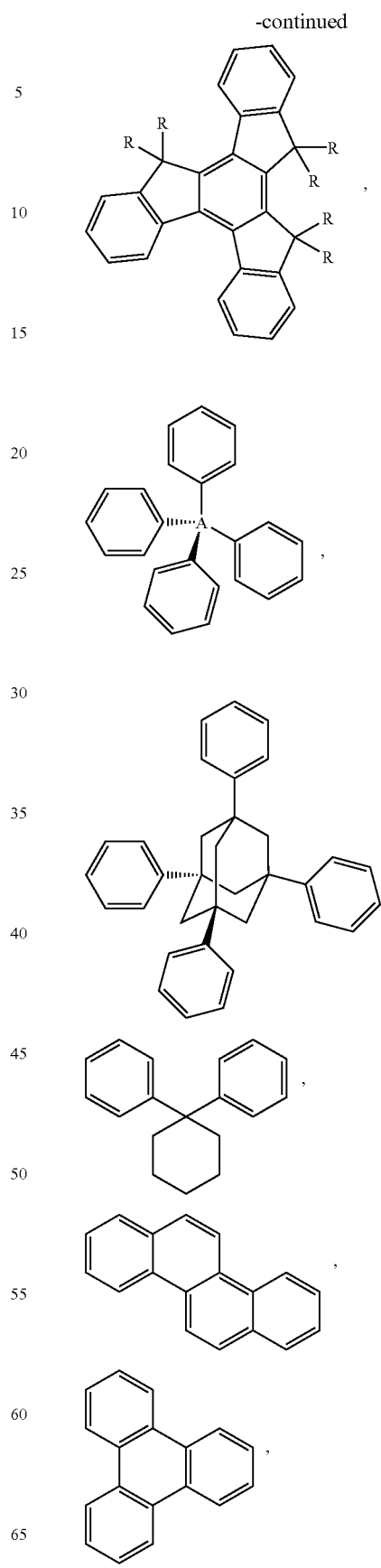

-continued
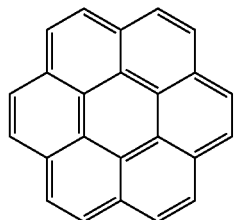
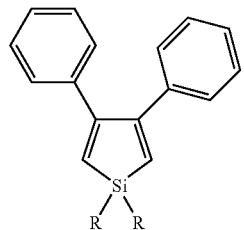
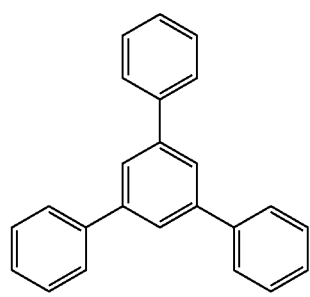
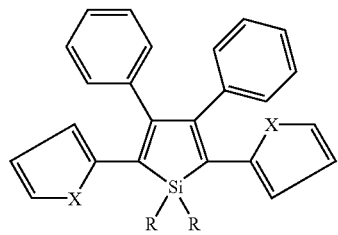
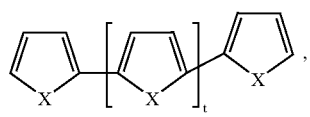
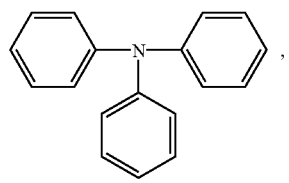
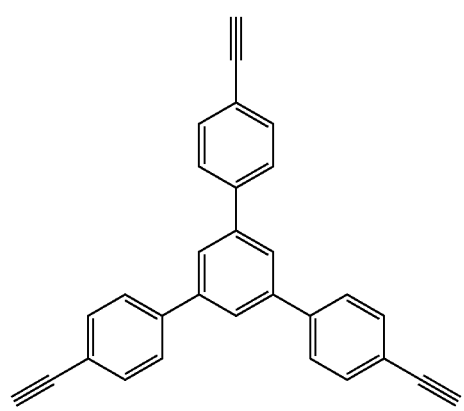
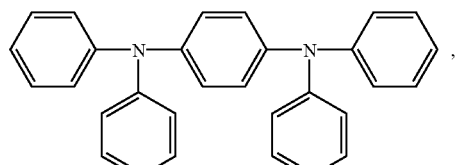
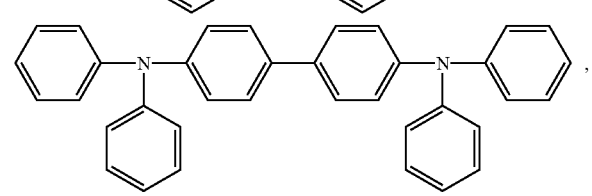
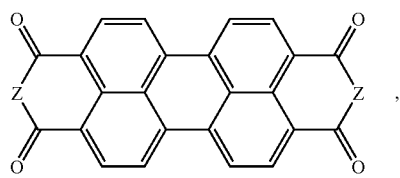
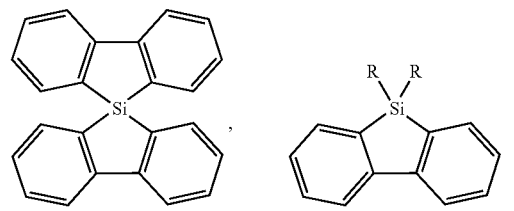
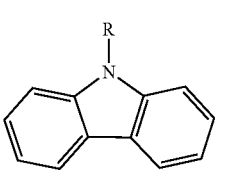
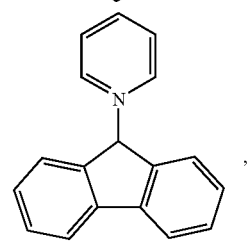

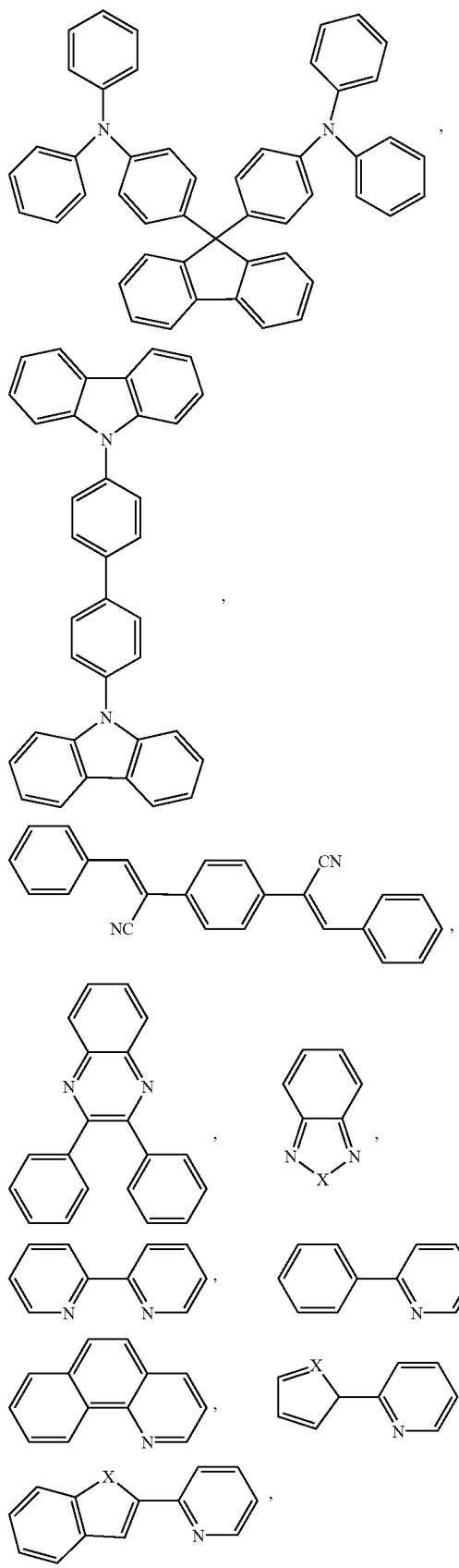
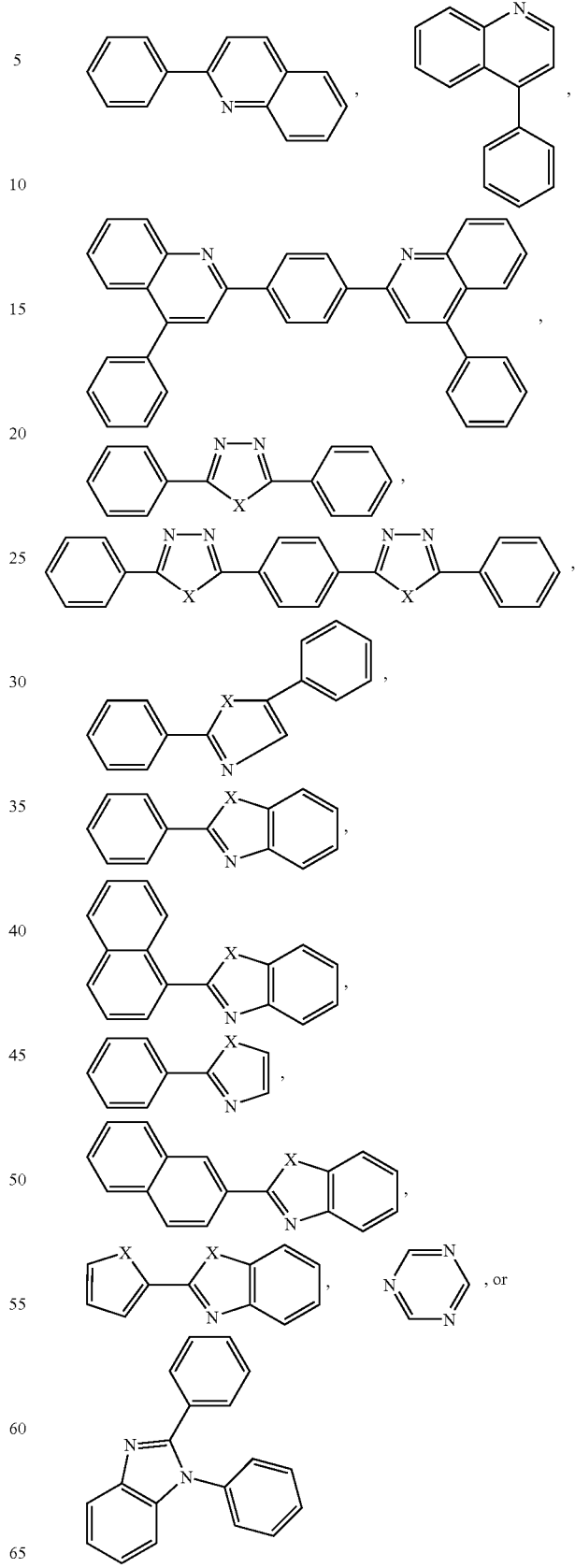

that is unsubstituted or substituted with one or more substituents selected from alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof;
EC is a first end capping group and is a monovalent radical of
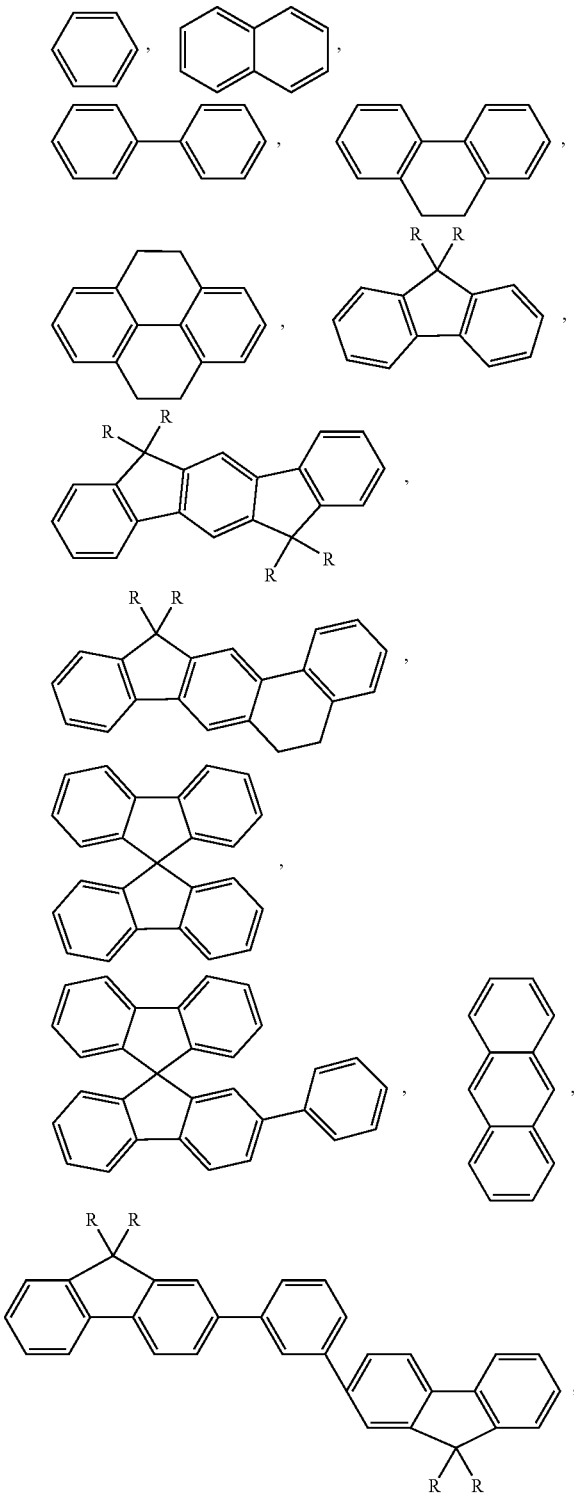
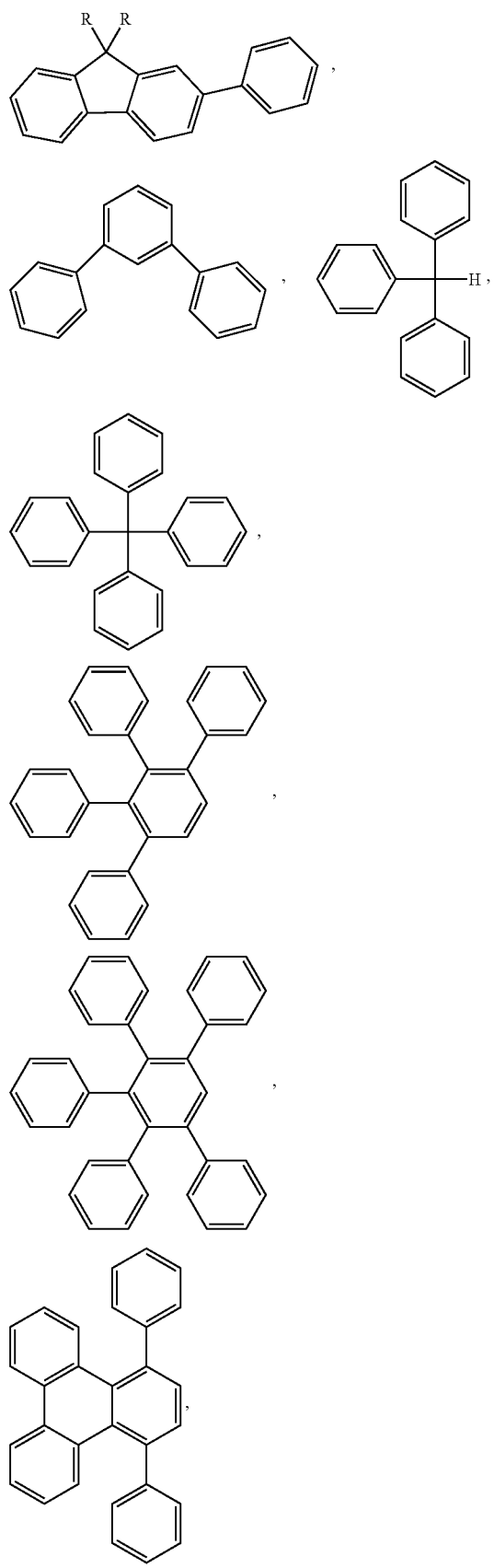

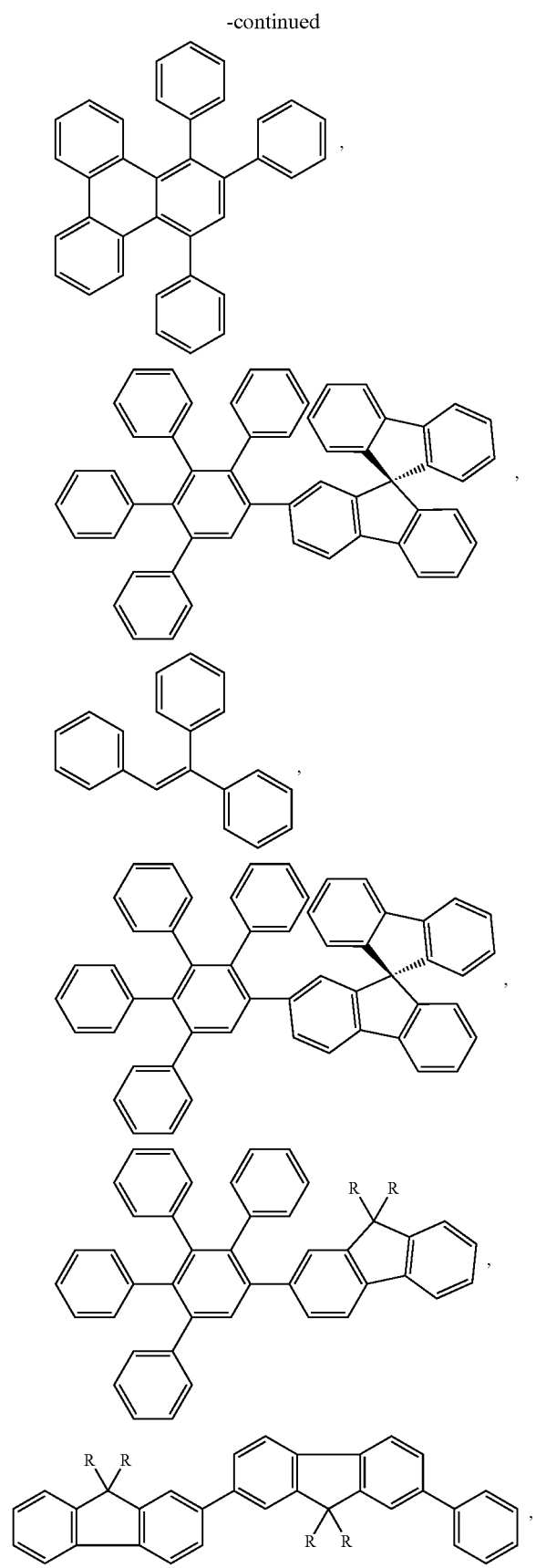
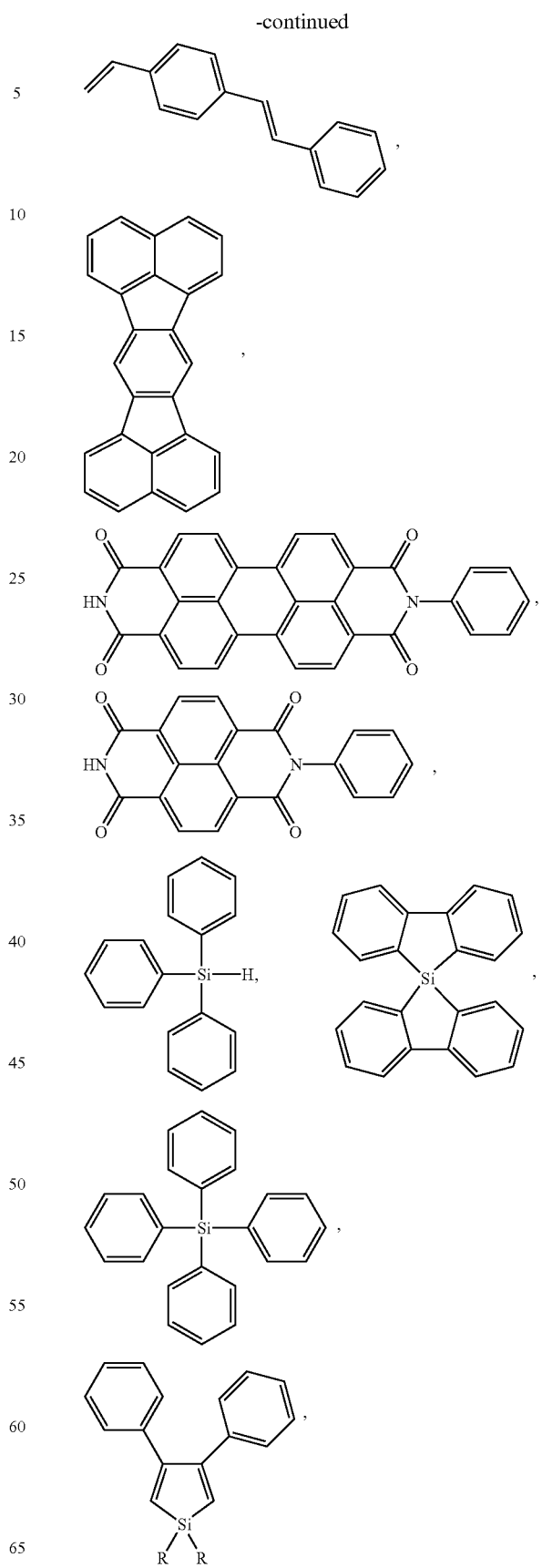

-continued
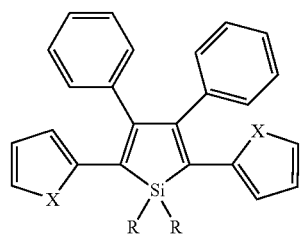
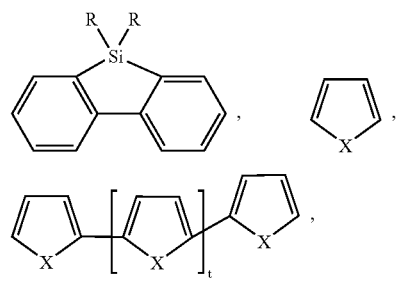
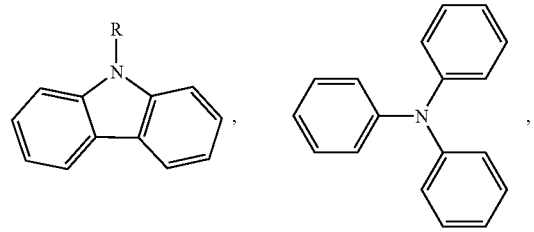
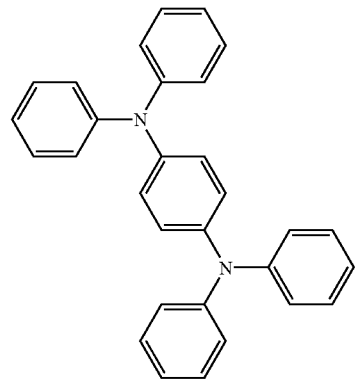
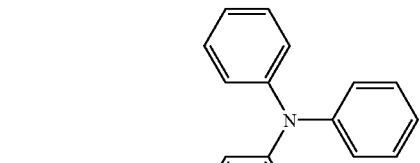
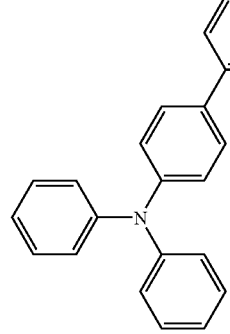
-continued
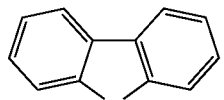
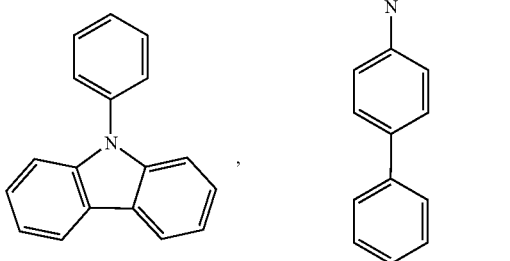
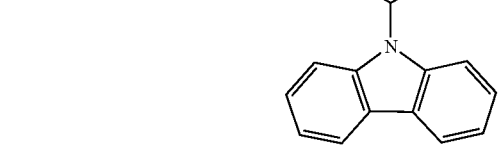
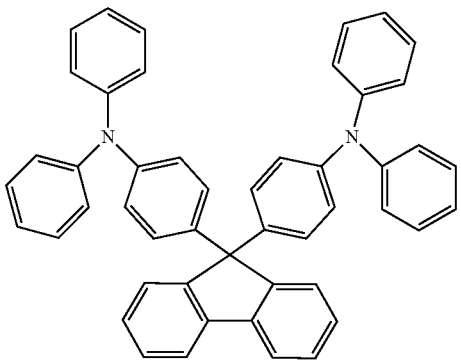
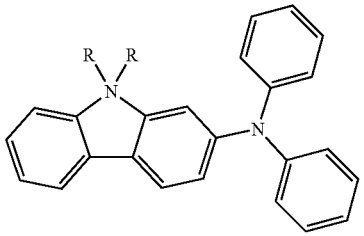
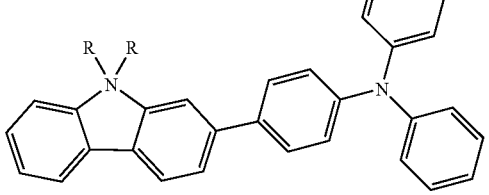
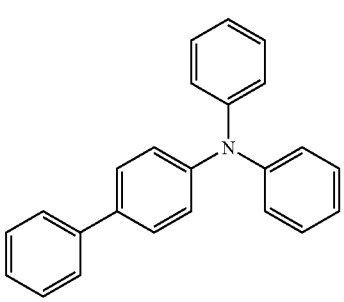

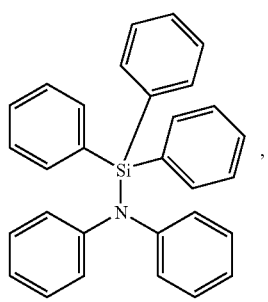
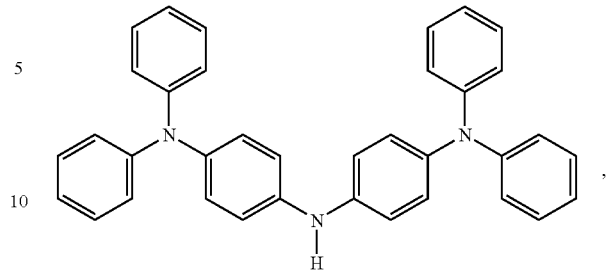
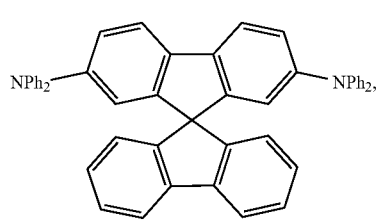
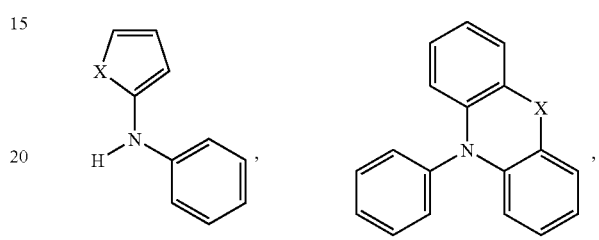
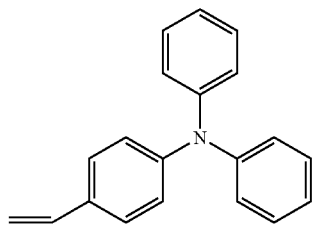
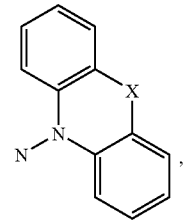
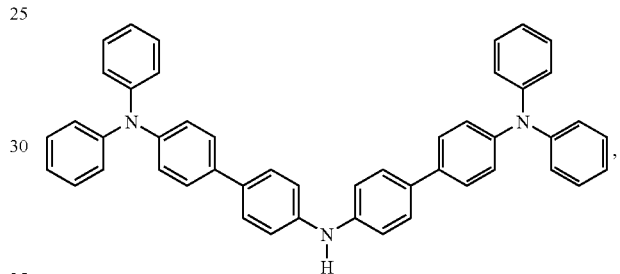
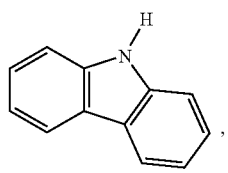
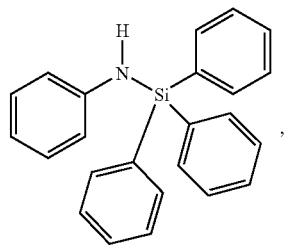
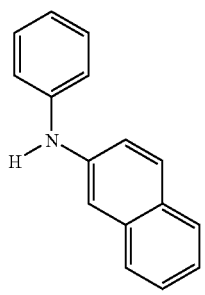
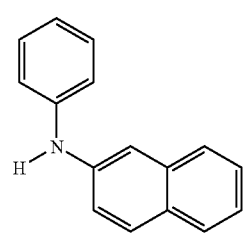
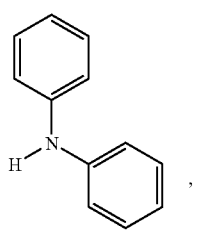
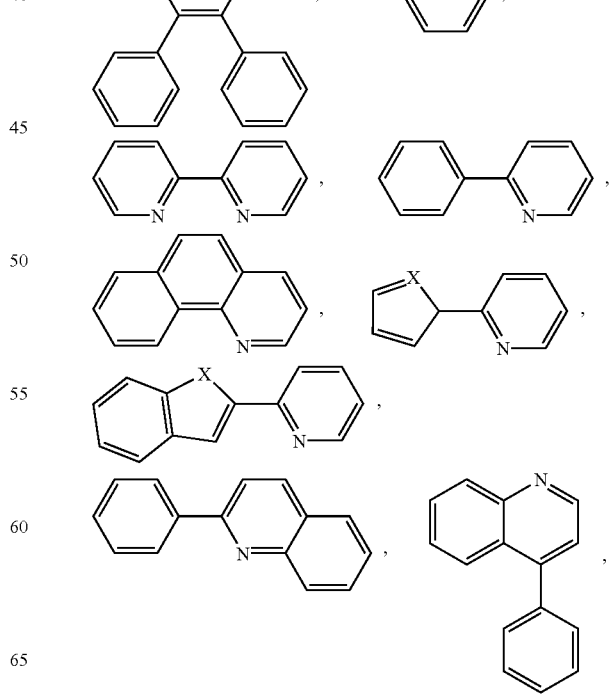

-continued
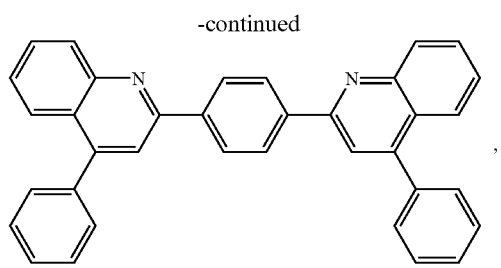
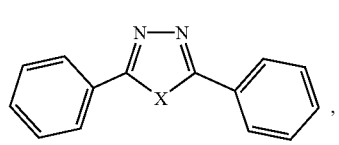
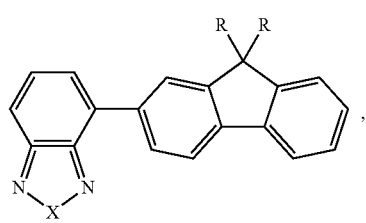
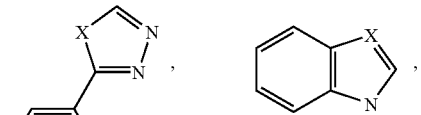
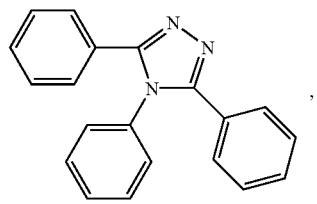
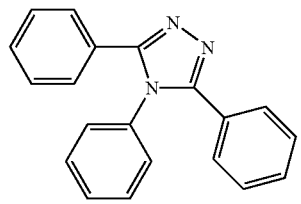
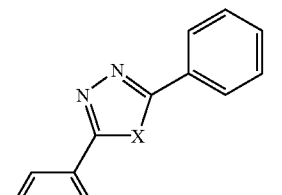
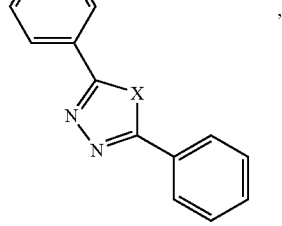
-continued
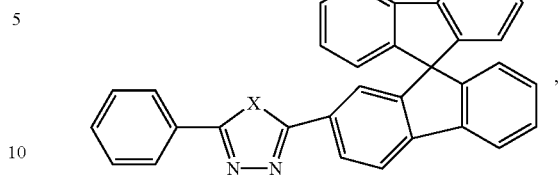
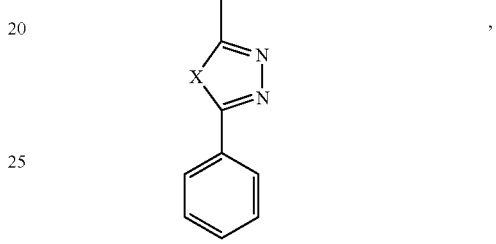
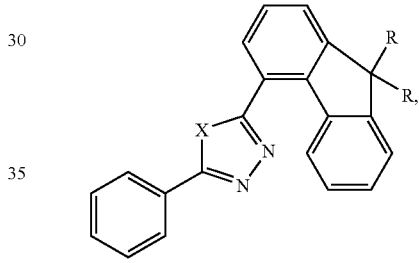
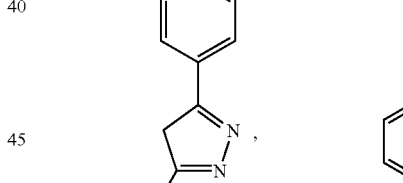
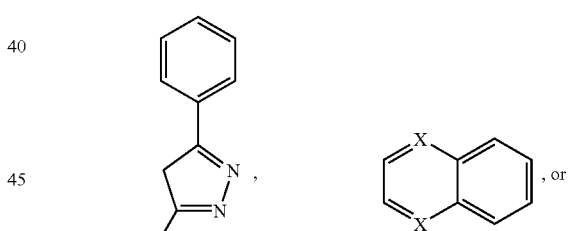
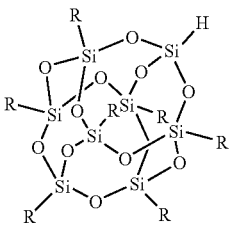
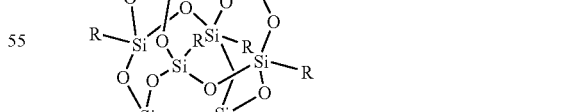
that is unsubstituted or substituted with one or more substituents selected from alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof;

n is an integer of 2 to 4, wherein the first end capping groups are identical;

each R is independently an alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;

each $R^1$ is independently hydrogen, alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;

each X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof;

A is C, Si, Ge, Pb, or Sn;

Z is NH or $CH_2$;

t is an integer of 0 to 4; and (b) a second compound that is selected from a charge transporting material, a charge blocking material, a light emitting material, a color conversion material, or a combination thereof, said second compound having an aromatic radical that comprises the first aromatic core of the first compound, wherein the aromatic radical of the second compound can be unsubstituted, substituted with a substituent of a same type that is present on the first aromatic core of the first compound, or substituted with a substituent that is absent on the first aromatic core of the first compound;

a second end capping group that comprises the first end capping group of the first compound, wherein the second end capping group can be unsubstituted, substituted with a substituent of a same, type that is present on the first end capping group, or substituted with a substituent that is absent on the first end capping group;

a divalent radical that comprises a divalent radical of the first end capping group of the first compound, wherein the divalent radical in the second compound can be unsubstituted, substituted with a substituent of a same type that is present on the first end capping group, or substituted with a substituent that is absent on the first end capping group; or a combination thereof, wherein the composition is amorphous and solution processible.

Another aspect of the invention provides a composition that includes (a) a first compound of Formula I

that is a charge transporting molecule, a charge blocking molecule, a light emitting molecule, a color conversion molecule, or a combination thereof, wherein $Ar^1$ is a first aromatic core and is a divalent, trivalent, or tetravalent radical of

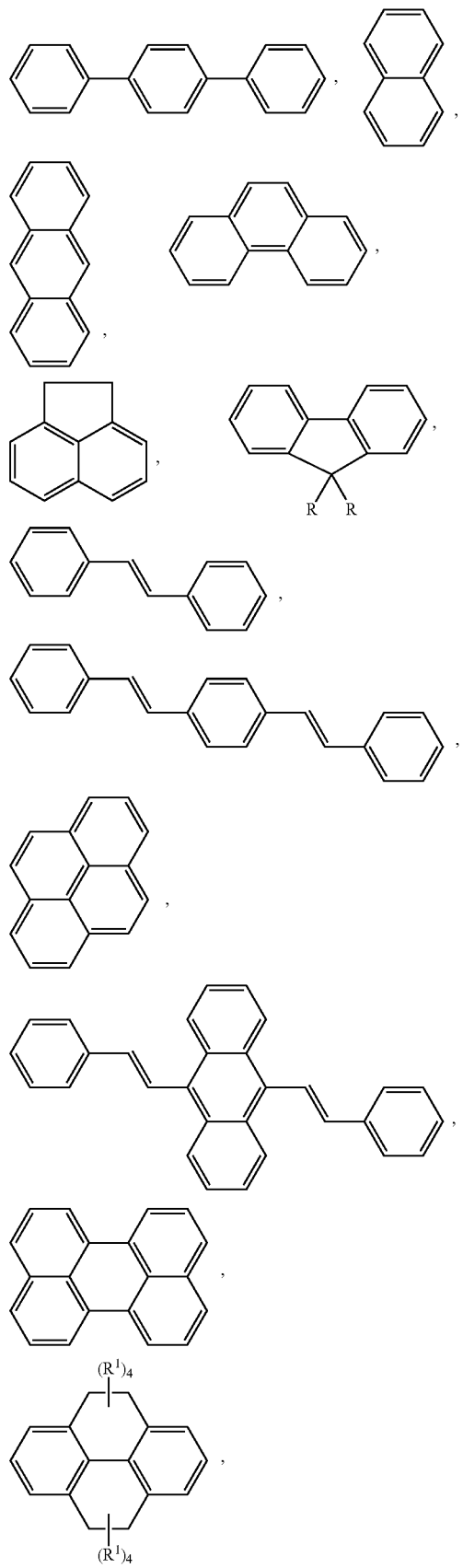

-continued
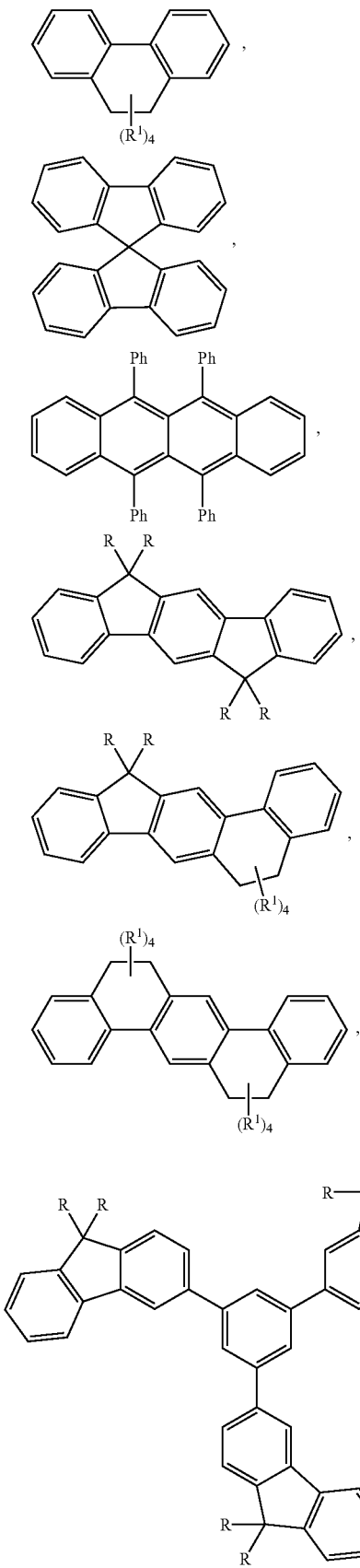
-continued
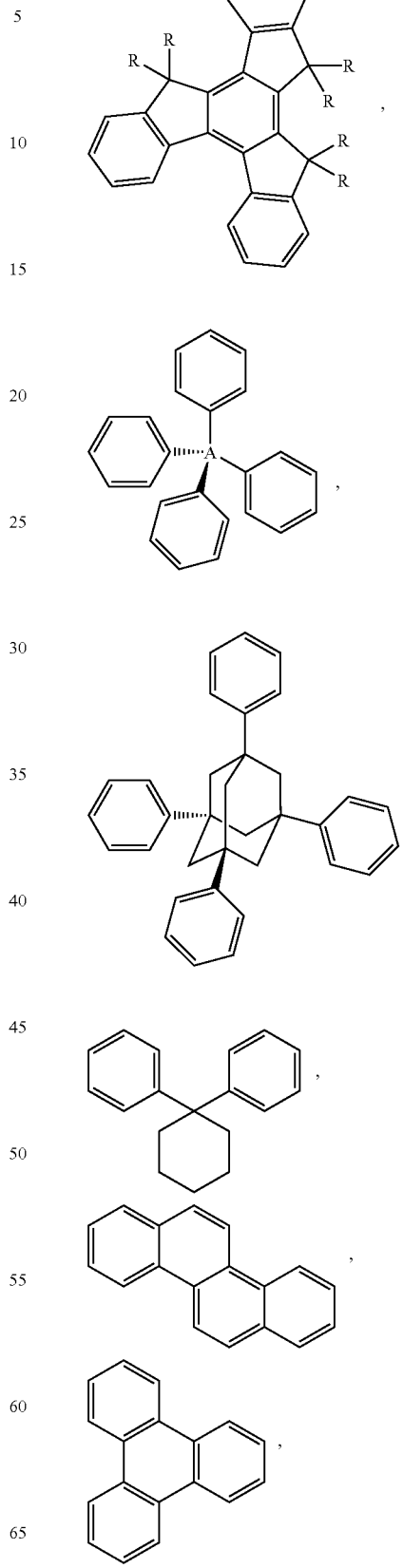

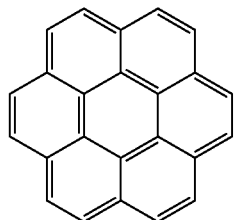
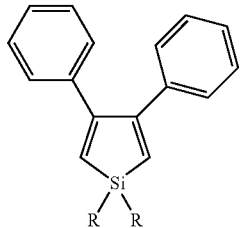
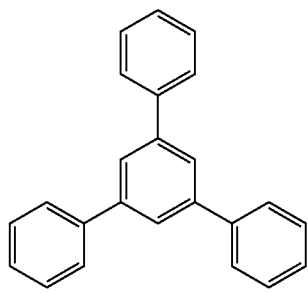
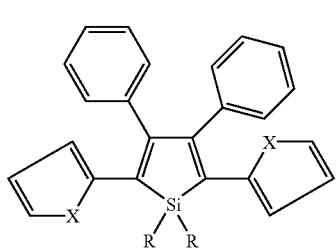
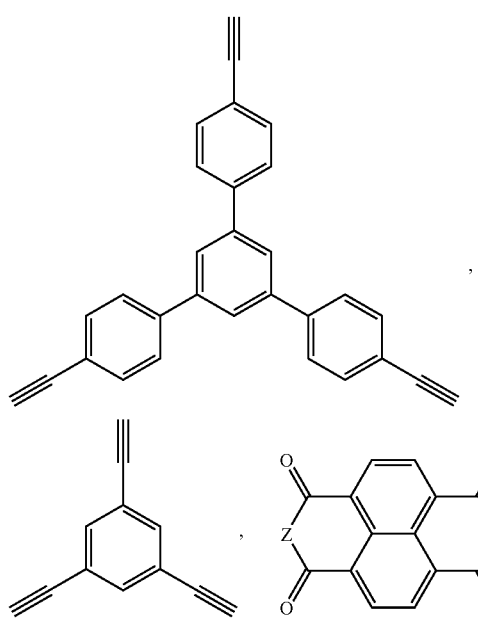
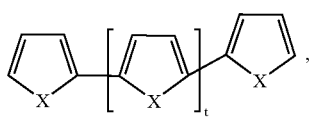
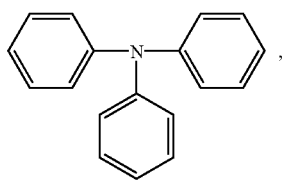
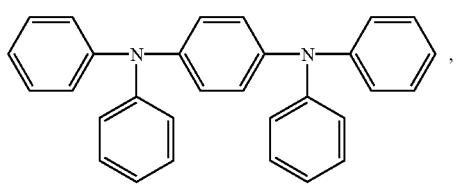
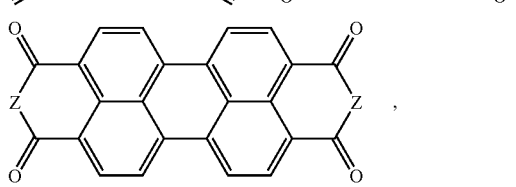
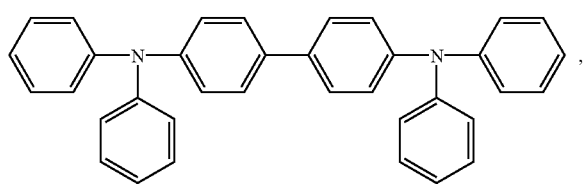
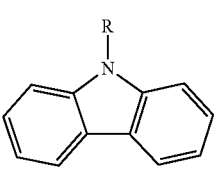
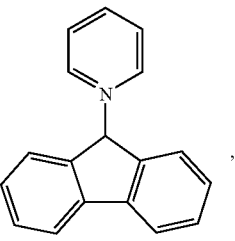

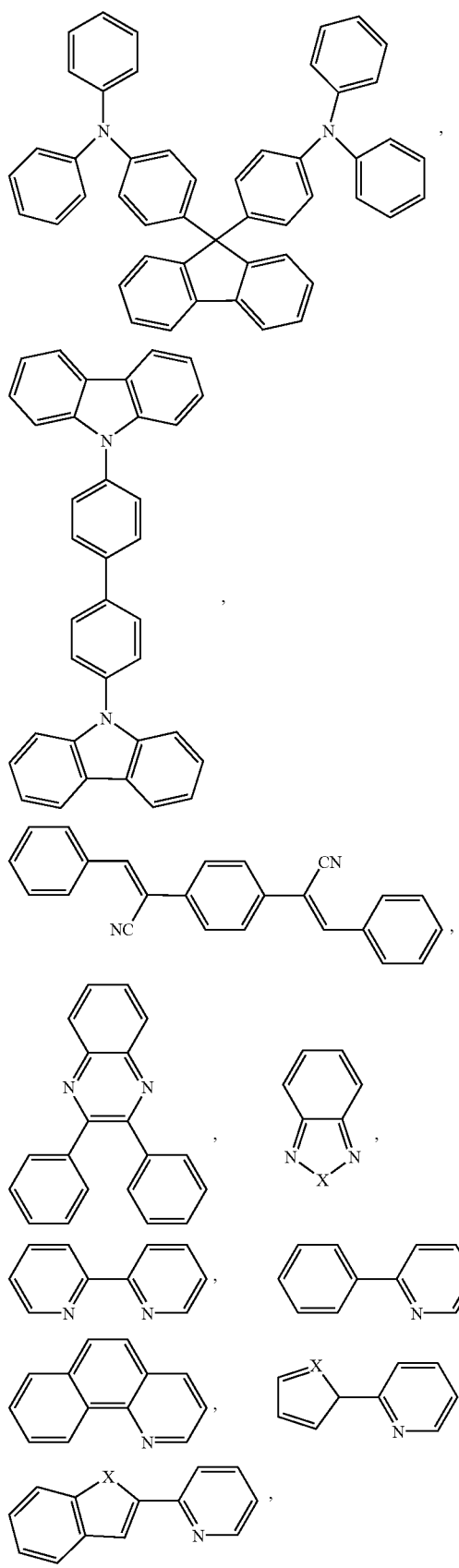
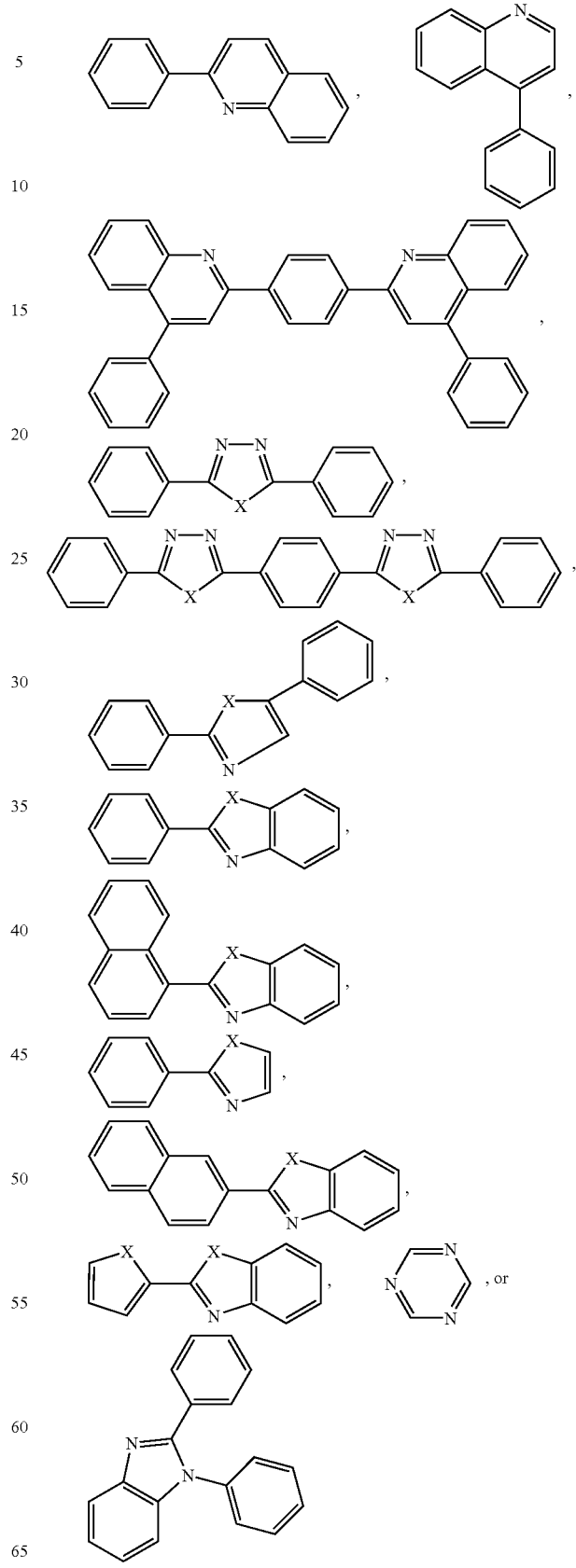

that is unsubstituted or substituted with one or more substituents selected from alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof;

EC is a first end capping group that is a $C_{6-60}$ carbocyclic aryl, a $C_{3-60}$ heteroaryl, a $C_{12-60}$ tertiary aromatic amino aryl, or a monovalent radical of a silsesquioxane that is unsubstituted or substituted with one or more substituents selected from alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof;

n is an integer of 2 to 4, wherein the first end capping groups are identical;

each R is independently an alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;

each $R^1$ is independently a hydrogen, alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;

X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof;

A is C, Si, Ge, Pb, or Sn;

Z is N or CH;

t is an integer of 0 to 4; and (b) a second compound that is selected from a charge transporting material, a charge blocking material, a light emitting material, a color conversion material, or a combination thereof, said second compound having an aromatic radical that comprises the first aromatic core of the first compound, wherein the aromatic radical of the second compound can be unsubstituted, substituted with a substituent of a same type that is present on the first aromatic core of the first compound, or substituted with a substituent that is absent on the first aromatic core of the first compound;

a second end capping group that comprises the first end capping group of the first compound, wherein the second end capping group can be unsubstituted, substituted with a substituent of a same type that is present on the first end capping group, or substituted with a substituent that is absent on the first end capping group;

a divalent radical that comprises a divalent radical of the first end capping group of the first compound, wherein the divalent radical in the second compound can be unsubstituted, substituted with a substituent of a same type that is present on the first end capping group, or substituted with a substituent that is absent on the first end capping group;

or a combination thereof, wherein the composition is amorphous and solution processible.

An additional aspect of the invention provides a composition that includes (a) a first compound of Formula II EC—$Ar^1$—EC    II that is a charge transporting molecule, a charge blocking molecule, a light emitting molecule, a color conversion molecule, or a combination thereof, wherein $Ar^1$ is a first aromatic core and is a divalent radical selected from

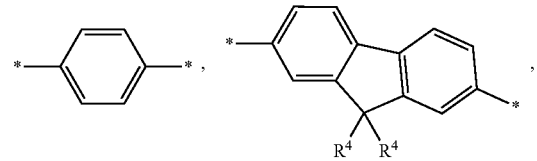

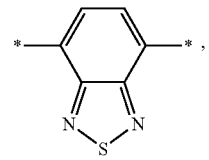

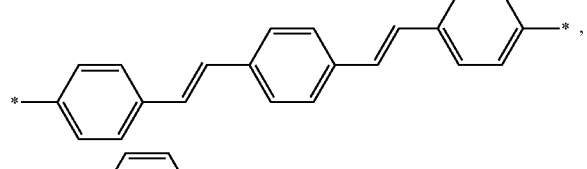

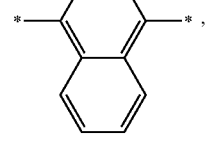

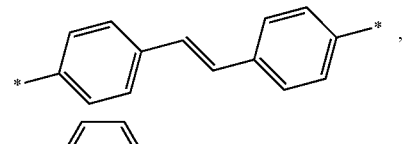

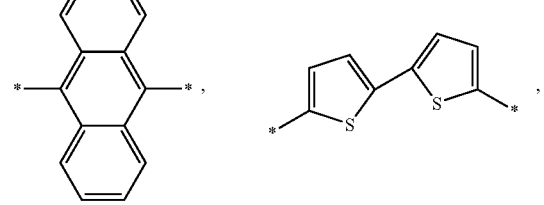

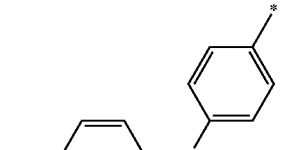

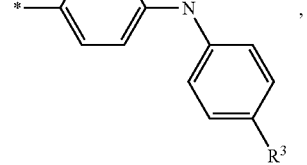

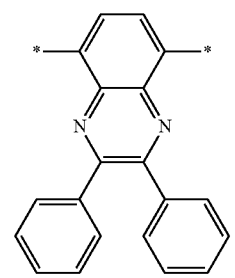

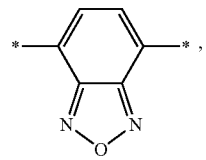

-continued
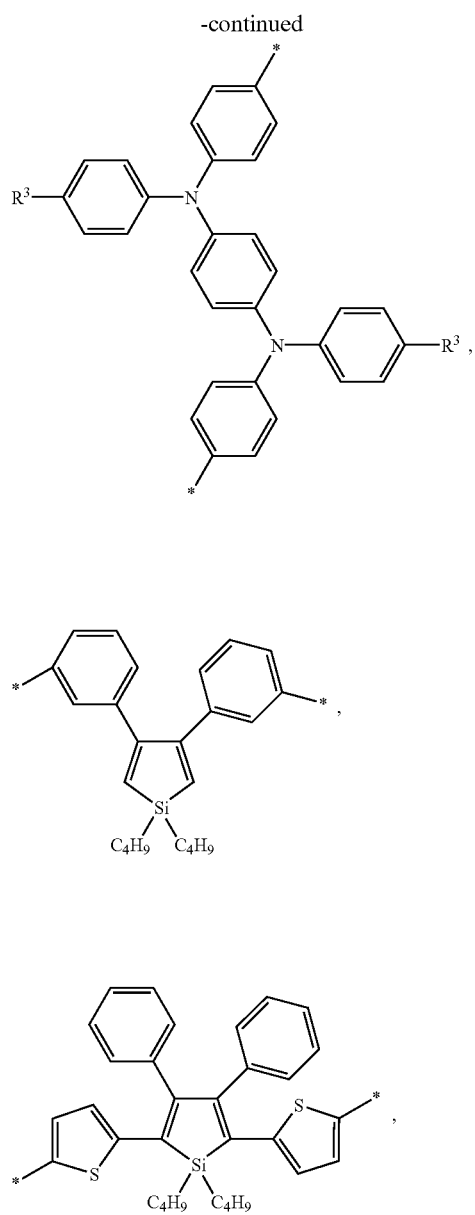
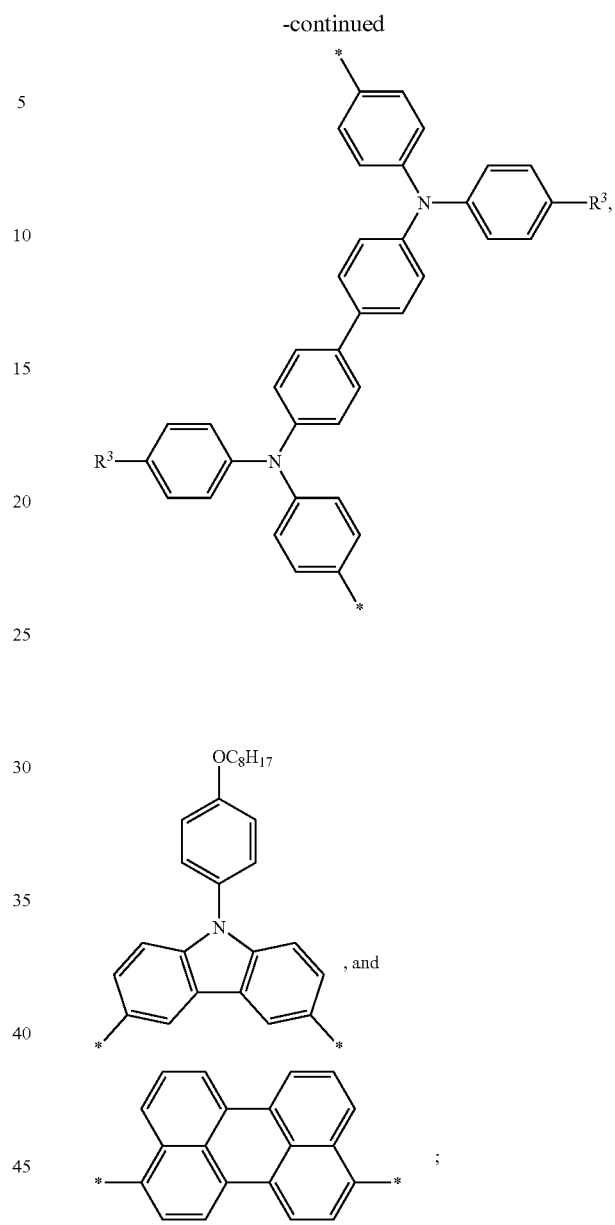
EC are two identical first end capping groups selected from -continued

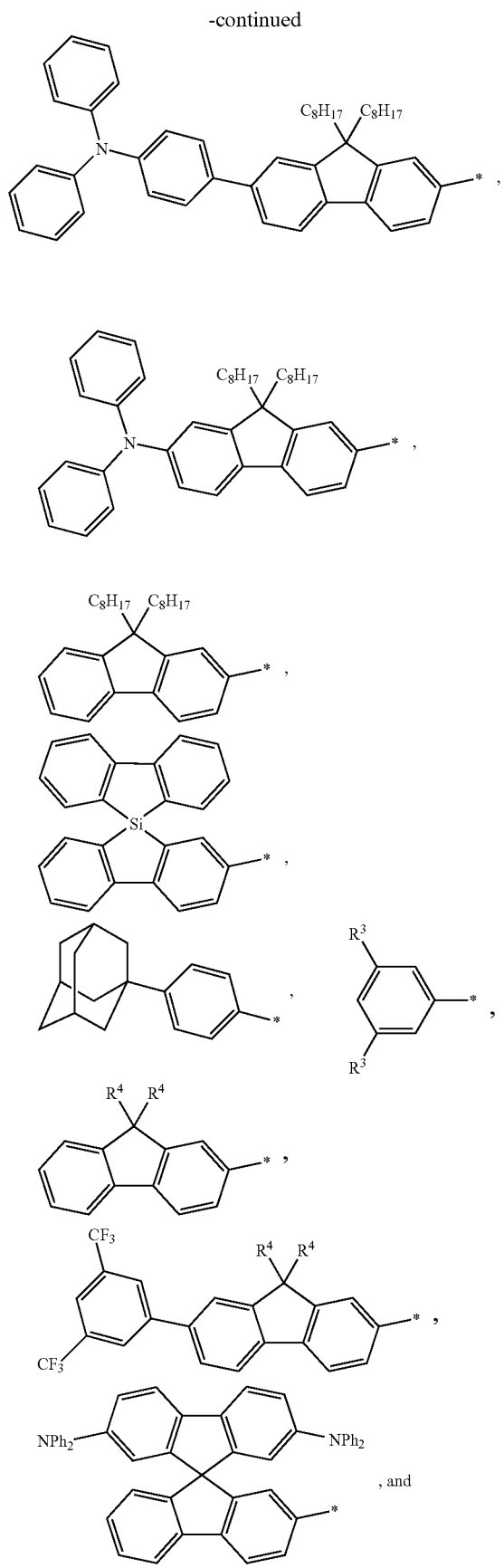

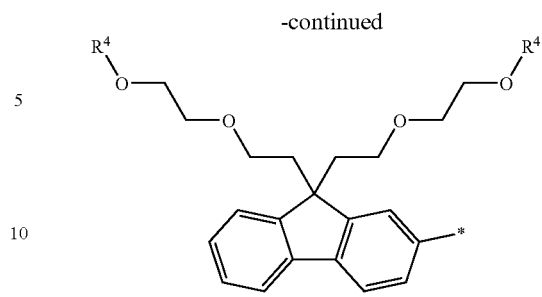

wherein
each Ph is phenyl; and
each $R^3$ is independently hydrogen, $C_{1-30}$ alkyl, $C_{6-20}$ aryl, $C_{3-20}$ heteroaryl, or $C_{1-30}$ heteroalkyl;
each $R^4$ is independently $C_{1-30}$ alkyl, $C_{6-20}$ aryl, $C_{3-20}$ heteroaryl, or $C_{1-30}$ heteroalkyl;

(b) a second compound that is selected from a charge transporting material, a charge blocking material, a light emitting material, a color conversion material, or a combination thereof, said second compound having an aromatic radical that comprises the first aromatic core of the first compound, wherein the aromatic radical of the second compound can be unsubstituted, substituted with a substituent of a same type that is present on the first aromatic core of the first compound, or substituted with a substituent that is absent on the first aromatic core of the first compound;

a second end capping group that comprises the first end capping group of the first compound, wherein the second end capping group can be unsubstituted, substituted with a substituent of a same type that is present on the first end capping group, or substituted with a substituent that is absent on the first end capping group;

a divalent radical that comprises a divalent radical of the first end capping group of the first compound, wherein the divalent radical in the second compound can be unsubstituted, substituted with a substituent of a same type that is present on the first end capping group, or substituted with a substituent that is absent on the first end capping group; or a combination thereof, wherein the composition is amorphous and solution processible.

Another aspect of the invention provides an organic electronic device that includes a composition of the invention. In some embodiments, the organic electronic device is an organic electroluminescent device.

Additionally, the invention provides a method of making an organic electroluminescent device. The method includes (1) preparing a donor sheet that includes a transfer layer containing a composition of the invention and (2) transferring the transfer layer to a surface of a receptor substrate.

The above summary of the present invention is not intended to describe each disclosed embodiment or every implementation of the present invention. The Figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
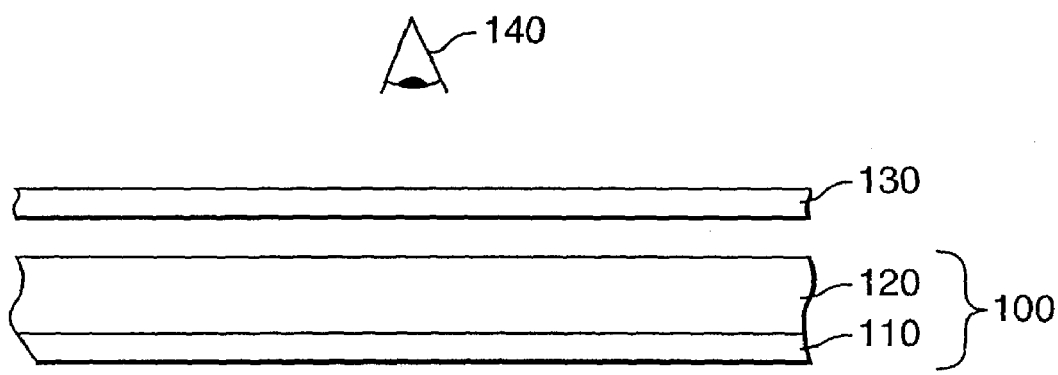
FIG. 1 is a schematic side view of an organic electroluminescent display construction.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Definitions

As used herein, the terms "a", "an", and "the" are used interchangeably with "at least one" to mean one or more of the elements being described.

As used herein, the term "active" when used to refer to a compound means that the compound can transport holes, transport electrons, participate in electron/hole recombination, emit light, or a combination thereof.

As used herein, the term "amorphous" refers to a compound or composition that is not crystalline and that does not crystallize when removed from a solvent.

As used herein, the term "alkyl" includes both straight-chained, branched, and cyclic alkyl groups that are unsubstituted or substituted. The alkyl group typically has 1 to about 30 carbon atoms. In some embodiments, the alkyl group contains 1 to about 20 or 1 to about 10 carbon atoms. Examples of alkyl groups include, but are not limited to, methyl, ethyl, n-propyl, n-butyl, n-pentyl, tert-butyl, isopropyl, isobutyl, n-octyl, n-heptyl, and ethylhexyl.

As used herein, the term "alkoxy" refers to a group having an oxygen atom attached to an alkyl group. The alkoxy group typically has 1 to about 30 carbon atoms. In some embodiments, the alkoxy group contains 1 to about 20 or 1 to about 10 carbon atoms. Examples include methoxy, ethoxy, propoxy, butoxy, and the like. An alkoxy is a subset of a heteroalkyl group. Alkoxy groups can be unsubstituted or substituted.

As used herein, the term "alkenyl" refers to a monovalent radical of a straight-chained, branched, or cyclic alkene having one or more aliphatic carbon-carbon double bond and includes both unsubstituted and substituted alkenyl groups. The alkenyl groups typically include 2 to about 30 carbon atoms. In some embodiments, the alkenyl groups contain 2 to about 20 or 2 to about 10 carbon atoms. Examples of alkenyl groups include, but are not limited to, n-oct-3-enyl and n-hept-6-enyl. The alkenyl groups can have alternating double and single carbon-carbon bonds. For example, the alkenyl groups can be a diene or a triene with a single carbon-carbon bond between each carbon-carbon double bond.

As used herein, the term "alkylene" includes both straight-chained, branched, and cyclic divalent hydrocarbon radicals and includes both unsubstituted and substituted alkylene groups. The alkylene groups are typically include up to about 30 carbon atoms. In some embodiments, the alkylene groups contain up to about 20 or up to about 10 carbon atoms. Examples of "alkylene" as used herein include, but are not limited to, methylene, ethylene, propylene, butylene, and isopropylene, and the like.

As used herein, the term "aromatic" refers to both a carbocyclic aromatic compound or group and a heteroaromatic compound or group. A carbocyclic aromatic compound is a compound that contains only carbon atoms in the aromatic ring structure. A heteroaromatic compound is a compound that contains at least one heteroatom selected from S, O, N and P in ring in the aromatic ring structure.

As used herein, the term "aryl" refers to monovalent unsaturated aromatic carbocyclic radicals having one to ten rings, multiple fused rings, or combinations thereof. In some embodiments, the aryl group has up to 10 rings, up to 8 rings, up to 6 rings, up to 4 rings, up to 3 rings, up to 2 rings, or one aromatic ring. The aryl group can contain, for example, up to about 60, up to about 50, up to about 40, up to about 30, or up to about 20 carbon atoms. Examples of aryl groups include, but are not limited to, phenyl, biphenyl, terphenyl, anthryl, naphthyl, acenaphthyl, phenanthryl, dihydrophenathrenyl, anthracenyl, fluorenyl, 9-silafluorenyl, tetrahydropyrenyl, perylenyl, spirobisfluorenyl, fluoranthenyl, pyrenyl, rubrenyl, chrysenyl, dihydropyrenyl, and tetrahydropyrenyl.

As used herein, the term "arylene" refers to divalent unsaturated aromatic carbocyclic radicals having one to ten rings, multiple fused rings, or combinations thereof. In some embodiments, the arylene group has up to 8 rings, up to 6 rings, up to 4 rings, up to 3 rings, up to 2 rings, or one aromatic ring. In some examples, the arylene group contains up to 60 carbon atoms, up to 50 carbon atoms, up to 40 carbon atoms, up to 30 carbon atoms, or up to 20 carbon atoms. Examples of arylene groups include, but are not limited to, divalent radicals of benzene, naphthalene, acenaphthene, phenanthrene, anthracene, fluorene, 9-silafluorene, fluoranthene, benzopyrene, aromatic corene, dihyrophenanthrene, tetrahydropyrene, perylene, spirobisfluorene, pyrene, rubrene, and chrysene. Specific examples of arylene groups include benzene-1,2-diyl, benzene-1,3-diyl, benzene-1,4-diyl, naphthalene-1,8-diyl, naphthalene-2,7-diyl, naphthalene-2,6-diyl, naphthalene-1,4-diyl, naphthalene-1,5-diyl, anthracene-1,4-diyl, acenaphthene-diyl, phenanthren-3,8-diyl, 5,6-dihydrophenathren-3,8-diyl, 4,5,9,10-tetrahydropyren-2,7-diyl, pyren-2,7-diyl, fluoren-2,7-diyl, 9-silafluoren-2,7-diyl, anthracene-9,10-diyl, perylene-3,9-diyl, perylene-3,10-diyl, spirobisfluorene-diyl, 5,6,12,13-tetrahydrodibenzo [a,h] anthracene-3,10-diyl, fluoranthene-diyl, rubrene-diyl, chrysene-diyl, benzo[g,h,i]perylene-diyl, and the like.

As used herein, the term "aryloxy" refers to a group having an oxygen atom attached to an aryl group. An example includes, but is not limited to, phenoxy.

An asterisk (—*) in any formula infra indicates the location of a bond to another group in a molecule.

As used herein, the term "carbocyclic" refers to a ring formed of carbon atoms. There are no heteroatoms in the ring structure.

As used herein, the term "conjugated" refers to unsaturated compounds having at least two carbon-carbon double or triple bonds with alternating carbon-carbon single bonds and carbon-carbon double or triple bonds. Likewise, the term "unconjugated" refers to unsaturated compounds that are not conjugated. For example, an unconjugated aromatic group can have two or more carbon-carbon single bonds interrupting alternating carbon-carbon single bonds and carbon-carbon double or triple bonds.

As used herein, "electrochemically stable" is meant stable to electrochemical degradation such that any oxidation and/or reduction reactions entered into are reversible.

As used herein, the term "electroactive" refers to a compound that transports holes, transports electrons, or participates in an electron/hole recombination.

As used herein, the term "ester" refers to a compound having a COO-alkyl group where alkyl is defined above. The ester typically has 2 to 30, 2 to 20, or 2 to 10 carbon atoms.

As used herein, the term "fluoroalkyl" refers to an alkyl group that has at least one hydrogen atom replaced with a fluorine atom.

As used herein, the term "heteroalkyl" includes both straight-chained, branched, and cyclic alkyl groups with one or more heteroatoms independently selected from S, O, N, P, or Si replacing a carbon atom. The heteroalkyl group typically contains 1 to about 30 carbon atoms and can have up to 10 heteroatoms. In some embodiments, the heteroalkyl group contains 1 to about 20 or 1 to about 10 carbon atoms. An alkoxy group is a subset of a heteroalkyl group. Examples of heteroalkyl groups include, but are not limited to, methoxy, ethoxy, propoxy, 3,6-dioxaheptyl, 3-(trimethylsilyl)-propyl, poly(oxyalkylene) groups having a segment of formula $-O(C_mH_{2m}O)_y-$ where m is an integer of 1 to 6 and y is an integer of 2 to 20, and poly(dialkylsiloxane) groups having a segment of formula $-[Si(C_wH_{2w+1})_2O]_y-$ where w is an integer of 1 to 10 and y is an integer of 2 to 20. Heteroalkyl groups can be unsubstituted or substituted.

As used herein, the term "heteroaryl" refers to a monovalent radical of a five to seven member aromatic ring that includes one or more heteroatoms independently selected from S, O, N and P in the ring. Such a heteroaryl ring can be fused to one or more rings and can contain one to about 10 other rings selected from another heterocyclic ring(s), heteroaryl ring(s), aryl ring(s), cycloalkenyl ring(s), cycloalkyl rings, and combinations thereof. In some embodiments, the heteroaryl ring has to up to 8 other rings, up to 6 other rings, up to 4 other rings, up to 3 other rings, up to 2 other rings, or one other ring. The heteroaryl typically contains up to about 50 carbon atoms. In some embodiments, the heteroaryl contains up to about 40 carbon atoms, up to about 30 carbon atoms, or up to about 20 carbon atoms. Examples of heteroaryl groups include, but are not limited to, furanyl, thiophenyl, pyrrolyl, imidazolyl, pyrazolyl, triazolyl, tetrazolyl, thiazolyl, oxazolyl, isoxazolyl, oxadiazolyl, thiadiazolyl, isothiazolyl, pyridinyl, pyridazinyl, pyrazinyl, pyrimidinyl, quinolinyl, isoquinolinyl, benzofuranyl, benzothiophenyl, indolyl, carbazoyl, benzoxazolyl, benzothiazolyl, benzimidazolyl, cinnolinyl, quinazolinyl, quinoxalinyl, phthalazinyl, benzothiadiazolyl, benzotriazinyl, phenazinyl, phenanthridinyl, acridinyl, and indazolyl, siloles, and the like.

As used herein, "heteroaryls having a —C=N— unit" is a subset of the heteroaryls and refers to heteroaryls that have a —C=N— unit in at least one heteroaromatic ring. Examples of suitable groups include, but are not limited to, oxadiazolyls, N-substituted-triazolyls, N-substituted imidazolyls, N-substituted pyrazolyls, oxazolyls, isooxazolyls, thiazolyls, isothiazolyls, pyridinyls, pyridazinyls, pyrimidinyls, pyrazinyls, triazinyls, tetrazenyls, benzoxazolyls, benzothiazolyls, benzothiadiazolyls, quinolinyls, isoquinolinyls, cinnolinyls, quinazolinyls, quinoxalinyls, phthalazinyls, benzotriazinyls, phenazinyls, phenanthridinyls, acridinyls, and the like.

As used herein, "heteroaryls that are electron rich" is a subset of the heteroaryls and refers to heteroaryls that can donate electron density from the heteroatom into the pi bonding system. Examples include, but are not limited to, monovalent radicals of diarylsilanolyls, thiophenyls, bithiophenyls, furanyls, N-alkyl carbazolyl, N-aryl carbazolyl, N-alkyl pyrrolyl, N-aryl pyrrolyl, and the like.

As used herein, the term "heteroarylene" refers to an aromatic divalent radical of a five to seven member aromatic ring that includes one or more heteroatoms independently selected from S, O, N, and P. Such a heteroaromatic ring can be fused to one or more rings and can contain 1 to about 10 other rings selected from another heterocyclic ring(s), heteroaryl ring(s), aryl ring(s), cycloalkenyl ring(s), cycloalkyl rings, and combinations thereof. In some embodiments, the heteroaromatic ring is fused to up to 8 other rings, up to 4 other rings, up to 3 other rings, up to 2 other rings, or one other ring. The heteroarylene typically contains up to about 50 carbon atoms. In some embodiments, the heteroarylene contains up to about 40 carbon atoms, up to about 30 carbon atoms, or up to about 20 carbon atoms. Examples of heteroarylene groups include, but are not limited to, divalent radicals of furan, thiophene, pyrrole, imidazole, pyrazole, triazole, tetrazole, thiazole, oxazole, isoxazole, oxadiazole, thiadiazole, isothiazole, pyridine, pyridazine, pyrazine, pyrimidine, quinoline, isoquinoline, benzofuran, benzothiophene, indole, carbazole, benzoaxazole, benzothizole, benzimidiazole, cinnoline, quinazoline, quinoxaline, phthalazine, benzothiadiazole, benzotriazine, phenazine, phenanthridine, acridine, indazole, and silones. Specific examples of heteroarylenes include, but are not limited to, furan-2,5-diyl, thiophene-2,4-diyl, 1,3,4-oxadiazole-2,5-diyl, 1,3,4-thiadiazole-2,5-diyl, 1,3-thiazole-2,4-diyl, benzo[1,2,5]thiadiazole-4,7-diyl, 1,3-thiazole-2,5-diyl, pyridine-2,4-diyl, pyridine-2,3-diyl, pyridine-2,5-diyl, pyrimidine-2,4-diyl, quinoline-2,3-diyl, 1,1-dialkyl-1H-silole-2,5-diyl, and the like.

As used herein, "heteroarylenes having —C=N— units" is a subset of heteroarylenes and refers to heteroarylenes having a —C=N— unit in at least one heteroaromatic ring. Examples of heteroarylenes having —C=N— units include, but are not limited to, divalent radicals of oxadiazoles, N-substituted-triazoles, N-substituted imidazoles, N-substituted pyrazoles, oxazoles, isoxazole, thiazoles, isothiazoles, pyridines, pyridazines, pyrimidines, pyrazines, triazines, tetrazenes, benzoxazoles, benzothiazoles, benzothiadiazoles, quinolines, isoquinolines, cinnolines, quinazolines, quinoxalines, phthalazines, benzotriazines, phenazines, phenanthridines, acridines, and the like.

As used herein, "heteroarylenes that are electron rich" is a subset of heteroarylenes and refers to heteroarylenes that can donate electron density from the heteroatom into a pi bonding system. Suitable examples include divalent radicals of diarylsilanoles, thiophenes, bithiophenes, furans, N-alkyl carbazoles, N-aryl carbazoles, N-alkyl pyrroles, N-aryl pyrroles, and the like.

As used herein, the term "inactive" when used to refer to a compound means that the compound is not electroactive, not electroluminescent, or a combination thereof.

As used herein, the term "perfluoroalkyl" refers to an alkyl group that has all the hydrogen atoms replace with fluorine atoms. A perfluoroalkyl is a subset of a fluoroalkyl.

As used herein, the term "silsesquioxane" refers to a compound that have 1.5 times as many oxygen atoms as silicon atoms (e.g., $SiO_{1.5}$). The compounds can has up to 20, up to 16, up to 8, or up to 4 Si atoms. The compounds can be bridged or unbridged. In some embodiments, the compound is bridged and contains 8 silicon atoms.

As used herein the term "solution processible" refers to a compound or composition that can be dissolved in a solution. In some embodiments, a compound or composition that is solution processible can be coated from a solution as a thin film. In other embodiments, a solution of the compound of composition can be applied to a substrate. For example, the solution can be printed or coated onto a substrate.

As used herein, the term "small molecule" refers to a compound that is non-polymeric (e.g., less than three repeating units when there are repeating units).

As used herein, the term "substituent" refers to a group selected from alkyl, alkenyl, alkoxy, aryl, aryloxy, heteroalkyl, fluoro, fluoroalkyl, perfluoroalkyl, diarylamino, cyano, nitro, ester, or combinations thereof. In some embodiments, the substituents are selected from $C_{1-30}$ alkyl, $C_{2-30}$ alkenyl, $C_{1-30}$ alkoxy, $C_{6-30}$ aryl, $C_{6-30}$ aryloxy, $C_{1-30}$ heteroalkyl, $C_{3-30}$ heteroaryl, fluoro, $C_{1-30}$ fluoroalkyl, and $C_{1-30}$ perfluoroalkyl, $C_{12-30}$ diarylamino, cyano, nitro, $C_{2-30}$ ester, or combinations thereof.

As used herein, the term "tertiary aromatic amine" refers to a class of molecular compounds having one or more tertiary nitrogen centers and each nitrogen center is bonded to three aromatic carbon centers. Examples of tertiary aromatic amines include diarylanilines; alkyl carbazole; aryl carbazole; and tetraaryldiamine such as, for example, N,N,N'N '-tetraarylbenzidines, N,N,N',N'tetraaryl-1,4-phenylenediamines, N,N,N'N'tetraryl-2,7-diaminofluorene derivatives such as those taught in patent applications EP 0 953 624 A1 and EP 0 879 868 A2, N,N'-bis(3-methylphenyl)-N,N'-bis(phenyl)benzidine (also known as TPD), N,N'-bis(1-naphthyl)-N,N'-bis(phenyl)benzidine (also known as NPB), 1,4-bis(carbazolyl)biphenyl (also known as CBP), and other tetraaryldiamine derivatives such as those described in B.E. Koene et al., Chem. Mater.,10, 2235-2250 (1998), U.S. Patent No. 5,792,557, U.S. Pat. No. 5,550,290 and patent application EP 0 891 121 Al; peraryltriamine derivatives such as those described in U.S. Pat. No. 6,074,734 and patent application EP 0 827 367 Al; starburst amine derivatives such as 4,4',4"-tris(N,N-diarylamino)triphenylamines and 1,3,5-tris(4-diarylaminophenyl)benzenes, 4,4',4"-tris(N,N-diphenylamino)triphenylamine (also known as TDATA), 4,4',4"-tris(N-3-methylphenyl-N-phenylamino)triphenylamine (also known as mTDATA); 1,3,5-Tris(4-diphenylaminophenyl)benzenes (TDAPBs); and other dendridic and spiro amine derivatives as taught in patent application EP 0 650 955 Al, Tokito et al., Polym. Prep. (Am. Chem. Soc. Div. Polym. Chem.) 38(1), 388-389 (1997), Tanake et al., Chem. Commun., 2175-2176 (1996), and Tokito et al., Appl. Phys. Lett., 70(15), 1929-1931 (1997).

As used herein, the term "tertiary aromatic amino aryl" refers to a monovalent aromatic ring radical of a tertiary aromatic amine as defined above.

As used herein, the term "tertiary aromatic amino arylene" refers to a divalent unsaturated aromatic carbocyclic radical of a tertiary aromatic amine as defined above.

The present invention contemplates compositions and methods for making organic electronic devices and displays that include the compositions. Examples of organic electronic devices that can be made include organic transistors and diodes, photovoltaic devices, organic electroluminescent (OEL) devices such as organic light emitting diodes (OLEDs), and the like. The compositions can be used in thermal patterning methods to prepare organic electronic devices. The compositions can also be used in non-thermal printing, patterning, and transfer methods of preparing organic electronic devices such as, for example, inkjet printing, screen printing, and photolithographic patterning.

Organic electroluminescent (OEL) display or device refers to an electroluminescent display or devices that includes an organic emissive material, whether that emissive material includes a small molecule (SM) emitter, a SM doped polymer, a light emitting polymer (LEP), a doped LEP, a blended LEP, or another organic emissive material whether provided alone or in combination with any other organic or inorganic materials that are functional or non-functional in the OEL display or devices R. H. Friend, et al. ("Electroluminescence in Conjugated Polymers," Nature, 121, 397 (1999)), incorporated herein by reference, describes one mechanism of electroluminescence as including the "injection of electrons from one electrode and holes from the other, the capture of oppositely charged carriers (so-called recombination), and the radiative decay of the excited electron-hole state (exciton) produced by this recombination process."

Materials for OEL devices can be small molecule (SM) or polymeric in nature. SM materials include charge transporting, charge blocking, color converting, semiconducting, and electroluminescent organic and organometallic compounds. Generally, SM materials can be vacuum deposited or evaporated to form thin layers in: a device. In practice, multiple layers of SMs are typically used to produce efficient OELs since a given material generally does not have both the desired charge transport and electroluminescent properties.

LEP materials are typically conjugated polymeric or oligomeric molecules that preferably have sufficient film-forming properties for solution processing. Conventionally, LEP materials are utilized by casting a solvent solution of the LEP material on a substrate, and evaporating the solvent, thereby leaving a polymeric film. Other methods for forming LEP films include ink jetting and extrusion coating. Alternatively, LEPs can be formed in situ on a substrate by reaction of precursor species. Efficient LEP lamps have been constructed with one, two, or more organic layers.

As an example of a device structure, FIG. 1 illustrates an OEL display or device 100 that includes a device layer 110 and a substrate 120. Any other suitable display component can also be included with display 100. Optionally, additional optical elements or other devices suitable for use with electronic displays, devices, or lamps can be provided between display 100 and viewer position 140 as indicated by optional element 130.

In some embodiments like the one shown, device layer 110 includes one or more OEL devices that emit light through the substrate toward a viewer position 140. The viewer position 140 is used generically to indicate an intended destination for the emitted light whether it be an actual human observer, a screen, an optical component, an electronic device, or the like. In other embodiments (not shown), device layer 110 is positioned between substrate 120 and the viewer position 140. The device configuration shown in FIG. 1 (termed "bottom emitting") may be used when substrate 120 is transmissive to light emitted by device layer 110 and when a transparent conductive electrode is disposed in the device between the emissive layer of the device and the substrate. The inverted configuration (termed "top emitting") may be used when substrate 120 does or does not transmit the light emitted by the device layer and the electrode disposed between the substrate and the light emitting layer of the device does not transmit the light emitted by the device.

Device layer 110 can include one or more OEL devices arranged in any suitable manner. For example, in lamp applications (e.g., backlights for liquid crystal display (LCD) modules), device layer 110 might constitute a single OEL device that spans an entire intended backlight area. Alternatively, in other lamp applications, device layer 110 might constitute a plurality of closely spaced devices that can be contemporaneously activated. For example, relatively small and closely spaced red, green, and blue light emitters can be patterned between common electrodes so that device layer 110 appears to emit white light when the emitters are activated. Other arrangements for backlight applications are also contemplated.

In direct view or other display applications, it may be desirable for device layer 110 to include a plurality of independently addressable OEL devices that emit the same or different colors. Each device might represent a separate pixel or a separate sub-pixel of a pixilated display (e.g., high resolution display), a separate segment or sub-segment of a segmented display (e.g., low information content display), or a separate icon, portion of an icon, or lamp for an icon (e.g., indicator applications).

In at least some instances, an OEL device includes a thin layer, or layers, of one or more suitable organic materials sandwiched between a cathode and an anode. When activated, electrons are injected into the organic layer(s) from the cathode and holes are injected into the organic layer(s) from the anode. As the injected charges migrate towards the oppositely charged electrodes, they may recombine to form electron-hole pairs that are typically referred to as excitons. The region of the device in which the excitons are generally formed can be referred to as the recombination zone. These excitons, or excited state species, can emit energy in the form of light as they decay back to a ground state.

Other layers can also be present in OEL devices such as hole transport layers, electron transport layers, hole injection layer, electron injection layers, hole blocking layers, electron blocking layers, buffer layers, and the like. In addition, photoluminescent materials can be present in the electroluminescent or other layers in OEL devices, for example, to convert the color of light emitted by the electroluminescent material to another color. These and other such layers and materials can be used to alter or tune the electronic properties and behavior of the layered OEL device, for example to achieve a desired current/voltage response, a desired device efficiency, a desired color, a desired brightness, and the like.

FIGS. 4A to 4D illustrate examples of different OEL device configurations. Each configuration includes a substrate 250, an anode 252, a cathode 254, and a light emitting layer 256. The configurations of FIGS. 4C and 4D also include a hole transport layer 258 and the configurations of FIGS. 4B and 4D include an electron transport layer 260. These layers conduct holes from the anode or electrons from the cathode, respectively.

The anode 252 and cathode 254 are typically formed using conducting materials such as metals, alloys, metallic compounds, metal oxides, conductive ceramics, conductive dispersions, and conductive polymers, including, for example, gold, platinum, palladium, aluminum, calcium, titanium, titanium nitride, indium tin oxide (ITO), fluorine tin oxide (FTO), and polyaniline. The anode 252 and the cathode 254 can be single layers of conducting materials or they can include multiple layers. For example, an anode or a cathode may include a layer of aluminum and a layer of gold, a layer of calcium and a layer of aluminum, a layer of aluminum and a layer of lithium fluoride, or a metal layer and a conductive organic layer.

The hole transport layer 258 facilitates the injection of holes from the anode into the device and their migration towards the recombination zone. The hole transport layer 258 can further act as a barrier for the passage of electrons to the anode 252. The hole transport layer 258 can include, for example, a diamine derivative, such as N,N'-bis(3-methylphenyl)-N,N'-bis(phenyl)benzidine (also known as TPD) or N,N'-bis(1-naphthyl)-N,N'-bis(phenyl)benzidine (NPB), or a triarylamine derivative, such as, 4,4',4"-Tris(N,N-diphenylamino)triphenylamine (TDATA) or 4,4',4"-Tris(N-3-methylphenyl-N-phenylamino)triphenylamine (mTDATA). Other examples include copper phthalocyanine (CuPC); 1,3,5-Tris(4-diphenylaminophenyl)benzenes (TDAPBs); and other compounds such as those described in H. Fujikawa, et al., *Synthetic Metals*, 91, 161 (1997) and J. V. Grazulevicius, P. Strohriegl, "Charge-Transporting Polymers and Molecular Glasses", *Handbook of Advanced Electronic and Photonic Materials and Devices*, H. S. Nalwa (ed.), 10, 233-274 (2001), both of which are incorporated herein by reference.

The electron transport layer 260 facilitates the injection of electrons and their migration towards the recombination zone. The electron transport layer 260 can further act as a barrier for the passage of holes to the cathode 254, if desired. As an example, the electron transport layer 260 can be formed using the organometallic compound tris(8-hydroxyquinolato) aluminum (Alq3). Other examples of electron transport materials include 1,3-bis [5-(4-(1,1-dimethylethyl)phenyl)-1,3,4-oxadiazol-2-yl]benzene, 2-(biphenyl-4-yl)-5-(4-(1,1-dimethylethyl)phenyl)-1,3,4-oxadiazole (tBuPBD) and other compounds described in C. H. Chen, et al., *Macromol. Symp.* 125, 1 (1997) and J. V. Grazulevicius, P. Strohriegl, "Charge-Transporting Polymers and Molecular Glasses", *Handbook of Advanced Electronic and Photonic Materials and Devices*, H. S. Nalwa (ed.), 10, 233 (2001), both of which are incorporated herein by reference.

Each configuration also includes a light emitting layer 256 that includes one or more light emitting polymers (LEP) or other light emitting molecules (e.g., small molecule (SM) light emitting compounds). A variety of light emitting materials including LEP and SM light emitters can be used. Examples of classes of suitable LEP materials include poly(phenylenevinylene)s (PPVs), poly-para-phenylenes (PPPs), polyfluorenes (PFs), polybisfluorenes, other LEP materials now known or later developed, and co-polymers or blends thereof. Suitable LEPs can also be molecularly doped, dispersed with fluorescent dyes or other photoluminescent (PL) materials, blended with active or non-active materials, dispersed with active or non-active materials, and the like. Examples of suitable LEP materials are described in Kraft, et al., *Angew. Chem. Int. Ed.*, 37, 402-428 (1998); U.S. Pat. Nos. 5,621,131; 5,708,130; 5,728,801; 5,840,217; 5,869,350; 5,900,327; 5,929,194; 6,132,641; and 6,169,163; and PCT Patent Application Publication No. 99/40655, all of which are incorporated herein by reference.

SM materials are generally non-polymer organic or organometallic molecular materials that can be used in OEL displays and devices as emitter materials, charge transport materials, as dopants in emitter layers (e.g., to control the emitted color) or charge transport layers, and the like. Commonly used SM materials include metal chelate compounds, such as tris(8-hydroxyquinoline) aluminum (Alq3), and N,N'-bis(3-methylphenyl)-N,N'-diphenylbenzidine (TPD). Other SM materials are disclosed in, for example, C. H. Chen, et al., *Macromol. Symp.* 125, 1 (1997), Japanese Laid Open Patent Application 2000-195673, U.S. Pat. Nos. 6,030,715, 6,150,043, and 6,242,115 and, PCT Patent Applications Publication Nos. WO 00/18851 (divalent lanthanide metal complexes), WO 00/70655 (cyclometallated iridium compounds and others), and WO 98/55561, all of which are incorporated herein by reference.

Light emitting material, such as one or more light emitting polymers (LEPs) or other light emitting molecules, can be solution coated as part of a coating composition that includes a material capable of forming a matrix (preferably, an amorphous, non-polymeric, organic matrix that resists crystallization). Preferably, the matrix can facilitate a reduction in cohesive strength, as compared to typical polymer transfer layers, during transfer from a donor medium to a receptor, as described below. The matrix-forming material may also act to compatibilize more than one electrically active material (e.g. two otherwise incompatible LEPs or an LEP and a phosphorescent emitter). LEPs will be used as an example for the description below, but it will be recognized that other light emitting, semiconducting, hole transporting, electron transporting, or otherwise electrically active molecules could be used in place of or in addition to one or more LEPs. In addition, laser thermal transfer will be used as an example of a method for forming light emitting and other layers, however, it will be recognized that other transfer, patterning, and printing techniques can be used, such as inkjet printing, screen printing, thermal head printing, and photolithographic patterning.

One aspect of the present invention provides compositions that include a first compound that is a small molecule in combination with at least one other material selected from a charge transporting material, a charge blocking material, a light emitting material, a color conversion material, or a combination thereof. The second compound can be a small molecule or a polymeric material and has at least some structural similarities to the first compound. The compositions can be used to prepare organic electronic devices such as organic electroluminescent devices. The compositions are amorphous and solution processable.

The first compound has an aromatic core and 2 to 4 identical end capping groups that are bonded to the aromatic core. As used herein, the term "aromatic core" refers that that portion of the compound that is not part of an end capping group. The aromatic core can include carbocyclic aromatic groups, heteroaromatic groups, or combinations thereof. The aromatic core can be fully conjugated or can have the conjugation interrupted in one or more locations (i.e., unconjugated).

The second compound has structural similarities to the first compound. The second compound can include a radical that includes the aromatic core of the first compound, a monovalent radical that includes the end capping groups of the first compound, or a group that is a divalent radical that includes a divalent radical of the end capping group of the first compound.

One aspect of the invention provides a composition that includes (a) a first compound of Formula I

   I that is a charge transporting molecule, a charge blocking molecule, a light emitting molecule, a color conversion molecule, or a combination thereof, wherein Ar$^1$ is a first aromatic core and is a divalent, trivalent, or tetravalent radical of

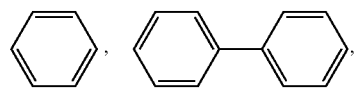

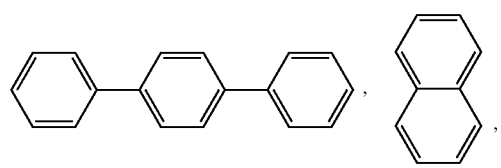

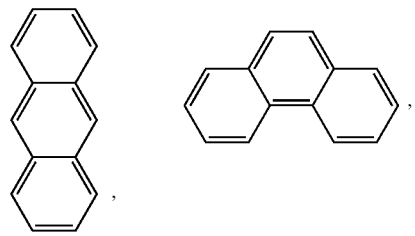

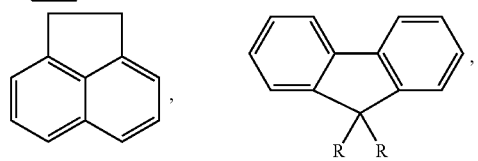

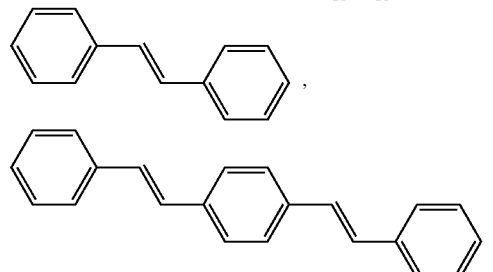

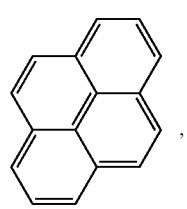

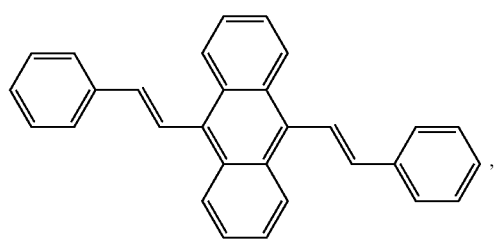
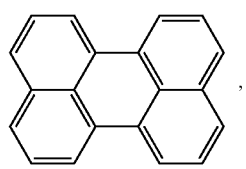
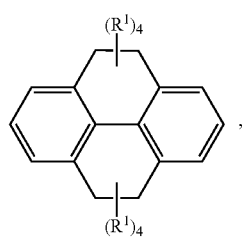
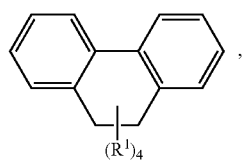
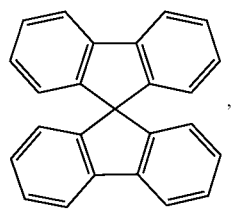
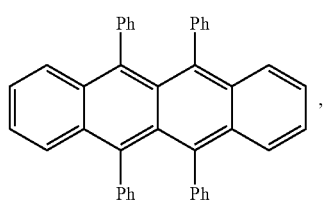
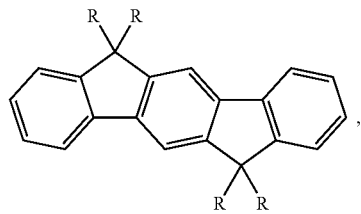
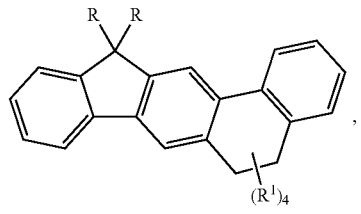
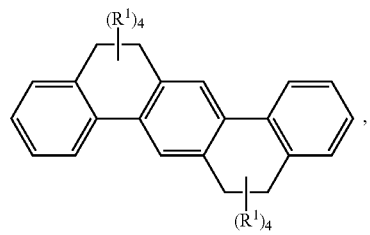
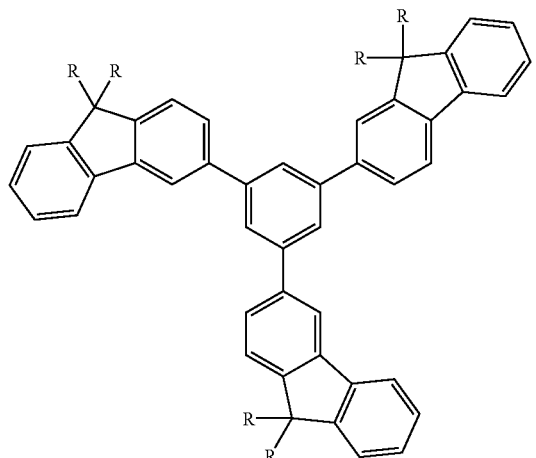
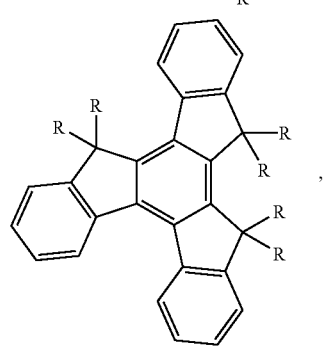
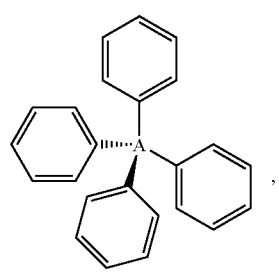
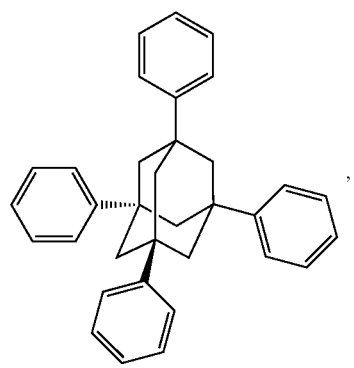

-continued
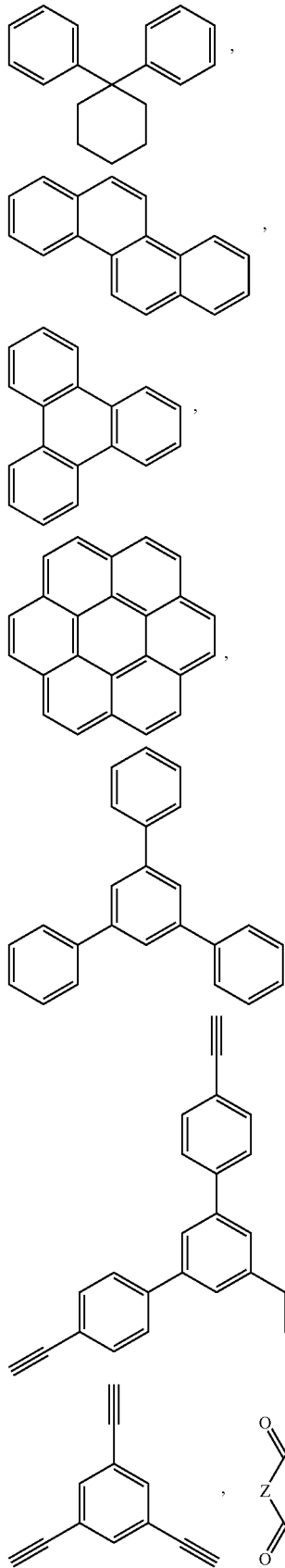
-continued
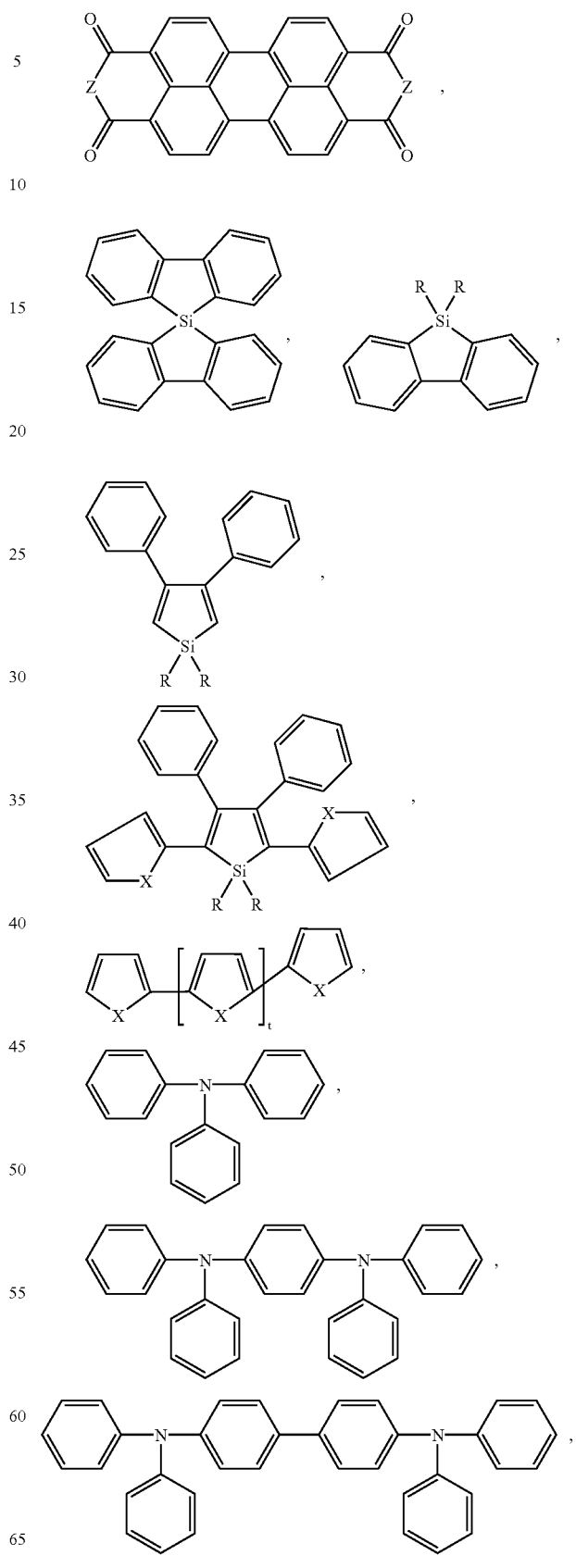

-continued
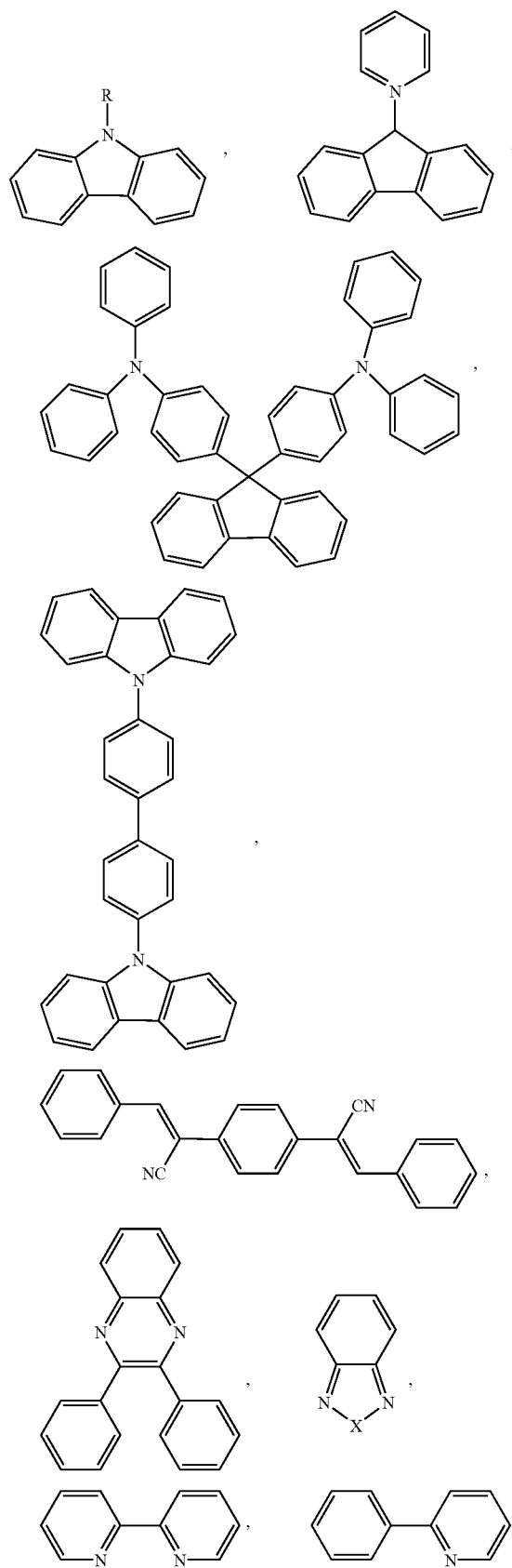
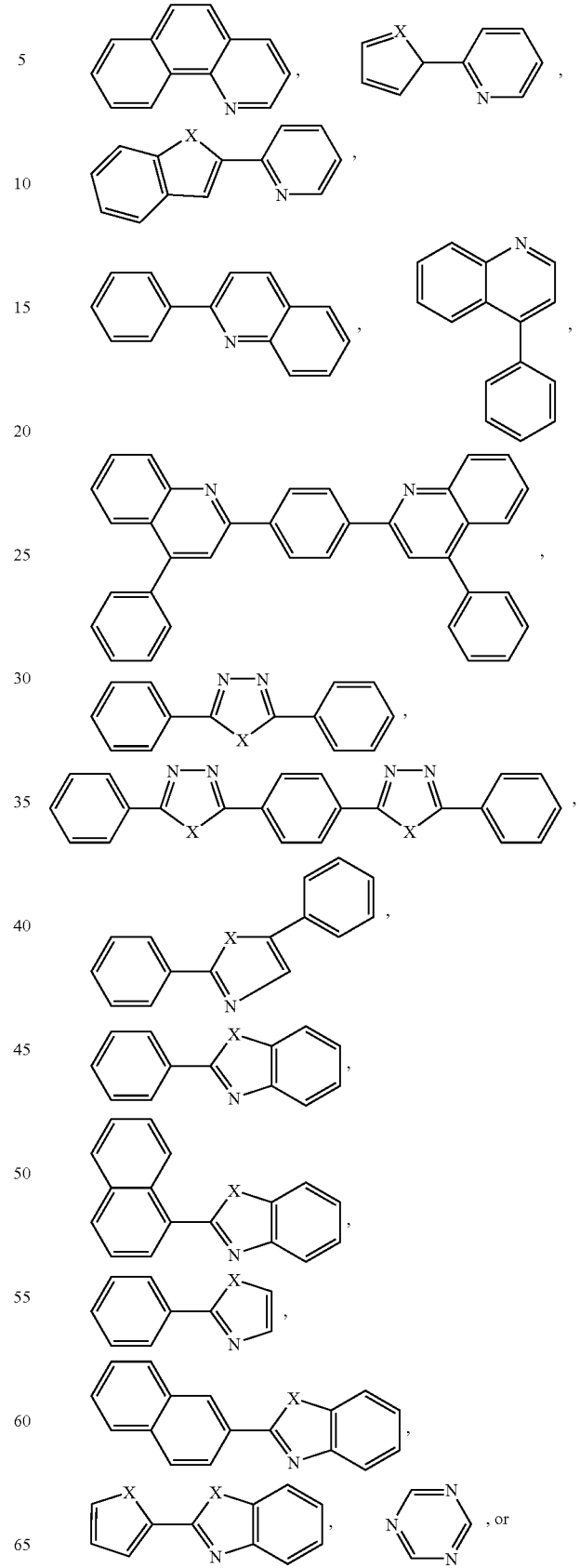

-continued
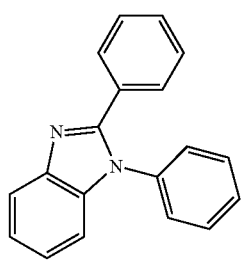
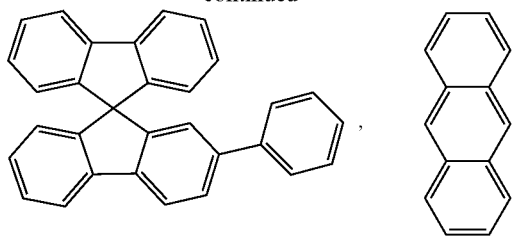
that is unsubstituted or substituted with one or more substituents selected from alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;
EC is a first end capping group and is a monovalent radical of
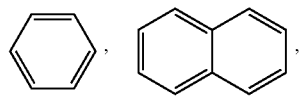
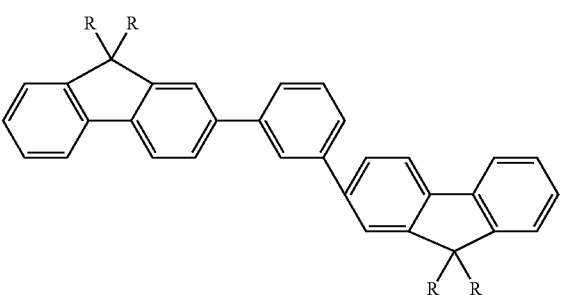
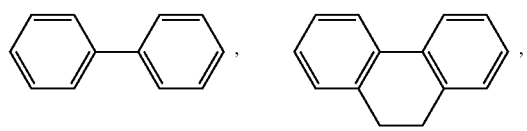
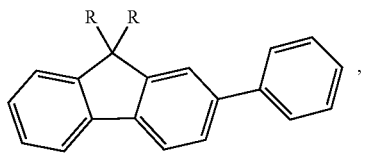
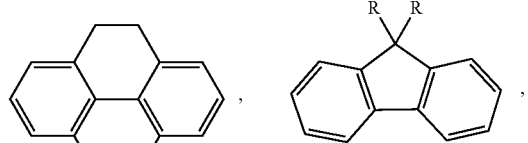
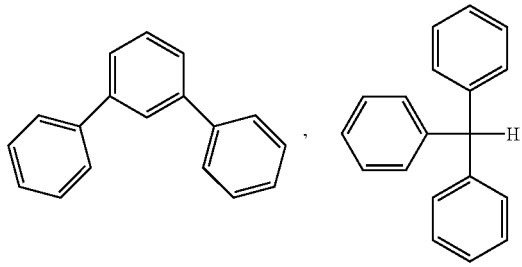
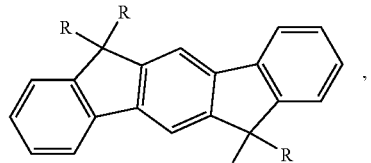
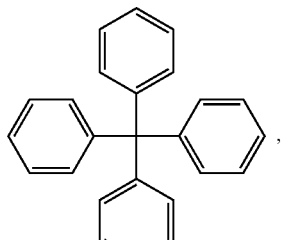
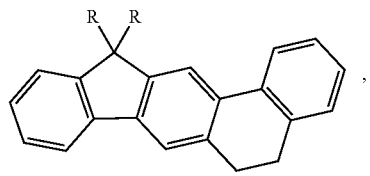
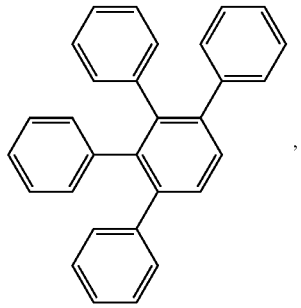

-continued
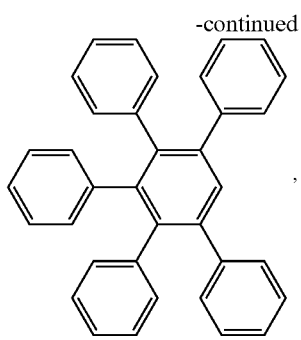
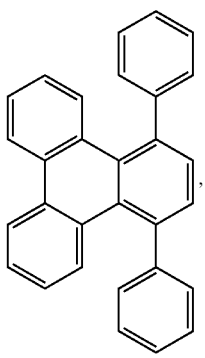
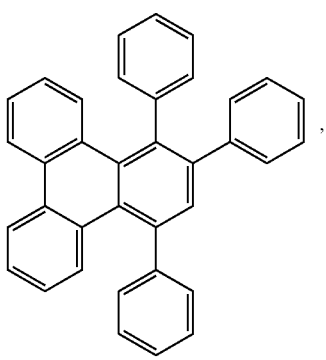
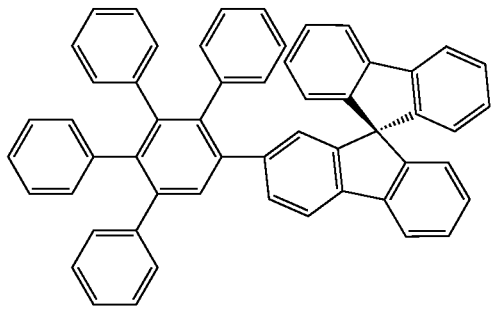
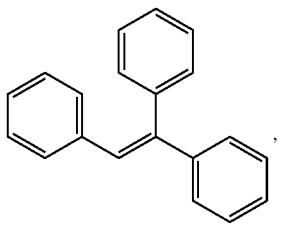
-continued
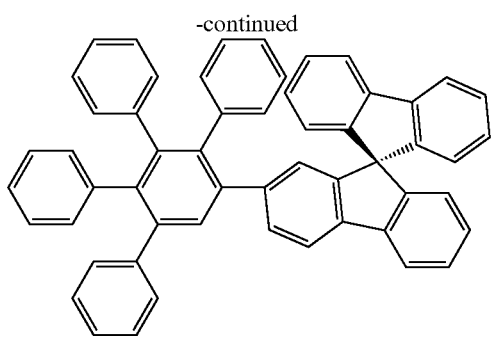
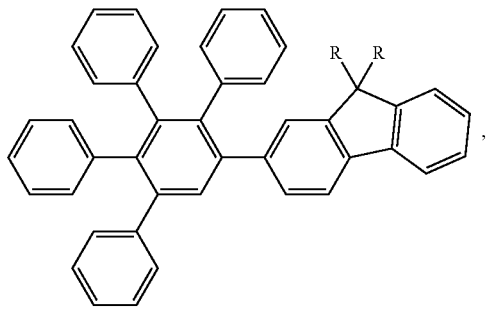
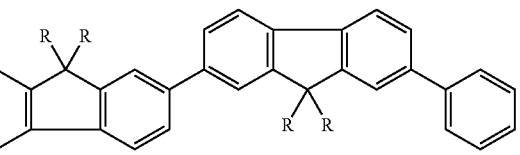
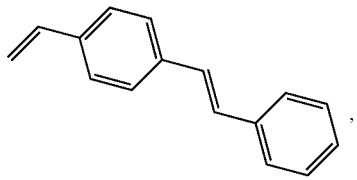
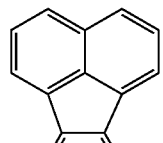
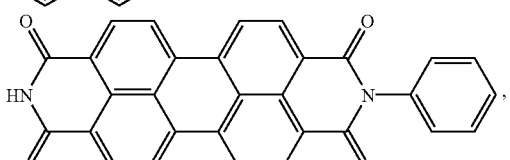
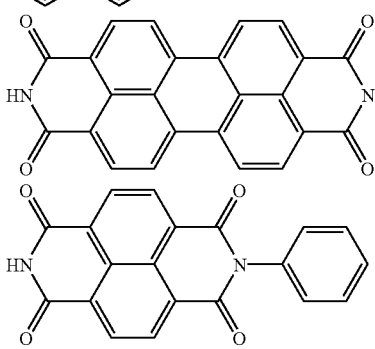

-continued
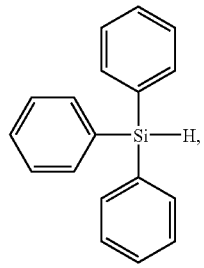 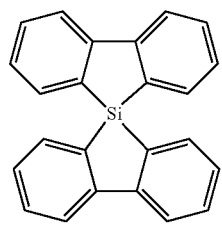
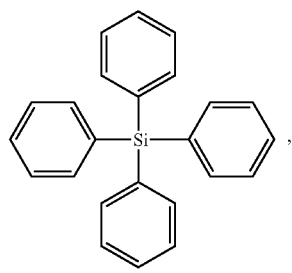
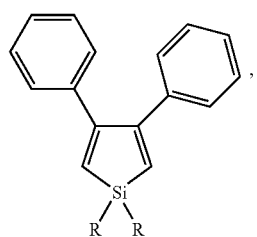
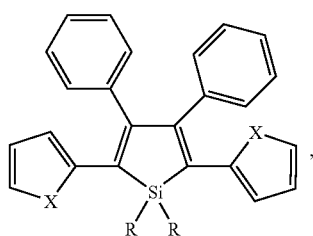
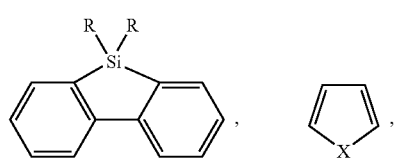
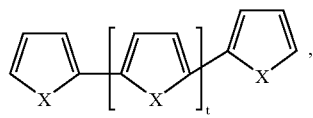
-continued
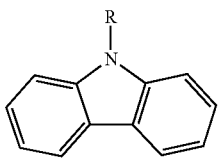 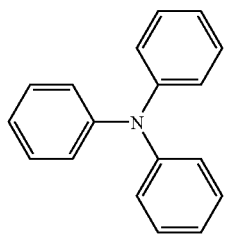
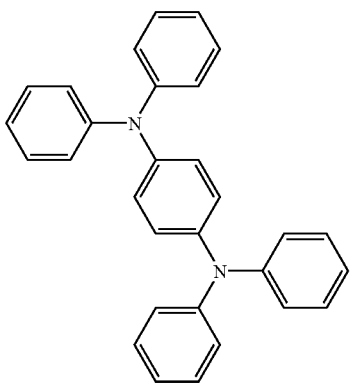
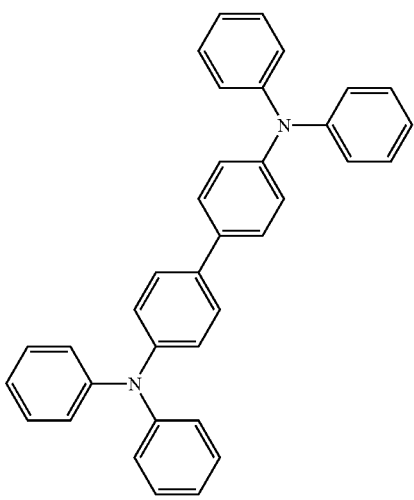
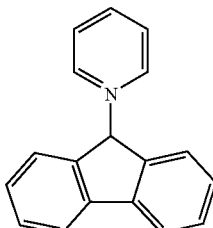 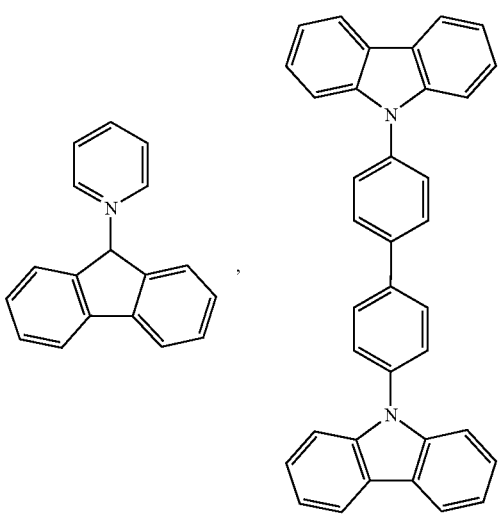

-continued
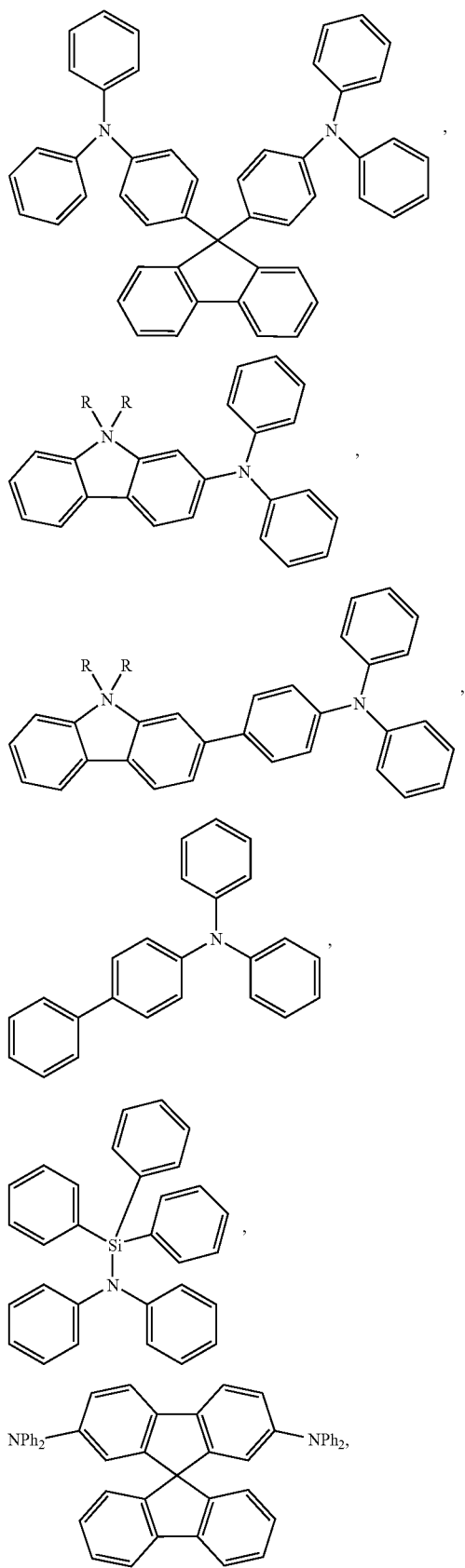
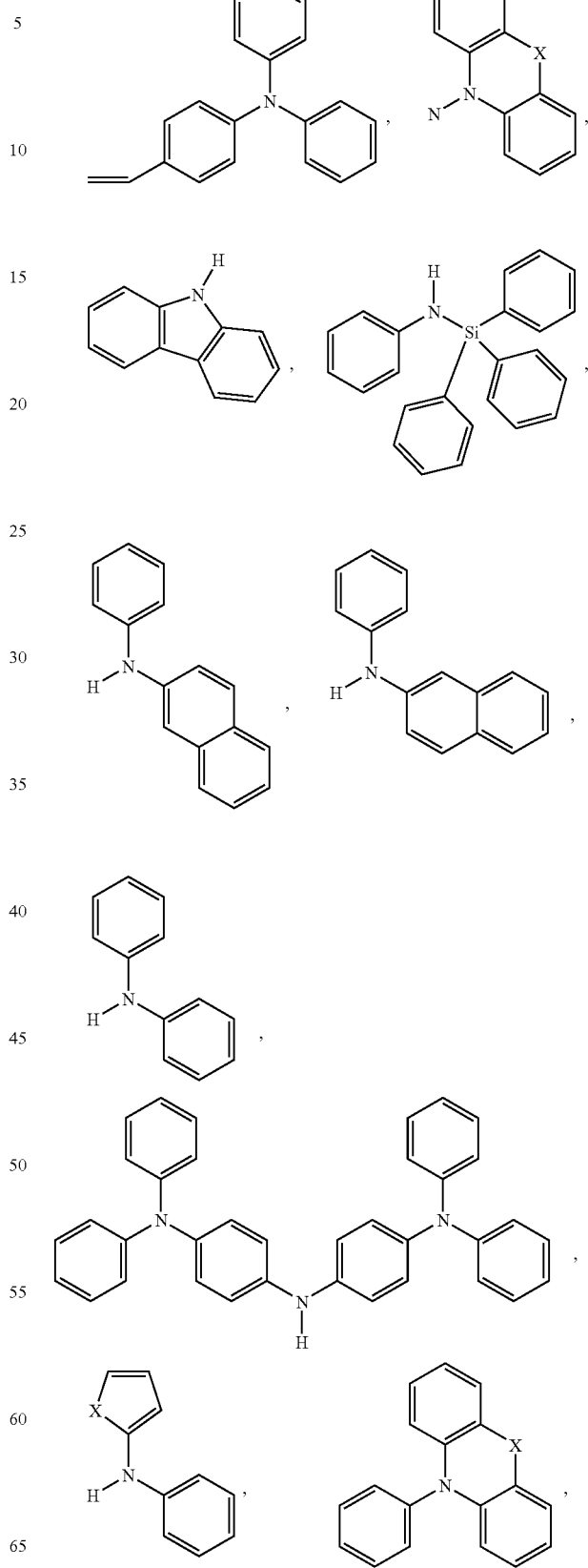

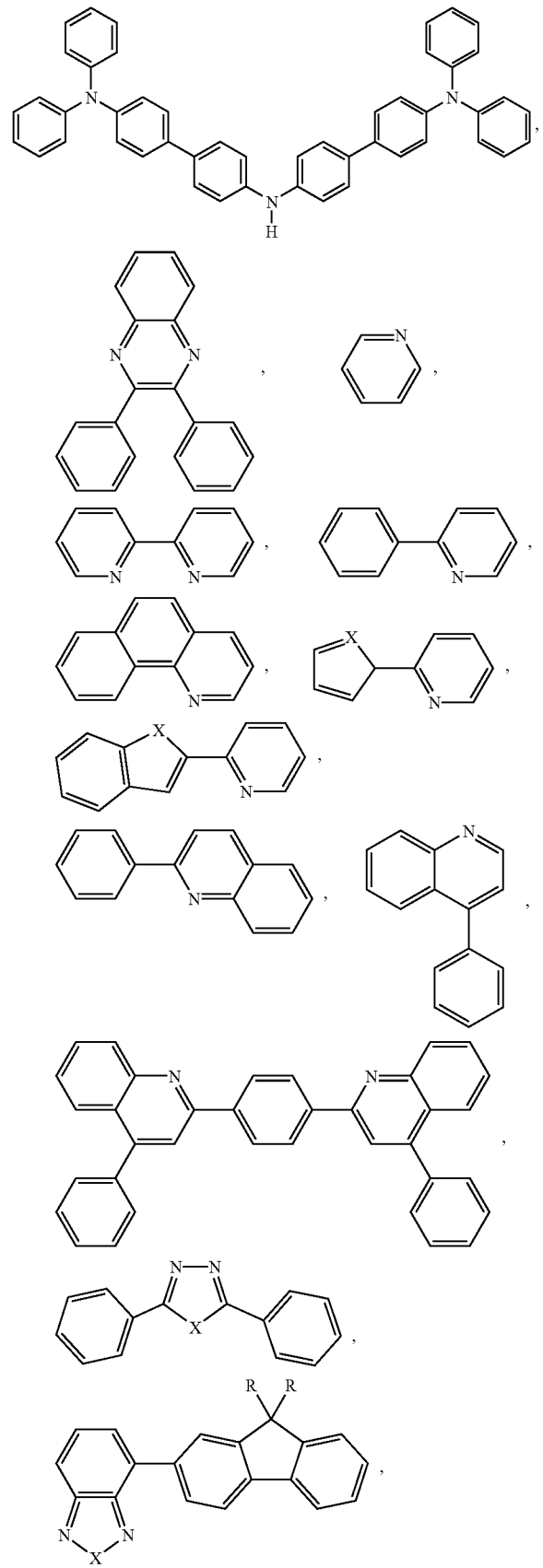
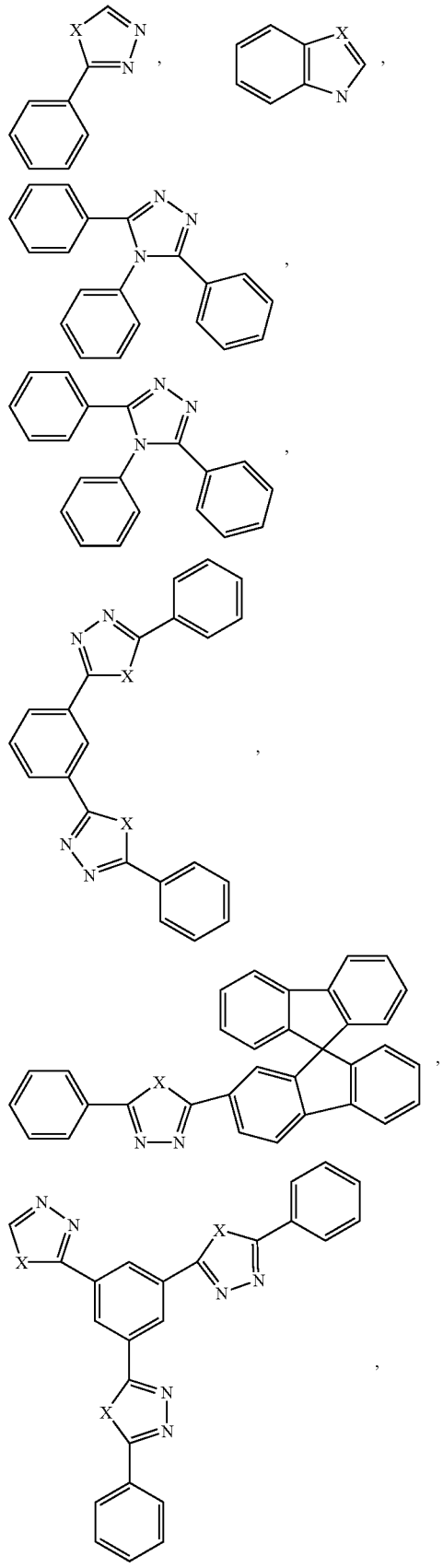

-continued

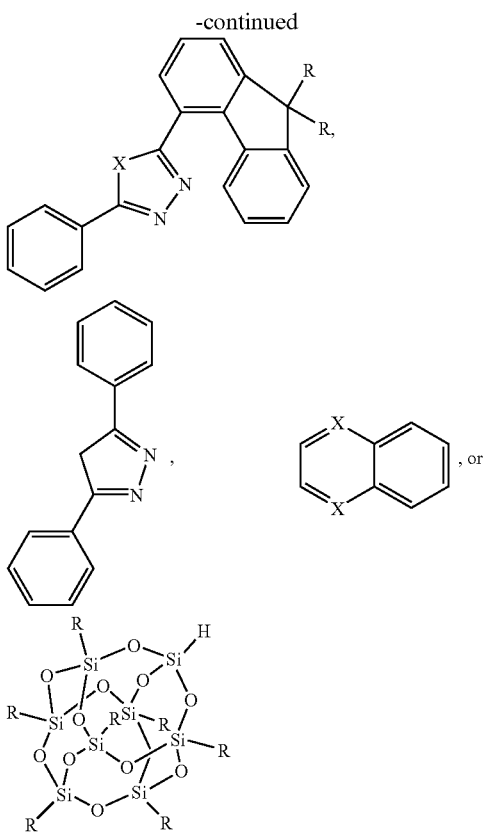

that is unsubstituted or substituted with one or more substituents selected from alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof;

n is an integer of 2 to 4, wherein the first end capping groups are identical; and each R is independently an alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;

each $R^1$ is independently a hydrogen, alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;

each X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof;

A is C, Si, Ge, Pb, or Sn;

Z is NH or $CH_2$;

t is an integer of 0 to 4; and (b) a second compound that is selected from a charge transporting material, a charge blocking material, a light emitting material, a color conversion material, or a combination thereof, said second compound having an aromatic radical that comprises the first aromatic core of the first compound, wherein the aromatic radical of the second compound can be unsubstituted, substituted with a substituent of a same type that is present on the first aromatic core of the first compound, or substituted with a substituent that is absent on the first aromatic core of the first compound;

a second end capping group that comprises the first end capping group of the first compound, wherein the second end capping group can be unsubstituted, substituted with a substituent of a same type that is present on the first end capping group, or substituted with a substituent that is absent on the first end capping group;

a divalent radical that comprises a divalent radical of the first end capping group of the first compound, wherein the divalent radical in the second compound can be unsubstituted, substituted with a substituent of a same type that is present on the first end capping group, or substituted with a substituent that is absent on the first end capping group; or a combination thereof, wherein the composition is amorphous and solution processible.

The end capping group and aromatic core radicals formed typically do not include hydrogen attached to a silicon or nitrogen atom. That is, if the compound from which the radical is selected has a hydrogen attached to either a nitrogen or silicon atom, then the radical typically is formed by abstraction of the hydrogen atom attached to the nitrogen or silicon atom.

The aromatic core of the first compound can be conjugated or unconjugated. The end capping groups are typically attached to a conjugated portion of the aromatic core. When the aromatic core is unconjugated, the two to four end capping groups of the first compound can be connected such that they are all in the same conjugated portion of the aromatic core, all in conjugated portions of the aromatic core but separated from each other by a non-conjugated portion, or a combination thereof. For example, if the aromatic core of the first compound is a divalent, trivalent, or tetravalent radical of

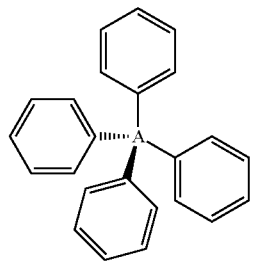

the end capping groups could all be attached to the same phenyl ring, to separate phenyl rings, or to a combination thereof. In some embodiments, A is Si or C.

In some embodiments, the end capping groups are conjugated to the aromatic core. There can be 2 to 4 end capping groups attached to the aromatic core. In some examples, the first compound has two end capping groups.

The first compound can have a substituent on the first aromatic core, the first end capping group, or a combination thereof. The substituents can be selected from alkyl, alkenyl, alkoxy, aryl, aryloxy, fluoro, fluoroalkyl, perfluoroalky, diarylamino, cyano, nitro, ester, heteroalkyl, heteroaryl, and combinations thereof. In some embodiments, the compounds are substituted with a $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, and combinations thereof. For example, the compounds can be substituted with a $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, a $C_{3-20}$ heteroaryl, and combinations thereof.

The substituent group can enhance, for example, the solubility of the compounds in organic solvents, the compatibility of the compounds with other materials in a composition, the solution processability of the compounds, or a combination thereof. The substituent can modify the solubility parameter, modify the ionization potential, modify the electron affinity, reduce intramolecular or intermolecular interactions that can produce undesirable emissions, or any combination of these. For example, a substituent can suppress aggregation and phase separation of the compounds when the compounds are formed into thin films.

In some embodiments of the first compound, R, $R^1$, or a substituent can include a divalent poly(oxyalkylene) soft segment of Formula III

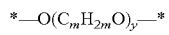

III or a divalent poly(dialkylsiloxane) soft segment of Formula IV

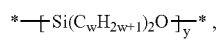

IV where m is an integer of 1 to 6, y is an integer of 2 to 20, and w is an integer of 1 to 10. In some embodiments, the poly(oxyalkylene) or poly(dialkylsiloxane) soft segment can be connected to an alkyl (e.g., straight chain, branched chain, or cyclic), aryl, or heteroaryl group. The substituent can, for example, have Formula V

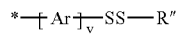

V where SS is a poly(oxyalkylene) or poly(dialkylsiloxane) soft segment, Ar is an arylene group, v is an integer of 0 or 1, and R" is an aryl, heteroaryl, or a alkyl. In some examples, R" is a sterically hindered group. Groups according to Formula V can reduce the formation of intermolecular or intramolecular configurations that produce undesirable excimer or exciplex emission.

In other embodiments of the first compound, R, $R^1$, or a substituent can include fluoro, $C_{1-30}$ fluoroalkyl, $C_{1-30}$ perfluoroalky, or combinations thereof. These substituents can improve the solubility and the film forming properties of the compounds. These substituents can also lower the vapor pressure of the compounds and make them easier to vapor deposit. Additionally, these substituents can increase the ionization potential of the compound, can increase the electron affinity of the compound, or a combination thereof. Compounds having an increased ionization potential and electron affinity can more easily inject electrons and block holes when used in an organic electroluminescent device.

The second compound can be unsubstituted, can have a substituent of a same type that is present on the corresponding structure of the first compound, or can be substituted with a substituent that is absent on the corresponding structure of the first compound. The corresponding structure of the first compound can be the first aromatic core, the first end capping group, or a divalent radical of the first end capping group.

In some embodiments, the substituent on a radical of the second compound can be identical to that on a corresponding structure of the first compound. Both the radical of the second compound and the corresponding structure of the first compound can be free of substituents. In a specific example, the first end capping group can be a radical of anthracene without any substituent group and the second compound includes a radical of anthracene without any substituent group. Similarly, both the radical of the second compound and the corresponding structure of the first compound can have identical substituents. In a specific example, the first end capping group can be a radical of anthracene with a methoxy substituent and the second compound includes a radical of anthracene with a methoxy substituent in the same position as in the first end capping group.

Additionally, the second compound can contain a radical that is similar to, but not identical to, a corresponding structure of the first compound. For example, a substituent on a radical of the second compound can be absent on a corresponding structure of the first compound. In a specific example, the first end capping group is a radical of anthracene without any substituent groups and the second compound includes a radical of anthracene with a methoxy substituent. Likewise, a substituent on a radical included in the first compound can be absent on a corresponding structure of the second compound. In another specific example, the first compound has an end capping group that is a spirobisfluorenyl group with a methyl substituent and the second compound has an end capping group that is an unsubstituted spirobisfluorenyl group.

A substituent on a radical of the second compound can be of the same type of substituent (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) present on the corresponding structure of the first compound but contain a different number of carbon atoms. In a specific example, the first end capping group is a radical of anthracene with a methoxy substituent and the second compound includes a radical of anthracene with an ethoxy substituent. In another specific example, the first compound has an end capping group that is a spirobisfluorenyl group substituted with a methyl group and the second compound contains an end capping group that is a spirobisfluorenyl group substituted with a tert-butyl group.

The substituents on the first compound and the second compound cannot be of a different type if they are substituted in the same position. In a specific example, if the first end capping group is a spirobisfluorenyl group substituted with a methyl group and the second compound has a spirobisfluorenyl group substituted with a phenyl group in the same position where the methyl group is located on the first end capping groups, then the groups are not considered to be structurally similar.

The second compound of the composition can be a small molecule (i.e., non-polymeric) or can be a polymeric material. In some embodiments, the composition includes both a hole transporting material and an electron transporting material. In other embodiments, the composition includes a hole transporting material, an electron transporting material, and a light emitting material.

The composition of the invention can include a compound of Formula I and a second compound that has an aromatic radical that includes the first aromatic core of the first compound. The first aromatic core can be a carbocyclic aromatic radical that is a divalent, trivalent, or tetravalent radical of

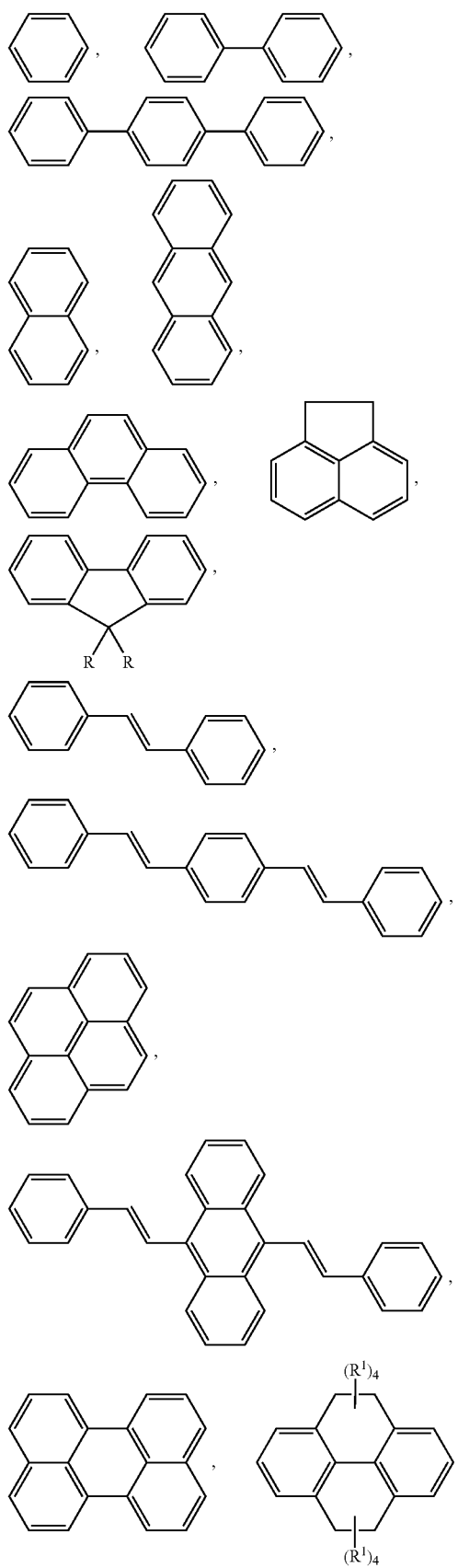
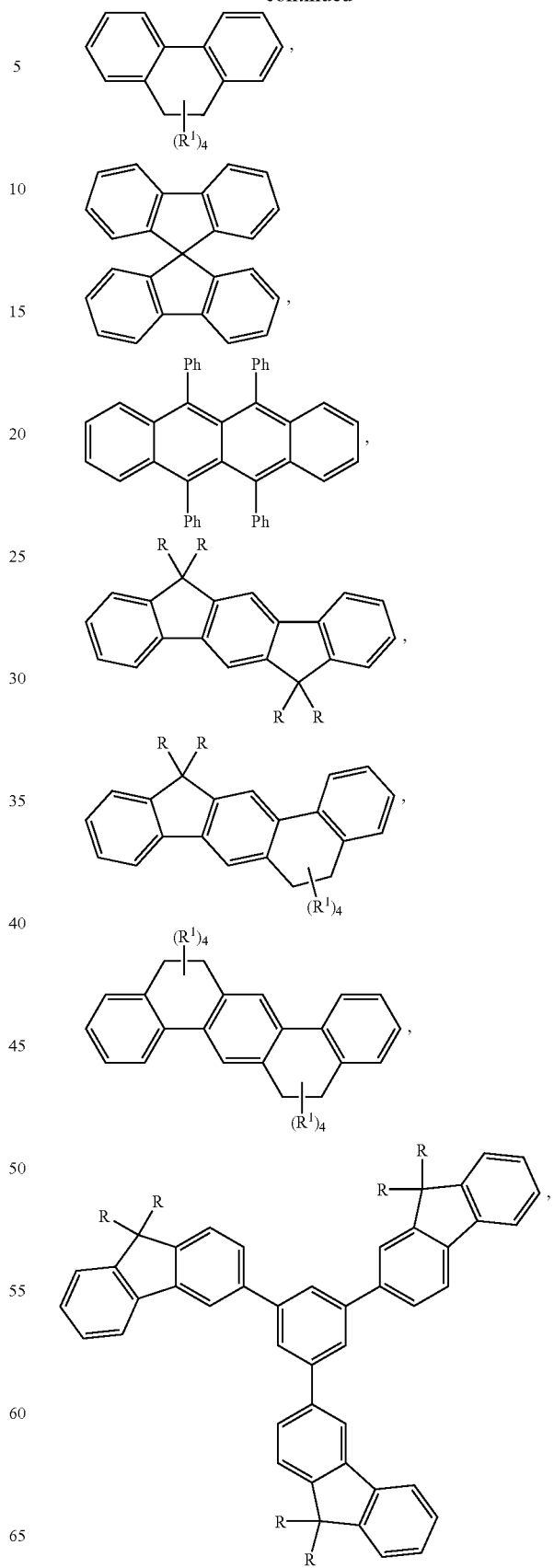

-continued

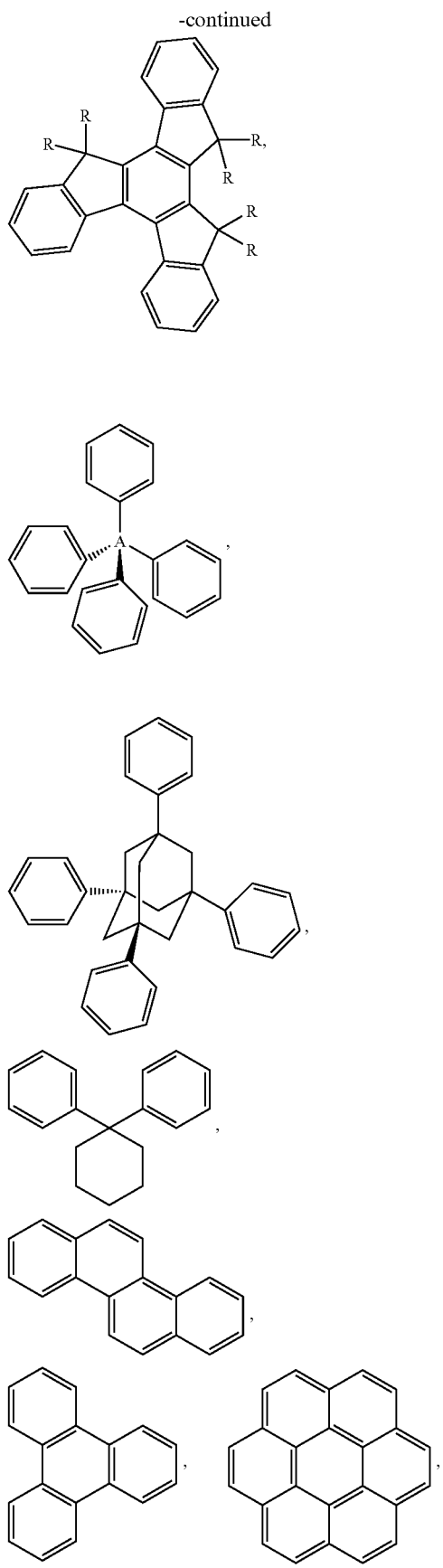

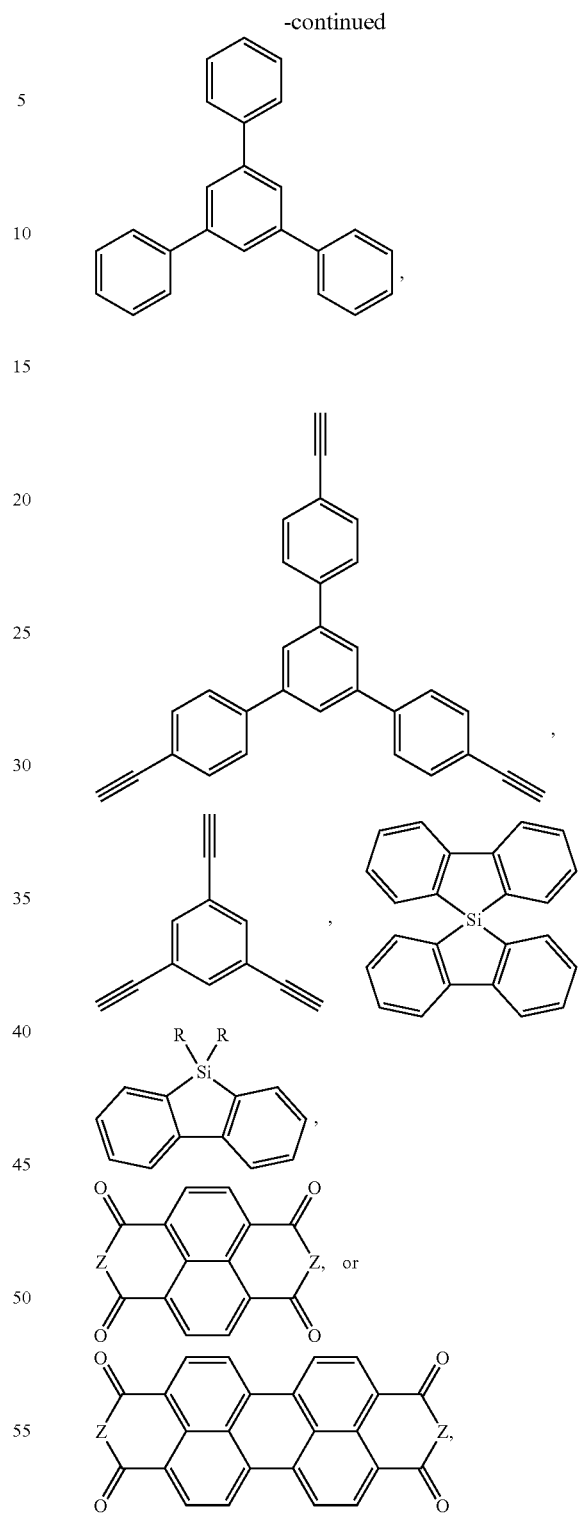

that is unsubstituted or substituted with one or more substituents selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl; $C_{3-20}$ heteroaryl, and combinations thereof. Each Z is N or CH. Each A is A is C, Si, Ge, Pb, or Sn. Each R is independently a $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, or combinations thereof. Each $R^1$ is independently a hydrogen, $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, or combinations thereof.

The composition of the invention can include a compound of Formula I and a second compound that has an aromatic radical that includes the first aromatic core of the first compound. The first aromatic core can be an electron rich heteroaromatic radical or a tertiary aromatic amino aromatic radical that is a divalent, trivalent, or tetravalent radical of

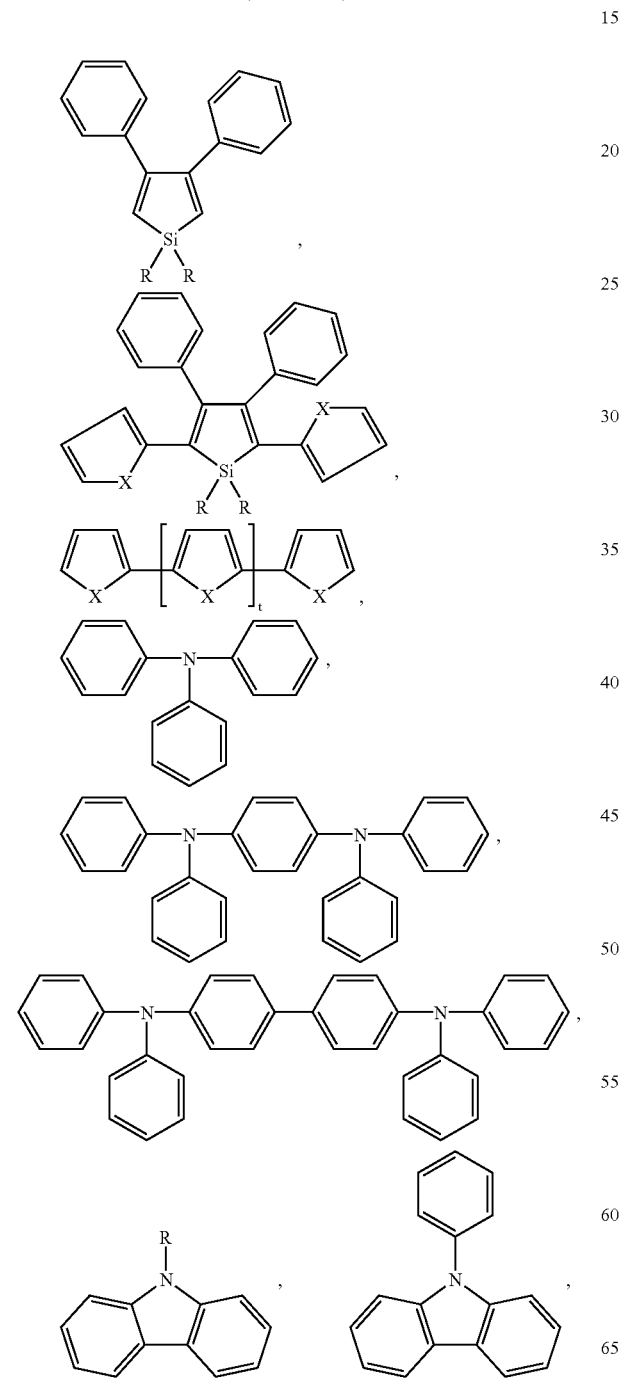

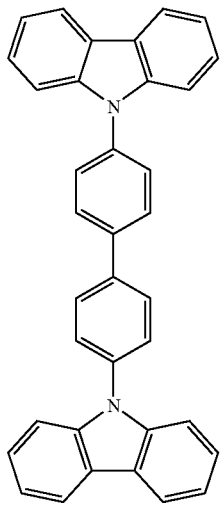

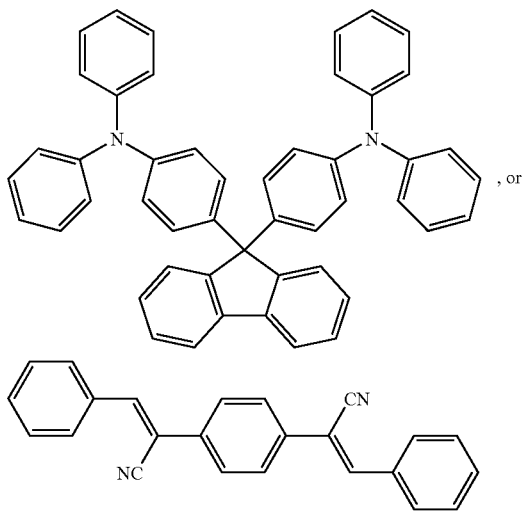

that is unsubstituted or substituted with one or more substituents selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof. Each R is independently a $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, or combinations thereof. Each X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof. Each t is an integer of 0 to 4.

The composition of the invention can include a compound of Formula I and a second compound that has an aromatic radical that includes the first aromatic core of the first compound. The first aromatic core can be a heteroaromatic radical having a —C=N— unit. That is, the first aromatic core can be a divalent, trivalent, or tetravalent radical of

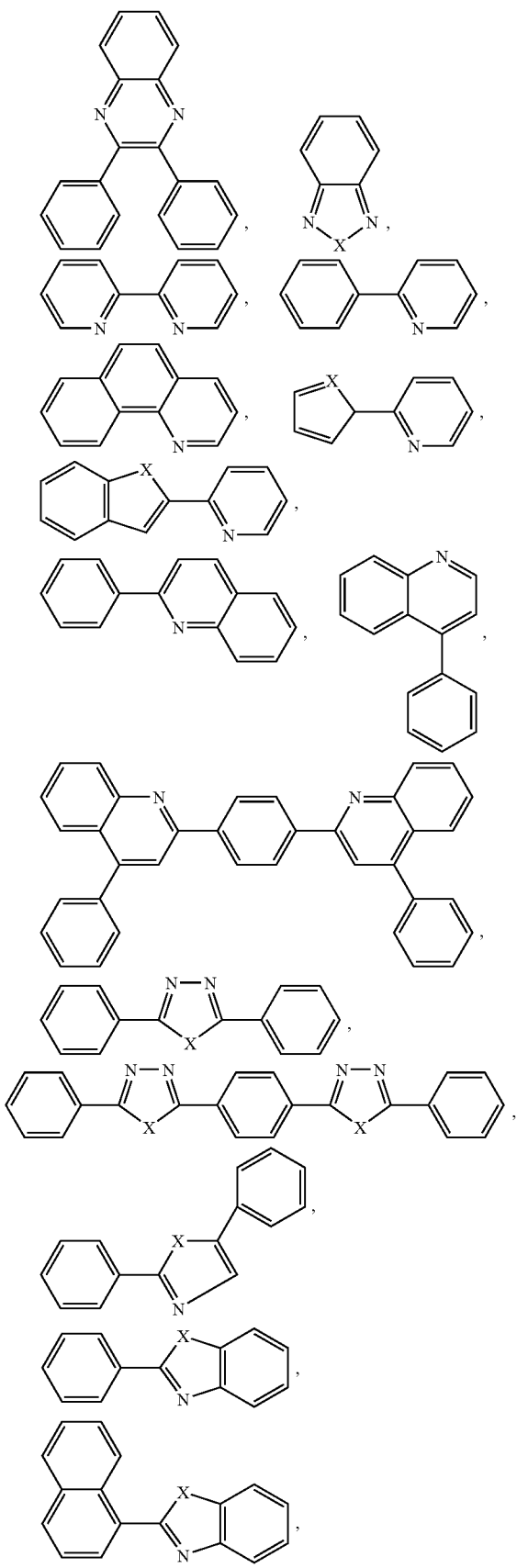
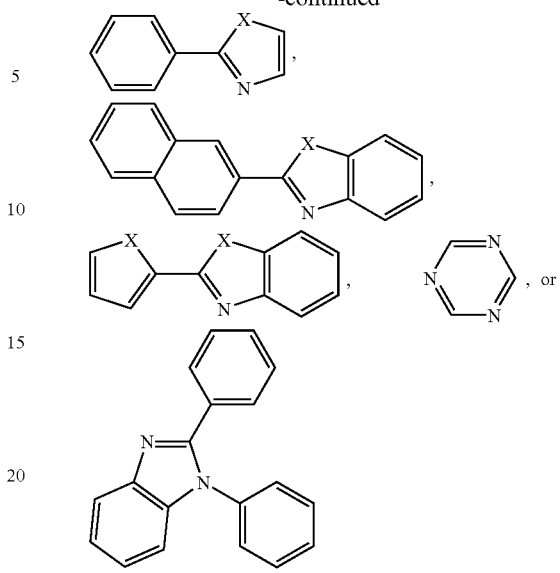
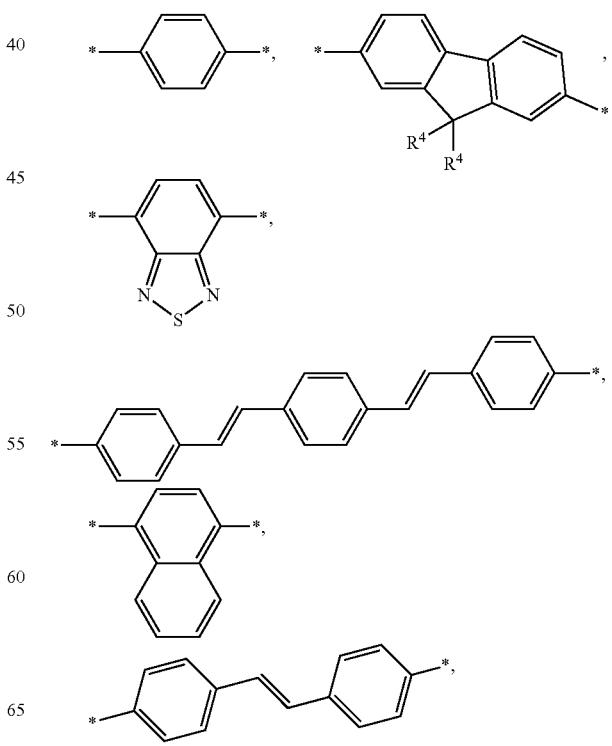

that is unsubstituted or substituted with one or more substituents selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof. Each X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof.

The composition of the invention can include a first compound of Formula I and a second compound that contains an aromatic radical selected from

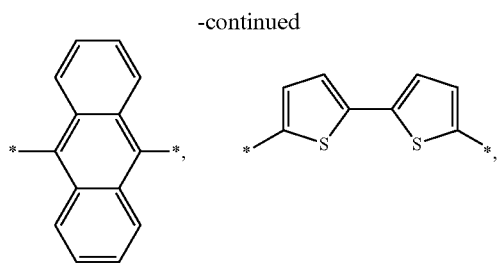
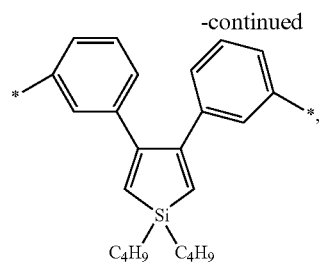
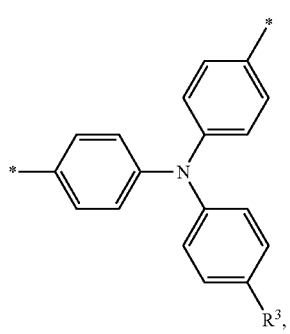
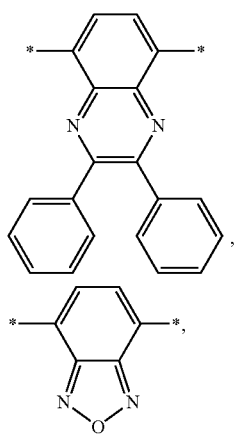
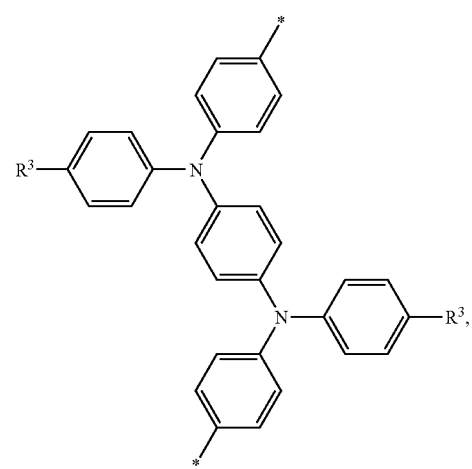

-continued

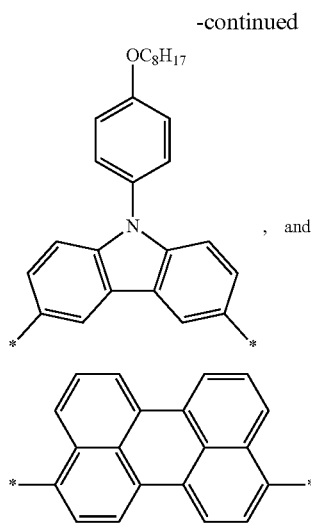, and

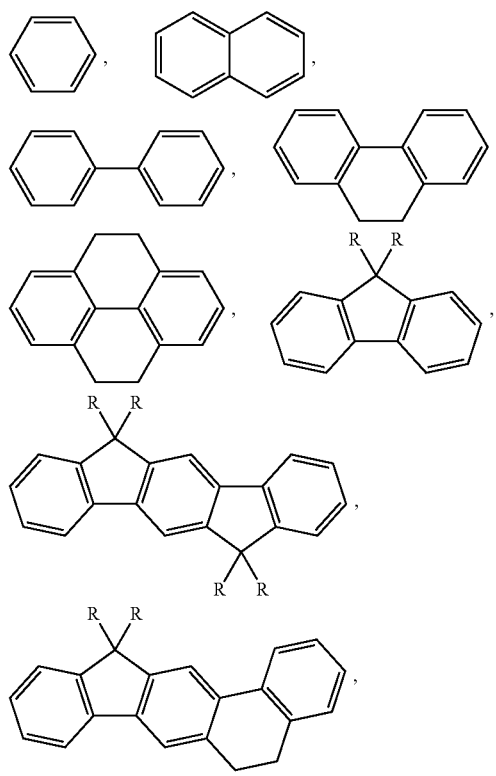

Each $R^3$ is independently hydrogen, $C_{1-30}$ alkyl, $C_{6-20}$ aryl, $C_{3-20}$ heteroaryl, or $C_{1-30}$ heteroalkyl. Each $R^4$ is independently $C_{1-30}$ alkyl, $C_{6-20}$ aryl, $C_{3-20}$ heteroaryl, or $C_{1-30}$ heteroalkyl.

The composition of the invention can include a compound of Formula I and a second compound that has a second end capping group that includes the first end capping group or a second compound that has a divalent radical that includes a divalent radical of the first end capping group. The first end capping group can be a $C_{6-60}$ carbocyclic aryl that is a monovalent radical of -continued

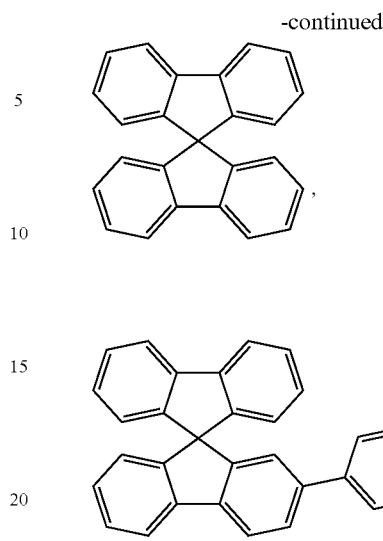

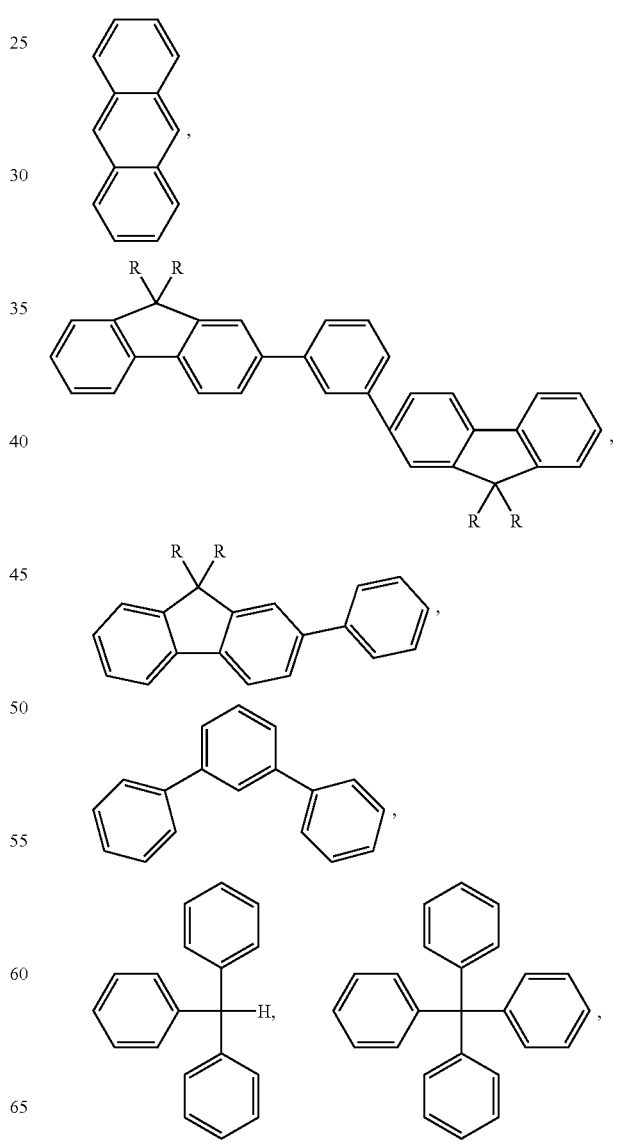

-continued
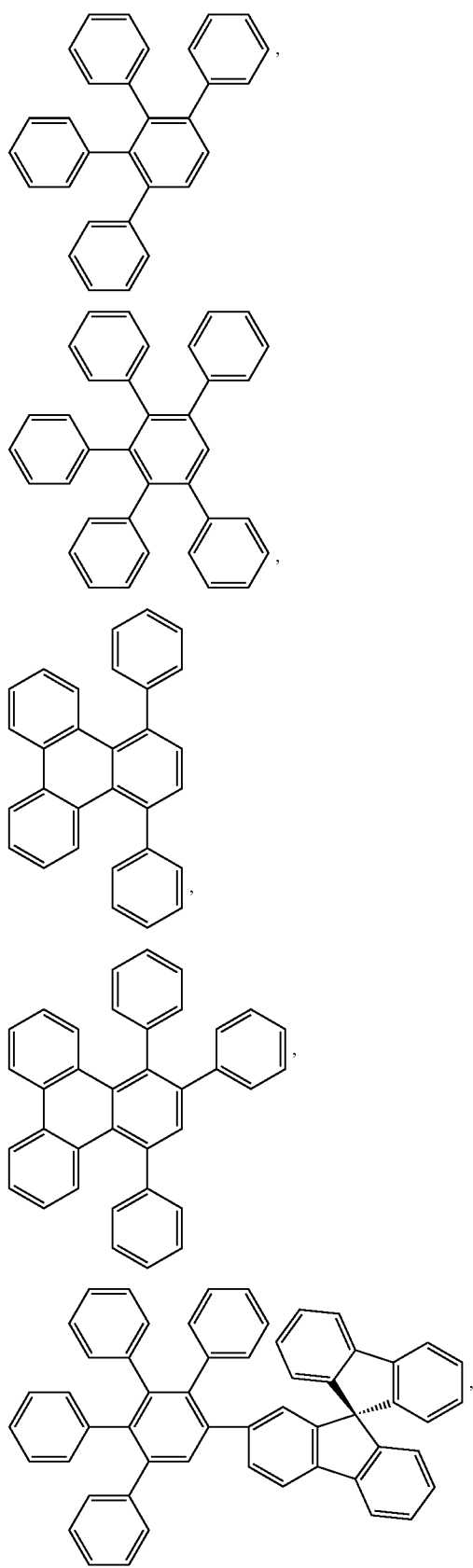
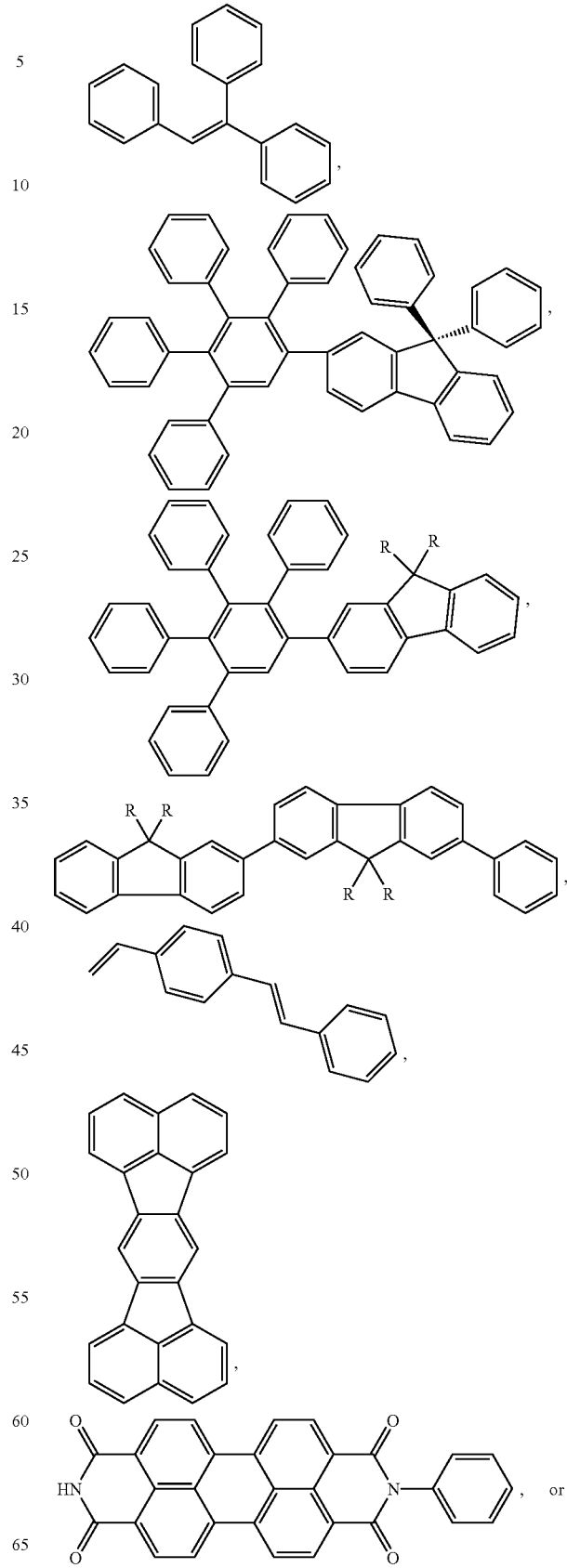

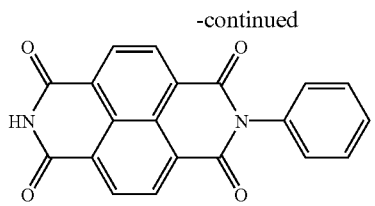

that is unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof. Each R is independently a $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, or combinations thereof.

The composition of the invention can include a compound of Formula I and a second compound that has a second end capping group that includes the first end capping group or a second compound that has a divalent radical that includes a divalent radical of the first end capping group. The first end capping group can be a $C_{3-60}$ heteroaryl having a —C=N— unit that is a monovalent radical of

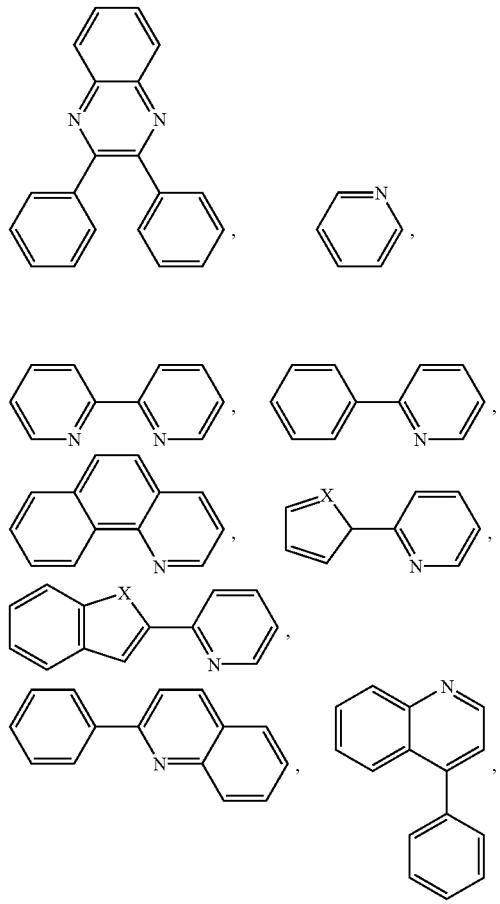

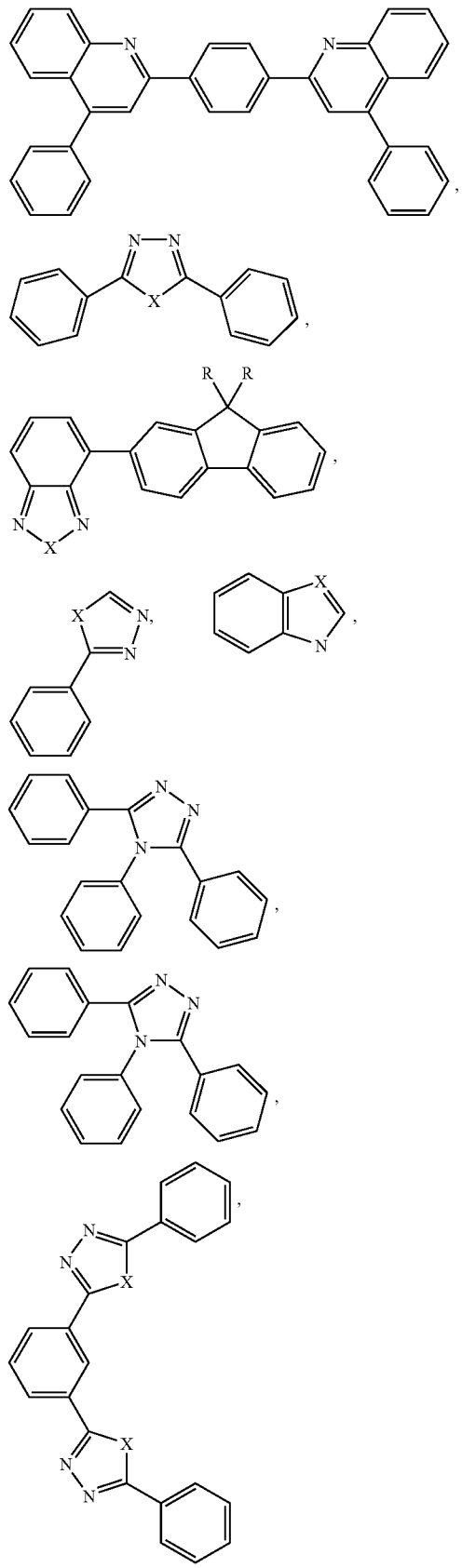

that is unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof. Each R is independently a $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, or combinations thereof. Each X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof.

The composition of the invention can include a compound of Formula I and a second compound that includes the first end capping group or a second compound that has a divalent radical that includes a divalent radical of the first end capping group. The first end capping group can be a $C_{12-60}$ tertiary aromatic amino aryl or a $C_{3-60}$ heteroaryl that is electron rich. That is, the first end capping group can be a monovalent radical of -continued
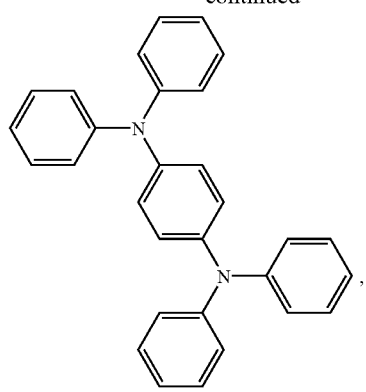
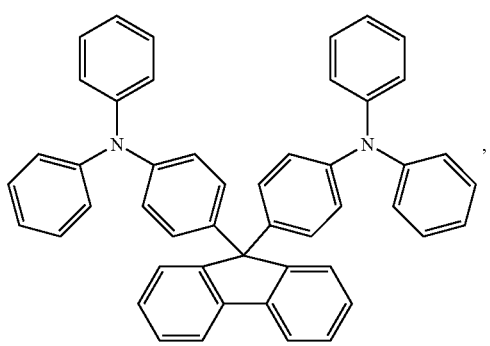
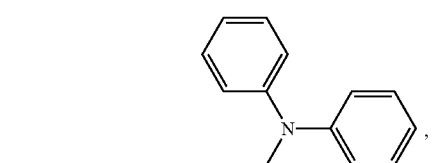
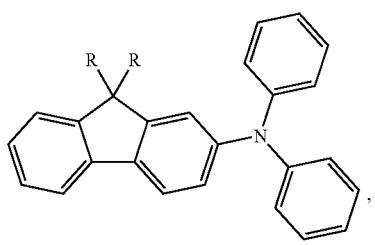
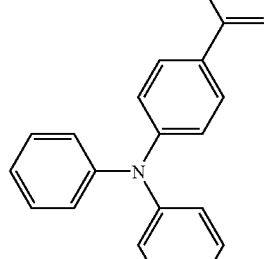
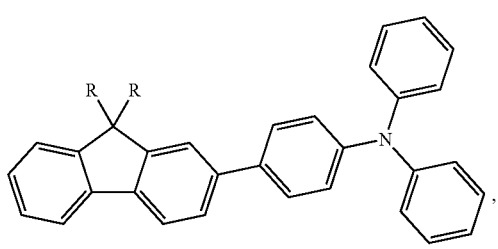
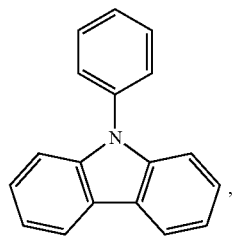
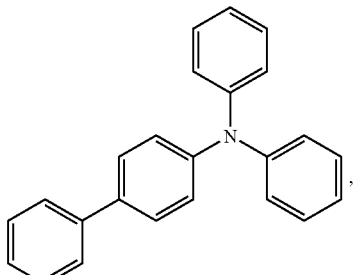
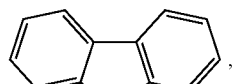
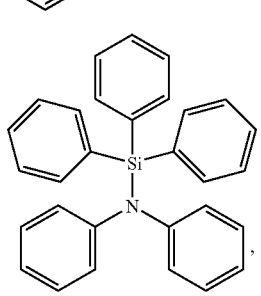
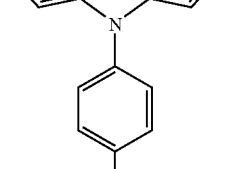
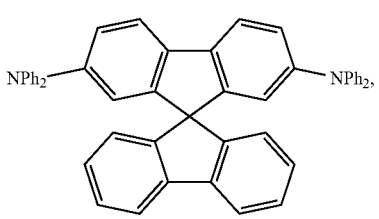
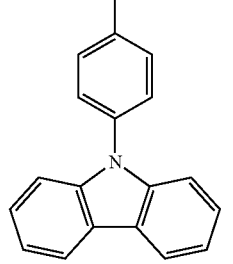

-continued

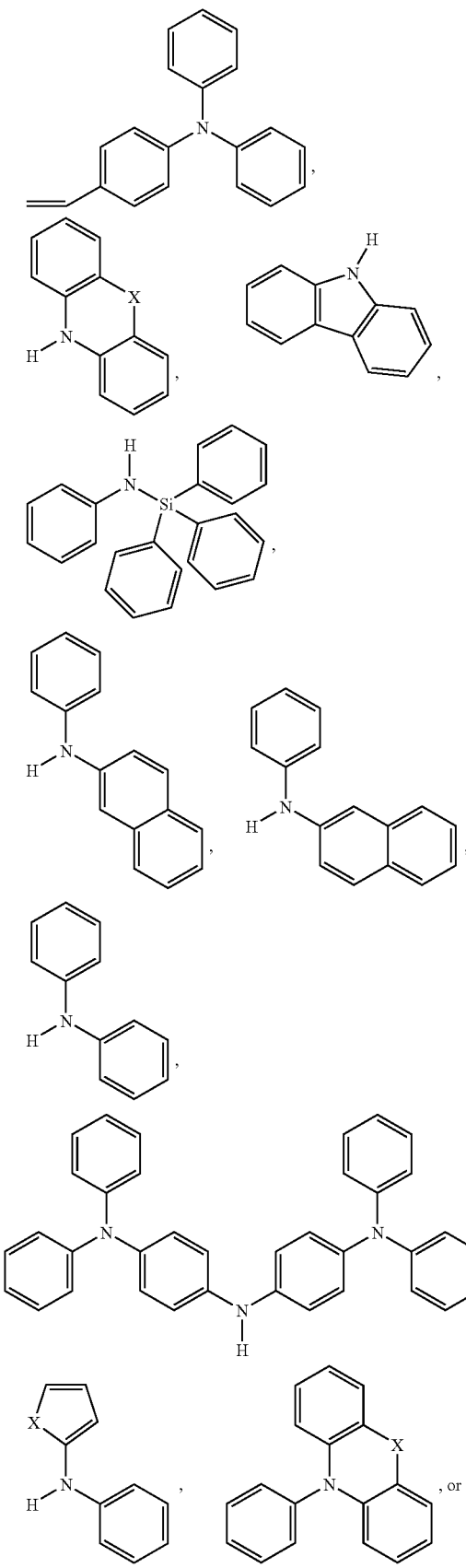

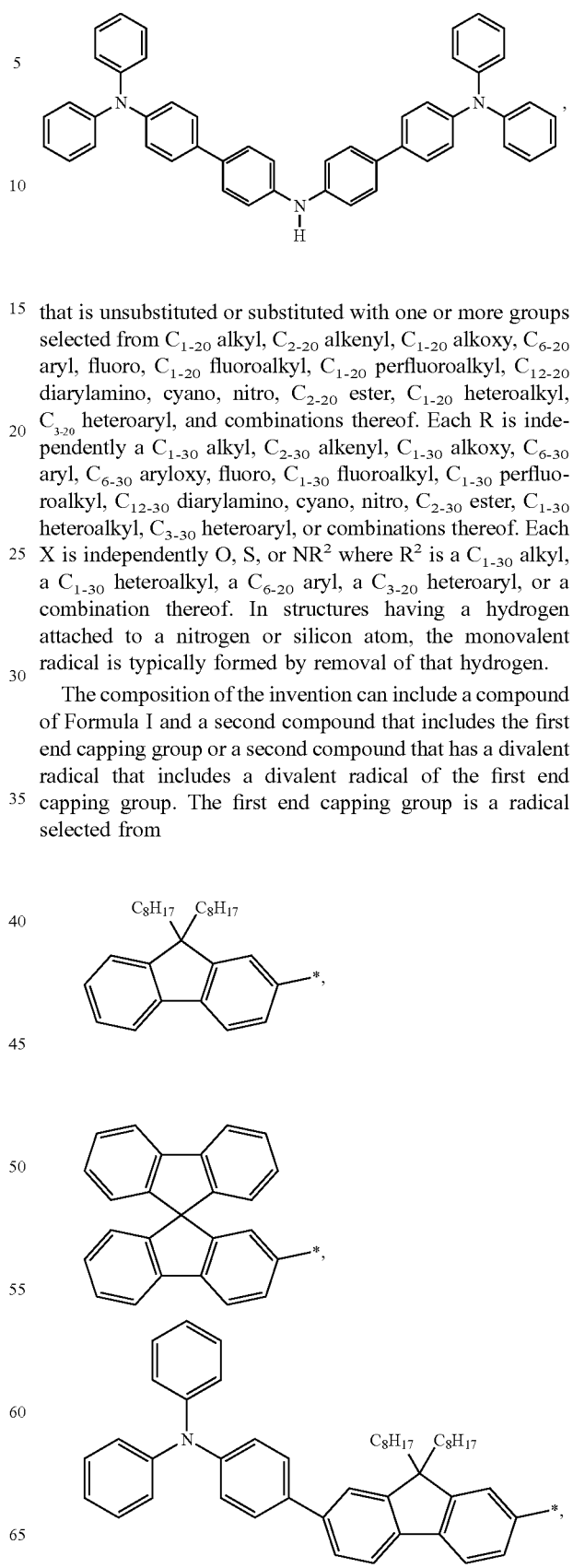

that is unsubstituted or substituted with one or more groups selected from $C_{1-20}$ alkyl, $C_{2-20}$ alkenyl, $C_{1-20}$ alkoxy, $C_{6-20}$ aryl, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof. Each R is independently a $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, or combinations thereof. Each X is independently O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof. In structures having a hydrogen attached to a nitrogen or silicon atom, the monovalent radical is typically formed by removal of that hydrogen.

The composition of the invention can include a compound of Formula I and a second compound that includes the first end capping group or a second compound that has a divalent radical that includes a divalent radical of the first end capping group. The first end capping group is a radical selected from -continued

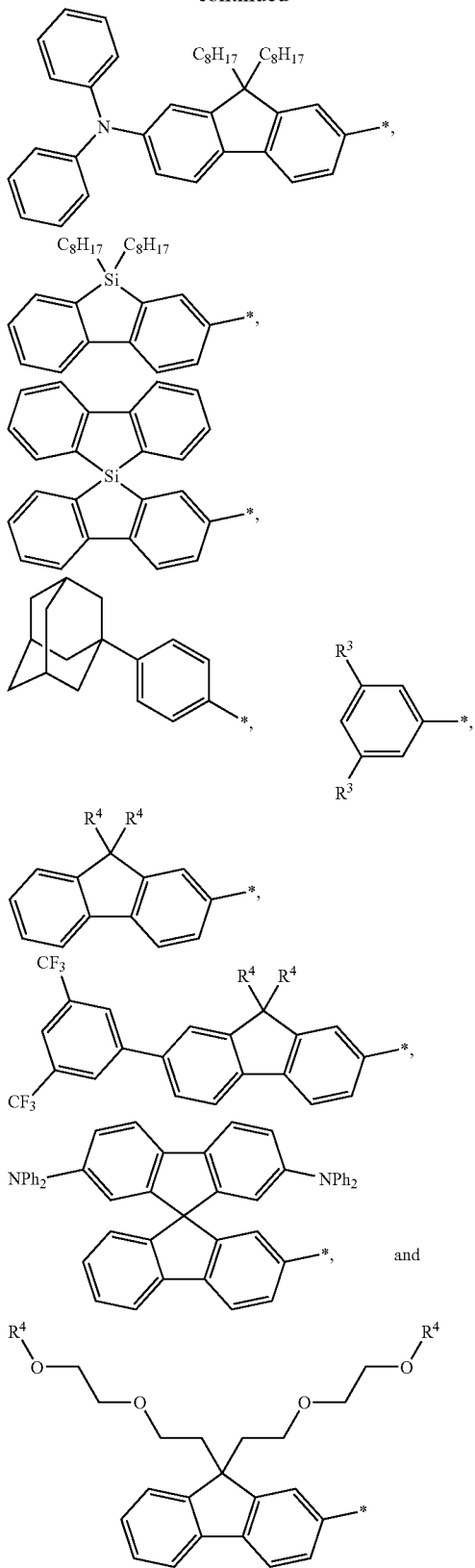

where each Ph is phenyl and each $R^3$ is independently hydrogen, $C_{1-30}$ alkyl, $C_{6-20}$ aryl, $C_{3-20}$ heteroaryl, or $C_{1-30}$ heteroalkyl. Each $R^4$ is independently $C_{1-30}$ alkyl, $C_{6-20}$ aryl, $C_{3-20}$ heteroaryl, or $C_{1-30}$ heteroalkyl.

Another aspect of the invention provides a composition that includes (a) a first compound of Formula II $$EC-Ar^1-EC \quad\quad II$$

that is a charge transporting material, a charge blocking material, a light emitting material, a color conversion material, or a combination thereof, wherein $Ar^1$ is a first aromatic core and is a divalent radical selected from

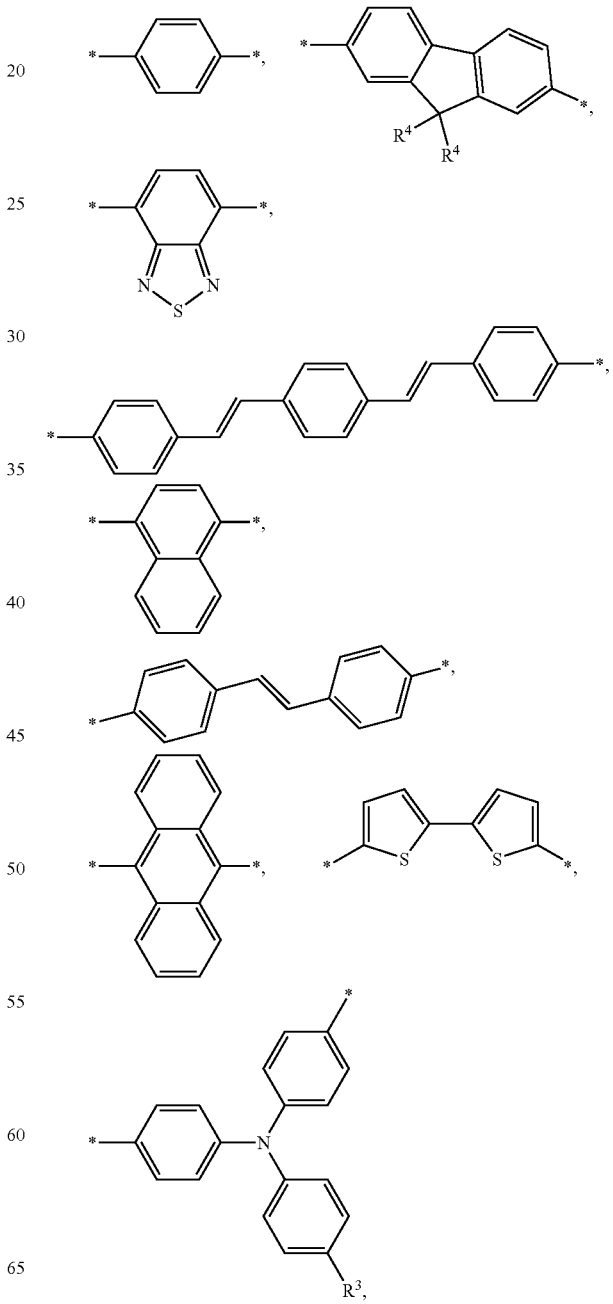

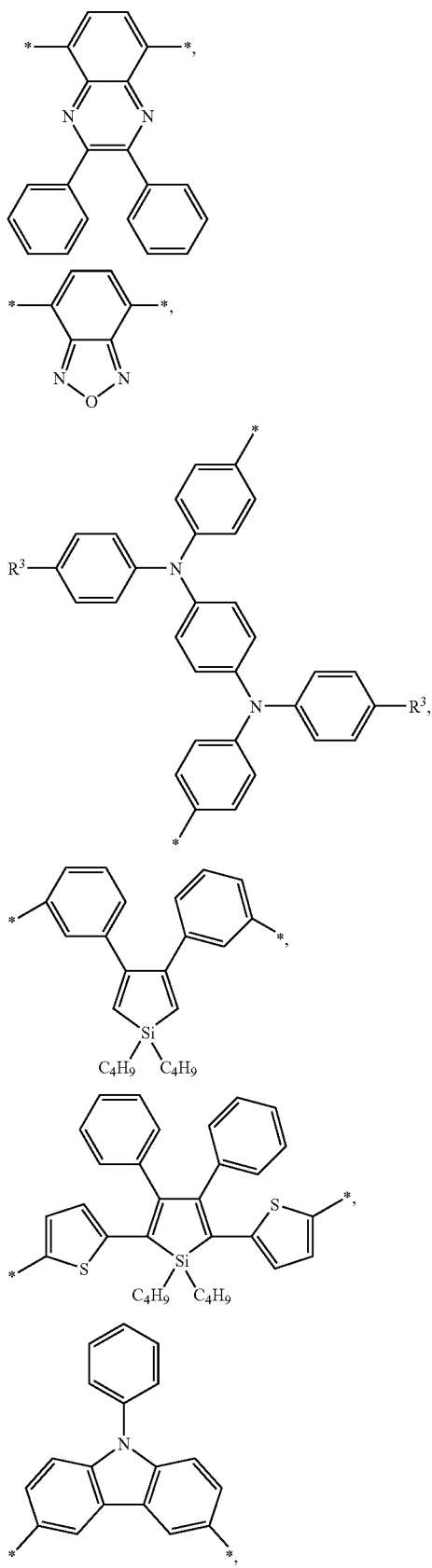
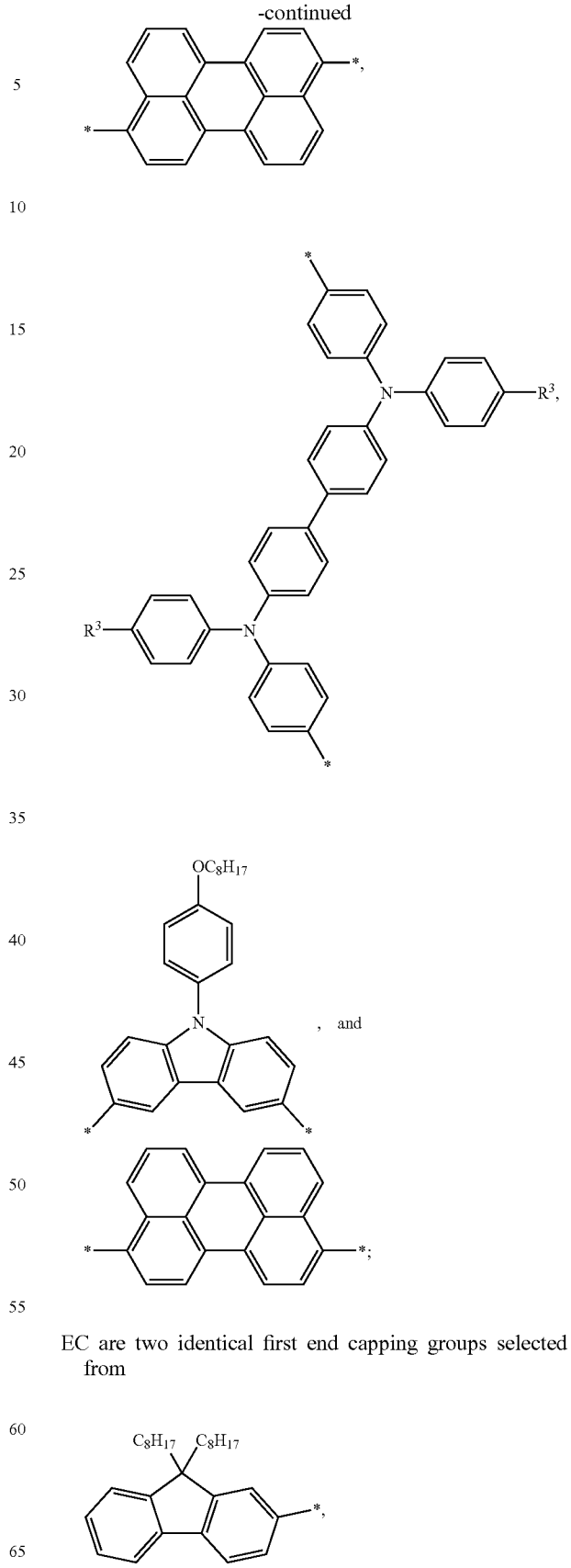
EC are two identical first end capping groups selected from -continued

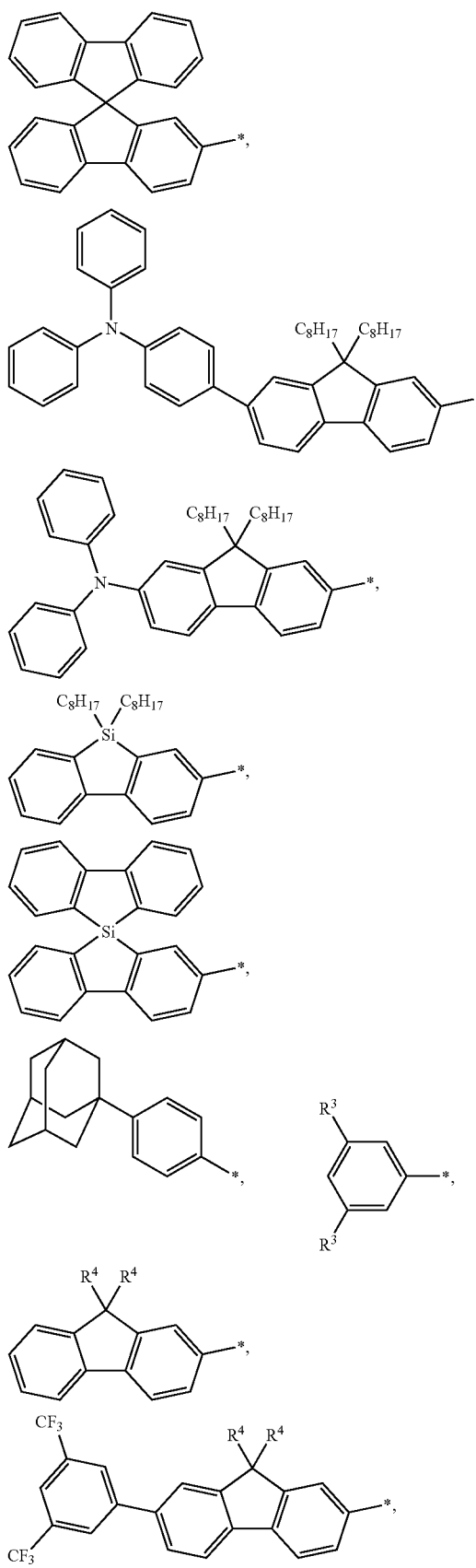

-continued

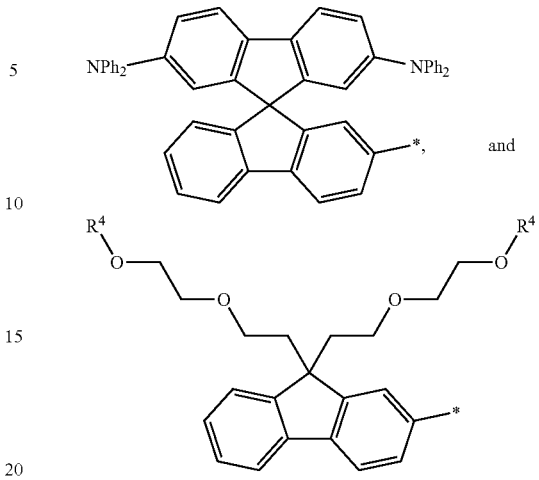

wherein
each Ph is phenyl; and
each $R^3$ is independently hydrogen, $C_{1-30}$ alkyl, $C_{6-20}$ aryl, $C_{3-20}$ heteroaryl, or $C_{1-30}$ heteroalkyl;
each $R^4$ is independently $C_{1-30}$ alkyl, $C_{6-20}$ aryl, $C_{3-20}$ heteroaryl, or $C_{1-30}$ heteroalkyl; and (b) a second compound that is selected from a light emitting material, a charge transporting material, an electron transporting material, or a combination thereof, said second compound having
  an aromatic radical that comprises the first aromatic core of the first compound, wherein the aromatic radical of the second compound can be unsubstituted, substituted with a substituent of a same type that is present on the first aromatic core of the first compound, or substituted with a substituent that is absent on the first aromatic core of the first compound;
  a second end capping group that comprises the first end capping group of the first compound, wherein the second end capping group can be unsubstituted, substituted with a substituent of a same type that is present on the first end capping group, or substituted with a substituent that is absent on the first end capping group;
  a divalent radical that comprises a divalent radical of the first end capping group of the first compound, wherein the divalent radical in the second compound can be unsubstituted, substituted with a substituent of a same type that is present on the first end capping group, or substituted with a substituent that is absent on the first end capping group; or
  a combination thereof,
wherein the composition is amorphous and solution coatable.

An additional aspect of the invention provides a composition that includes
(a) a first compound of Formula I

   I that is a light emitting material, a charge transporting material, a charge blocking material, or a combination thereof, wherein
Ar¹ is a first aromatic core and is a divalent, trivalent, or tetravalent radical of
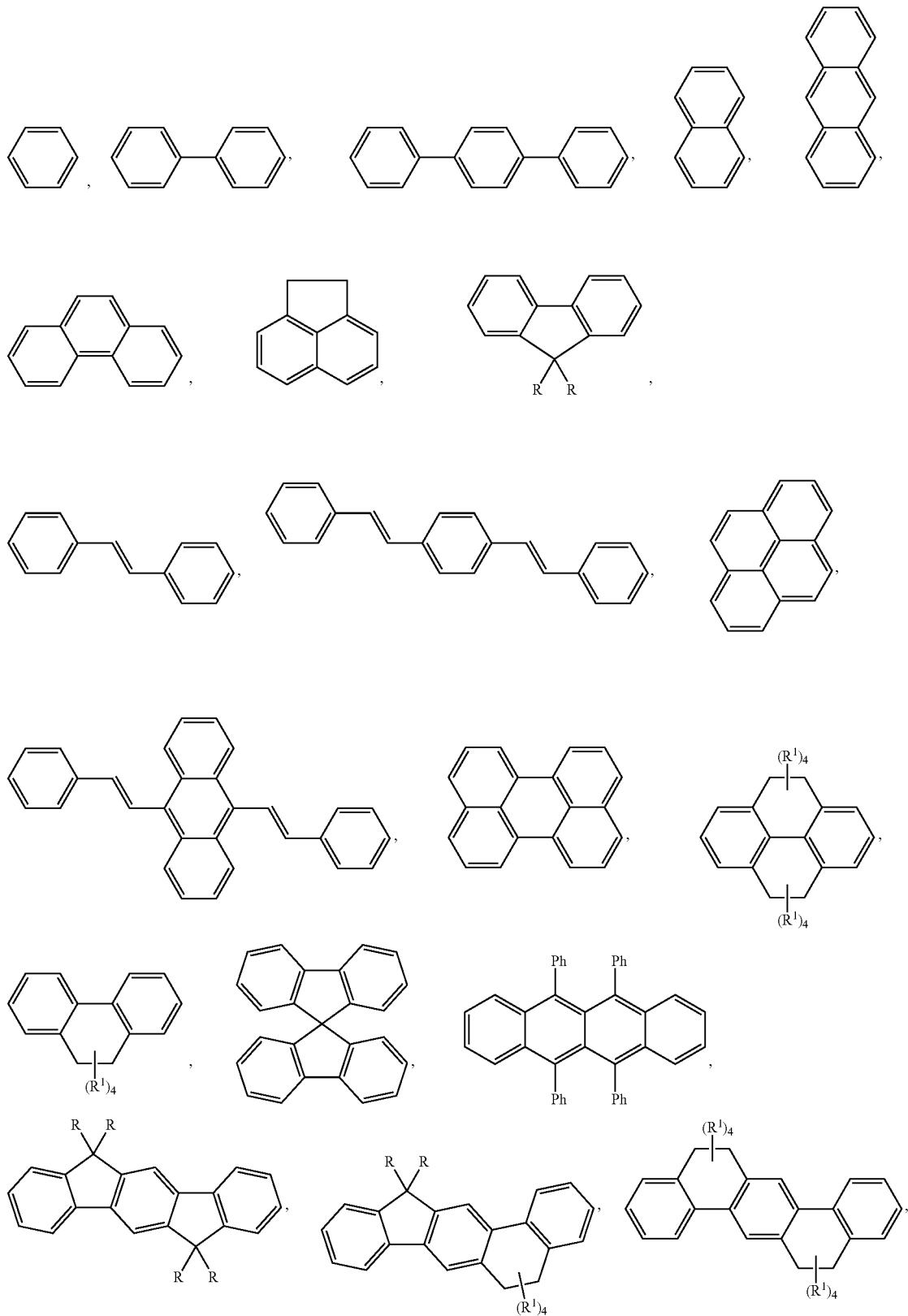

-continued
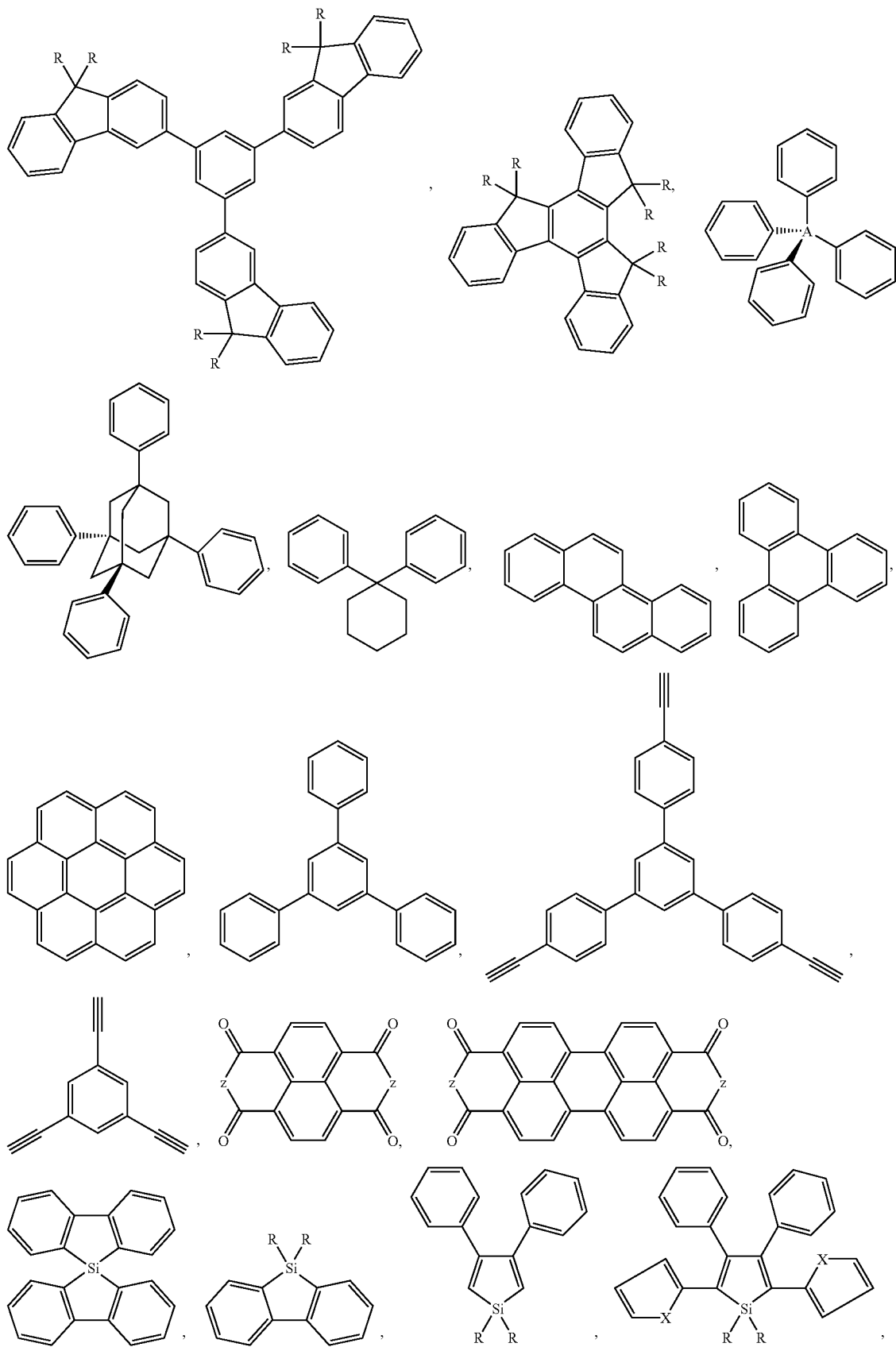

-continued
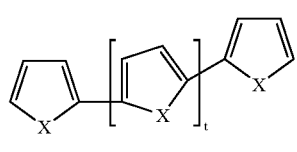 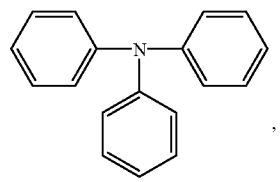 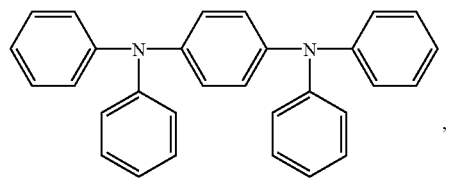
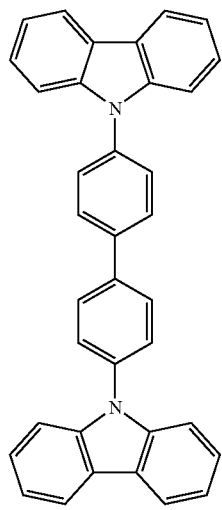 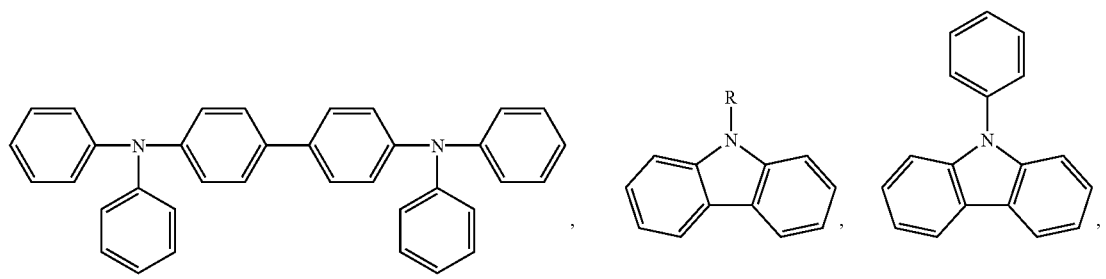
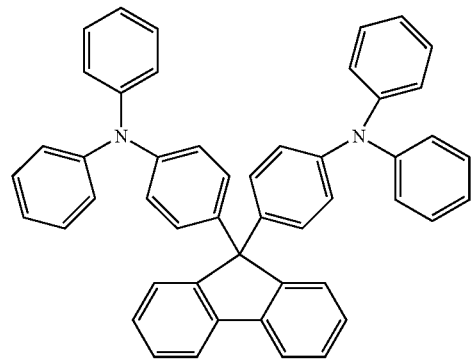
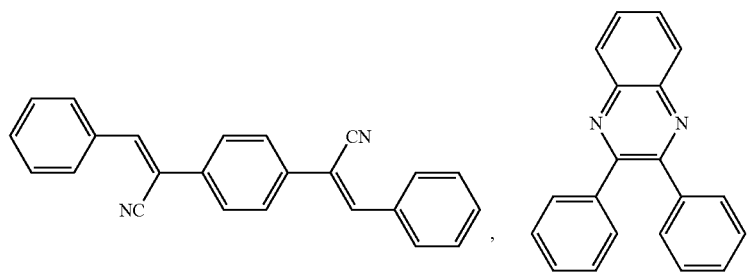
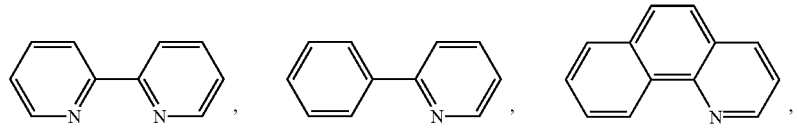
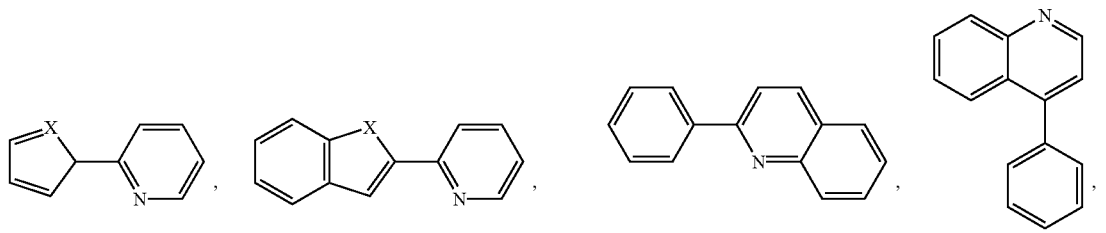

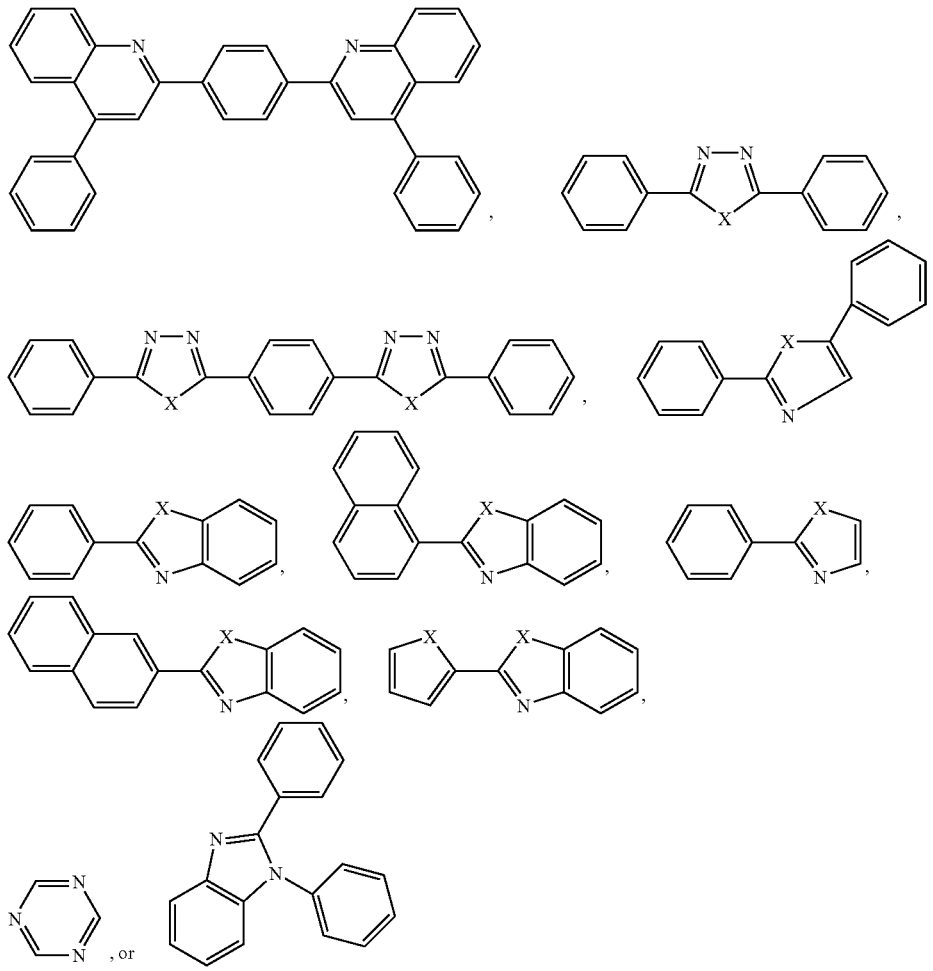

that is unsubstituted or substituted with one or more substituents selected from alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof;

EC is a first end capping group that is a $C_{6-60}$ carbocyclic aryl, a $C_{3-60}$ heteroaryl, a tertiary $C_{12-60}$ aromatic amino aryl, or a monovalent radical of a silsesquioxane that is unsubstituted or substituted with one or more substituents selected from alkyl, alkenyl, alkoxy, aryl, fluoro, fluoroalkyl, perfluoroalkyl, diarylamino, cyano, nitro, ester, heteroalkyl, heteroaryl, and combinations thereof;

n is an integer of 2 to 4, wherein the first end capping groups are identical; and each R is independently an alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;

each $R^1$ is independently a hydrogen, alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;

X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof;

A is C, Si, Ge, Pb, or Sn;

Z is NH or $CH_2$;

t is an integer of 0 to 4; and (b) a second compound that is selected from a light emitting material, a charge transporting material, an electron transporting material, or a combination thereof, said second compound having an aromatic radical that comprises the first aromatic core of the first compound, wherein the aromatic radical of the second compound can be unsubstituted, substituted with a substituent of a same type that is present on the first aromatic core of the first compound, or substituted with a substituent that is absent on the first aromatic core of the first compound;

a second end capping group that comprises the first end capping group of the first compound, wherein the second end capping group can be unsubstituted, substituted with a substituent of a same type that is present on the first end capping group, or substituted with a substituent that is absent on the first end capping group;

a divalent radical that comprises a divalent radical of the first end capping group of the first compound, wherein the divalent radical in the second compound can be unsubstituted, substituted with a substituent of a same type that is present on the first end capping group, or substituted with a substituent that is absent on the first end capping group; or a combination thereof, wherein the composition is amorphous and solution coatable.

The first compound can have two to four end capping groups. In some examples, the first compound has two end capping groups.

The second compound can have a second end capping group that includes the first end capping group or the second compound can include a divalent radical that includes a divalent radical of the first end capping group. The first end capping group can be a $C_{6-60}$ carbocyclic aryl, a $C_{3-60}$ a heteroaryl, or a $C_{12-60}$ tertiary aromatic amino aryl.

The first end capping group can be a $C_{6-60}$ carbocyclic aryl that contains phenyl, biphenyl, terphenyl, anthryl, naphthyl, acenaphthyl, phenanthryl, dihydrophenathrenyl, anthracenyl, fluorenyl, 9-silafluorenyl, tetrahydropyrenyl, perylenyl, spirobisfluorenyl, fluoranthenyl, pyrenyl, dihydropyrenyl, tetrahydropyrenyl, rubrenyl, chrysenyl, benzo[g,h,i]perylenyl or a radical thereof. The first end capping group of the first compound can be unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof.

The first end capping group can be a $C_{3-60}$ heteroaryl that contains a furanyl, thiophenyl, pyrrolyl, imidazolyl, pyrazolyl, triazolyl, tetrazolyl, thiazolyl, oxazolyl, isoxazolyl, oxadiazolyl, thiadiazolyl, isothiazolyl, pyridinyl, pyridazinyl, pyrazinyl, pyrimidinyl, quinolinyl, isoquinolinyl, benzofuranyl, benzothiophenyl, indolyl, carbazoyl, benzoxazolyl, benzothiazolyl, benzimidazolyl, cinnolinyl, quinazolinyl, quinoxalinyl, phthalazinyl, benzothiadiazolyl, benzotriazinyl, phenazinyl, phenanthridinyl, acridinyl, indazolyl, siloles, or a radical thereof. The first end capping group of the first compound can be unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof.

The first end capping group can be a $C_{12-60}$ tertiary aromatic amino aryl that contains a radical of diarylaniline, alkylcarbazole, arylcarbazole, tetraaryldiamine, starburst amine, peraryltriamine, dendridic amine, or spiroamine. The first end capping group of the first compound can be unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof.

Suitable $C_{12-60}$ tertiary aromatic amino aryl end capping groups can be radicals, for example, of N,N,N'N'-tetraarylbenzidine, N,N,N',N'-tetraaryl-1,4-phenylenediamine, N,N,N'N'-tetraaryl-2,7-diaminofluorene, N,N'-bis(3-methylphenyl)-N,N'-bis(phenyl)benzidine, N,N'-bis(1-naphthyl)-N,N'-bis(phenyl)benzidine, 1,4-bis(carbazolyl)biphenyl, 4,4',4''-tris(N,N-diarylamino)triphenylamine, 1,3,5-tris(4-diarylaminophenyl)benzene, 4,4',4''-tris(N,N-diphenylamino)triphenylamine, 4,4',4''-tris(N-3-methylphenyl-N-phenylamino)triphenylamine, or 1,3,5-tris(4-diphenylaminophenyl)benzene that can be unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof.

The end capping group of the first compound can be radical that include a silsesquioxane. Suitable silsesquioxanes can have up to 20 Si atoms. In some embodiments, the silsesquioxane has 8 Si atoms. For example, the silsesquioxane can have the formula $R_7Si_8O_{11}$ (OH) where R is a $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, and combinations thereof.

In one embodiment of a composition of the invention, the first compound is a compound according to Formula I or Formula II and has a first end capping group (e.g., the first compound can be represented, for example by the formula $Z_1$-A-$Z_1$ where A is the aromatic core and $Z_1$ are two identical end capping groups). The second compound can be polymeric or a small molecule (i.e., non-polymeric) and has a second end capping group that includes the first end capping group(e.g., the second compound has an end capping group $Z_2$; and $Z_2$ includes $Z_1$).

In a variation of this first embodiment, the first end capping group or the second end capping group has a substituent that is absent in the other moiety. In another variation, the first end capping group and the second end capping group have the same type of substituents (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the number of carbon atoms in the substituents are different.

In a second embodiment, the first compound is a compound according to Formula I or Formula II and has a first aromatic core (e.g., the first compound can be represented, for example by the formula Z-$A_1$-Z where $A_1$ is the first aromatic core and Z are two identical end capping groups). The second compound can be polymeric or a small molecule and contains a divalent, trivalent, or tetravalent radical that includes the first aromatic core (e.g., the second compound contains a radical $A_2$ and $A_2$ includes $A_1$).

In a variation of the second embodiment, the first aromatic core or the corresponding radical in the second compound has a substituent that is absent in the other moiety. In another variation, the first aromatic core and the corresponding radical in the second compound have the same type of substituents (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the number of carbon atoms in the substituents are different.

In a third embodiment, the first compound is a compound according to Formula I or Formula II and has a first end capping group (e.g., the first compound can be represented, for example, by the formula $Z_1$-A-$Z_1$ where A is the aromatic core and $Z_1$ are two identical first end capping groups). The second compound is a small molecule and has a second end capping group that includes the first end capping group (e.g., the second compound can be represented, for example, by the formula $Z_2$-B-$Z_2$ where B is the aromatic core and $Z_2$ are two identical second end capping groups; and $Z_2$ includes $Z_1$). Such a composition could be used, for example, to prepare a film that includes two small molecules with an active (i.e., electroactive or electroluminescent) aromatic core. The similar end capping groups can be used to enhance the compatibility of the two small molecules.

In a variation of the third embodiment, the first end capping group or the second end capping group can contain a substituent that is lacking in the other end capping group. In another variation, both the first and the second end capping groups can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms.

In a fourth embodiment, the composition includes a first compound according to Formula I or Formula II, a second compound that is a small molecule, and a third compound that is a light emitting polymer. The first compound has a first end capping group (e.g., the first compound can be represented, for example, by the formula $Z_1$-A-$Z_1$ where A is the aromatic core and $Z_1$ are two identical first end capping groups) and the second compound has a second end capping group that includes the first end capping group (e.g., the second compound can be represented, for example, by the formula $Z_2$-B-$Z_2$ where B is the aromatic core and $Z_2$ are two identical second end capping groups; and $Z_2$ includes $Z_1$). Such a composition could be used, for example, to prepare a film that includes a small molecule blend with a light emitting polymer where the end capping groups of the first and second compound can enhance the compatibility of the entire composition. The small molecules can include active aromatic cores.

In a variation of the fourth embodiment, the first end capping group or the second end capping group can contain a substituent that is lacking in the other end capping group. In another variation, both the first and the second end capping groups can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms.

In a fifth embodiment, the composition includes a first compound according to Formula I or Formula II, a second compound that is a small molecule, and third compound that is an electroactive polymer. The first compound has a first end capping group (e.g., the first compound can be represented, for example, by the formula $Z_1$-A-$Z_1$ where A is the aromatic core and $Z_1$ are two identical first end capping groups) and the second compound has a second end capping group that includes the first end capping group (e.g., the second compound can be represented, for example, by the formula $Z_2$-B-$Z_2$ where B is the aromatic core and $Z_2$ are two identical second end capping groups; and $Z_2$ includes $Z_1$). Such a composition could be used, for example, to prepare a film that includes a small molecule blend with an electroactive polymer where the end capping groups of the first and second compound can enhance the compatibility of the entire composition. The small molecules can include active aromatic cores.

In a variation of the fifth embodiment, the first end capping group or the second end capping group can contain a substituent that is lacking in the other end capping group. In another variation, both the first and the second end capping groups can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms.

In a sixth embodiment, the composition include a first compound according to Formula I or Formula II, a second compound that is a small molecule, and a third compound that is an inactive polymer. As used herein, the term "inactive polymer" refers to a polymer that is not electroactive and that is not a light emitting polymer. The inactive polymer can serve as a matrix for the first compound and the second compound. The first compound has a first end capping group (e.g., the first compound can be represented, for example, by the formula $Z_1$-A-$Z_1$ where A is the aromatic core and $Z_1$ are two identical first end capping groups) and the second compound has a second end capping group that includes the first end capping group (e.g., the second compound can be represented, -for example, by the formula $Z_2$-B-$Z_2$ where B is the aromatic core and $Z_2$ are two identical second end capping groups; and $Z_2$ includes $Z_1$). Such a composition could be used, for example, to prepare a film that includes a small molecule blend in an inactive polymer matrix where the end capping groups of the first and second compound can enhance the compatibility of the entire composition. The small molecules can include active aromatic cores.

In a variation of this sixth embodiment, the first end capping group or the second end capping group can contain a substituent that is lacking in the other end capping group. In another variation, both the first and the second end capping groups can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms.

In a seventh embodiment, the composition includes a first compound according to Formula I or Formula II and a second compound that is a small molecule. The first compound has a first aromatic core (e.g., the first compound can be represented, for example, by the formula Z-$A_1$-Z where $A_1$ is the first aromatic core and Z are two identical end capping groups) and the second compound contains a corresponding radical that includes the first aromatic core (e.g., the second compound can be represented, for example, by the formula Y-$A_2$-Y where $A_2$ is the second aromatic core and Y are two identical end capping groups; and $A_2$ includes $A_1$). Such a composition could be used, for example, to prepare a film that includes two small molecules with active (i.e., electroactive or electroluminescent) end capping groups. The similar aromatic cores can be used, for example, to enhance the compatibility of the two small molecules.

In a variation of the seventh embodiment, either the first aromatic core or the corresponding radical in the second compound contain a substituent that is lacking in the other moiety. In another variation, both the first aromatic core and the corresponding radical in the second compound have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof) but the substituents can contain a different number of carbon atoms.

In an eighth embodiment, the composition includes a first compound according to Formula I or Formula II, a second compound that is a small molecule, and a third compound that is a light emitting polymer. The first compound has a first aromatic core (e.g., the first compound can be represented, for example, by the formula Z-$A_1$-Z where $A_1$ is the first aromatic core and Z are two identical end capping groups) and the second compound contains a corresponding radical that includes the first aromatic core (e.g., the second compound can be represented, for example, by the formula Y-$A_2$-Y where $A_2$ is the second aromatic core and Y are two identical end capping groups; and $A_2$ includes $A_1$). Such a composition could be used, for example, to prepare a film that includes a small molecule blend with a light emitting polymer where the aromatic cores of the first and second compound can enhance the compatibility of the entire composition. The small molecules can include, for example, active end capping groups.

In a variation of the eighth embodiment, either the first aromatic core or the corresponding radical in the second compound can contain a substituent that is lacking in the other moiety. In another variation, both the first aromatic core and the corresponding radical in the second compound can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms.

In a ninth embodiment, the composition includes a first compound according to Formula I or Formula II, a second compound that is a small molecule, and a third compound that is an electroactive polymer. The first compound has a first aromatic core (e.g., the first compound can be represented, for example, by the formula $Z-A_1-Z$ where $A_1$ is the first aromatic core and Z are two identical end capping groups) and the second compound contains a corresponding radical that includes the first aromatic core (e.g., the second compound can be represented, for example, by the formula $Y-A_2-Y$ where $A_2$ is the second aromatic core and Y are two identical end capping groups; and $A_2$ includes $A_1$). Such a composition could be used, for example, to prepare a film that includes a small molecule blend with an electroactive polymer where the aromatic cores of the first and second compound can enhance the compatibility of the entire composition. The small molecules can include, for example, active end capping groups.

In a variation of the ninth embodiment, either the first aromatic core or the corresponding radical in the second compound can contain a substituent that is lacking in the other moiety. In another variation, both the first aromatic core and the corresponding radical in the second compound can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms.

In a tenth embodiment, the composition includes a first compound according to Formula I or Formula II, a second compound that is a small molecule, and a third compound that is an inactive polymer. The first compound has a first aromatic core (e.g., the first compound can be represented, for example, by the formula $Z-A_1-Z$ where $A_1$ is the first aromatic core and Z are two identical end capping groups) and the second compound contains a corresponding radical that includes the first aromatic core (e.g., the second compound can be represented, for example, by the formula $Y-A_2-Y$ where $A_2$ is the second aromatic core and Y are two identical end capping groups; and $A_2$ includes $A_1$). Such a composition could be used, for example, to prepare a film that includes a small molecule blend with an inactive polymer where the aromatic cores of the first and second compound can enhance the compatibility of the entire composition. The small molecules can include, for example, active end capping groups.

In a variation of the tenth embodiment, either the first aromatic core or the corresponding radical in the second compound can contain a substituent that is lacking in the other moiety. In another variation, both the first aromatic core and the corresponding radical in the second compound can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms.

In an eleventh embodiment, the composition includes a first compound according to Formula I or Formula II and a second compound that is a polymer. The first compound has a first aromatic core (e.g., the first compound can be represented by the formula $Z-A_1-Z$ where $A_1$ is the first aromatic core and Z are two identical end capping groups). The polymer is a reaction product of a monomer mixture that includes a first monomer that contains a radical that includes the first aromatic core (e.g., the first monomer contains a radical $A_2$; and $A_2$ includes $A_1$). Such a composition can be used, for example, to prepare a film that includes a small molecule having groups in common with a polymer. The common groups can enhance the compatibility of the compounds in the composition.

In a variation of the eleventh embodiment, either the first aromatic core or the corresponding radical in the second compound can contain a substituent that is lacking in the other moiety. In another variation, both the first aromatic core and the corresponding radical in the second compound can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms.

In a twelfth embodiment, the composition includes a first compound according to Formula I or Formula II and a second compound that is a polymer. The first compound contains a first end capping group (e.g., the first compound can be represented, for example, by a formula $Z_1-A-Z_1$ where A is the aromatic core and $Z_1$ are two identical first end capping groups). The polymer is a reaction product of a monomer mixture that includes a first monomer that contains a divalent radical that includes a divalent radical of the first end capping group (e.g., the first monomer contains $Z_2$; and $Z_2$ includes a radical of $Z_1$). Such a composition can be used, for example, to prepare a film that includes a small molecule having groups in common with a polymer. The similar groups in both the first and second compound can enhance the compatibility of the compounds in the composition.

In a variation of the twelfth embodiment, the first end capping group or the second end capping group can contain a substituent that is lacking in the other end capping group. In another variation, both end capping groups can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof) but the substituents can contain a different number of carbon atoms.

In a thirteenth embodiment, the composition includes a first compound according to Formula I or Formula II, a second compound that is a small molecule, and a polymer. The first compound has a first end capping group and a first aromatic core (e.g., the first compound can be-represented, for example, by the formula $Z_1-A-Z_1$ where A is the first aromatic core and $Z_1$ are two identical first end capping groups). The second compound has a second end capping group that includes the first end capping group $Z_1$ but a second aromatic core that is different than the first aromatic core (e.g., the second compound can be represented, for example, by the formula $Z_2-B-Z_2$ where B is the second aromatic core and $Z_2$ are two identical second end capping groups; $Z_1$ includes $Z_2$; and B does not include A). The polymer is the reaction product of a monomer mixture that includes a first monomer that contains a radical that includes the first aromatic core and a second monomer that contains a radical that includes the second aromatic core (e.g., the first monomer contains a radical $A_3$ and the second monomer contains a radical $B_3$; $A_3$ includes A; and $B_3$ includes B). Such a composition can be used, for example, to prepare a film that includes small molecules that have groups in common with a polymer formed by reacting the monomer mixture. The similar groups in both the small molecules and the similar groups between the small molecules and the polymer can enhance the compatibility of the compounds in the composition.

In a first variation of the thirteenth embodiment, the first end capping group or the second end capping group can contain a substituent that is lacking in the other end capping group. In a second variation, both end capping groups can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms. In a third variation, either the first aromatic core or the corresponding radical in the polymer can contain a substituent that is lacking in the other moiety. In a fourth variation, both the first aromatic core and the corresponding radical in the polymer can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms. In a fifth variation, either the second aromatic core or the corresponding radical in the polymer can contain a substituent that is lacking in the other moiety. In another variation, both the second aromatic core and the corresponding radical in the polymer have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms.

In a fourteenth embodiment, the composition includes a first compound according to Formula I or Formula II, a second compound that is a small molecule, and a polymer. The first compound has a first aromatic core and a first end capping group (e.g., the first compound can be represented, for example, by the formula $Z-A_1-Z$ where $A_1$ is the first aromatic core and Z are two identical first end capping groups). The second compound has a second aromatic core that includes the first aromatic core but a second end capping group that is different than the first end capping group (e.g., the second compound can be represented, for example, by the formula $Y-A_2-Y$ where $A_2$ is the second aromatic core and Y are two identical second end capping groups; and $A_2$ includes $A_1$). The polymer is the reaction product of a monomer mixture that includes a first monomer that contains a divalent radical of the first end capping group and a second monomer that contains a divalent radical of the second end capping group (e.g., the first monomer can contain the radical $Z_3$ and the second monomer can contain the radical $Y_3$; $Z_3$ includes a radical of Z; $Y_3$ includes a radical of Y). Such a composition can be used, for example, to prepare a film that includes small molecules that have groups in common with a polymer formed by reacting the monomer mixture. The similar groups between the two small molecules and the similar groups between the small molecules and the polymer can enhance the compatibility of the composition.

In a first variation of the fourteenth embodiment, the first aromatic core or the radical in the second compound can contain a substituent that is lacking in the other moiety. In a second variation, both the first aromatic core and the corresponding radical in the second compound can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms. In a third variation, either the first end capping group or the corresponding monovalent radical in the first monomer of the monomer mixture can contain a substituents that are lacking in the other moiety. In a fourth variation, both the first end capping group and the corresponding monovalent radical in the first monomer can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms. In a fifth variation, either the second end capping group or the corresponding monovalent radical in the second monomer of the monomer mixture can contain a substituent that is lacking in the other moiety. In another variation, both the second end capping group and the corresponding, monovalent radical in the second monomer can have substituents that are of the same type (e.g., alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof) but the substituents can contain a different number of carbon atoms.

The above embodiments provide examples where the first compound has two end capping groups. Similar examples include those in which the first compound has three or four end capping groups.

The above embodiments provide examples where the second compound has two end capping groups. Similar examples include those in which the second compound has only one end capping group or more than two end capping groups.

The above embodiments provide examples where the second compound has identical end capping groups. The end capping groups of the second compound can be the same or different from each other. Similar examples include those in which at least one of the end capping groups has structural similarities to the first compound.

In some examples of the first compound, there are two end capping groups attached to the aromatic core. The compounds of Formula II or compounds of Formula I where n equals two can be formed using the following reaction, for example:

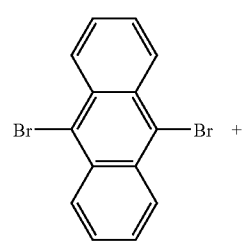

-continued

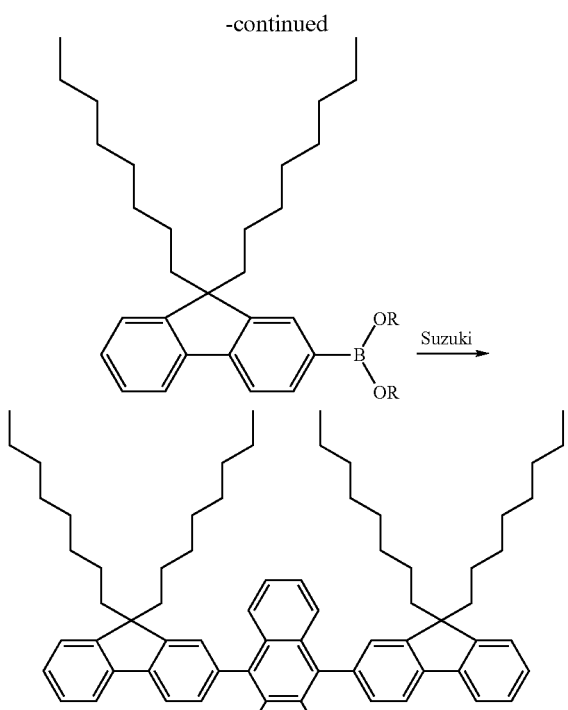

S.K. Brownstein, et al. J. Org. Chem. 2002, 67, 663

The compositions of the invention can be used to prepare organic electroluminescent devices. In some embodiments, the organic electroluminescent includes an organic emissive element that contains the compositions of the invention. That is, the organic emissive element includes a first compound that is a small molecule having a first aromatic core and two to four identical end capping groups and a second compound that has at least some structural similarities to the first compound. The second compound can be a charge transporting material, a charge blocking material, a light emitting material, a color conversion material, or a combination thereof.

In some embodiments, the organic emissive element has multiple layers. The composition of the invention can be in a light emitting layer, a charge transporting layer, a charge blocking layer, or a combination thereof.

The various layers in an organic emissive element can be formed by solution coating the layers. Light emitting layers based on LEP materials have been fabricated by solution coating a thin layer of the material as described, for example, in U.S. Pat. No. 5,408,109, incorporated herein by reference.

Another method of forming devices includes the transfer of one or more transfer layers by laser thermal patterning as described in, for example, U.S. Pat. Nos. 6,485,884; 6,242,152; 6,228,555; 6,228,543; 6,221,553; 6,221,543; 6,214,520; 6,194,119; 6,114,088; 5,998,085; 5,725,989; 5,710,097; 5,695,907; 5,693,446; U.S. Patent Publication Nos. 2003-0068525; 2003-0124265; and 2002/0158574; U.S. Pat. Nos. 6,521,324; 6,358,664; and 6,284,425; and WO02/22374; all of which are incorporated herein by reference. The patterning process can depend upon the physical properties of the transfer layer.

One parameter is the cohesive, or film strength, of the transfer layer. During imaging, the transfer layer preferably breaks cleanly along the line dividing imaged and unimaged regions to form the edge of a pattern. Highly conjugated polymers that exist in extended chain conformations, such as polyphenylenevinylenes, can have high tensile strengths and elastic moduli comparable to that of polyaramide fibers. In practice, clean edge formation during the laser thermal imaging of light emitting polymers can be challenging. The undesired consequence of poor edge formation is rough, torn, or ragged edges on the transferred pattern. Another parameter is the strength of the bond formed between the transfer layer and the receptor surface. This strength may be influenced by the solubility parameter compatibility of the transfer layer and the receptor surface.

In addition, laser thermal transfer will be used as an example of a method for forming light emitting and other layers, however, it will be recognized that other transfer, patterning, and printing techniques can be used, such as inkjet printing, screen printing, thermal head printing, and photolithographic patterning.

Referring back to FIG. 1, device layer 110 is disposed on substrate 120. Substrate 120 can be any substrate suitable for OEL device and display applications. For example, substrate 120 can include glass, clear plastic, or other suitable material(s) that are substantially transparent to visible light. Substrate 120 can also be opaque to visible light, for example stainless steel, crystalline silicon, poly-silicon, or the like. Because some materials in OEL devices can be particularly susceptible to damage due to exposure to oxygen or water, substrate 120 preferably provides an adequate environmental barrier, or is supplied with one or more layers, coatings, or laminates that provide an adequate environmental barrier.

Substrate 120 can also include any number of devices or components suitable in OEL devices and displays such as transistor arrays and other electronic devices; color filters, polarizers, wave plates, diffusers, and other optical devices; insulators, barrier ribs, black matrix, mask work and other such components; and the like. Generally, one or more electrodes will be coated, deposited, patterned, or otherwise disposed on substrate 120 before forming the remaining layer or layers of the OEL device or devices of the device layer 110. When a light transmissive substrate 120 is used and the OEL device or devices are bottom emitting, the electrode or electrodes that are disposed between the substrate 120 and the emissive material(s) are preferably substantially transparent to light, for example transparent conductive electrodes such as indium tin oxide (ITO) or any of a number of other transparent conductive oxides.

Element 130 can be any element or combination of elements suitable for use with OEL display or device 100. For example, element 130 can be an LCD module when device 100 is a backlight. One or more polarizers or other elements can be provided between the LCD module and the backlight device 100, for instance an absorbing or reflective clean-up polarizer. Alternatively, when device 100 is itself an information display, element 130 can include one or more polarizers, wave plates, touch panels, antireflective coatings, anti-smudge coatings, projection screens, brightness enhancement films, or other optical components, coatings, user interface devices, or the like.

Organic electronic devices containing materials for light emission can be made at least in part by selective thermal transfer of light emitting material from a thermal transfer donor sheet to a desired receptor substrate. For example, light emitting polymer displays and lamps can be made by coating an LEP on a donor sheet and then selectively transferring the LEP layer alone or along with other device layers or materials to the display substrate.

Figure 2:
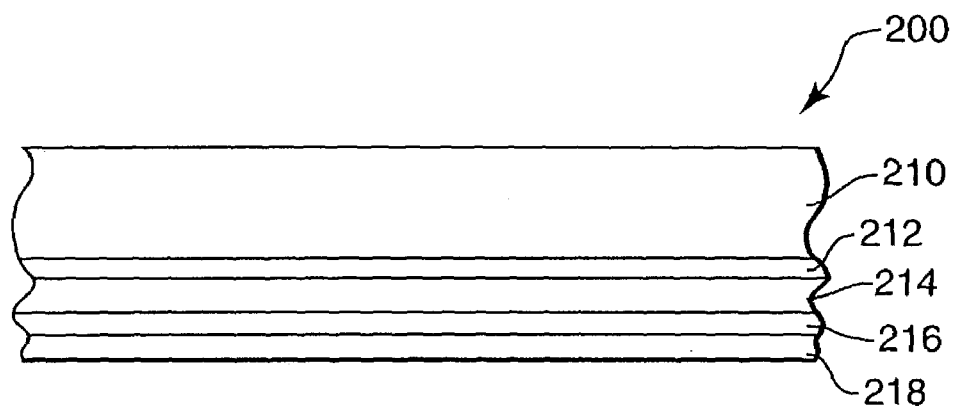
FIG. 2 is a schematic side view of a donor sheet for transferring materials.

Selective thermal transfer of layers containing light emitting materials for organic electronic devices can be performed using a thermal transfer donor. FIG. 2 shows an example of a thermal transfer donor 200 suitable for use in the present invention. Donor element 200 includes a base substrate 210, an optional underlayer 212, an optional light-to-heat conversion layer (LTHC layer) 214, an optional interlayer 216, and a transfer layer 218. Each of these elements are described in more detail in the discussion that follows. Other layers can also be present. Examples of suitable donors or layers of donors are disclosed in U.S. Pat. Nos. 6,242,152; 6,228,555; 6,228,543; 6,221,553; 6,221,543; 6,214,520; 6,194,119; 6,114,088; 5,998,085; 5,725,989; 5,710,097; 5,695,907; 5,693,446; 6,485,884; 6,358,664; 6,284.425; and 6,521.324; U.S. Publication Nos. 2003-0068525 and 2003-124265; and WO02/22374, all of which are incorporated herein by reference.

In processes of the present invention, emissive organic materials, including compositions of the invention, can be selectively transferred from the transfer layer of a donor sheet to a receptor substrate by placing the transfer layer of the donor element adjacent to the receptor and selectively heating the donor element. Illustratively, the donor element can be selectively heated by irradiating the donor element with imaging radiation that can be absorbed by light-to-heat converter material disposed in the donor, often in a separate LTHC layer, and converted into heat. In these cases, the donor can be exposed to imaging radiation through the donor substrate, through the receptor, or both. The radiation can include one or more wavelengths, including visible light, infrared radiation, or ultraviolet radiation, for example from a laser, lamp, or other such radiation source. Other selective heating methods can also be used, such as using a thermal print head or using a thermal hot stamp (e.g., a patterned thermal hot stamp such as a heated silicone stamp that has a relief pattern that can be used to selectively heat a donor). Material from the thermal transfer layer can be selectively transferred to a receptor in this manner to imagewise form patterns of the transferred material on the receptor. In many instances, thermal transfer using light from, for example, a lamp or laser, to patternwise expose the donor can be advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the donor sheet, or the materials of the donor sheet. The transferred pattern can also be controlled by irradiating the donor element through a mask.

As mentioned, a thermal print head or other heating element (patterned or otherwise) can also be used to selectively heat the donor element directly, thereby pattern-wise transferring portions of the transfer layer. In such cases, the light-to-heat converter material in the donor sheet is optional. Thermal print heads or other heating elements may be particularly suited for making lower resolution patterns of material or for patterning elements whose placement need not be precisely controlled.

Transfer layers can also be transferred from donor sheets without selectively transferring the transfer layer. For example, a transfer layer can be formed on a donor substrate that, in essence, acts as a temporary liner that can be released after the transfer layer is contacted to a receptor substrate, typically with the application of heat or pressure. Such a method, referred to as lamination transfer, can be used to transfer the entire transfer layer, or a large portion thereof, to the receptor.

The mode of thermal mass transfer can vary depending on the type of selective heating employed, the type of irradiation if used to expose the donor, the type of materials and properties of the optional LTHC layer, the type of materials in the transfer layer, the overall construction of the donor, the type of receptor substrate, and the like. Without wishing to be bound by any theory, transfer generally occurs via one or more mechanisms, one or more of which may be emphasized or de-emphasized during selective transfer depending on imaging conditions, donor constructions, and so forth. One mechanism of thermal transfer includes thermal melt-stick transfer whereby localized heating at the interface between the thermal transfer layer and the rest of the donor element can lower the adhesion of the thermal transfer layer to the donor in selected locations. Selected portions of the thermal transfer layer can adhere to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimated by heat generated in the donor element. A portion of the sublimated material can condense on the receptor. The present invention contemplates transfer modes that include one or more of these and other mechanisms whereby selective heating of a donor sheet can be used to cause the transfer of materials from a transfer layer to receptor surface.

A variety of radiation-emitting sources can be used to heat donor sheets. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geq 100$ mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 $J/cm^2$ or more. Other radiation sources and irradiation conditions can be suitable based on, among other things, the donor element construction, the transfer layer material, the mode of thermal mass transfer, and other such factors.

When high spot placement accuracy is desired (e.g., when patterning elements for high information content displays and other such applications) over large substrate areas, a laser can be particularly useful as the radiation source. Laser sources are also compatible with both large rigid substrates (e.g., 1 m×1 m×1.1 mm glass) and continuous or sheeted film substrates (e.g., 100 μm thick polyimide sheets).

During imaging, the donor sheet can be brought into intimate contact with a receptor (as might typically be the case for thermal melt-stick transfer mechanisms) or the donor sheet can be spaced some distance from the receptor (as can be the case for ablative transfer mechanisms or material sublimation transfer mechanisms). In at least some instances, pressure or vacuum can be used to hold the donor sheet in intimate contact with the receptor. In some instances, a mask can be placed between the donor sheet and the receptor. Such a mask can be removable or can remain on the receptor after transfer. If a light-to-heat converter material is present in the donor, radiation source can then be used to heat the LTHC layer (or other layer(s) containing radiation absorber) in an imagewise fashion (e.g., digitally or by analog exposure through a mask) to perform imagewise transfer or patterning of the transfer layer from the donor sheet to the receptor.

Typically, selected portions of the transfer layer are transferred to the receptor without transferring significant portions of the other layers of the donor sheet, such as the optional interlayer or LTHC layer. The presence of the optional interlayer may eliminate or reduce the transfer of material from an LTHC layer to the receptor or reduce distortion in the transferred portion of the transfer layer. Preferably, under imaging conditions, the adhesion of the optional interlayer to the LTHC layer is greater than the adhesion of the interlayer to the transfer layer. The interlayer can be transmissive, reflective, or absorptive to imaging radiation, and can be used to attenuate or otherwise control the level of imaging radiation transmitted through the donor or to manage temperatures in the donor, for example to reduce thermal or radiation-based damage to the transfer layer during imaging. Multiple interlayers can be present.

Large donor sheets can be used, including donor sheets that have length and width dimensions of a meter or more. In operation, a laser can be rastered or otherwise moved across the large donor sheet, the laser being selectively operated to illuminate portions of the donor sheet according to a desired pattern. Alternatively, the laser may be stationary and the donor sheet or receptor substrate moved beneath the laser.

In some instances, it may be necessary, desirable, or convenient to sequentially use two or more different donor sheets to form electronic devices on a receptor. For example, multiple layer devices can be formed by transferring separate layers or separate stacks of layers from different donor sheets. Multilayer stacks can also be transferred as a single transfer unit from a single donor element. For example, a hole transport layer and a light emitting layer can be co-transferred from a single donor. As another example, a semiconductive polymer and a light emitting layer can be co-transferred from a single donor. Multiple donor sheets can also be used to form separate components in the same layer on the receptor. For example, three different donors that each have a transfer layer comprising a light emitting layer capable of emitting a different color (for example, red, green, and blue) can be used to form RGB sub-pixel OEL devices for a full color polarized light emitting electronic display. As another example, a conductive or semiconductive polymer can be patterned via thermal transfer from one donor, followed by selective thermal transfer of emissive layers from one or more other donors to form a plurality of OEL devices in a display. As still another example, layers for organic transistors can be patterned by selective thermal transfer of electrically active organic materials (oriented or not), followed by selective thermal transfer patterning of one or more pixel or sub-pixel elements such as color filters, emissive layers, charge transport layers, electrode layers, and the like.

Materials from separate donor sheets can be transferred adjacent to other materials on a receptor to form adjacent devices, portions of adjacent devices, or different portions of the same device. Alternatively, materials from separate donor sheets can be transferred directly on top of, or in partial overlying registration with, other layers or materials previously patterned onto the receptor by thermal transfer or some other method (e.g., photolithography, deposition through a shadow mask, etc.). A variety of other combinations of two or more donor sheets can be used to form a device, each donor sheet forming one or more portions of the device. It will be understood that other portions of these devices, or other devices on the receptor, may be formed in whole or in part by any suitable process including photolithographic processes, ink jet processes, and various other printing or mask-based processes, whether conventionally used or newly developed.

Referring back to FIG. 2, various layers of the donor sheet 200 will now be described.

The donor substrate 210 can be a polymer film. One suitable type of polymer film is a polyester film, for example, polyethylene terephthalate (PET) or polyethylene naphthalate (PEN) films. However, other films with sufficient optical properties, including high transmission of light at a particular wavelength, or sufficient mechanical and thermal stability properties, depending on the particular application, can be used. The donor substrate, in at least some instances, is flat so that uniform coatings can be formed thereon. The donor substrate is also typically selected from materials that remain stable despite heating of one or more layers of the donor. However, as described below, the inclusion of an underlayer between the substrate and an LTHC layer can be used to insulate the substrate from heat generated in the LTHC layer during imaging. The typical thickness of the donor substrate ranges from 0.025 to 0.15 mm, preferably 0.05 to 0.1 mm, although thicker or thinner donor substrates may be used.

The materials used to form the donor substrate and an optional adjacent underlayer can be selected to improve adhesion between the donor substrate and the underlayer; to control heat transport between the substrate and the underlayer, to control imaging radiation transport to the LTHC layer, to reduce imaging defects and the like. An optional priming layer can be used to increase uniformity during the coating of subsequent layers onto the substrate and also increase the bonding strength between the donor substrate and adjacent layers.

An optional underlayer 212 may be coated or otherwise disposed between a donor substrate and the LTHC layer, for example to control heat flow between the substrate and the LTHC layer during imaging or to provide mechanical stability to the donor element for storage, handling, donor processing, or imaging. Examples of suitable underlayers and methods of providing underlayers are disclosed in U.S. Pat. No. 6,284,425, incorporated herein by reference The underlayer can include materials that impart desired mechanical or thermal properties to the donor element. For example, the underlayer can include materials that exhibit a low specific heat x density or low thermal conductivity relative to the donor substrate. Such an underlayer may-be used to increase heat flow to the transfer layer, for example to improve the imaging sensitivity of the donor.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, which might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation or reflection of imaging radiation by the underlayer may be used to control heat generation during imaging.

Referring again to FIG. 2, an LTHC layer 214 can be included in donor sheets of the present invention to couple irradiation energy into the donor sheet. The LTHC layer preferably includes a radiation absorber that absorbs incident radiation (e.g., laser light) and converts at least a portion of the incident radiation into heat to enable transfer of the transfer layer from the donor sheet to the receptor.

Generally, the radiation absorber(s) in the LTHC layer absorb light in the infrared, visible, or ultraviolet regions of the electromagnetic spectrum and convert the absorbed radiation into heat. The radiation absorber(s) are typically highly absorptive of the selected imaging radiation, providing an LTHC layer with an optical density at the wavelength of the imaging radiation in the range of about 0.2 to 3 or higher. Optical density of a layer is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in U.S. Pat. No. 6,228,555, non-homogeneous LTHC layers can be used to control temperature profiles in donor elements. This can give rise to donor sheets that have improved transfer properties (e.g., better fidelity between the intended transfer patterns and actual transfer patterns).

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers includes carbon black, metal oxides, and metal sulfides. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 µm or less, and may be about 1 µm or less. Suitable dyes include those dyes that absorb in the IR region of the spectrum. A specific dye may be chosen based on factors such as, solubility in, and compatibility with, a specific binder or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617. Additionally, black azo pigments based on copper or chromium complexes of, for example, pyrazolone yellow, dianisidine red, and nickel azo yellow can be useful. Inorganic pigments can also be used, including, for-example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, or as films, as disclosed in U.S. Pat. No. 5,256,506. Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers or oligomers with optional polymer.

The inclusion of a thermoplastic resin (e.g., polymer) may improve, in at least some instances, the performance (e.g., transfer properties or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer can be coated, in at least some instances, to a thickness of 0.05 µm to 20 µm, preferably, 0.5 µm to 10 µm, and, more preferably, 1 µm to 7 µm. An inorganic LTHC layer can be coated, in at least some instances, to a thickness in the range of 0.0005 to 10 µm, and preferably, 0.001 to 1 µm.

Referring again to FIG. 2, an optional interlayer 216 may be disposed between the LTHC layer 214 and transfer layer 218. The interlayer can be used, for example, to minimize damage and contamination of the transferred portion of the transfer layer and may also reduce distortion in the transferred portion of the transfer layer. The interlayer may also influence the adhesion of the transfer layer to the rest of the donor sheet. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater. In some embodiments, the interlayer includes a thermoplastic material that has a $T_g$ greater than any temperature attained in the transfer layer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material and properties of the LTHC layer, the material and properties of the transfer layer, the wavelength of the imaging radiation, and the duration of exposure of the donor sheet to imaging radiation. For polymer interlayers, the thickness of the interlayer typically is in the range of 0.05 µm to 10 µm. For inorganic interlayers (e.g., metal or metal compound interlayers); the thickness of the interlayer typically is in the range of 0.005 µm to 10 µm.

Referring again to FIG. 2, a thermal transfer layer 218 is included in donor sheet 200. Transfer layer 218 can include any suitable material or materials, disposed in one or more layers, alone or in combination with other materials. Transfer layer 218 is capable of being selectively transferred as a unit or in portions by any suitable transfer mechanism when the donor element is exposed to direct heating or to imaging radiation that can be absorbed by light-to-heat converter material and converted into heat.

The present invention contemplates a transfer layer that includes a composition of the invention. The composition of the invention can be in a light emitting layer, a charge transfer layer, a charge blocking layer, a color conversion layer, or a combination thereof. The transfer layer includes a small molecule according to Formula I or Formula II in combination with a second compound that has at least some structural similarities to the first compound and that is a light emitting material, a charge blocking material, a charge transporting material, a color conversion material, or a combination thereof.

One way of providing the transfer layer is by solution coating the light emitting material onto the donor. In this method, the compositions of the invention can be solubilized by addition of a suitable compatible solvent, and coated onto the alignment layer by spin-coating, gravure coating, Mayer rod coating, knife coating and the like. The solvent chosen preferably does not undesirably interact with (e.g., swell or dissolve) any of the already existing layers in the donor sheet. The coating can then be annealed and the solvent evaporated to leave a transfer.

The transfer layer can then be selectively thermally transferred from the donor element to a proximately located receptor substrate. There can be, if desired, more than one transfer layer so that a multilayer construction is transferred using a single donor sheet. The receptor substrate may be any item suitable for a particular application including, but not limited to, glass, transparent films, reflective films, metals, semiconductors, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of suitable rigid receptors include glass and rigid plastic that are coated or patterned with indium tin oxide or are circuitized with low temperature poly-silicon (LTPS) or other transistor structures, including organic transistors.

Suitable flexible substrates include substantially clear and transmissive polymer films, reflective films, transflective films, polarizing films, multilayer optical films, and the like. Flexible substrates can also be coated or patterned with electrode materials or transistors, for example transistor arrays formed directly on the flexible substrate or transferred to the flexible substrate after being formed on a temporary carrier substrate. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports. For making OELs on plastic substrates, it is often desirable to include a barrier film or coating on one or both surfaces of the plastic substrate to protect the organic light emitting devices and their electrodes from exposure to undesired levels of water, oxygen, and the like.

Receptor substrates can be pre-patterned with any one or more of electrodes, transistors, capacitors, insulator ribs, spacers, color filters, black matrix, hole transport layers, electron transport layers, and other elements useful for electronic displays or other devices.

Figure 3:
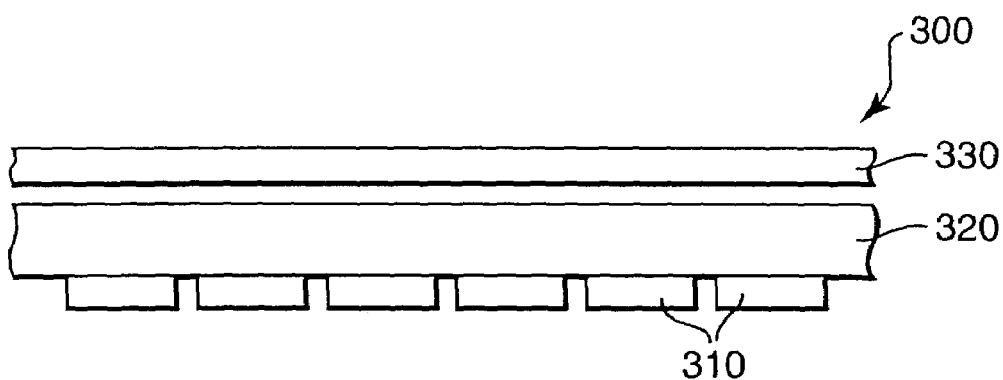
FIG. 3 is a schematic side view of an organic electroluminescent display.
Figure 4A:
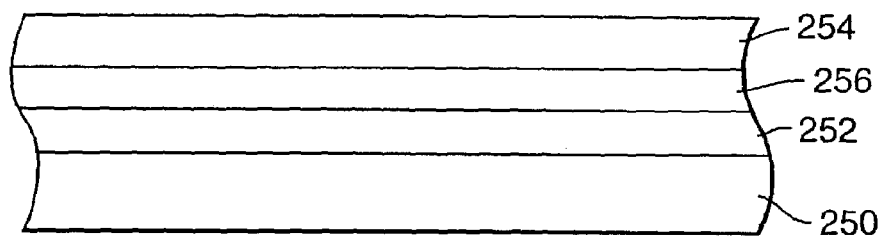
FIG. 4A is a schematic side view of a first embodiment of an organic electroluminescent device.
Figure 4B:
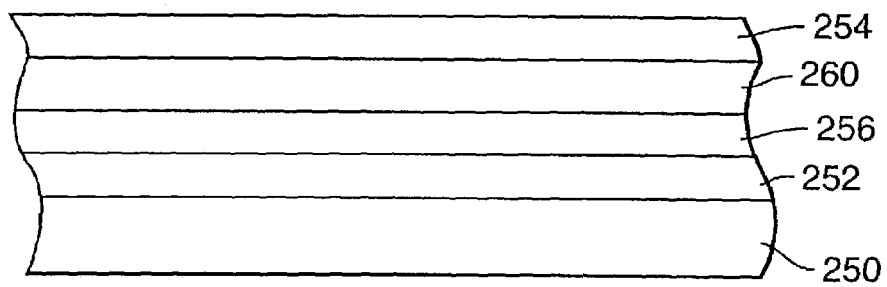
FIG. 4B is a schematic side view of a second embodiment of an organic electroluminescent device.
Figure 4C:
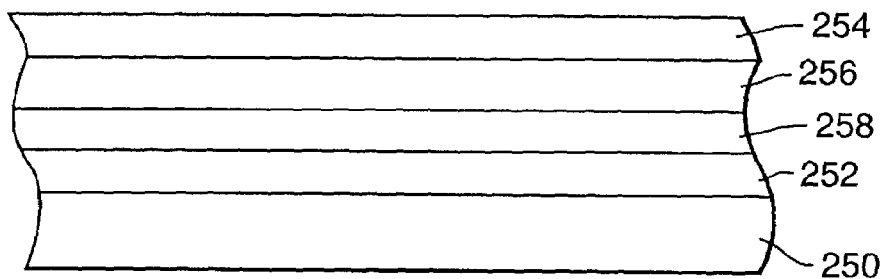
FIG. 4C is a schematic side view of a third embodiment of an organic electroluminescent device.
Figure 4D:
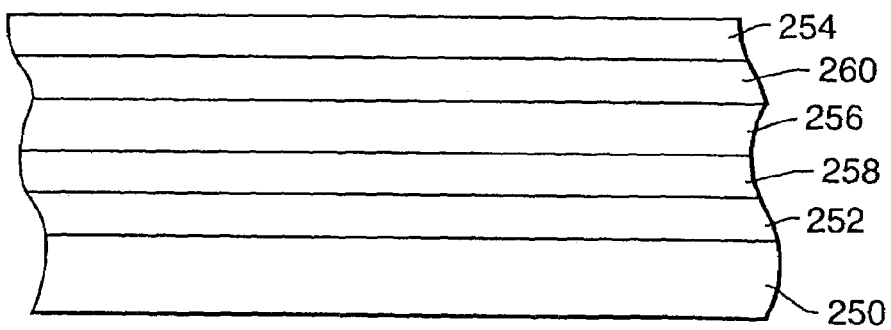
FIG. 4D is a schematic side view of a fourth embodiment of an organic electroluminescent device.

The present invention contemplates light emitting OEL displays and devices. In one embodiment, OEL displays can be made that emit light and that have adjacent devices that can emit light having different color. For example, FIG. 3 shows an OEL display 300 that includes a plurality of OEL devices 310 disposed on a substrate 320. Adjacent devices 310 can be made to emit different colors of light.

The separation shown between devices 310 is for illustrative purposes only. Adjacent devices may be separated, in contact, overlapping, etc., or different combinations of these in more than one direction on the display substrate. For example, a pattern of parallel striped transparent conductive anodes can be formed on the substrate followed by a striped pattern of a hole transport material and a striped repeating pattern of red, green, and blue light emitting layers, followed by a striped pattern of cathodes, the cathode stripes oriented perpendicular to the anode stripes. Such a construction may be suitable for forming passive matrix displays. In other embodiments, transparent conductive anode pads can be provided in a two-dimensional pattern on the substrate and associated with addressing electronics such as one or more transistors, capacitors, etc., such as are suitable for making active matrix displays. Other layers, including the light emitting layer(s) can then be coated or deposited as a single layer or can be patterned (e.g., parallel stripes, two-dimensional pattern commensurate with the anodes, etc.) over the anodes or electronic devices. Any other suitable construction is also contemplated by the present invention.

In one embodiment, display 300 can be a multiple color display. As such, it may be desirable to position optional polarizer 330 between the light emitting devices and a viewer, for example to enhance the contrast of the display. In exemplary embodiments, each of the devices 310 emits light. There are many displays and devices constructions covered by the general construction illustrated in FIG. 3. Some of those constructions are discussed as follows.

OEL backlights can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include white or single color large area single pixel lamps, for example where an emissive material is provided by thermal stamp transfer, lamination transfer, resistive head thermal printing, or the like; white or single color large area single electrode pair lamps that have a large number of closely spaced emissive layers patterned by laser induced thermal transfer; and tunable color multiple electrode large area lamps.

Low resolution OEL displays can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include graphic indicator lamps (e.g., icons); segmented alphanumeric displays (e.g., appliance time indicators); small monochrome passive or active matrix displays; small monochrome passive or active matrix displays plus graphic indicator lamps as part of an integrated display (e.g., cell phone displays); large area pixel display tiles (e.g., a plurality of modules, or tiles, each having a relatively small number of pixels), such as may be suitable for outdoor display used; and security display applications.

High resolution OEL displays can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include active or passive matrix multicolor or full color displays; active or passive matrix multicolor or full color displays plus segmented or graphic indicator lamps (e.g., laser induced transfer of high resolution devices plus thermal hot stamp of icons on the same substrate); and security display applications.

EXAMPLES

Examples 1-20 describe the synthesis of compounds of the invention and intermediates used in making them. All reagents were purchased from Aldrich Chemical Company unless other wise specified. All compounds were characterized by $^1$H-NMR and found to correspond to the structures shown.

Example 1

Synthesis of 2,7-dibromo-9,9-dioctyl-fluorene (1).

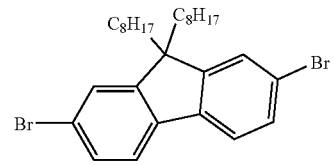

2,7-dibromo-9,9-dioctyl-fluorene (1) was synthesized by methods described by M. Ranger and M. Leclerc in *Can. J. Chem.* 1998, 1571-1577, incorporated herein by reference.

Example 2

Synthesis of 2,7-bis(4,4,5,5-tetramethyl-1,3,2-dioxaborolan-2-yl)-9,9-dioctylfluorene (2).

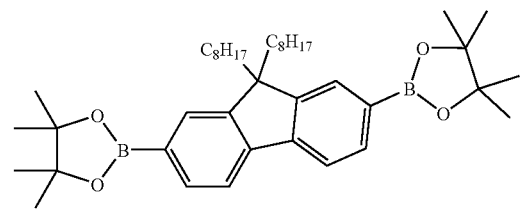

2,7-bis(4,4,5,5-tetramethyl-1,3,2-dioxaborolan-2-yl)-9,9-dioctylfluorene (2) was synthesized from 2,7-dibromo-9,9-dioctyl-fluorene (1) by methods described by M. Ranger and M. Leclerc in *Chem. Commun.* 1997, 1597-1598, incorporated herein by reference.

Example 3

Synthesis of 2,7-dibromo-9,9-bis(3,6-dioxaheptyl)-fluorene (3).

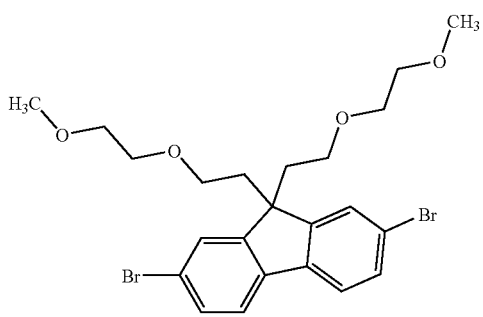

Benzyltriethylammonium chloride (3.19 g, 14 mmole, 0.077 eq) and 2,7-dibromofluorene (59 g, 182 mmole, 1 equiv.) were suspended in 178 mL DMSO. 50% aqueous NaOH 80 mL was added. 1-Bromo-2-(2-methoxyethoxy)ethane (80 g, 437 mmole, 2.4 equiv.) was then added in small portions. The reaction was stirred at room temperature for 2 hours before it was stopped and the aqueous layer was extracted with ether. The combined ether layers were washed with water five times and dried over $Na_2SO_4$. The organic layer was filtered, evaporated to dryness and the residual was flash chromatographed on a silica-gel column to give the pure compound 3 (73 g), in a yield of 86%.

Example 4

Synthesis of 2,7-dibromo-9,9-bis(3,6-dioxahexyl-6-phenyl)-fluorene (4).

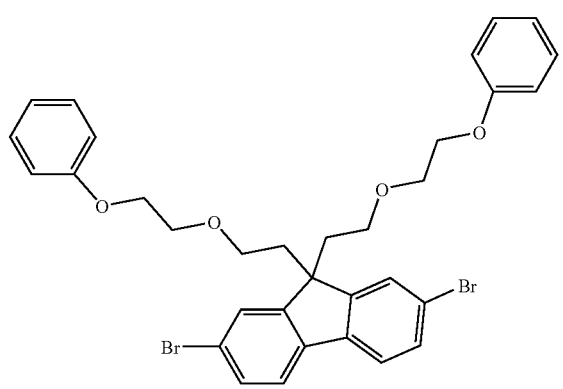

$PhO(CH_2)_2O(CH_2)_2I$ was first synthesized according to methods described by J. Otera, T. Shiomi, K. Murakami and Y. Kawasaki in *Bull. Chem. Soc. Jpn.*, 1981, 2964-2967, incorporated herein by reference.

2,7-Dibromo-9,9-bis(3,6-dioxahexyl-6-phenyl)-fluorene (4) was then synthesized from $PhO(CH_2)_2O(CH_2)_2I$ and 2,9-dibromofluorene following the general procedure outlined in Example 3.

Example 5

Synthesis of 4,7-dibromobenzo[1,2,5]thiadiazole (5)

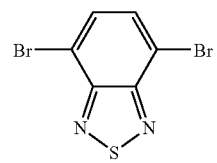

4,7-dibromobenzo[1,2,5]thiadiazole (5) was synthesized by methods described by K. Pilgram, M. Zupan and R. Skiles in *J. Heterocycl. Chem.* 1970, 7, 629-633, incorporated herein by reference.

Example 6

Synthesis of 3,9-dibromo-perylene and 3,10-dibromo-perylene (6)

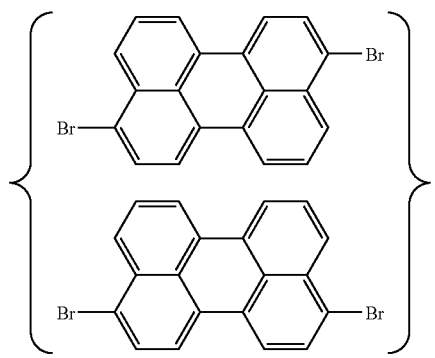

3,9-dibromo-perylene and 3,10-dibromo-perylene (6) were synthesized as a mixture by methods described by A. Zinke and H. Troger in *Chem. Ber.* in 1941, 74, 107-112, incorporated herein by reference.

Example 7

Synthesis of 3,6-Dibromo-9-phenylcarbazole (7)

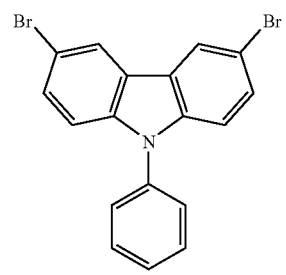

3,6-Dibromo-9-phenylcarbazole (7) was synthesized by the methods described by M. Park, J. R. Buck, C. J. Rizzo and J. Carmelo, in *Tetrahedron* 1998, 42, 12707-12714, incorporated herein by reference.

Example 8

Synthesis of 9-Phenyl-3,6-bis(4,4,5,5-tetramethyl-1,3,2-dioxaborolan-2-yl)-9H-carbazole (8).

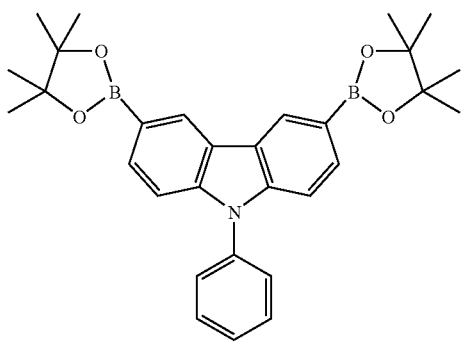

A 2L flask was charged with 600 mL dry THF and 3,6-dibromo-9-phenylcarbazole (7) (60 g, 0.15 mole). This was cooled to −78° C. with an acetone-dry ice bath. n-Butyllithium (138 mL of a 2.5M solution in hexanes, 0.34 mole) was added drop-wise via syringe. The reaction was stirred for 20 minutes and then warmed to −50° C. The temperature was reduced to −78° C. and 2-isopropoxy-4,4,5,5-tetramethyl-1,3,2-dioxaborolane (64 g, 0.34 mole) added via syringe at such a rate as to maintain the temperature below −60° C. The temperature was maintained at −78° C. for two hours and then poured into an aqueous solution of ammonium acetate (90 g in 2100 mL water). The layers were phase separated and the aqueous phase extracted with methyl-t-butyl ether (2×200 mL). The combined organic phase and extracts were washed with brine (2×200 mL) and dried over magnesium sulfate. Concentration and re-crystallization of the solid obtained from acetone gave pure 9-phenyl-3,6-bis(4,4,5,5-tetramethyl-1,3,2-dioxaborolan-2-yl)-9H-carbazole (8)

Example 9

Synthesis of 2-Bromo-9,9-dioctylfluorene (9).

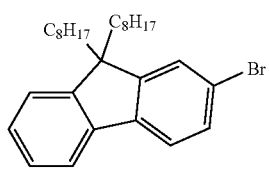

A 3L flask fitted with a mechanical stirrer was charged with 2-bromofluorene (45 g, 183.6 mmole) and 150 mL DMSO. Under a $N_2$ atmosphere was added 80 mL of a 50% aqueous NaOH solution and 2.72 g of benzyl triethylammonium chloride (2.72 g, 11.98 mmole). This was stirred for 2 h at RT. With vigorous mechanical stirring, n-octylbromide (84.96 g, 440 mmole) was added via a dropping funnel (exotherm). Stirring was continued for 2 h. To the reaction mixture was added 500 mL of a 1:1 mixture of water/ether and the organic layer separated and washed successively with brine and then water. Drying over magnesium sulfate and evaporation of the solvent gave an oil. Purification by column chromatography (silica gel; hexane as the mobile phase) gave 67 g (78% yield) of 2-bromo-9,9-dioctylfluorene (9) as a pale oil.

Example 10

Synthesis of 2-(4,4,5,5-tetramethyl-1,3,2-dioxaborolan-2-yl)-9,9-dioctylfluorene (10).

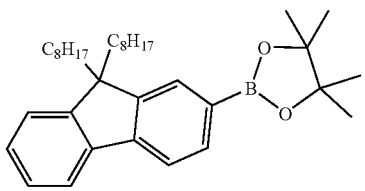

2-(4,4,5,5-Tetramethyl-1,3,2-dioxaborolan-2-yl)-9,9-dioctylfluorene (10) was synthesized from 2-bromo-9,9-dioctyl-fluorene (9) by methods described by M. Ranger and M. Leclerc in *Chem. Commun.* 1997, 1597-1598, incorporated herein by reference.

Example 11

Synthesis of 4-bromo-N,N-diphenylaniline (11)

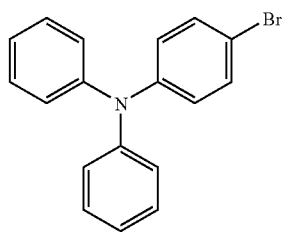

4-Bromo-N,N-diphenylaniline was synthesized according to methods described by S. C. Creason, J. W. Wheeler and R. F. Nelson in *J. Org. Chem.* 1972, 37, 4440-4446, incorporated herein by reference.

Example 12

Synthesis of 4-[9,9-dioctyl-7-(4,4,5,5-tetramethyl-1,3,2-dioxaborolan-2-yl)-9H-fluoren-2-yl]-N,N-diphenylaniline (12).

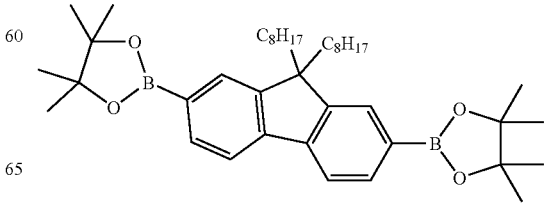

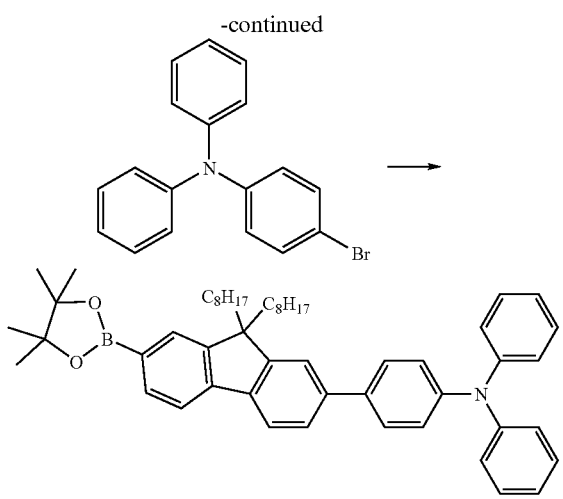

4-Bromo-N,N-diphenylaniline (11) (19.44 g, 60 mmole, 1 equiv), 2-[9,9-dioctyl-7-(4,4,5,5-tetramethyl-1,3,2-dioxaborolan-2-yl)-9H-fluoren-2-yl]-4,4,5,5-tetramethyl-1,3,2-dioxaborolane (2) (76.9 g, 120 mmole, 2 equiv), Aliquat® 336 (6 g, 15 mmole, 0.25 equiv) and 2M sodium carbonate solution (75 mL, 150 mmole, 2.5 equiv) were added to 600 mL of toluene. This was purged with a stream of nitrogen for about 30 min. Under a nitrogen purge, tetrakis(triphenylphosphine)palladium (348 mg, 0.30 mmole, 0.005 equiv) was added. The reaction mixture was then refluxed for 16 hrs. The reaction was cooled to RT and water added. The organic layer was separated and washed with water followed by brine. Drying of the organic layer over $Na_2SO_4$ and evaporation of the solvent gave a light yellow solid. This was suspended in acetone and the mixture brought to reflux and then allowed to stand at RT overnight. Filtration of the solid and concentration of the filtrate gave a solid that was subjected to column chromatography (toluene/hexane 3:7) to give 4-[9,9-dioctyl-7-(4,4,5,5-tetramethyl-1,3,2-dioxaborolan-2-yl)-9H-fluoren-2-yl]-N,N-diphenylaniline (12).

Example 13

Synthesis of 2-{7-[3,5-bis(trifluoromethyl)phenyl]-9,9-dioctyl-9H-fluoren-2-yl}-4,4,5,5-tetramethyl-1,3,2-dioxaborolane (13a) and 2,7-bis[3,5-bis(trifluoromethyl)phenyl]-9,9-dioctyl-9H-fluorene (13b).

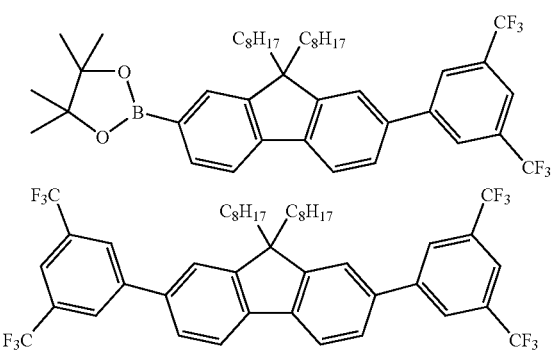

3,5-Bistrifluoromethylbromobenzene (0.293 g, 1 mmole, 1 equiv), 2,7-bis(4,4,5,5-tetramethyl-1,3,2-dioxaborolan-2-yl)-9,9-dioctylfluorene (2) (1.28 g, 2 mmole, 2 equiv), Aliquat® 336 (0.15 g, 0.375 mmole, 0.25 equiv) and 2M sodium carbonate solution (1.25 mL, 2.5 mmole, 2.5 equiv) were added to 10 mL of toluene. This was purged with a stream of nitrogen for about 30 min. Under a nitrogen purge, tetrakis(triphenylphosphine)palladium (14 mg, 0.012 mmole, 0.012 equiv) was added. The reaction mixture was then refluxed for 16 hrs. The reaction was cooled to RT and water added. The organic layer was separated and washed with water followed by brine. Drying of the organic layer over $Na_2SO_4$ and evaporation of the solvent gave a light yellow solid. The solid was dissolved in ether, and a small portion of it was applied on a silica prep TLC. The TLC plate was eluted with 1:1 toluene: hexane to give three distinctive bands. The middle band was collected and was determined to be 2-{7-[3,5-bis(trifluoromethyl)phenyl]-9,9-dioctyl-9H-fluoren-2-yl}-4,4,5,5-tetramethyl-1,3,2-dioxaborolane (3a) obtained as a light yellow oil (28 mg). $^1H$ NMR: δ0.53-0.69 (m, 4H), 0.78 (t, 6H), 0.96-1.29 (m, 20H), 1.40 (s, 12H), 1.97-2.11 (m, 4H), 7.52, (s, 1H), 7.56 (d, 1H), 7.72-7.80 (m, 2H), 7.80-7.88 (m, 3H), 8.05 (s, 2H). The fast-running band was collected and was determined to be the by-product 2,7-bis[3,5-bis(trifluoromethyl)phenyl]-9,9-dioctyl-9H-fluorene (13b) obtained as a light yellow oil (8 mg). $^1H$ NMR: δ0.51-0.65 (m, 4H), 0.70 (t, 6H), 0.91-1.26 (m, 20H), 1.98-2.11 (m, 4H), 7.49, (s, 2H), 7.56 (d, 2H), 7.80 (d, 4H), 8.00 (s, 4H).

Example 14

Synthesis of 2-bromo-9,9-bis(3,6-dioxaheptyl)-fluorene (14).

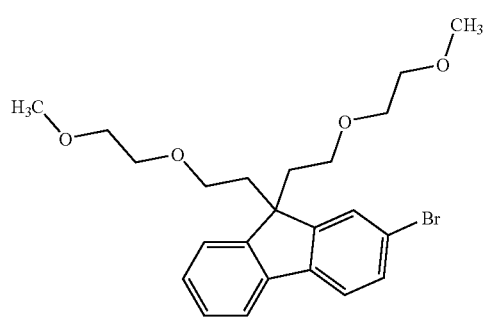

2-Bromo-9,9-bis(3,6-dioxaheptyl)-fluorene (14) was synthesized from bromo-2-(2-methoxyethoxy)ethane and 2-bromofluorene following the general procedure outlined in Example 3.

Example 15

Synthesis of 2-bromo-9,9-bis(3,6-dioxahexyl-6-phenyl)-fluorene (15).

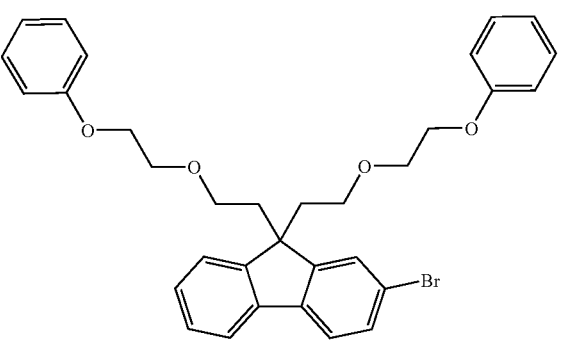

2-Bromo-9,9-bis(3,6-dioxahexyl-6-phenyl)-fluorene (15) was synthesized from PhO(CH$_2$)$_2$O(CH$_2$)$_2$I and 2-bromofluorene following the general procedure outlined in Example 3.

Example 16

Synthesis of 4,7-Bis-(9,9-dioctyl-9H-fluoren-2-yl)-benzo[1,2,5]thiadiazole (16).

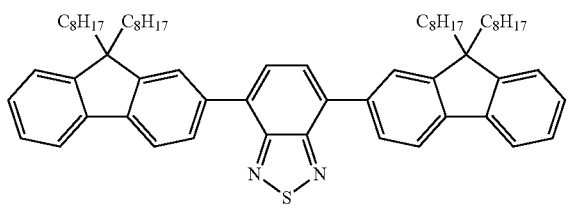

Into a flask was introduced 100 mL of toluene, 8.77 g of 2-(4,4,5,5-tetramethyl-1,3,2-dioxaborolan-2-yl)-9,9-dioctylfluorene (10) (17 mmol), 2 g of 4,7-dibromo-benzo[1,2,5]thiadiazole (5) (6.8 mmole), 0.69 g of Aliquat® 336 (1.7 mmol) and 17.2 mL of aqueous 2M Na$_2$CO$_3$. This was N$_2$ purged for 1 h. The flask was heated to about 80° C. and 33 mg of tetrakistriphenylphosphine palladium (0) (0.0042 mmol) then added under a nitrogen purge. The content of the flask was refluxed for 3 days. The reaction flask was allowed to cool to RT and about 50 mL water added and the organic layer separated. The aqueous layer was extracted with 50 mL toluene. The organic layers were combined and washed successively with water twice and then dried over MgSO$_4$. Concentration gave an oil which was purified by flash chromatography (eluent: 10% CH$_2$Cl$_2$ in Hexane) to give 4.0 g (64% yield) of 4,7-Bis-(9,9-dioctyl-9H-fluoren-2-yl)-benzo[1,2,5]thiadiazole 16 as a green solid.

Compound 16 was shown to exhibit a blue-white fluorescence (425 nm and 518 nm emissions) in dilute toluene solution when excited at 375 nm. At 0.2 mg/mL or as a spin cast thin film, this compound gave a green fluorescence (518 nm) under UV excitation.

Example 17

Synthesis of 3,9-Bis-(9,9-dioctyl-9H-fluoren-2-yl)-perylene (17a) and 3,10-Bis-(9,9-dioctyl-9H-fluoren-2-yl)-perylene (17b)

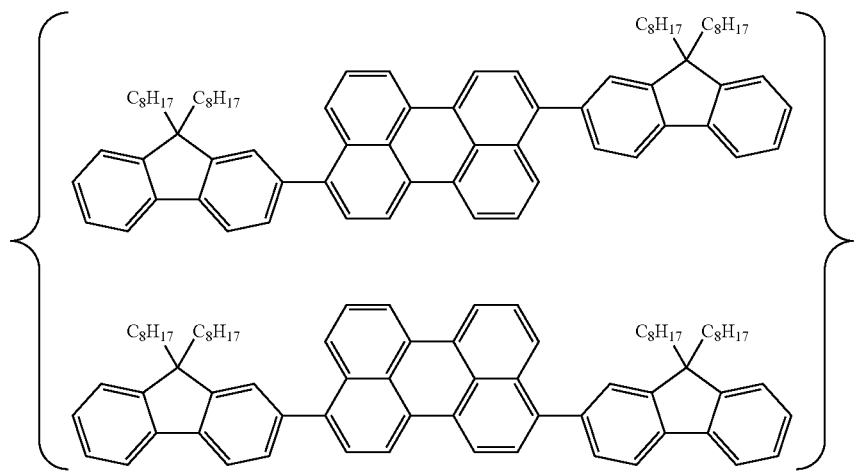

3,9-Bis-(9,9-dioctyl-9H-fluoren-2-yl)-perylene (17a) and 3,10-bis-(9,9-dioctyl-9H-fluoren-2-yl)-perylene (17b) are prepared as a mixture by reaction of the mixture of 3,9-dibromo-perylene and 3,10-dibromo-perylene (6) (6.8 mmoles) with 2-(4,4,5,5-tetramethyl-1,3,2-dioxaborolan-2-yl)-9,9-dioctylfluorene (10) (17 mmoles) under conditions as described in Example 16.

Example 18

Synthesis of 4,7-Bis-[9,9-dioctyl-9H-fluoren-2-yl-N,N-diphenyl-4-anilenyl]-benzo[1,2,5]thiadiazole (18)

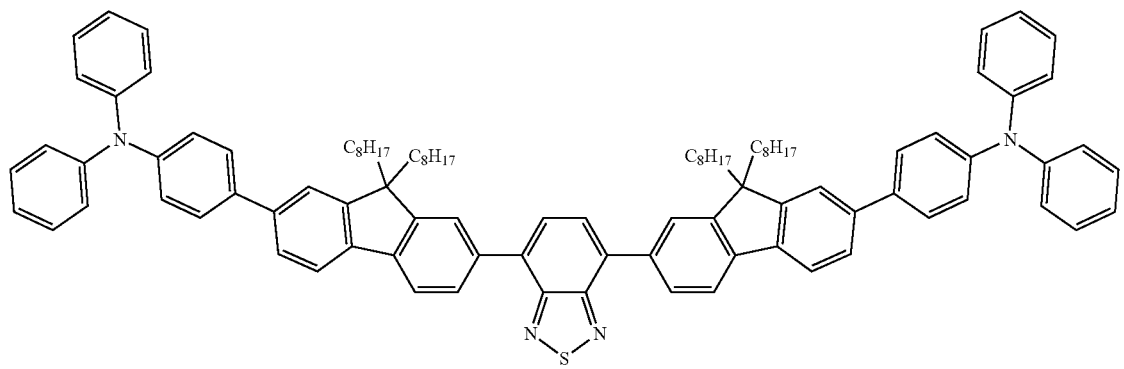

4,7-Bis-[9,9-dioctyl-9H-fluoren-2-yl-N,N-diphenyl-4-anilenyl]-benzo[1,2,5]thiadiazole (18) is prepared by reaction of 4-[9,9-dioctyl-7-(4,4,5,5-tetramethyl-1,3,2-dioxaborolan-2-yl)-9H-fluoren-2-yl]-N,N-diphenylaniline (12) (17 mmoles) with 4,7-dibromobenzo[1,2,5]thiadiazole (5) (6.8 mmoles) under conditions as described in Example 16.

Example 19

Synthesis of 9-Phenyl-3,6-bis{9,9-bis(3,6-dioxahexyl-6-phenyl)-fluoren-2-yl}-carbazole (19).

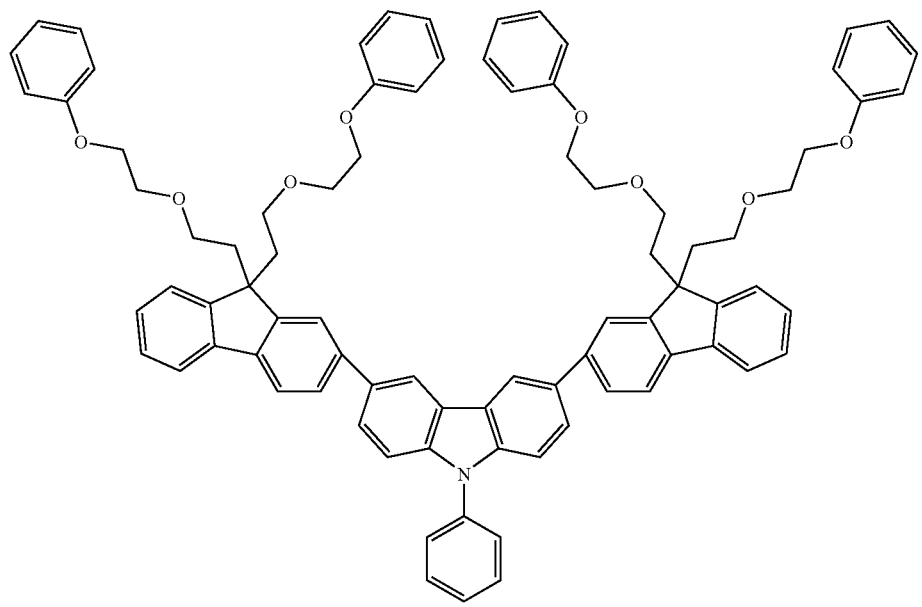

9-Phenyl-3,6-bis {9,9-bis(3,6-dioxahexyl-6-phenyl)-fluoren-2-yl}-carbazole 19 is prepared by reaction of 9-Phenyl-3,6-bis(4,4,5,5-tetramethyl-1,3,2-dioxaborolan-2-yl)-9H-carbazole (8) (6.8 mmoles) with 2-bromo-9,9-bis(3,6-dioxahexyl-6-phenyl)-fluorene (15) (17 mmoles) under conditions as described in Example 16.

Example 20

Synthesis of 9-Phenyl-3,6-Bis-[9,9-dioctyl-fluoren-2-yl-N,N-diphenyl-4-anilenyl]-carbazole (20)

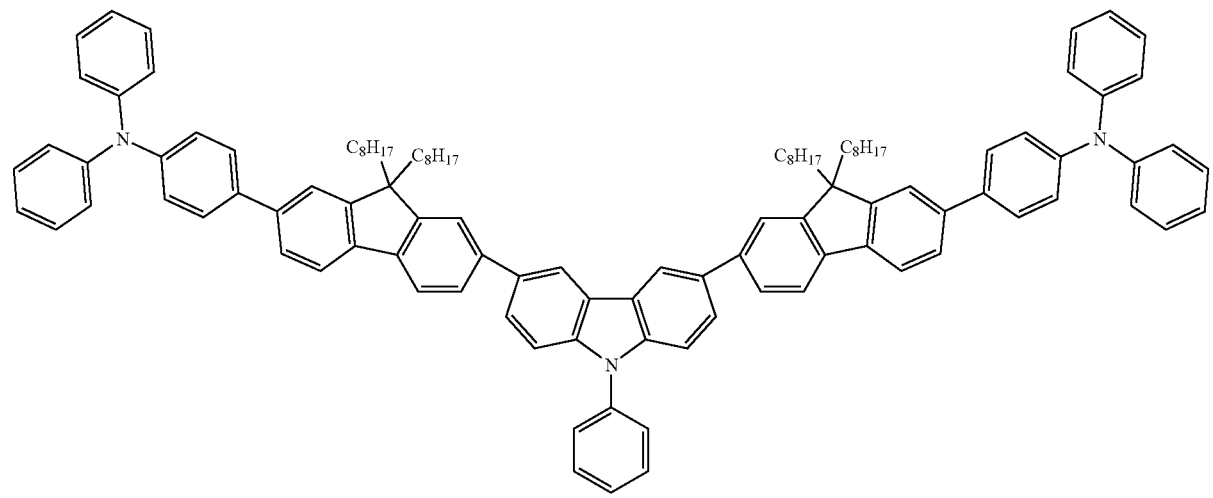

9-Phenyl-3,6-Bis-[9,9-dioctyl-fluoren-2-yl-N,N-diphenyl-4-anilenyl]-carbazole (20) is prepared by reaction of 4-[9,9-dioctyl-7-(4,4,5,5-tetramethyl-1,3,2-dioxaborolan-2-yl)-9H-fluoren-2-yl]-N,N-diphenylaniline (2) (17 mmoles) with 3,6-dibromo-9-phenylcarbazole (2) (6.8 mmoles) under conditions as described in Example 16.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

Each of the patents, patent documents, and publications cited above is hereby incorporated into this document as if reproduced in full.

What is claimed is:

1. A composition comprising:
   (a) a first compound of Formula I $[EC\frac{}{n} Ar^1]$  I that is a charge transporting material, a charge blocking material, a light emitting material, a color conversion material, or a combination thereof, wherein
   $Ar^1$ is a first aromatic core and is a divalent, trivalent, or tetravalent radical of

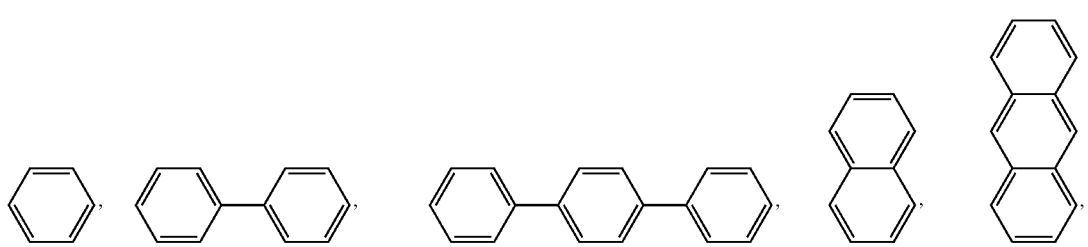

-continued
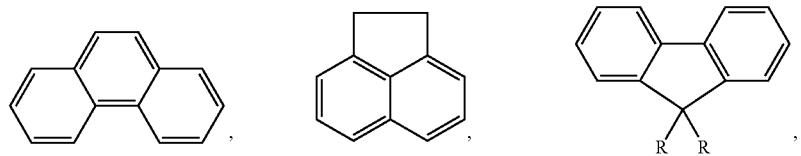
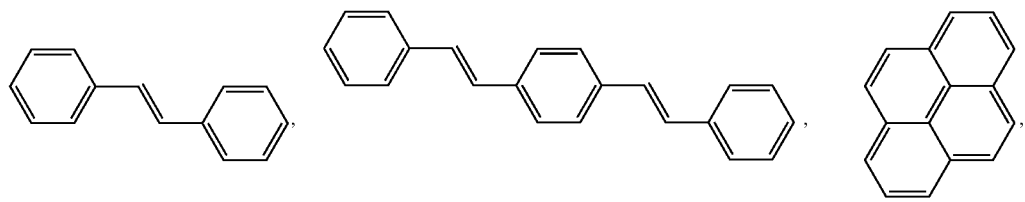
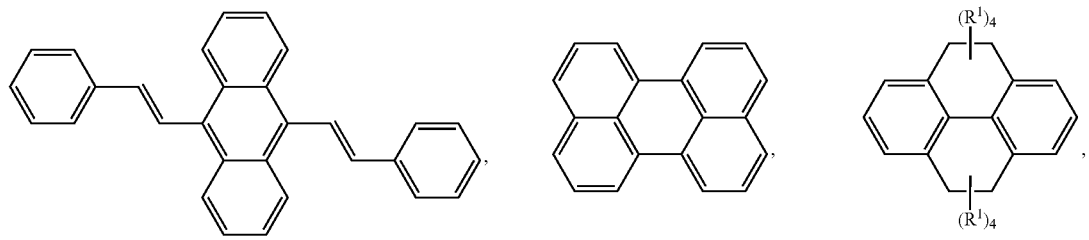
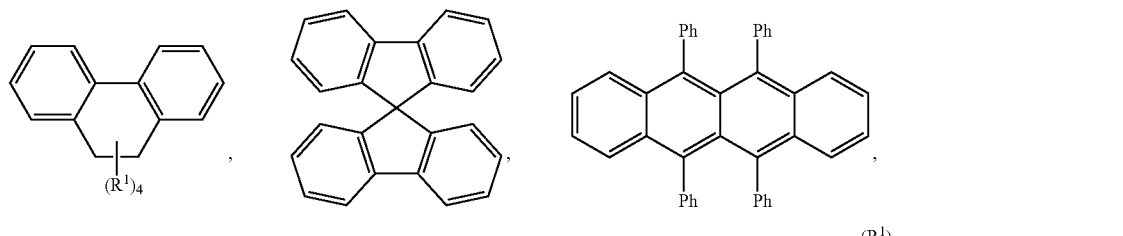
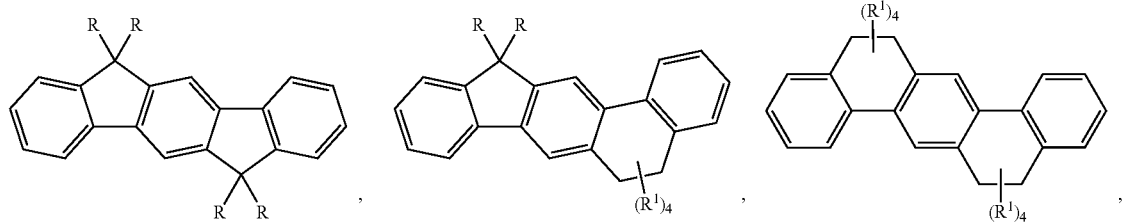
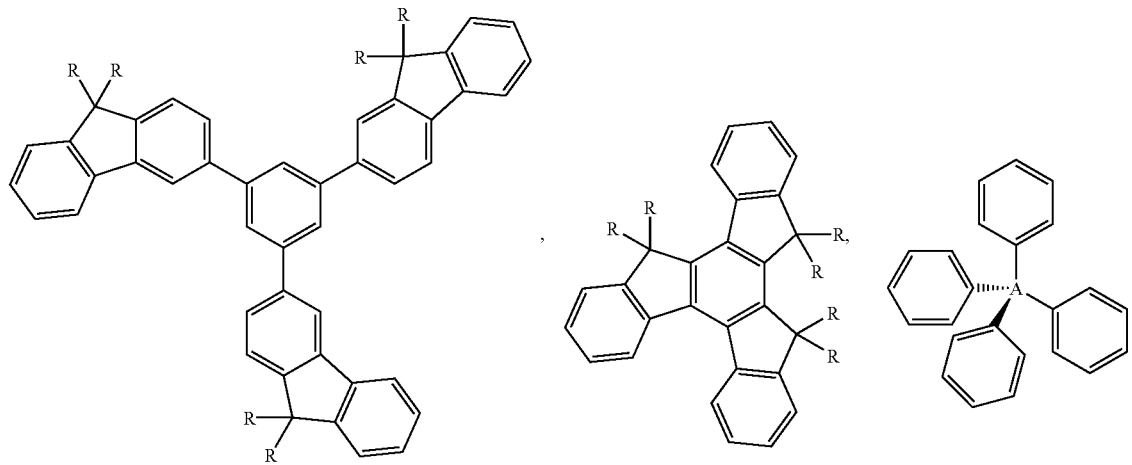

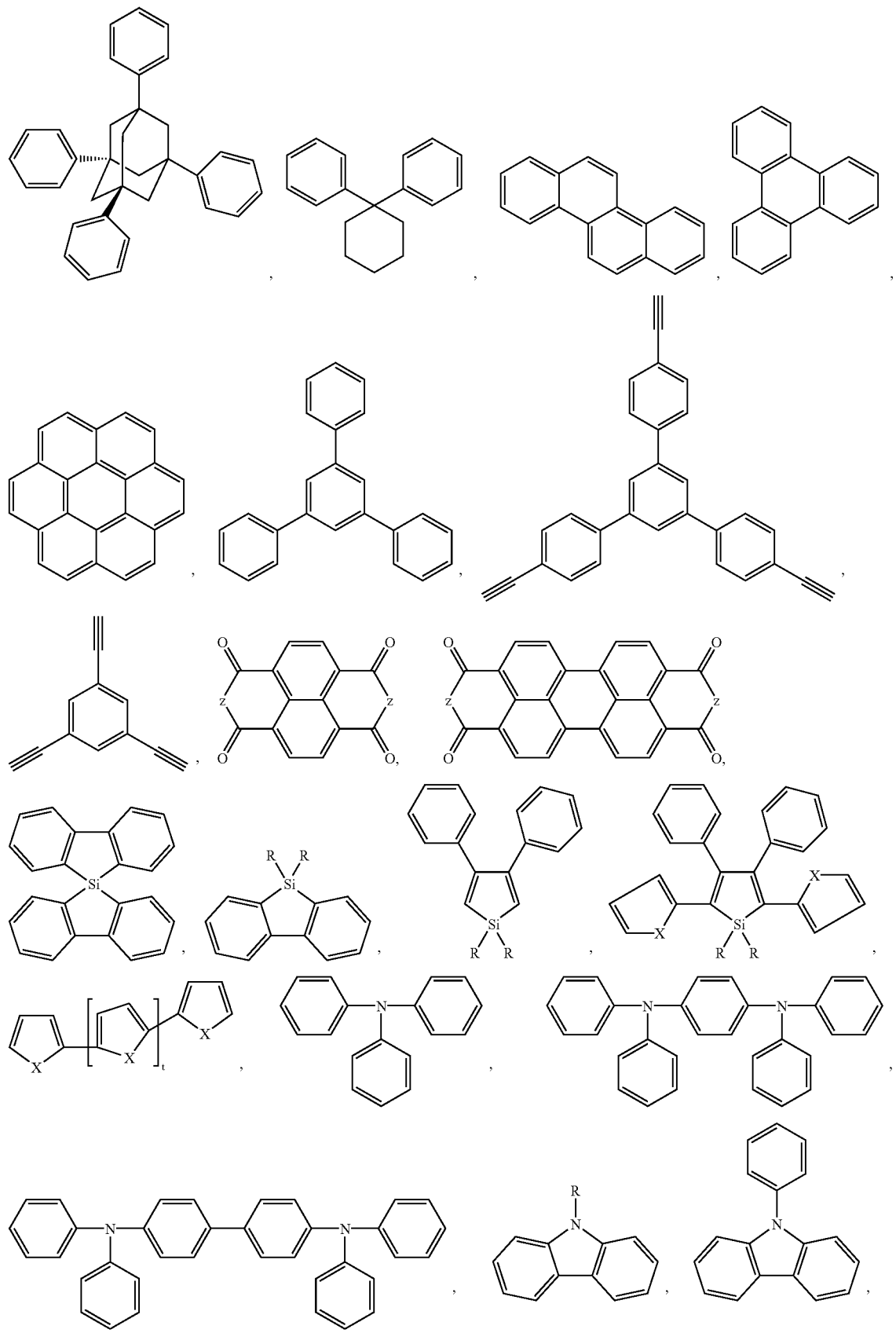

-continued
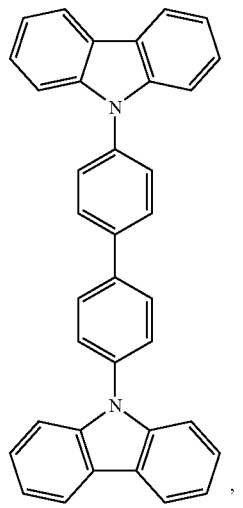
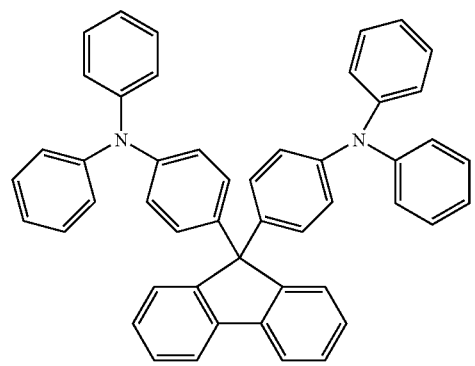
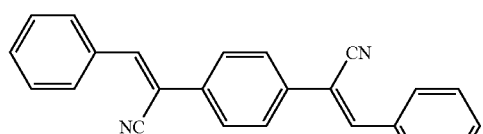
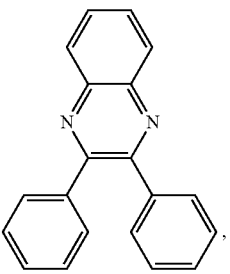
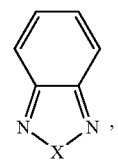
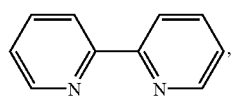
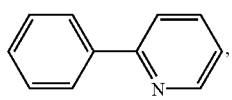
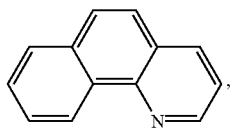
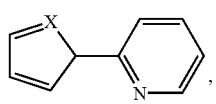
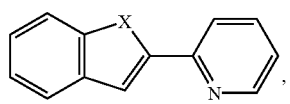
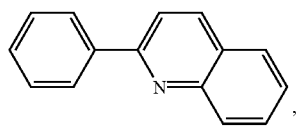
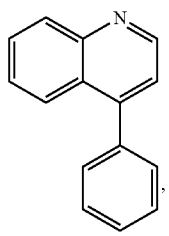
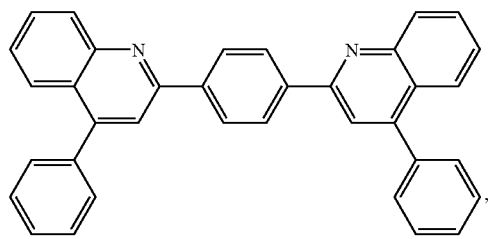
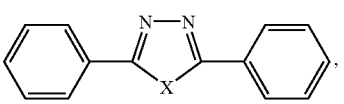
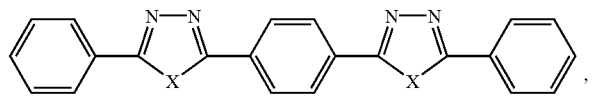
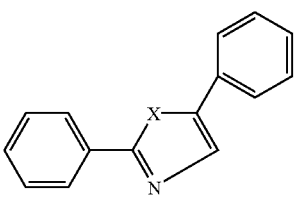

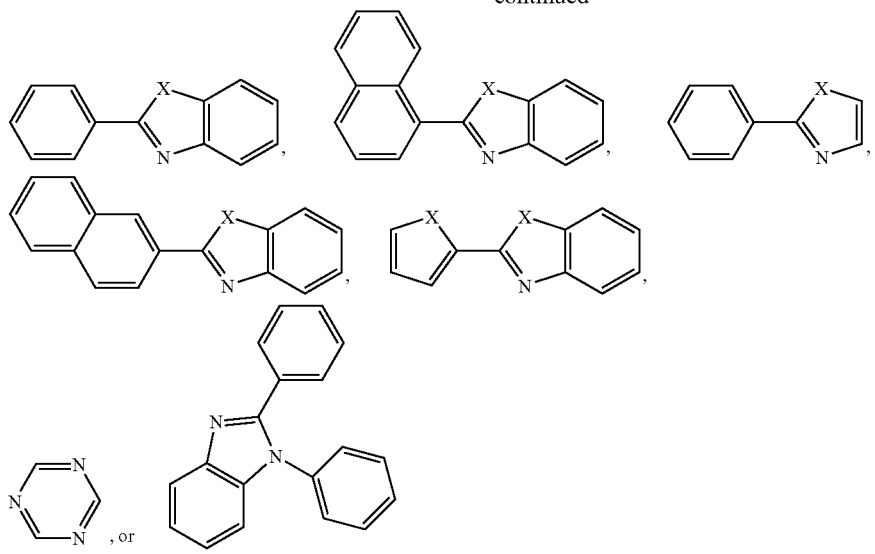
that is unsubstituted or substituted with one or more substituents selected from alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof;
EC is a first end capping group and is a monovalent radical of
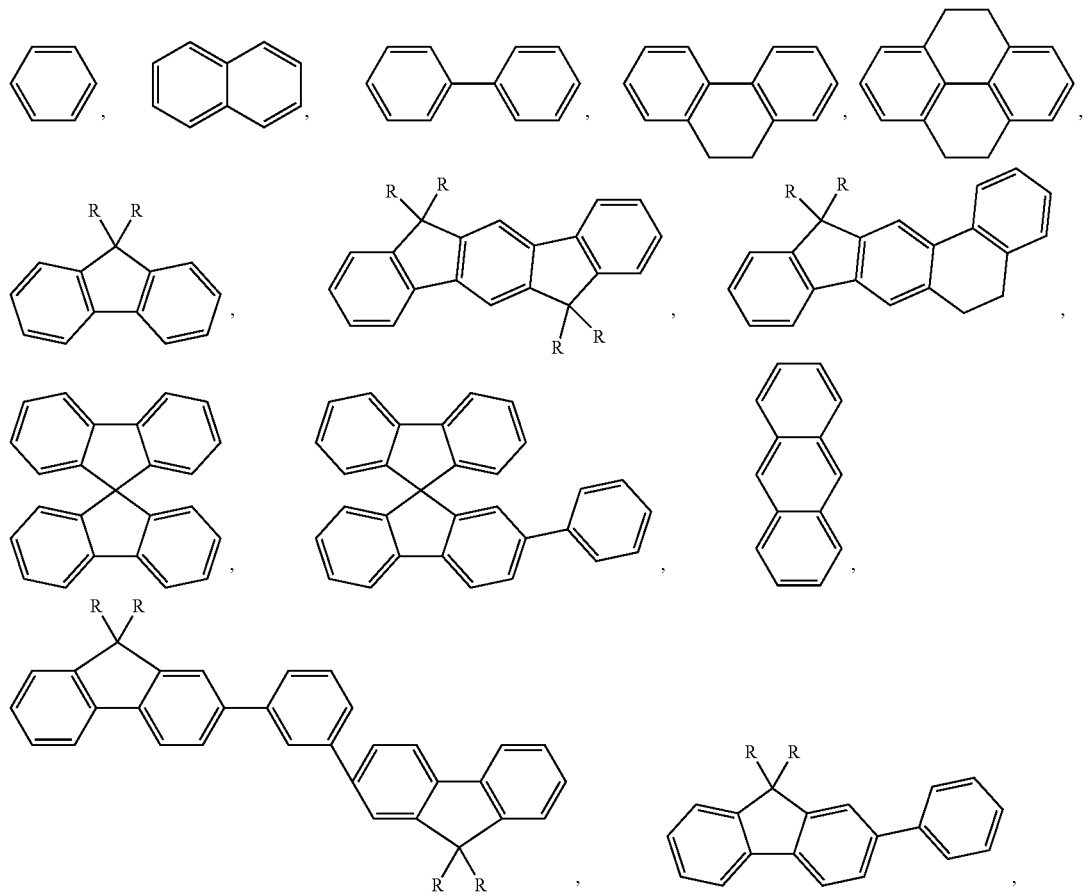

-continued
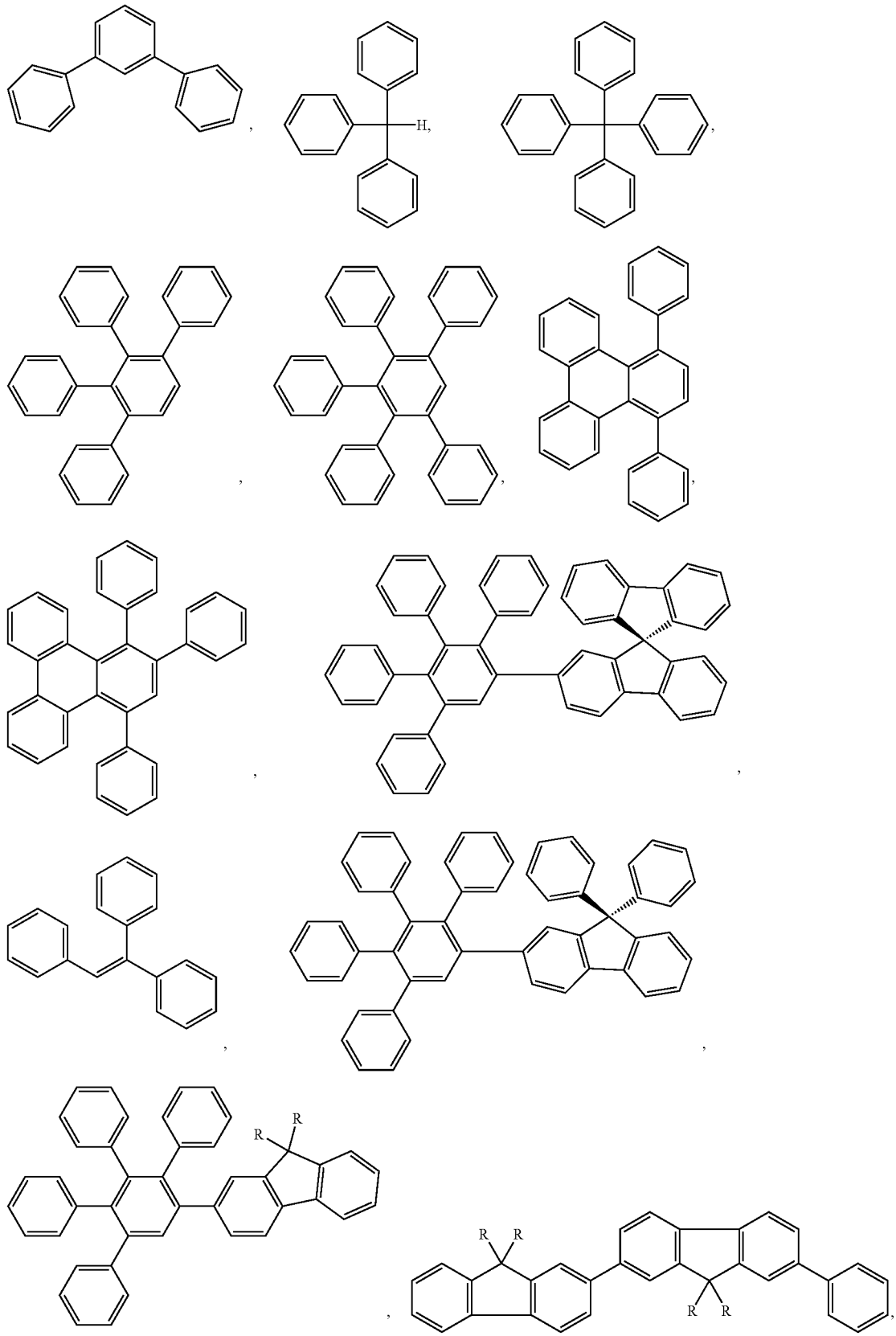

-continued
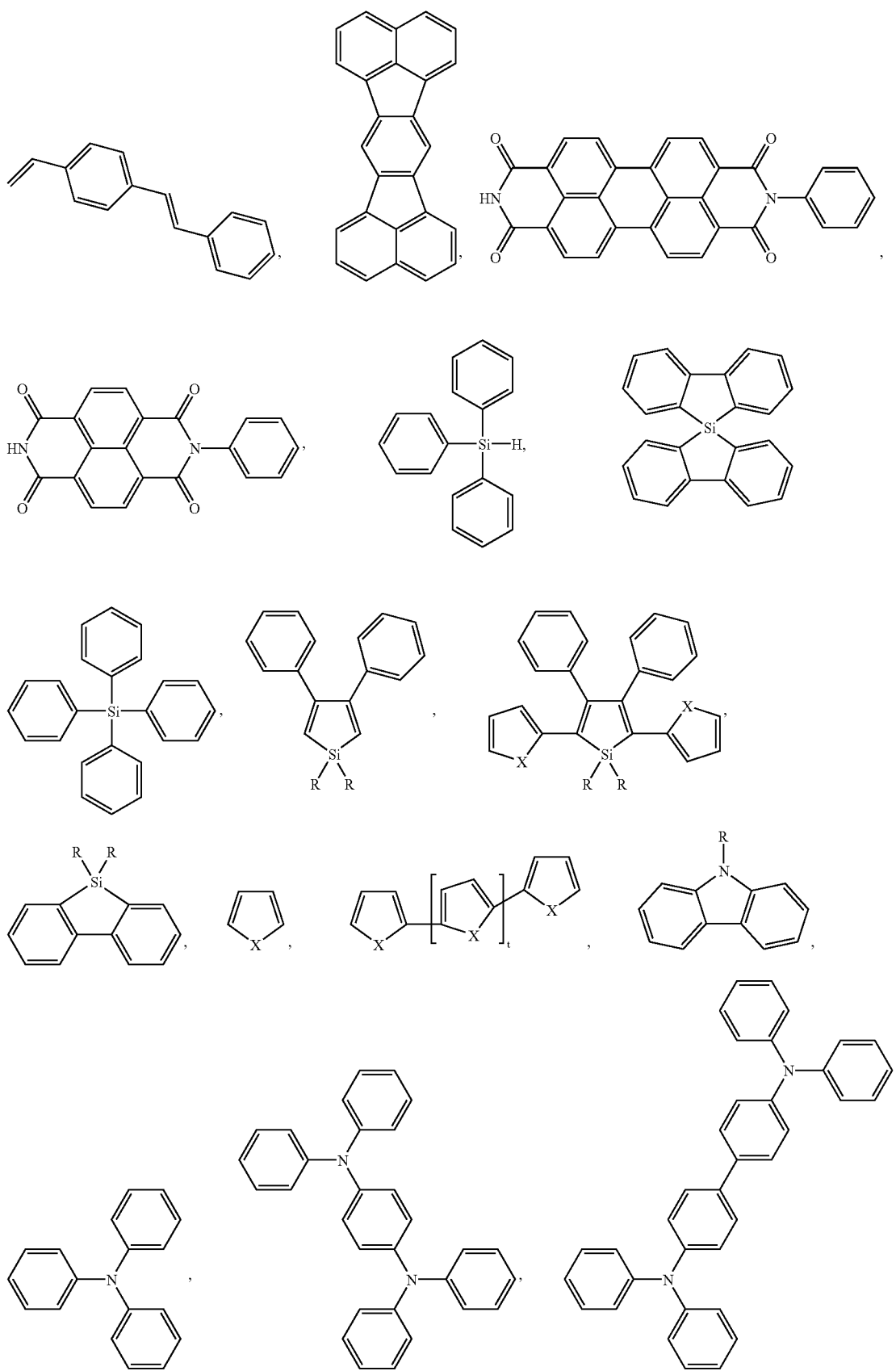

-continued
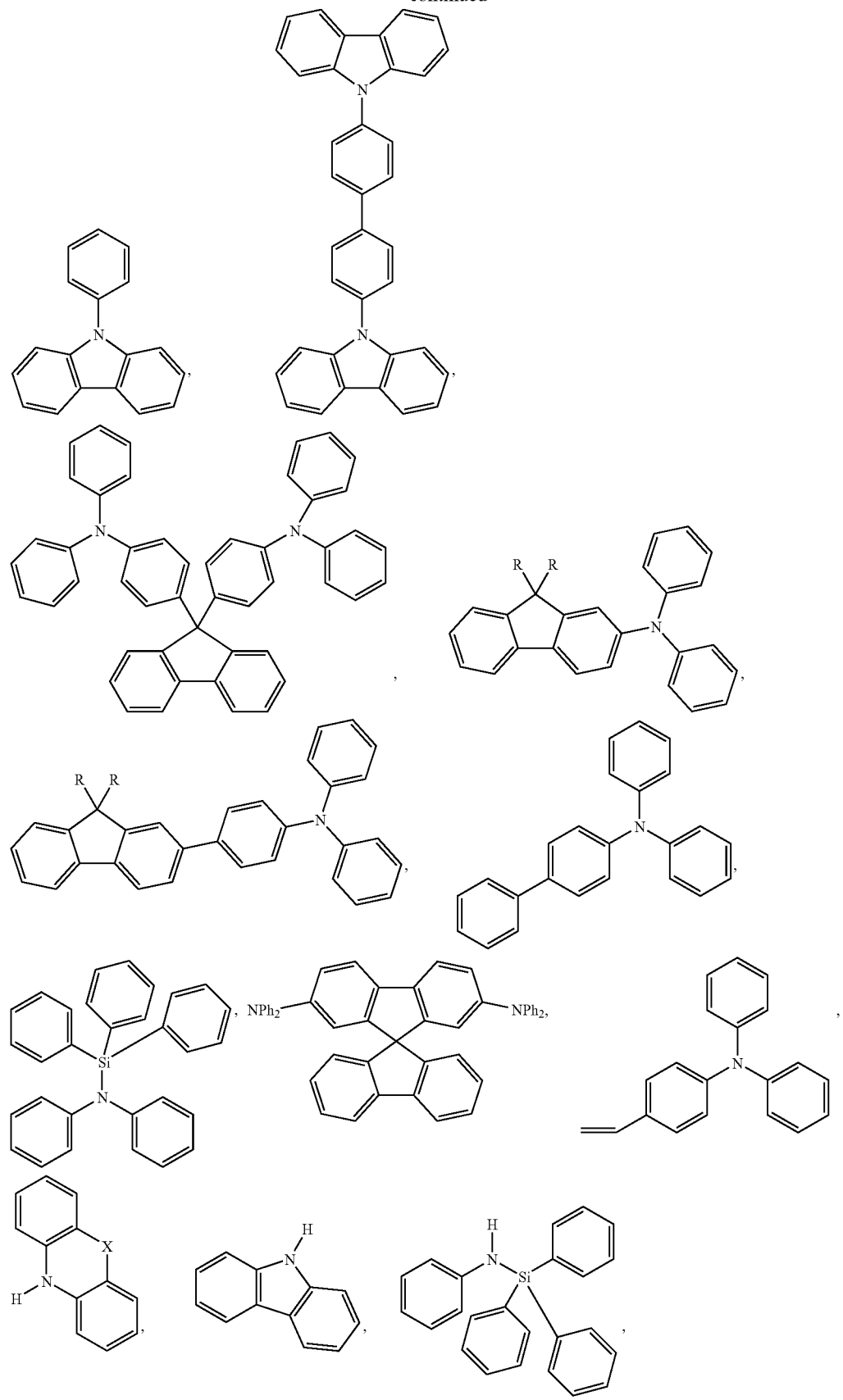

-continued
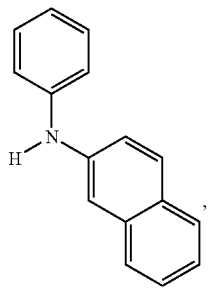 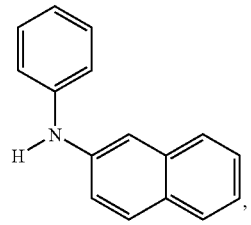 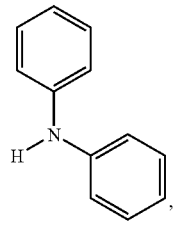
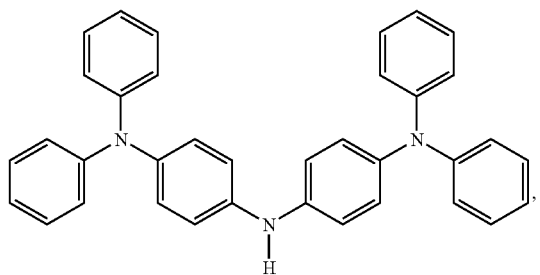 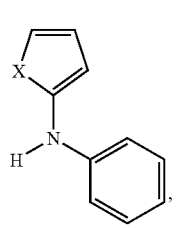 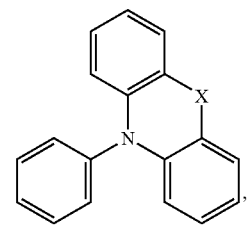
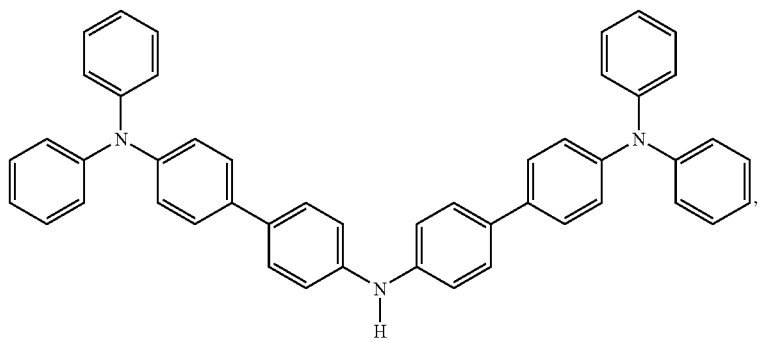
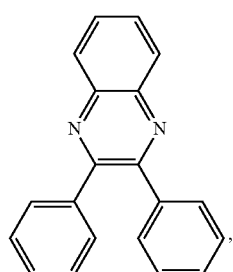 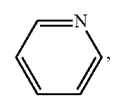  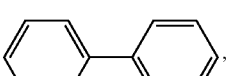
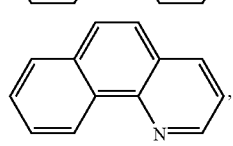 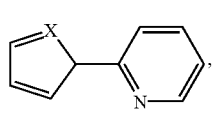 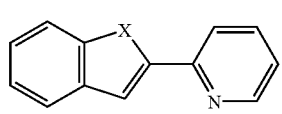 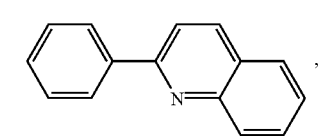
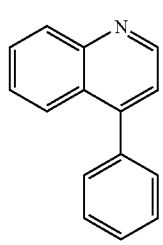 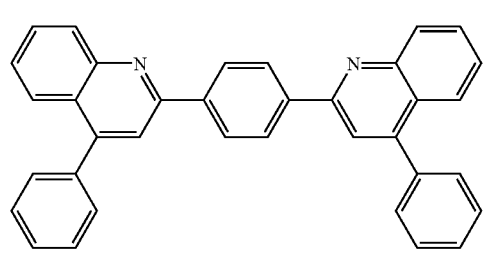 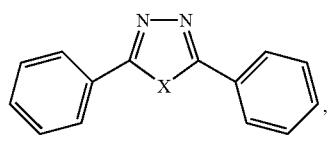

-continued
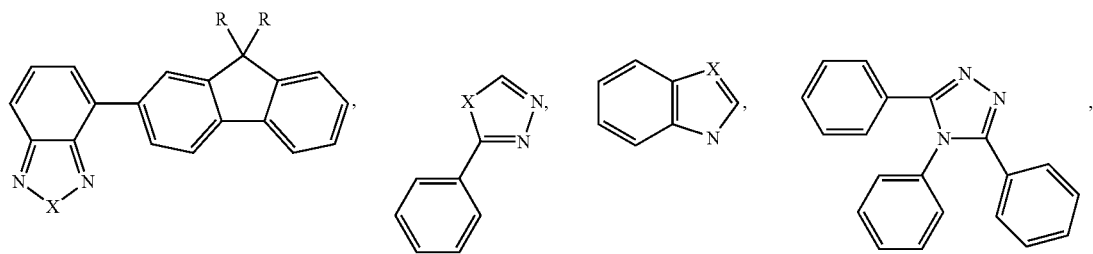
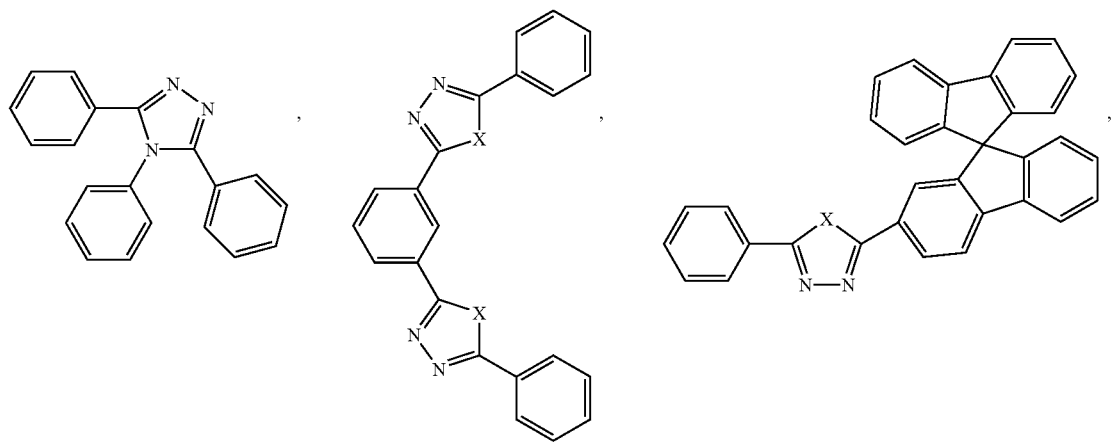
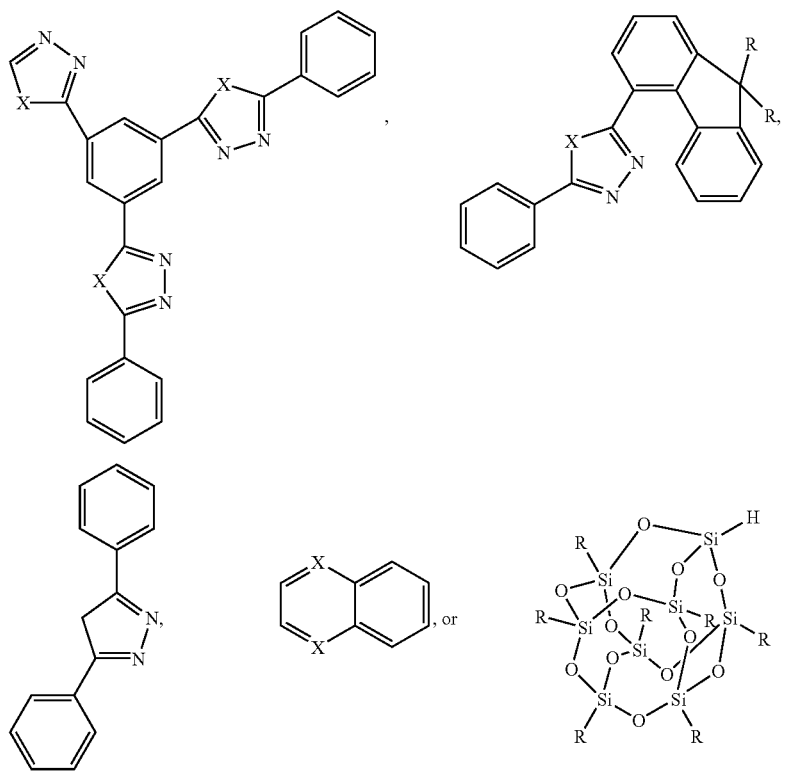
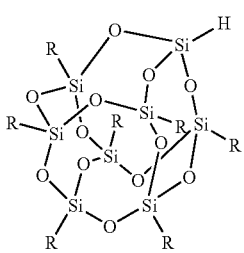

that is unsubstituted or substituted with one or more substituents selected from alky), alkenyl, alkoxy, aryl, aryloxy, fluoro, fluoroalkyl, perfluoroalkyl, diarylamino, cyano, nitro, ester, heteroalkyl, heteroaryl, and combinations thereof;
  n is an integer of 2 to 4, wherein the first end capping groups are identical; and
  each R is independently an alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;
  each $R^1$ is independently a hydrogen, alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;
X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof;
A is C, Si, Ge, Pb, or Sn;
Z is NH or $CH_2$;
t is an integer of 0 to 4; and
(b) a second compound that is selected from a charge transporting material, a charge blocking material, a light emitting material, a color conversion material, or a combination thereof, said second compound being a polymeric material having
  an aromatic radical that comprises the first aromatic core of the first compound, wherein the aromatic radical of the second compound can be unsubstituted, substituted with a substituent of a same type that is present on the first aromatic core of the first compound, or substituted with a substituent that is absent on the first aromatic core of the first compound,
  a second end capping group that comprises the first end capping group of the first compound, wherein the second end capping group can be unsubstituted, substituted with a substituent of a same type that is present on the first end capping group, or substituted with a substituent that is absent on the first end capping group;
  a divalent radical that comprises a divalent radical of the first end capping group of the first compound, wherein the divalent radical in the second compound can be unsubstituted, substituted with a substituent of a same type that is present on the first end capping group, or substituted with a substituent that is absent on the first end capping group; or
  a combination thereof,
wherein the composition is amorphous and solution processible.

2. The composition of claim 1, wherein the second compound is a light emitting polymer.

3. The composition of claim 1, wherein the second compound is an electroactive polymer.

4. The composition of claim 1, wherein the second compound is a polymer comprising the reaction product of a monomer mixture comprising a first monomer comprising the fist aromatic core of the first compound.

5. The composition of claim 1, wherein the second compound is a polymer that is the reaction product of a monomer mixture comprising a first monomer comprising the first end capping group or a radical of the first end capping group.

6. The composition of claim 1, wherein the second compound has an aromatic moiety that comprises the first aromatic core of the first compound, said first aromatic core being a divalent, trivalent, or tetravalent radical of

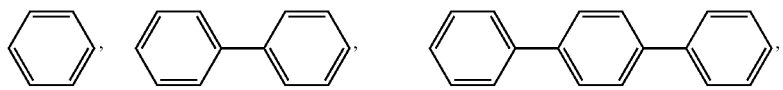

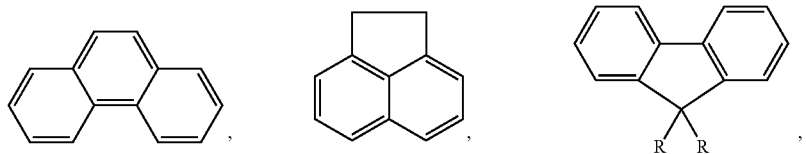

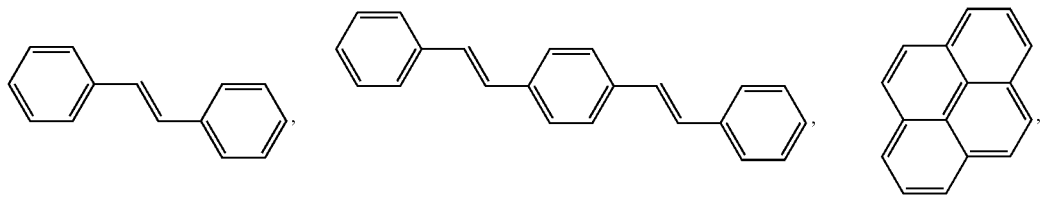

-continued
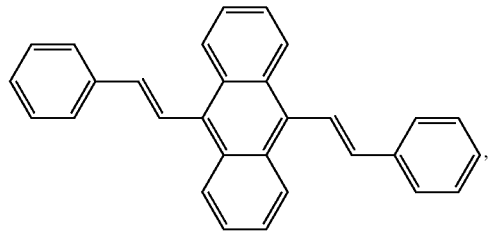 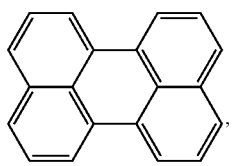 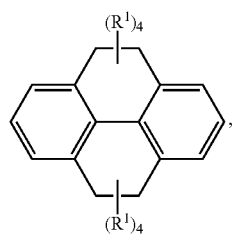
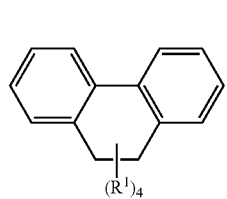 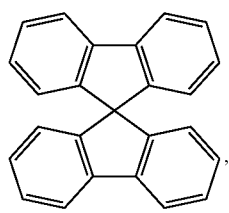 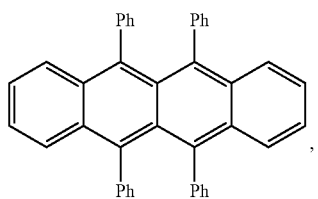
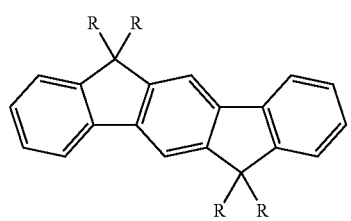 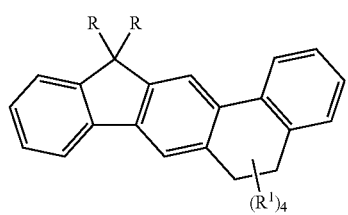 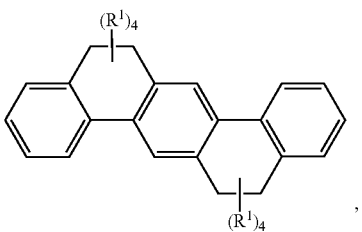
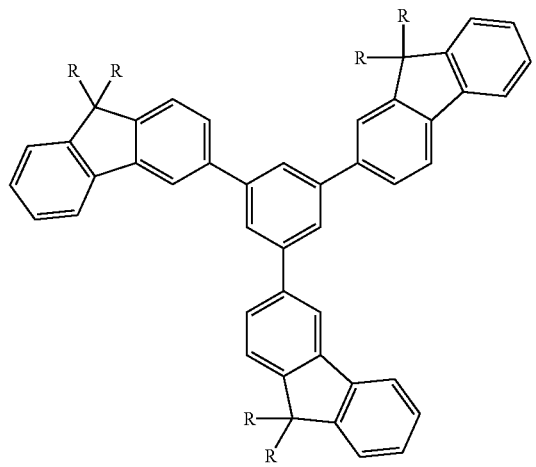 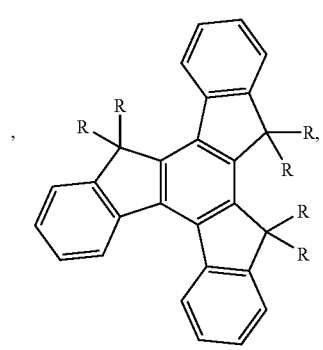 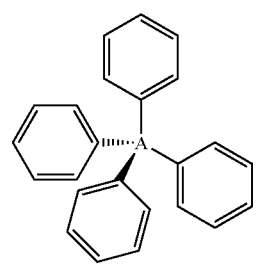
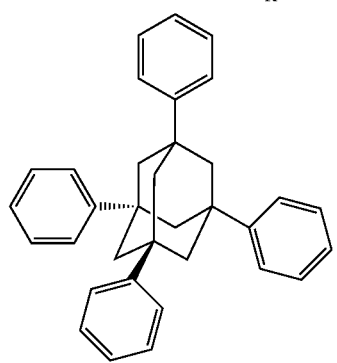 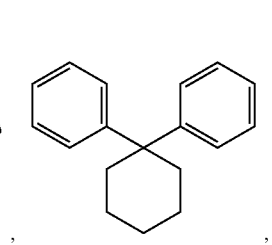 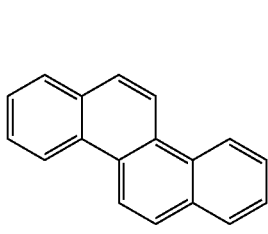 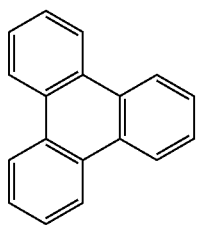

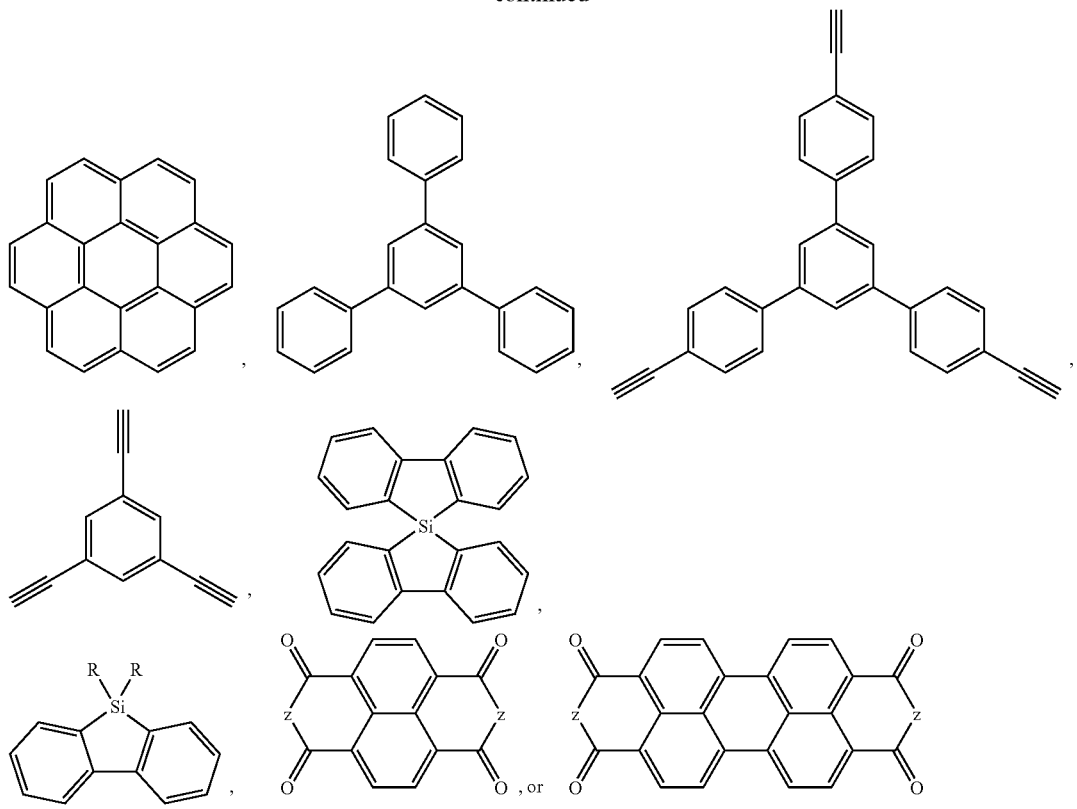

that is unsubstituted or substituted with one or more substituents selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof, wherein
Z is NH or $CH_2$; and
A is C, Si, Ge, Pb, or Sn;
each R is independently an $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, or combinations thereof; and each $R^1$ independently a hydrogen, $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$, fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, or combinations thereof.

7. The composition of claim 1, wherein the second compound has an aromatic moiety that comprises the first aromatic core of the first compound, said first aromatic core being a divalent, trivalent, or tetravalent radical of

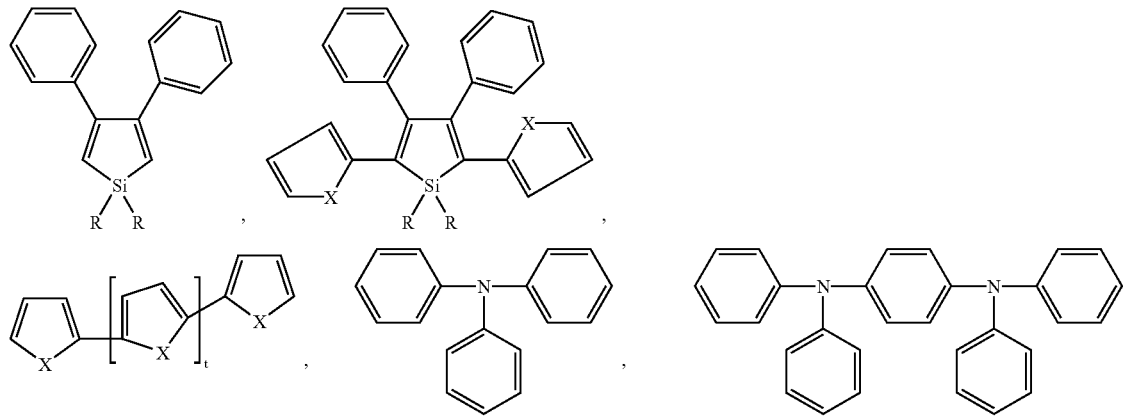

-continued

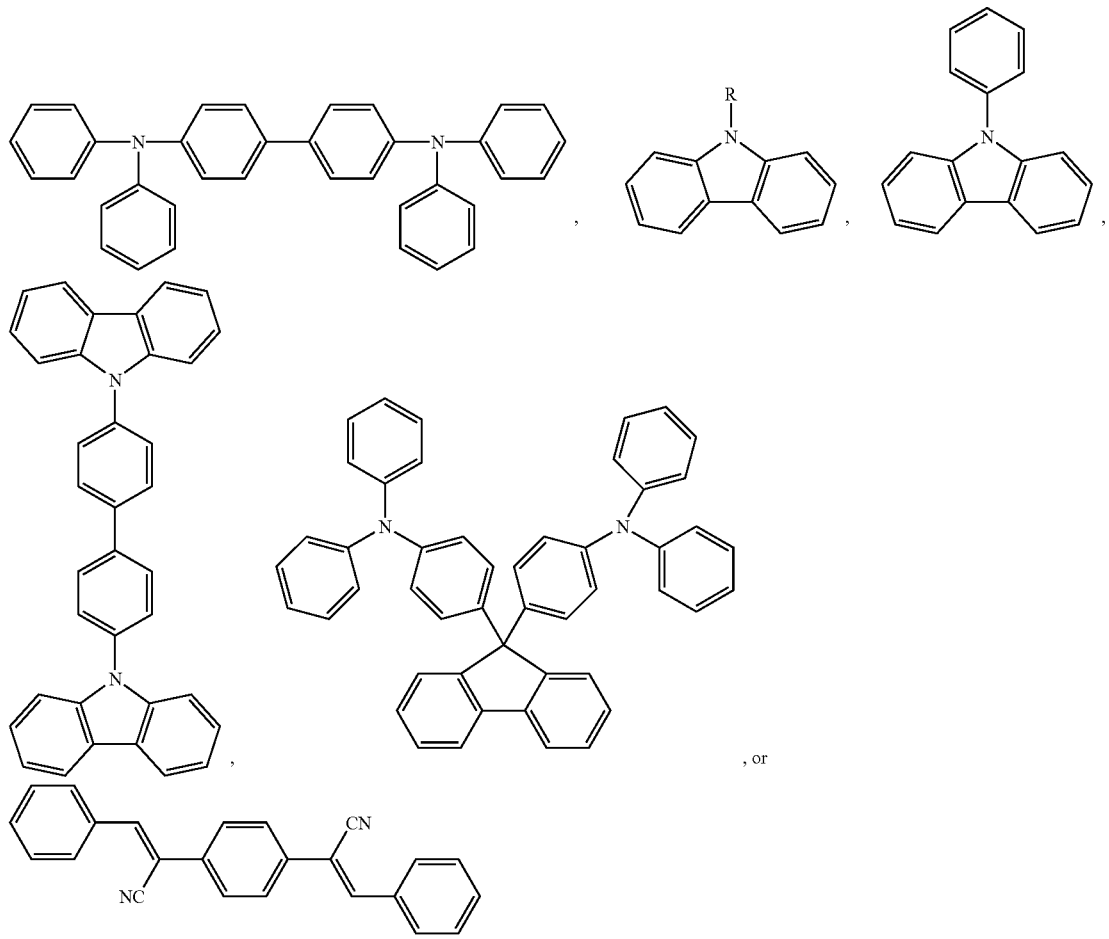

that is unsubstituted or substituted with one or more substituents selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof, wherein
each R is independently an $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino,
cyano, nitro, $C_{2-30}$ ester, $C_{1-30}$ heteroalkyl, $C_{3-30}$ heteroaryl, or combinations thereof;

X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof; and t is an integer from 1 to an integer of 0 to 4.

8. The composition of claim 1, wherein the second compound has an aromatic moiety that comprises the first aromatic core of the first compound, said first aromatic core being a divalent, trivalent, or tetravalent radical of

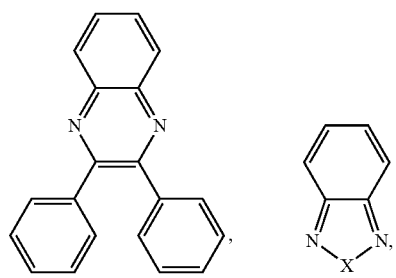

-continued
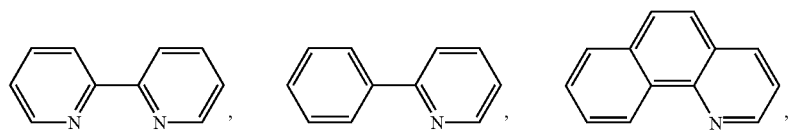
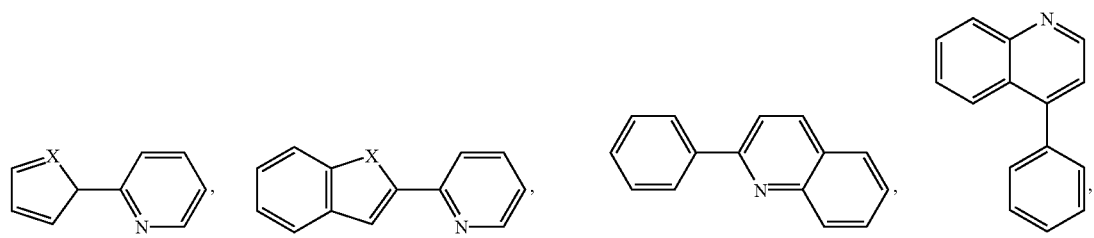
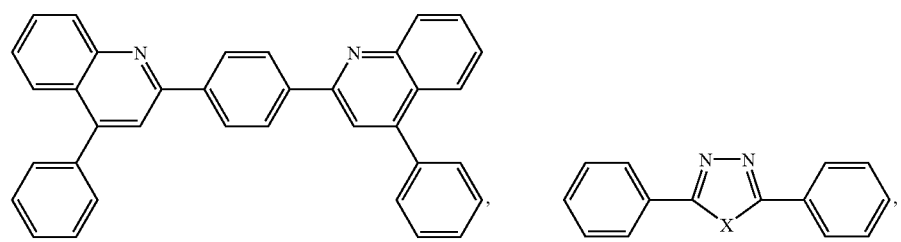
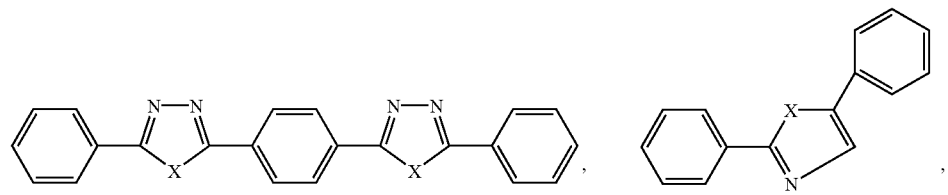
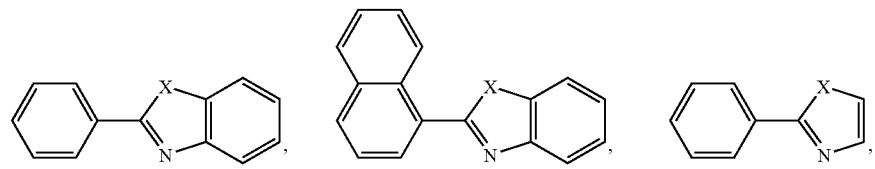
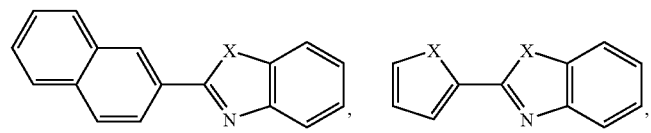
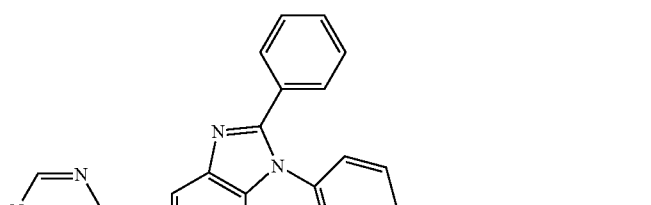
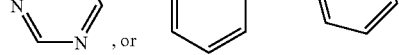, or that is unsubstituted or substituted with one or more substituents selected from $C_{1-20}$ alkyl, $C_{2-20}$ alkenyl, $C_{1-20}$ alkoxy, $C_{6-20}$ aryl, $C_{6-20}$ aryloxy, fluoro, $C_{,1-20}$ fluoroalkyl, $C_{1-20}$ perfluoroalkyl, diarylamino, cyano, nitro, ester, $C_{1-20}$ heteroalkyl, $C_{3-20}$ heteroaryl, and combinations thereof,
wherein
  X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof.

9. The compositions of claim 1, wherein the second compound has an aromatic moiety tat comprises the first aromatic core of the first compound, said first aromatic core being selected from

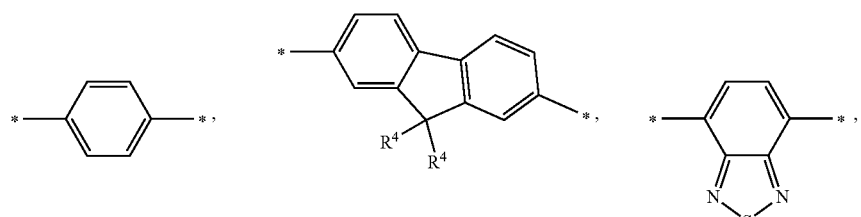

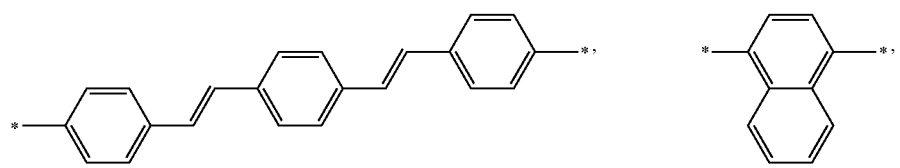

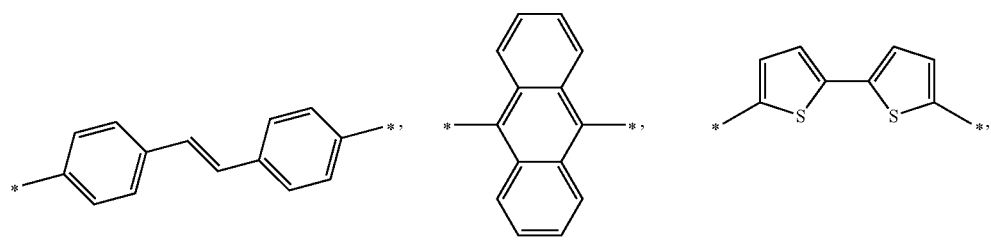

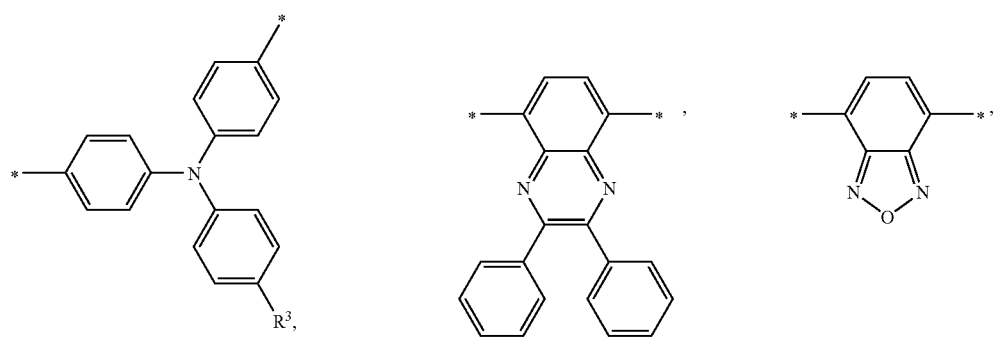

-continued
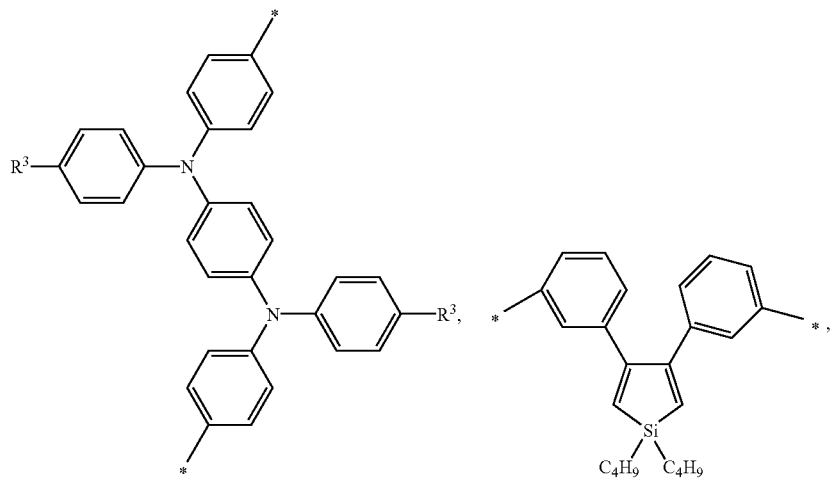
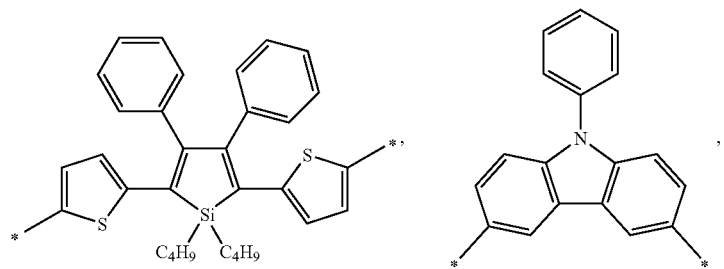
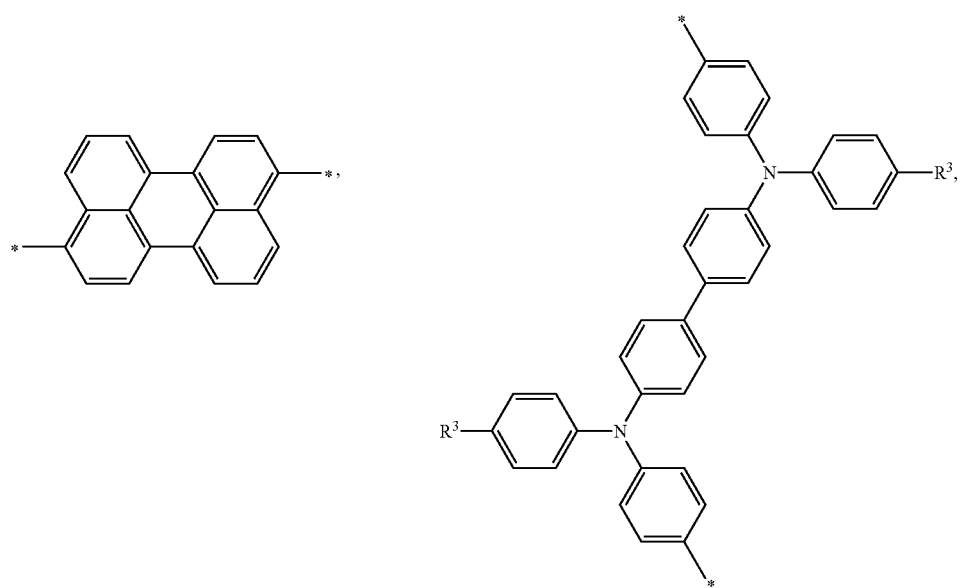

-continued

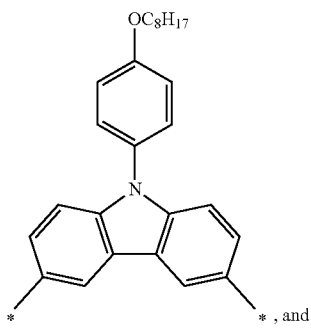 , and 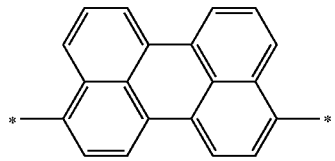

wherein
each $R^3$ is independently hydrogen, $C_{1-30}$ alkyl, $C_{6-20}$ aryl, $C_{3-20}$ heteroaryl, or $C_{1-30}$ heteroalkyl containing one or more atoms of S, N, O, P, or Si; and
each $R_4$ is independently $C_{1-30}$ alkyl, $C_{6-20}$ aryl, $C_{3-20}$ heteroaryl, or $C_{1-30}$ heteroalkyl containing one or more atoms of S, N, O, P, or Si.

10. The composition of claim 1, wherein the second compound has a second end capping group that comprises the first end capping group or the second compound comprises a divalent radical of the first end capping group, said first end capping group selected from

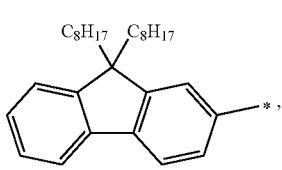

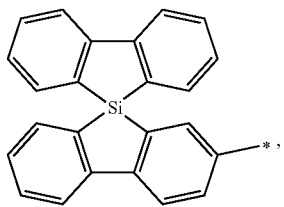

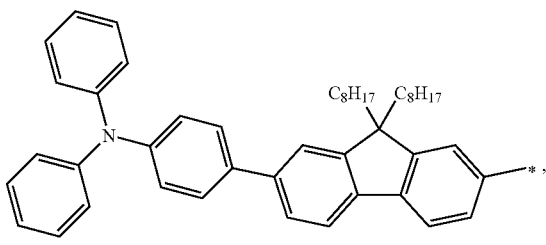

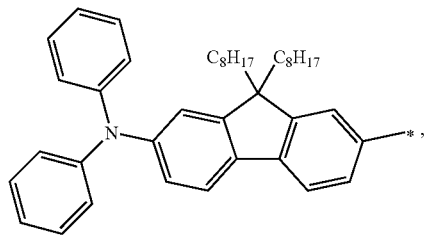

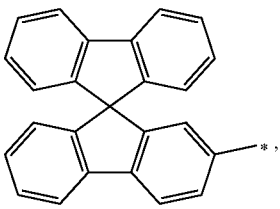

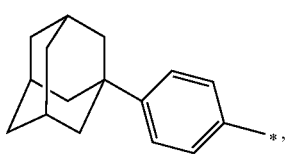

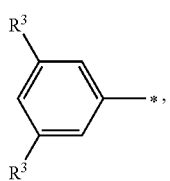

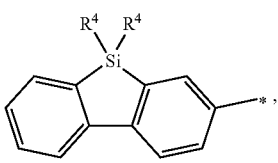

-continued

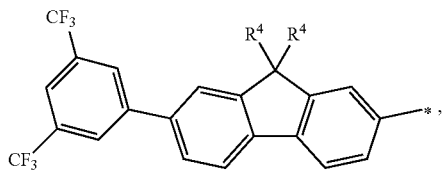

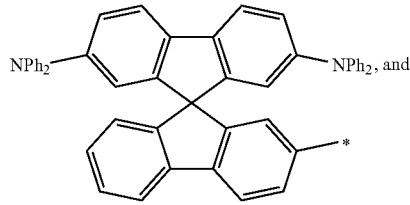

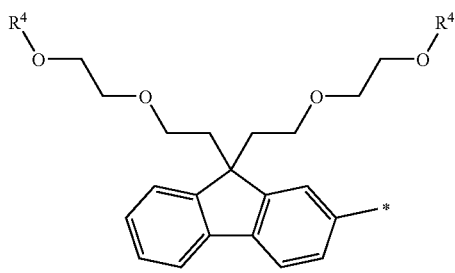

wherein each Ph is phenyl;

each $R^3$ is independently hydrogen, $C_{1-30}$ alkyl, $C_{6-20}$ aryl, $C_{3-20}$ heteroaryl, $C_{1-30}$ heteroalkyl, or combinations thereof; and each $R^4$ is independently $C_{1-30}$ alkyl, $C_{6-20}$ aryl, $C_{3-20}$ heteroaryl, $C_{1-30}$ heteroalkyl; or combinations thereof.

11. The composition of claim 10, wherein $R^3$ or $R^4$ is methyl or phenyl.

12. The composition of claim 1, wherein the second compound has a second end capping group that comprises the first end capping group or the second compound comprises a divalent radical of the first end capping group, said first end capping group being a $C_{6-60}$ carbocyclic aryl that is a monovalent radical of

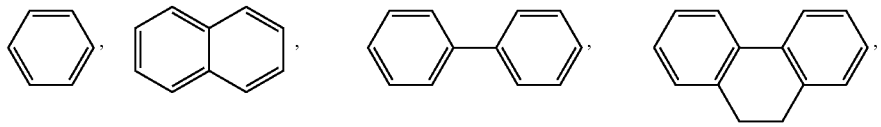

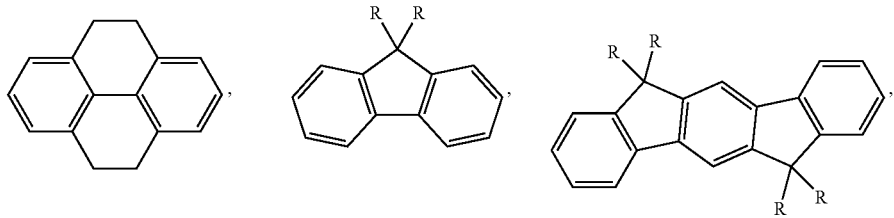

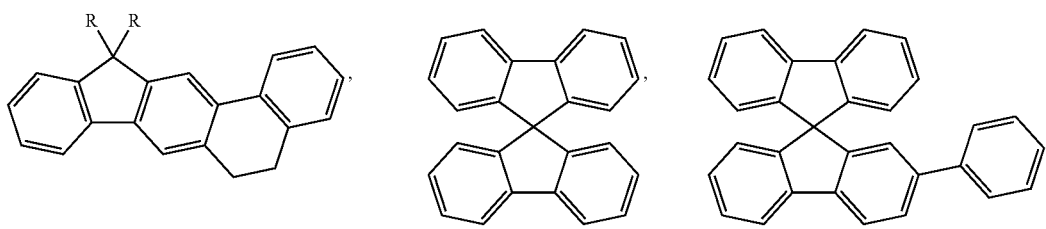

-continued
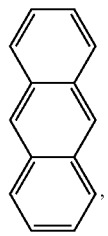 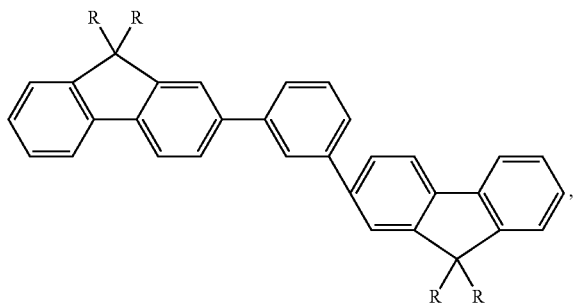
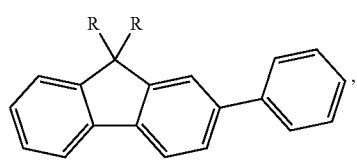 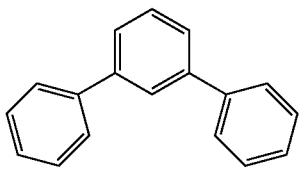 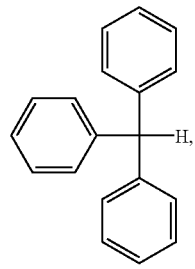
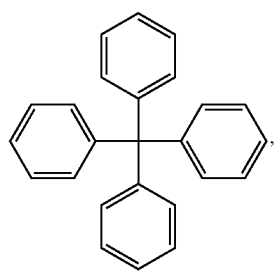 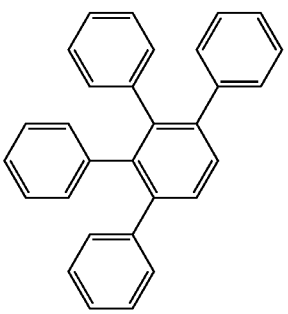 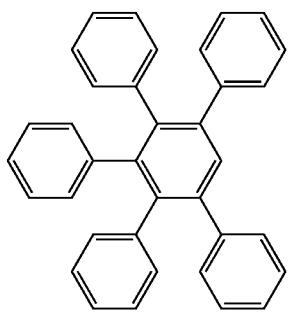
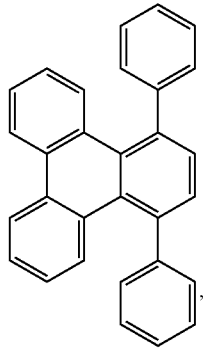
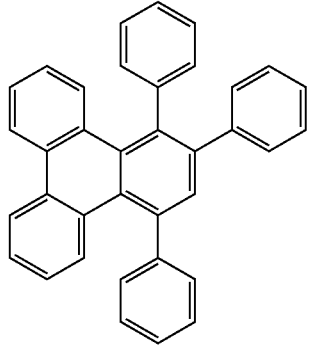 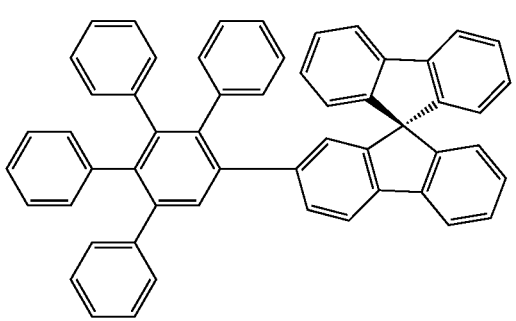

-continued

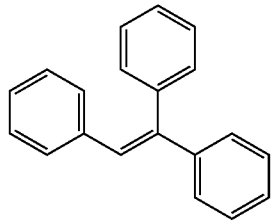
,
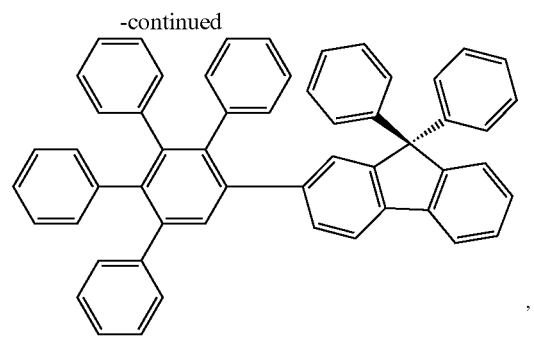
,

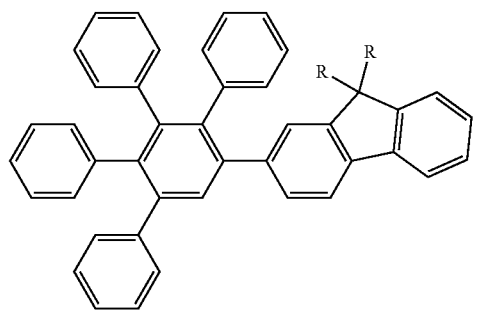
,
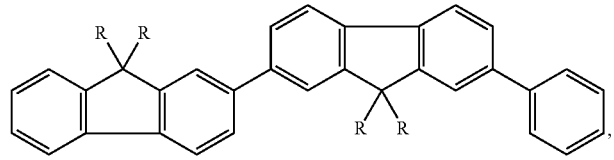
,

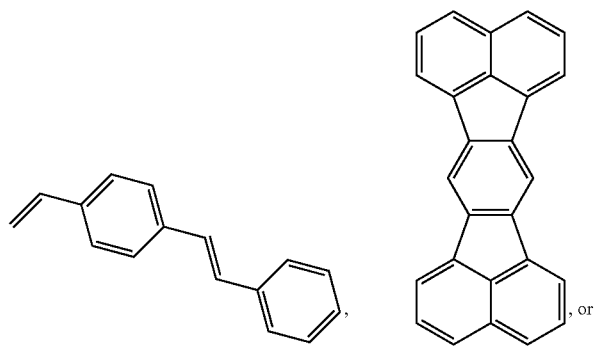

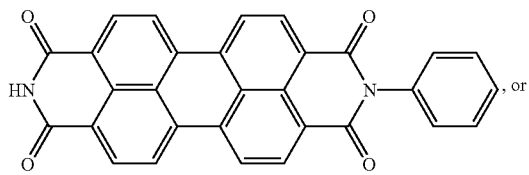
, or
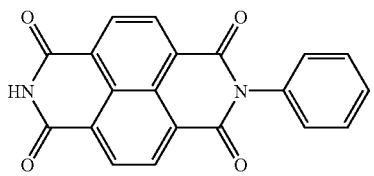

that is unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof, wherein each R is independently an $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, or combinations thereof.

13. The composition of claim 1, wherein the second compound has a second end capping group that comprises the first end capping group or the second compound comprises a divalent radical of the first end capping group, said first end capping group being a $C_{3-60}$ heteroaryl having an imine linkage and a monovalent radical of

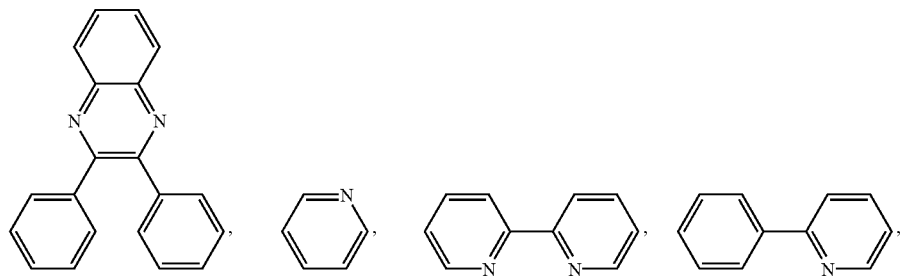
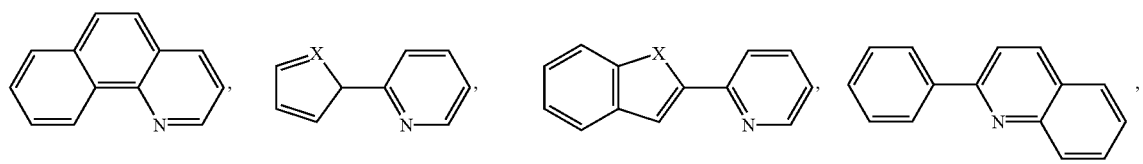
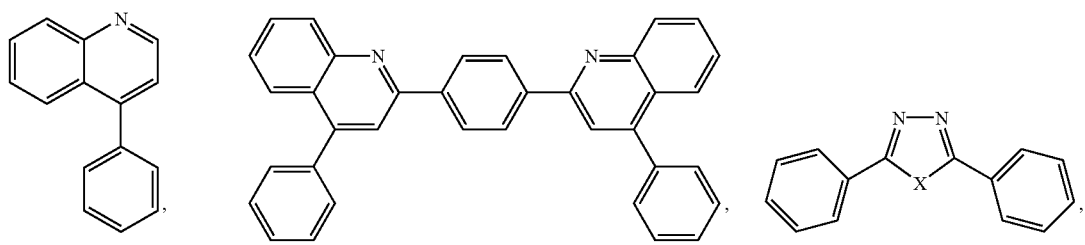
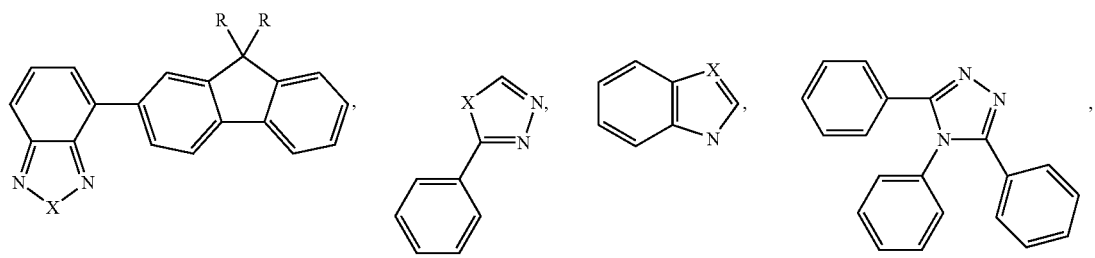
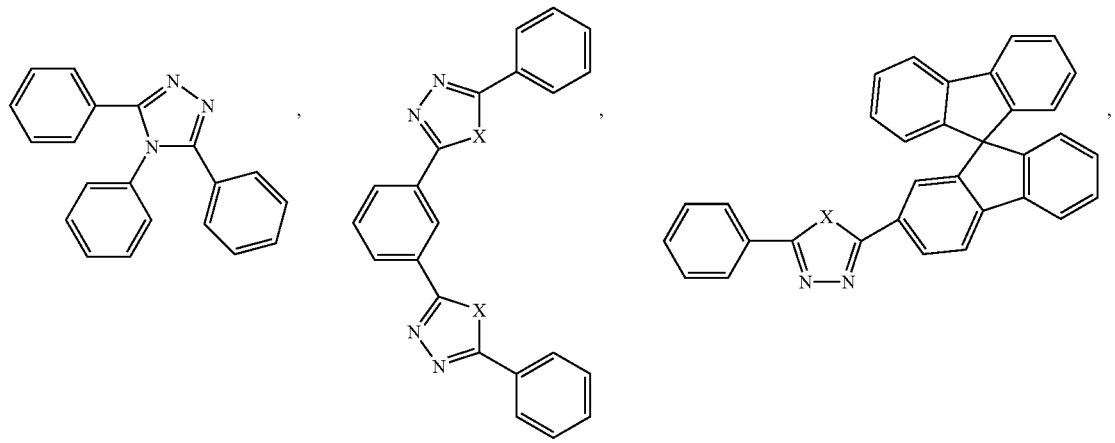

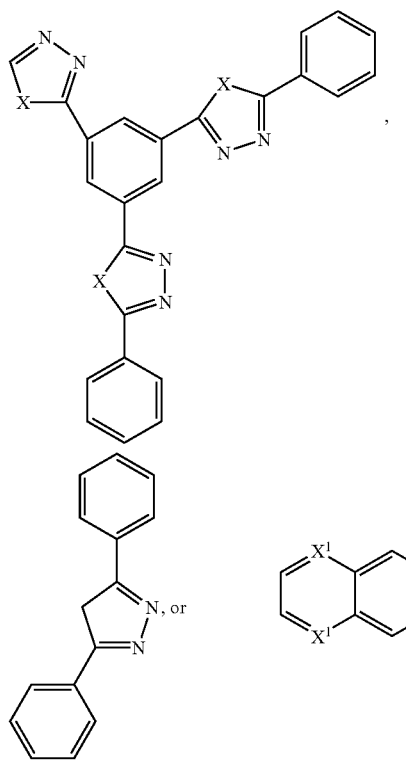
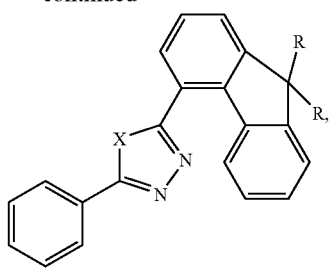

that is unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, diarylamino, cyano, nitro, ester, $C_{1-20}$ heteroalkyl, $C_{3-20}$ heteroaryl, and combinations thereof,
wherein
- each R is independently an $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-30}$ heteroaryl, or combinations thereof; and
- X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof.

14. The composition of claim 1, wherein the second compound has a second end capping group that comprises the first end capping group or the second compound comprises a divalent radical of the first end capping group, said first end capping group being a $C_{6-60}$ aromatic amino aryl or a $C_{3-60}$ heteroaryl that is electron rich and a monovalent radical of

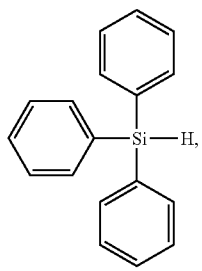
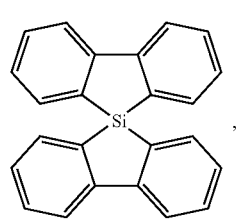

-continued

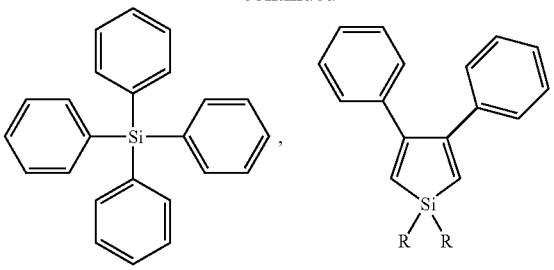
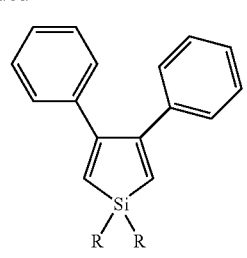
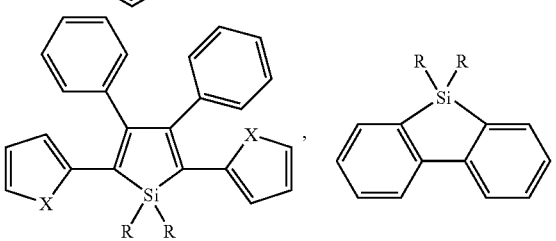
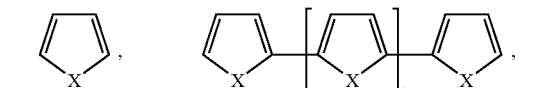
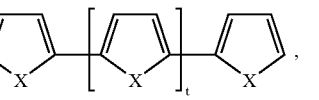
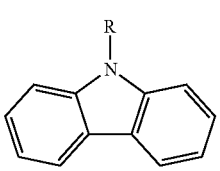
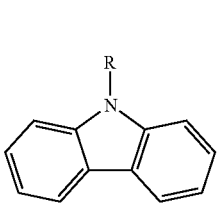

-continued
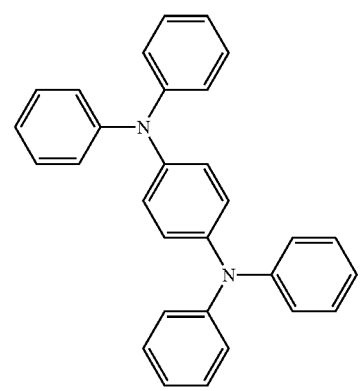
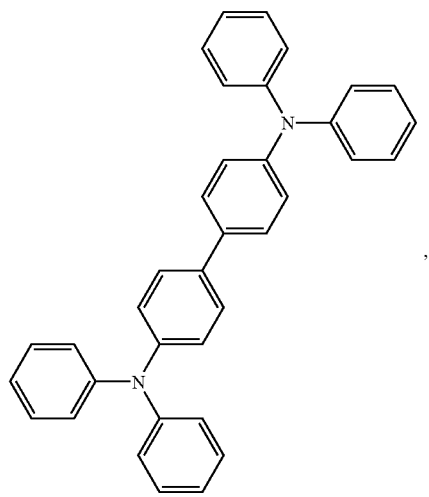
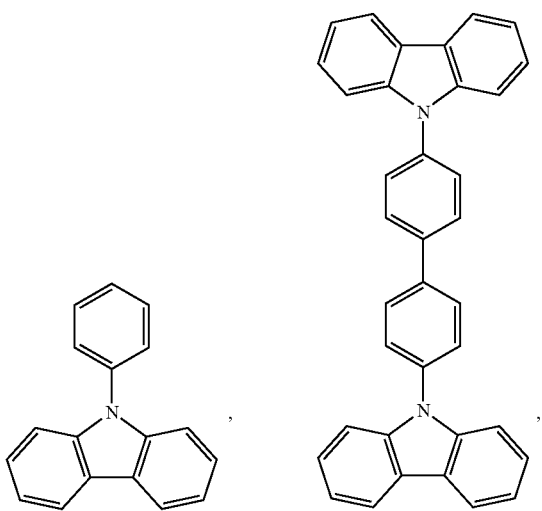
-continued
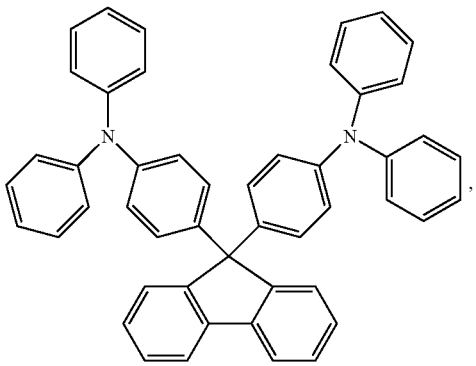
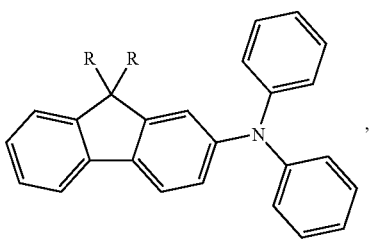
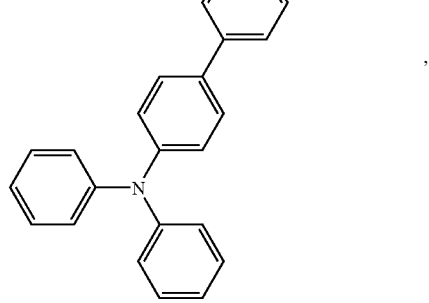
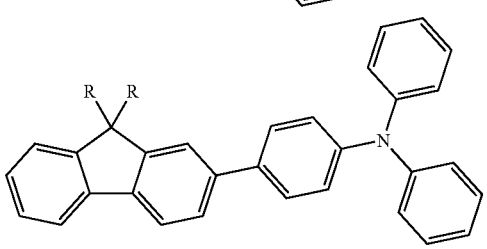
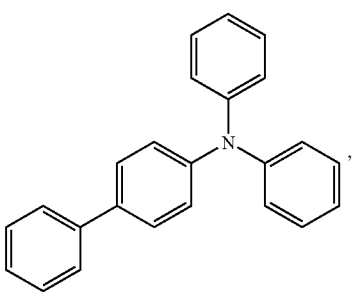
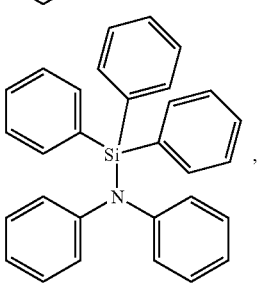
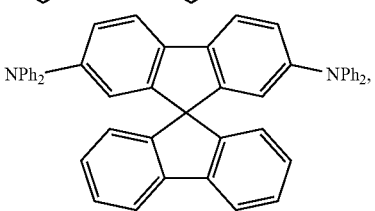

-continued

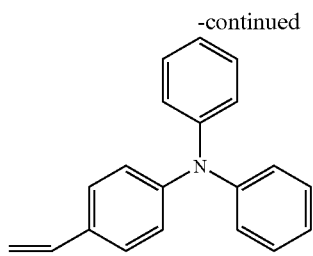

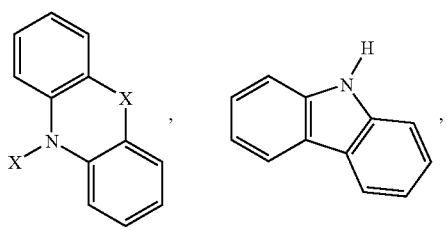

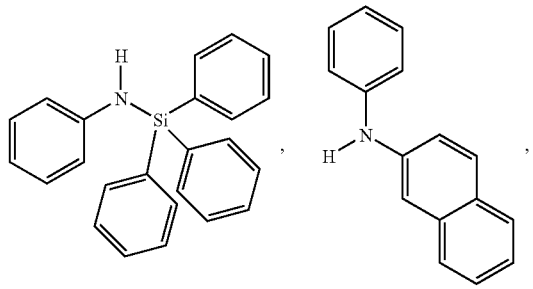

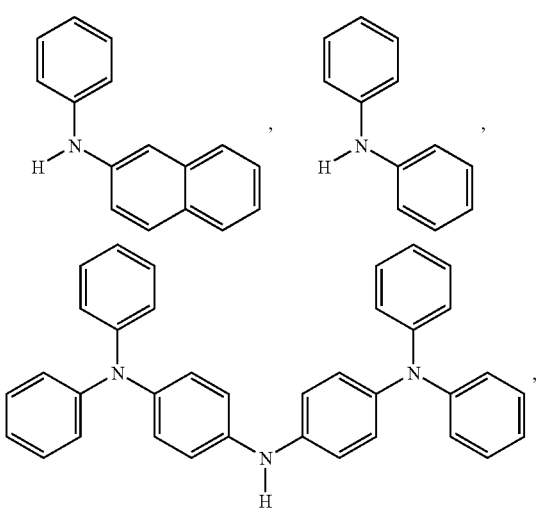

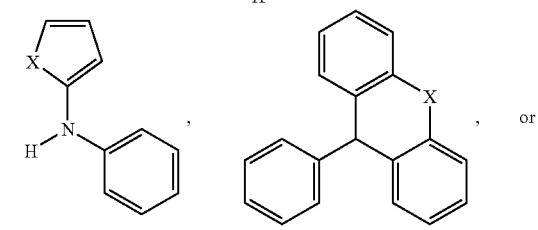

-continued

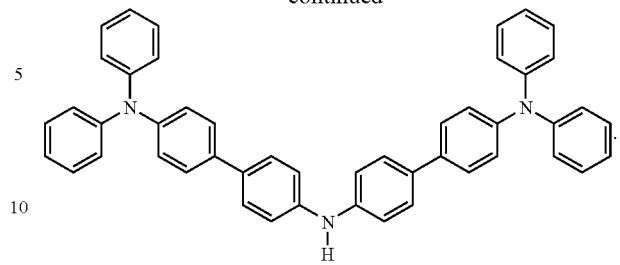

that is unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{,1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof, wherein each R is independently an $C_{1-30}$ alkyl, $C_{2-30}$ alkenyl, $C_{1-30}$ alkoxy, $C_{6-30}$ aryl, $C_{6-30}$ aryloxy, fluoro, $C_{1-30}$ fluoroalkyl, $C_{1-30}$ perfluoroalkyl, $C_{12-30}$ diarylamino, cyano, nitro, $C_{2-30}$ ester, $C_{1-30}$ heteroalkyl, $C_{3-20}$ heteroaryl, or combinations thereof; and each X is independently O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof.

15. The composition of claim 1, wherein the composition comprises a hole transporting material and an electron transporting material.

16. The composition of claim 1, wherein the composition comprises a hole transporting material, an electron transporting material, and a light emitting material.

17. The composition of claim 1, wherein R, $R^1$ or a substituent on the first compound comprises at least one soft segment comprising a divalent poly(oxyalkylene) segment of formula

or a divalent poly(dialkylsiloxane) segment of formula

where m is an integer of 1 to 6, y is an integer of 2 to 20, and w is an integer of 1 to 10.

18. The composition of claim 1, wherein R, $R^1$, or a substituent on the first compound comprises at least one fluoro, fluoroalkyl, or perfluoroalkyl group.

19. The composition of claim 1, wherein n is equal to 2.

20. A composition comprising:
(a) a first compound of Formula II

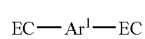

II that is a light emitting material, a charge transporting material, a charge blocking material, or a combination thereof,
wherein
$Ar^1$ is a first aromatic core and is a divalent radical selected from -continued
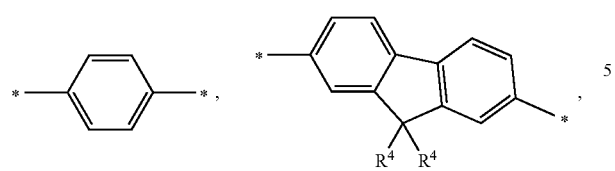
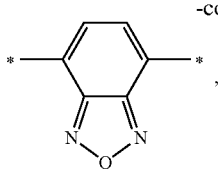
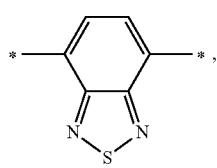
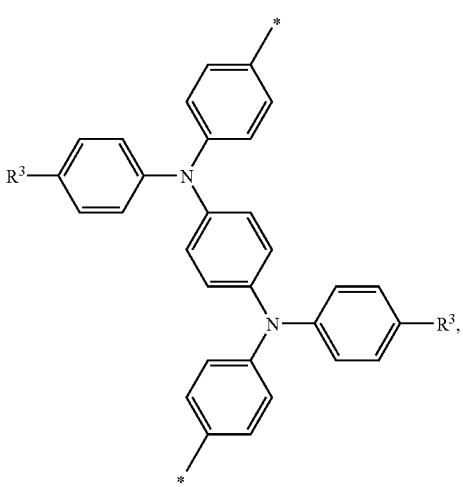
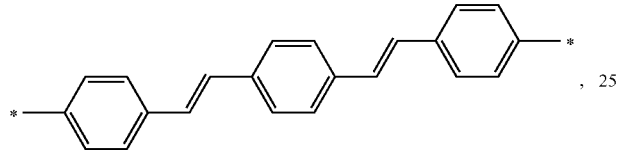
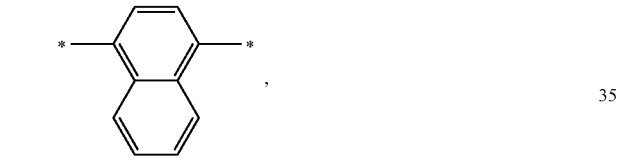
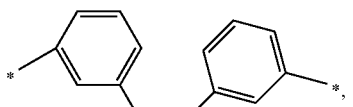
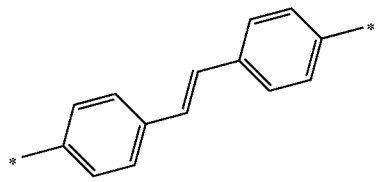
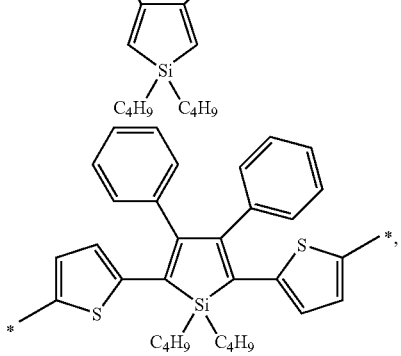
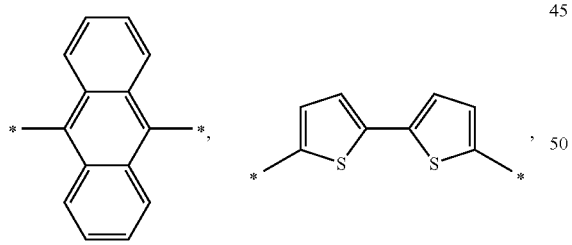
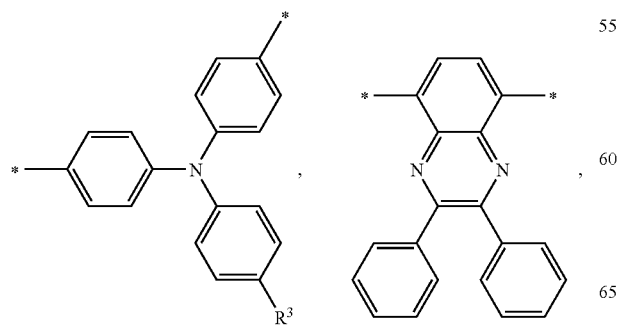
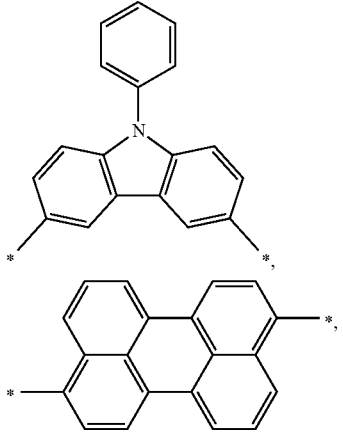

-continued

EC are two identical first end capping groups selected from

-continued

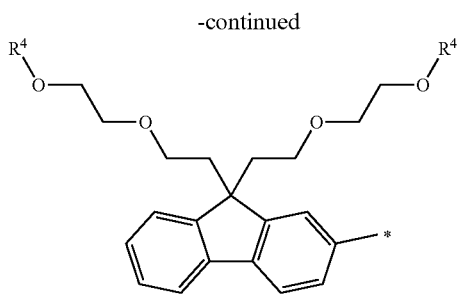

wherein
  each Ph is phenyl; and
  each $R^3$ is independently hydrogen, $C_{1-30}$ alkyl, $C_{6-20}$ aryl, $C_{3-20}$ heteroaryl, or $C_{1-30}$ heteroalkyl;
  each $R^4$ is independently $C_{1-30}$ alkyl, $C_{6-20}$ aryl, $C_{3-20}$ heteroaryl, or $C_{1-30}$ heteroalkyl; and (b) a second compound that is selected from a charge transporting material, a charge blocking material, a light emitting material, a color conversion material, or a combination thereof, said second compound being a polymeric material having an aromatic radical that comprises the first aromatic core of the first compound, wherein the aromatic radical of the second compound can be unsubstituted, substituted with a substituent of a same type that is present on the first aromatic core of the first compound, or substituted with a substituent that is absent on the first aromatic core of the first compound;

a second end capping group that comprises the first end capping group of the first compound, wherein the second end capping group can be unsubstituted, substituted with a substituent of a same type that is present on the first end capping group, or substituted with a substituent that is absent on the first end capping group;

a divalent radical that comprises a divalent radical of the first end capping group of the first compound, wherein the divalent radical in the second compound can be unsubstituted, substituted with a substituent of a same type that is present on the first end capping group, or substituted with a substituent that is absent on the first end capping group;

or a combination thereof,
wherein the composition is amorphous and solution processible.

21. A composition comprising:
  (b) a first compound of Formula I

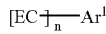  I that is a charge transporting material, a charge blocking material, a light emitting material, a color conversion material, or a combination thereof, wherein
  $Ar^1$ is a first aromatic core and is a divalent, trivalent, or tetravalent radical of

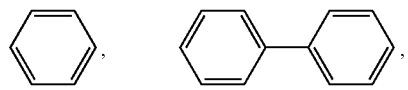

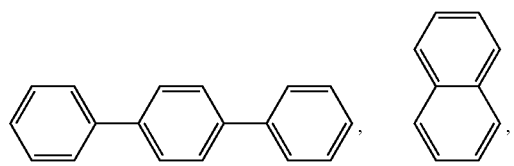

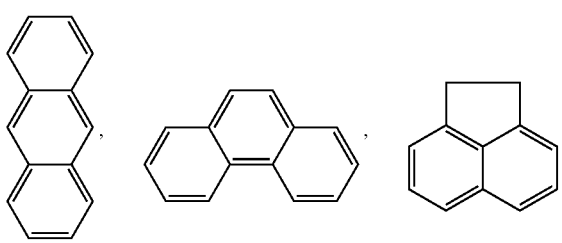

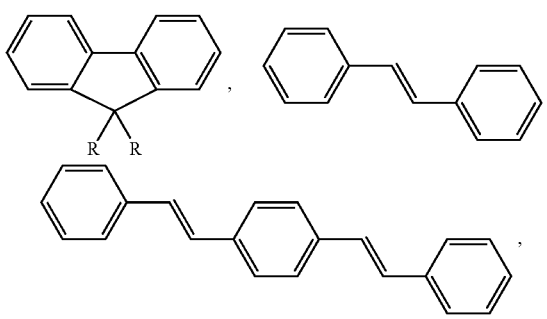

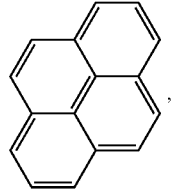

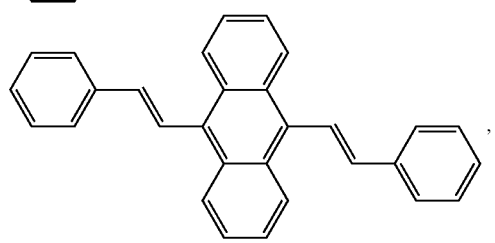

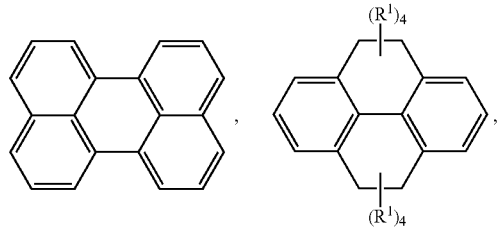

-continued
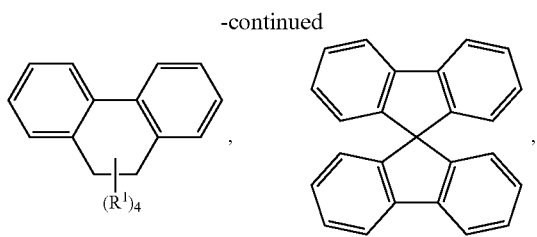
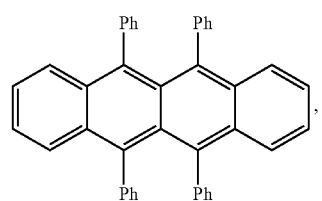
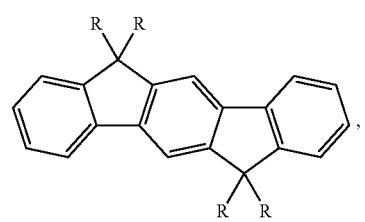
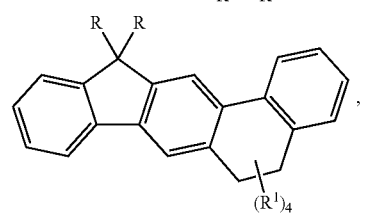
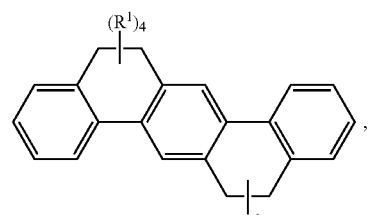
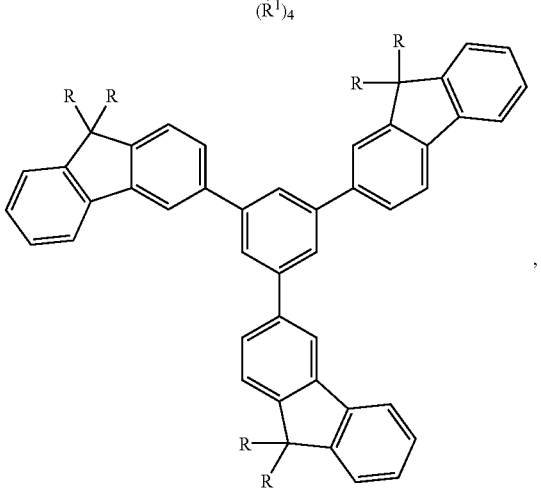
-continued
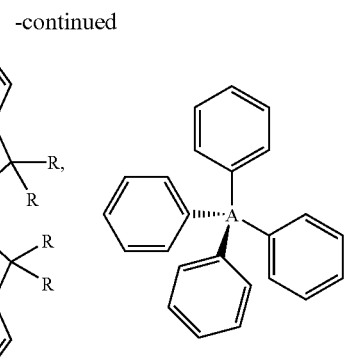
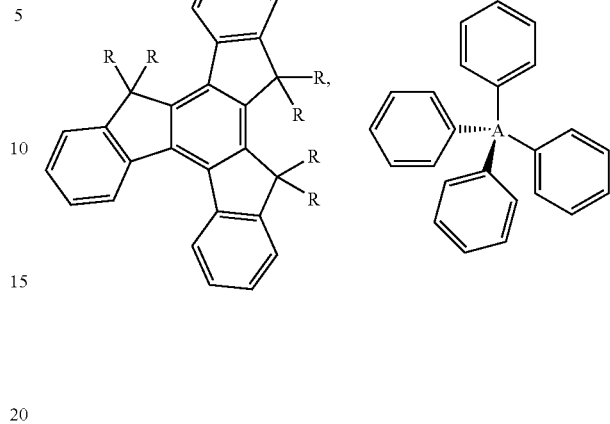
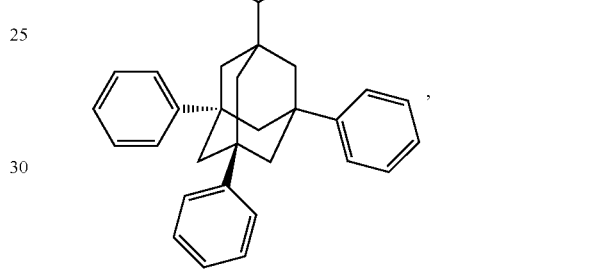
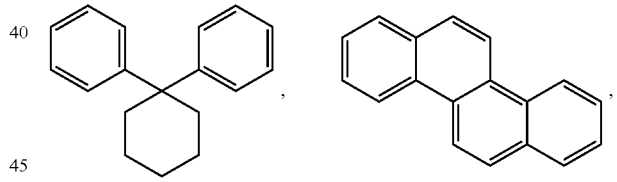
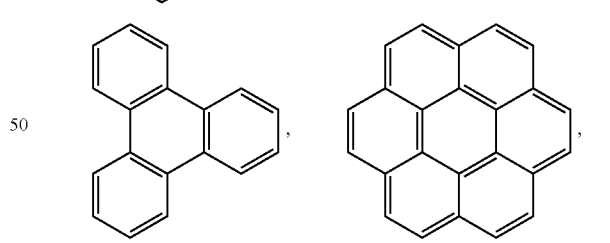
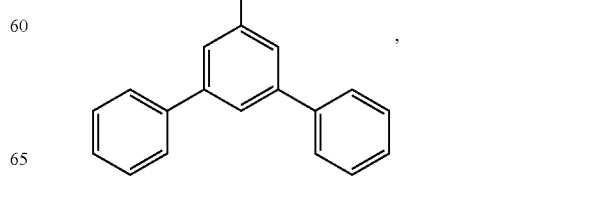

-continued
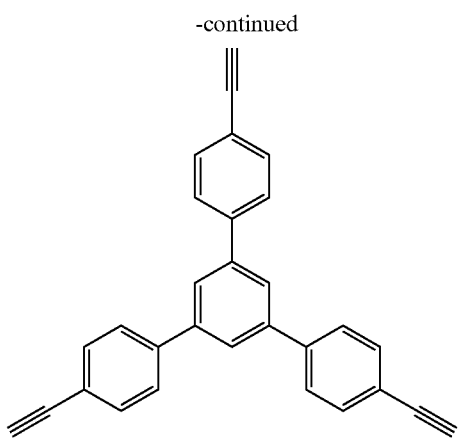
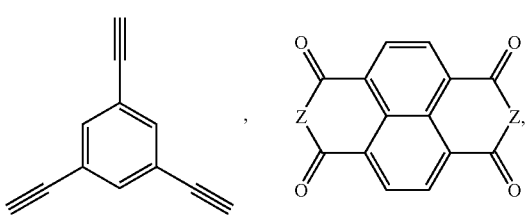
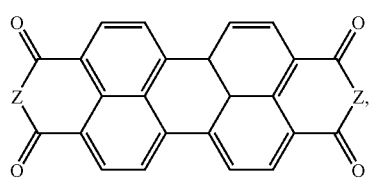
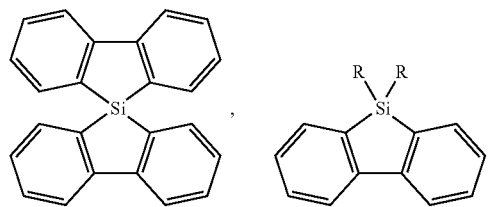
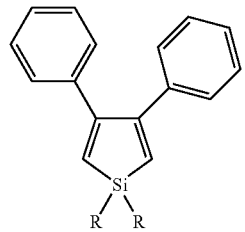
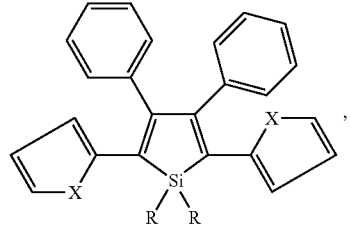
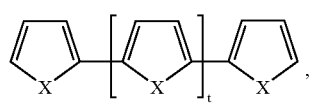
-continued
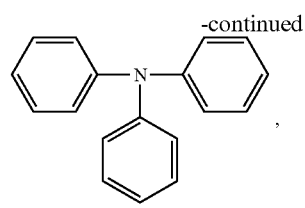
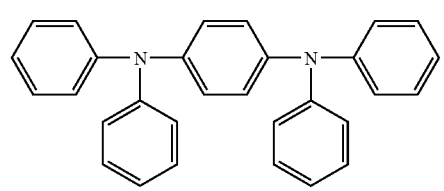
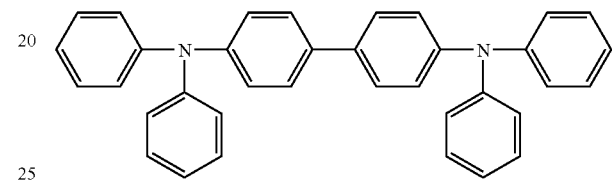
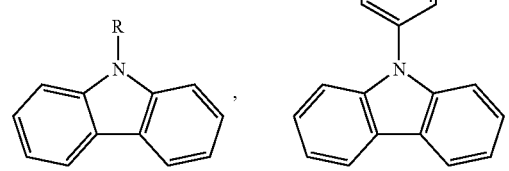
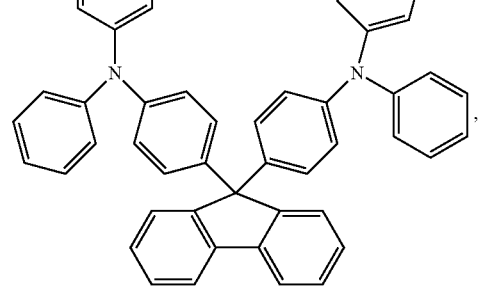

that is unsubstituted substituted with one or more substituents selected from alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof;

EC is a first end capping group that is a $C_{6-60}$ carbocyclic aryl, a $C_{3-60}$ heteroaryl, a $C_{12-30}$ aromatic amino aryl, or a monovalent radical of a silsesquioxane that is unsubstituted or substituted with one or more substituents selected from alkyl, alkenyl, alkoxy, aryl, aryloxy, fluoro, fluoroalkyl, perfluoroalkyl, diarylamino, cyano, nitro, ester, heteroalkyl, heteroaryl, and combinations thereof;

n is an integer of 2 to 4, wherein the first end capping groups are identical;

each R is independently an alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;

each $R^1$ independently a hydrogen, alkyl, alkenyl, alkoxy, aryl, aryloxy, fluoro, fluoroalkyl, perfluoroalkyl, diarylamino, cyano, nitro, ester, heteroalkyl, heteroaryl, or combinations thereof;

X is O, S, or $NR^2$ where $R^2$ is a $C_{1-30}$ alkyl, a $C_{1-30}$ heteroalkyl, a $C_{6-20}$ aryl, a $C_{3-20}$ heteroaryl, or a combination thereof;

A is C, Si, Ge, Pb, or Sn;

Z is N or CH;

t is an integer of 0 to 4; and (b) a second compound that is selected from a charge transporting material, a charge blocking material, a light emitting material, a color conversion material, or a combination thereof, said second compound being a polymeric material having
an aromatic radical that comprises the first aromatic core of the first compound, wherein the aromatic radical of the second compound can be unsubstituted, substituted with a substituent of a same type that is present on the first aromatic core of the first compound, or substituted with a substituent that is absent on the first aromatic core of the first compound;

a second end capping group that comprises the first end capping group of the first compound, wherein the second end capping group can be unsubstituted, substituted with a substituent of a same type that is present on the first end capping group, or substituted with a substituent that is absent on the first end capping group;

a divalent radical that comprises a divalent radical of the first end capping group of the first compound, wherein the divalent radical in the second compound can be unsubstituted, substituted with a substituent of a same type that is present on the first end capping group, or substituted with a substituent that is absent on the first end capping group;

or a combination thereof, wherein the composition is amorphous and solution processible.

22. The composition of claim 21, wherein the second compound has a second end capping group that comprises the first end capping group or the second compound comprises a divalent radical of the first end capping group, said first end capping group being a $C_{6-60}$ carbocyclic aryl comprising phenyl, biphenyl, anthryl, naphthyl, acenaphthyl, phenanthryl, dihydrophenathrenyl, anthracenyl, fluorenyl, 9-silafluorenyl, tetrahydropyrenyl, perylenyl, spirobisfluorenyl, fluoranthenyl, pyrenyl, dihydropyrenyl, tetrahydropyrenyl, rubrenyl, chrysenyl, or benzo[g,h,i]perylenyl, wherein the first end capping group is unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{2-20}$ diarylamino, cyano, nitro, $C_{2-20}$ ester, $C_{1-20}$ heteroalkyl, $C_{3-20}$ heteroaryl, and combinations thereof.

23. The composition of claim 21, wherein the second compound has a second end capping group that comprises the first end capping group or the second compound comprises a divalent radical of the first end capping group, said first end capping group being a $C_{3-60}$ a heteroaryl comprising a furanyl, thiophenyl, pyrrolyl, imidazolyl, pyrazolyl, triazolyl, tetrazolyl, thiazolyl, oxazolyl, isoxazolyl, oxadiazolyl, thiadiazolyl, isothiazolyl, pyridinyl, pyridazinyl, pyrazinyl, pyrimidinyl, quinolinyl, isoquinolinyl, benzofuranyl, benzothiophenyl, indolyl, carbazoyl, benzoxazolyl, benzothiazolyl, benzimidazolyl, cinnolinyl, qiunazolinyl, quinoxalinyl, phthalazinyl, benzothiadiazolyl, benzotriazinyl, phenazinyl, phenanthridinyl, acridinyl, indazolyl, or siloles, wherein the first end capping group is unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof.

24. The composition of claim 21, wherein the second compound has a second end capping group that comprises the first end capping group or the second compound comprises a divalent radical of the first end capping group, said first end capping group being a $C_{12-60}$ tertiary aromatic amino aryl comprising a monovalent radical of diarylaniline, alkylcarbazole, arylcarbazole, tetraaryldiamine, starburst amine, peraryltriantine, dendridic amine, or spiroaxnine, wherein the first end capping group is unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof.

25. The composition of claim 21, wherein the second compound has a second end capping group that comprises the first end capping group or the second compound comprises a divalent radical of the first end capping group, said first end capping group being a $C_{12-60}$ tertiary aromatic amino aryl comprising a monovalent radical of N,N,N'N'-tetraarylbenzidine, N,N,N',N'-tetraayl-1,4-phenylenediaxnine, N,N,N'N'- tetraryl-2,7-diaminofluorene, N,N'-bis(3-methylphenyl)-N,N'-bis(phenyl)benzidine, N,N'-bis(1-naphthyl)-N,N'-bis(phenyl)benzidine, 1,4-bis(carbazolyl)biphenyl, 4,4'4"-tris(N,N-diarylamino)triphenylamine, 1,3,5-tris(4-diarylaminophenyl)benzene, 4,4',4"-tris(N,N-diphenylamino)triphenylamine, 4,4',4"-tris(N-3-methylphenyl-N-phenylamino)triphenylamine, or 1,3,5-tris(4-diphenylaminophenyl)benzene, wherein the first end capping group is unsubstituted or substituted with one or more groups selected from $C_{1-20}$ alkyl, $C_{2-20}$ alkenyl, $C_{1-20}$ alkoxy, $C_{6-20}$ aryl, $C_{6-20}$ aryloxy, fluoro, $C_{1-20}$ fluoroalkyl, $C_{1-20}$ perfluoroalkyl, $C_{12-20}$ diarylamino, cyano, nitro, $C_{2-20}$ ester, $C_{1-20}$ heteroalkyl, $C_{3-20}$ heteroaryl, and combinations thereof.

26. The composition of claim 21, wherein n is equal to 2.

27. An organic electronic device comprising the composition of claim 1.

28. The organic electronic device of claim 27, wherein organic electronic device is an organic electroluminescent device.

29. The organic electronic device of claim 28, wherein the organic electroluminescent device comprises an organic emissive element comprising the first and second compound.

30. The organic electronic device of claim 29, wherein the organic emissive element has multiple layers and the composition is in a light emitting layer.

31. The organic electronic device of claim 29, wherein the organic emissive element has multiple layers and the composition is in a charge transporting layer, a charge blocking layer, a light emitting layer, a color conversion layer, or a combination thereof.

* * * * *

UNITED STATES PATENT AND TRADEMARK OFFICE
CERTIFICATE OF CORRECTION

PATENT NO. : 7,282,275 B2  Page 1 of 6
APPLICATION NO. : 10/414066
DATED : October 16, 2007
INVENTOR(S) : Martin B. Wolk It is certified that error appears in the above-identified patent and that said Letters Patent is hereby corrected as shown below:

Page 2, Column 2 (Other Publications), Line 64 - Delete "vinylcarbarzole)" and insert -- vinylcarbazole) --, therefor.

Page 2, Column 2 (Other Publications), Line 64 - Delete "Anthracence" and insert -- Anthracene --, therefor, Column 6, Lines 58-65 (Approx.) - Delete " 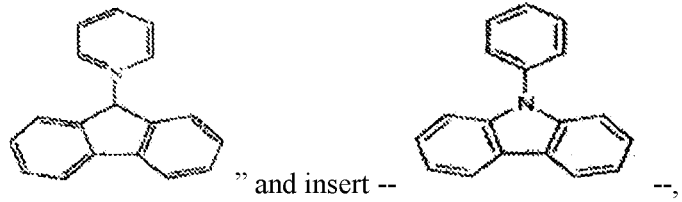 therefor.

Column 14, Lines 36-44 (Approx.) - Delete " 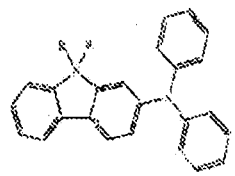 " and insert 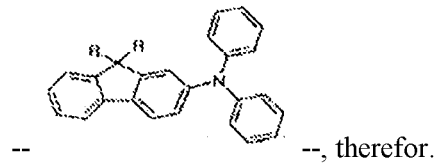 --, therefor.

Column 14, Line 46-54 (Approx.) - Delete " 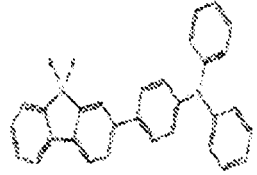 " and insert

Signed and Sealed this

Tenth Day of August, 2010

David J. Kappos
*Director of the United States Patent and Trademark Office*

-- 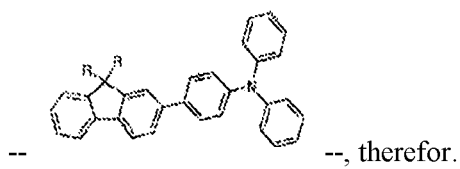 --, therefor.

Column 15, Lines 26-34 (Approx.) - Delete "  " and insert --  --, therefor.

Column 18, Lines 52-59 (Approx.) - Delete " 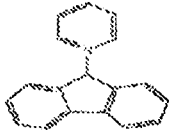 " and insert -- 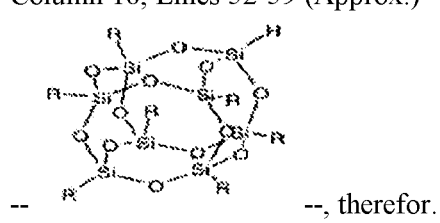 --, therefor.

Column 24 (2$^{nd}$ Structure from Left to Right), Lines 57-65 (Approx.) - Delete " 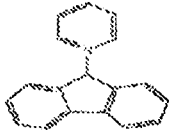 " and insert -- 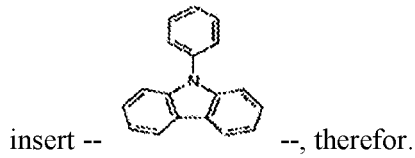 --, therefor.

Column 34, Line 50 (Approx.) - Delete "dihyrophenanthrene," and insert -- dihydrophenanthrene, --, therefor.

Column 34, Line 56 (Approx.) - Delete "dihydrophenathren" and insert -- dihydrophenanthren --, therefor.

Column 37, Line 38 - Delete "N'N '"and insert -- N'N' --, therefor.

Column 37, Line 39 - Delete "N'N'tetraryl" and insert -- N'N'tetraaryl --, therefor.

Column 38, Line 21 - After "devices" insert -- . --.

Column 38, Line 35 - Delete "in:" and insert -- in --, therefor.

Column 47 (2nd Structure from Left to Right) - Lines 1-11 (Approx.) - Delete " 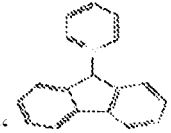 " and insert -- 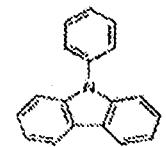 --, therefor.

Column 54 (1st Structure from Left to Right), Lines 52-60 (Approx.) - Delete " 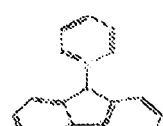 " and insert -- 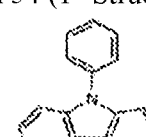 --, therefor.

Column 56 (2nd Structure from Left to Right), Lines 1-11 (Approx.) - Delete " 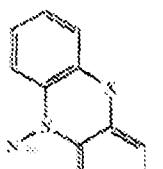 " and insert -- 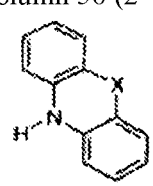 --, therefor.

Column 59, Lines 24-32 (Approx.) - Delete " 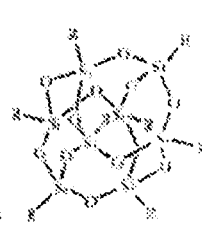 " and insert -- 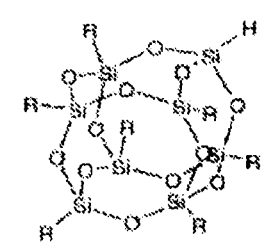 --, therefor.

Column 60, Line 66 - Delete "$C_{1-30}$heteroalkyl," and insert -- $C_{1-30}$ heteroalkyl, --, therefor.

Column 66, Line 65 - Delete "heteroalkyl;" and insert -- heteroalkyl, --, therefor.

CERTIFICATE OF CORRECTION (continued)
U.S. Pat. No. 7,282,275 B2

Column 66, Line 66 - After "A is" delete "A is".

Column 90, Line 28 (Approx.) - Delete "$C_{1-30}$heteroalkyl;" and insert -- $C_{1-30}$ heteroalkyl; --, therefor.

Column 99, Line 59 (Approx.) - Delete "tetraryl" and insert -- tetraaryl --, therefor.

Column 100, Line 22 - Delete "group(e.g.," and insert -- group (e.g., --, therefor.

Column 102, Line 10 - Delete "-for" and insert -- for --, therefor.

Column 104, Line 57 - Delete "be-represented," and insert -- be represented, --, therefor.

Column 106, Line 27 - Delete "corresponding," and insert -- corresponding --, therefor.

Column 109, Line 17 - Delete "6,284.425;" and insert -- 6,284,425; --, therefor.

Column 109, Line 17 - Delete "6,521.324;" and insert -- 6,521,324; --, therefor.

Column 112, Line 32 - Delete "underlayer;" and insert -- underlayer, --, therefor.

Column 112, Line 47 - After "reference" insert -- . --.

Column 112, Line 52 - Delete "may-be" and insert -- may be --, therefor.

Column 116, Line 3 - Delete "interlayers);" and insert -- interlayers), --, therefor.

Column 124, Line 13 - Delete "(3a)" and insert -- (13a) --, therefor.

Column 124, Line 14 - Delete "δ0.53" and insert -- δ 0.53 --, therefor.

Column 124, Line 21 - Delete "δ0.51"and insert -- δ 0.51 --, therefor.

Column 129, Line 39 - Delete "(2)" and insert -- (12) --, therefor.

Column 129, Line 40 - Delete "(2)" and insert -- (7) --, therefor.

Column 147-148 (3rd Structure from Left to Right), Line 4 - In Claim 1, delete " 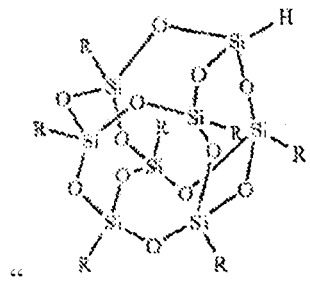 " and insert -- 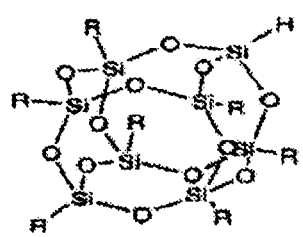 --, therefor.

CERTIFICATE OF CORRECTION (continued)
U.S. Pat. No. 7,282,275 B2

Column 149, Line 2 - In Claim 1, delete "alky)," and insert -- alkyl, --, therefor.

Column 149, Line 21 - In Claim 1, delete "to4;" and insert -- to 4; --, therefor.

Column 149, Lines 33-34 - In Claim 1, delete "compound," and insert -- compound; --, therefor.

Column 154, Line 40 - In Claim 6, delete "$C_{1-30}$," and insert -- $C_{1-30}$ --, therefor.

Column 159, Line 3 - In Claim 8, delete "$C_{,1-20}$" and insert -- $C_{1-20}$ --, therefor.

Column 159, Line 11 - In Claim 9, delete "tat" and insert -- that --, therefor.

Column 163, Line 23 - In Claim 9, delete "R₄is" and insert -- $R^4$ is --, therefor.

Column 163-164 (2nd Structure from Left to Right), Line 26 (Approx.) - In Claim 10, after

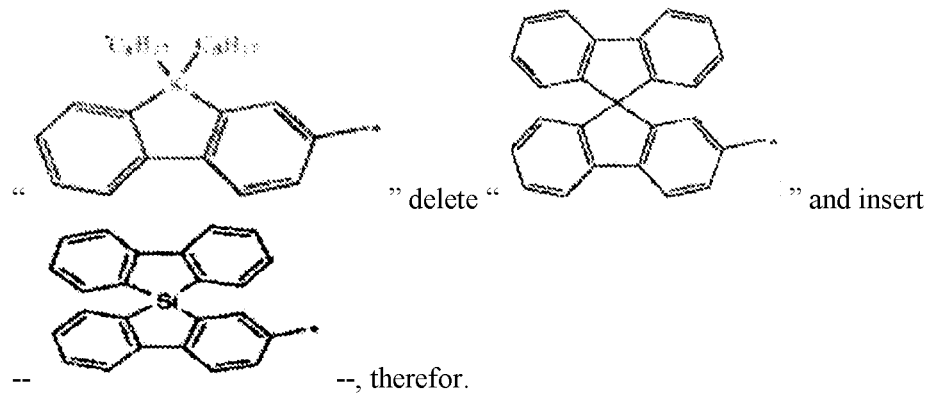

--, therefor.

Column 163-164 (3rd Structure from Left to Right), Line 27 (Approx.) - In Claim 10, after

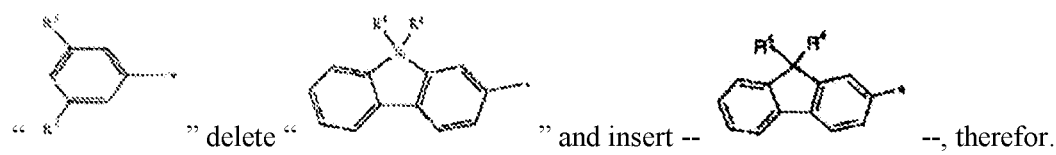

Column 169, Line 62 (Approx.) - In Claim 12, delete "$C_{,12-20}$" and insert -- $C_{12-20}$ --, therefor.

Column 177 (1st Structure from Left to Right), Lines 14-21 (Approx.) - In Claim 14, delete

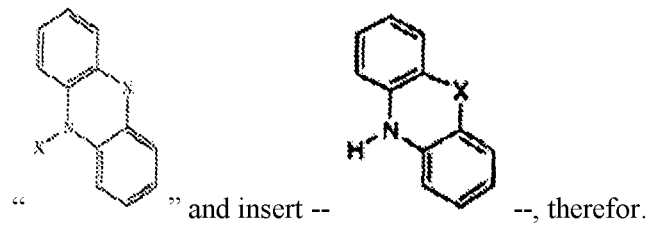

--, therefor.

Column 177 (2nd Structure from Left to Right), Lines 59-66 (Approx.) - In Claim 14, delete

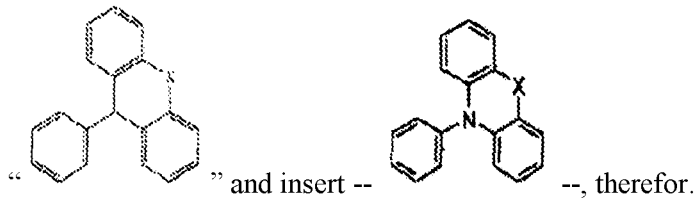 " and insert -- -- , therefor.

Column 178, Line 16 - In Claim 14, delete "$C_{,1-20}$" and insert -- $C_{1-20}$ --, therefor.

Column 178, Line 23 - In Claim 14, delete "$C_{3-20}$" and insert -- $C_{3-30}$ --, therefor.

Column 178, Line 34 - In Claim 17, delete "$R^1$" and insert -- $R^1$, --, therefor.

Column 178, Line 66 - In Claim 20, delete "Ar $^1$" and insert -- $Ar^1$ --, therefor.

Column 183, Line 58 (Approx.) - In Claim 21, delete "(b)" and insert -- (a) --, therefor.

Column 187, Lines 30- 36 (Approx.) - In Claim 21, delete "  " and insert -- 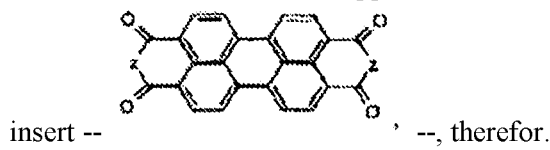 ' --, therefor.

Column 190, Line 29 - In Claim 21, after "unsubstituted" insert -- or --.

Column 190, Line 35 - In Claim 21, delete "$C_{12-30}$" and insert -- $C_{12-60}$ --, therefor.

Column 191, Line 48 - In Claim 23, delete "qiunazolinyl," and insert -- quinazolinyl, --, therefor.

Column 192, Line 8 - In Claim 24, delete "peraryltriantine," and insert -- peraryltriamine, --, therefor.

Column 192, Line 8 - In Claim 24, delete "spiroaxnine," and insert -- spiroamine, --, therefor.

Column 192, Line 21 - In Claim 25, delete "tetraayl" and insert -- tetraaryl --, therefor.

Column 192, Lines 21-22 - In Claim 25, delete "phenylenediaxnine," and insert -- phenylenediamine, -- , therefor.

Column 192, Line 22 - In Claim 25, delete "tetraryl" and insert -- tetraaryl --, therefor.

Column 192, Line 25 - In Claim 25, delete "4,4'4"" and insert -- 4,4',4" --, therefor.